(12) United States Patent
Moriwaki

(10) Patent No.: US 11,800,729 B2
(45) Date of Patent: Oct. 24, 2023

(54) IMAGING ELEMENT, STACKED IMAGING ELEMENT, AND SOLID-STATE IMAGING DEVICE

(71) Applicant: SONY CORPORATION, Tokyo (JP)

(72) Inventor: Toshiki Moriwaki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 361 days.

(21) Appl. No.: 17/250,717

(22) PCT Filed: Aug. 30, 2019

(86) PCT No.: PCT/JP2019/034146
§ 371 (c)(1),
(2) Date: Feb. 24, 2021

(87) PCT Pub. No.: WO2020/050170
PCT Pub. Date: Mar. 12, 2020

(65) Prior Publication Data
US 2021/0327961 A1    Oct. 21, 2021

(30) Foreign Application Priority Data

Sep. 4, 2018 (JP) .................................. 2018-165081

(51) Int. Cl.
*H01L 27/30* (2006.01)
*H10K 39/32* (2023.01)
*H10K 30/30* (2023.01)

(52) U.S. Cl.
CPC ............. *H10K 39/32* (2023.02); *H10K 30/30* (2023.02)

(58) Field of Classification Search
CPC ................. H01L 27/307; H01L 51/441; H01L 27/146–14893; H01L 17/14603–14616;
(Continued)

(56) References Cited

U.S. PATENT DOCUMENTS

2012/0274608 A1    11/2012   Kim et al.
2016/0037098 A1    2/2016    Lee et al.
(Continued)

FOREIGN PATENT DOCUMENTS

CN    102904560 A    1/2013
CN    106206627 A    12/2016
(Continued)

OTHER PUBLICATIONS

International Search Report and Written Opinion of PCT Application No. PCT/JP2019/034146, dated Nov. 5, 2019, 09 pages of ISRWO.

*Primary Examiner* — Jarrett J Stark
(74) *Attorney, Agent, or Firm* — CHIP LAW GROUP

(57) ABSTRACT

An imaging element 10 includes a first electrode 21, a charge accumulation electrode 24 disposed apart from the first electrode 21, a photoelectric conversion unit 23 formed in contact with the first electrode 21 and above the charge accumulation electrode 24 with an insulation layer 82 interposed between the photoelectric conversion unit 23 and the charge accumulation electrode 24, and a second electrode 22 formed on the photoelectric conversion unit 23. The photoelectric conversion unit 23 includes a photoelectric conversion layer 23A and an inorganic oxide semiconductor material layer 23B disposed in an order of the photoelectric conversion layer 23A and the inorganic oxide semiconductor material layer 23B from the second electrode side. The inorganic oxide semiconductor material layer 23B contains indium (In) atoms, tin (Sn) atoms, titanium (Ti) atoms, and zinc (Zn) atoms.

14 Claims, 75 Drawing Sheets

(58) Field of Classification Search
CPC .......................... H01L 27/1462–14623; H01L 27/14625–14629; H01L 27/1463; H01L 27/1464; H01L 27/14636; H01L 27/14603; H01L 27/14665–14676; H01L 27/14678; H01L 21/823406; H01L 27/1057; H01L 27/14658–14663; H01L 27/14654–14656; H01L 27/14649–14652; H01L 27/14645–14647; H01L 27/14643–14663; H01L 27/14689; H01L 27/14812; H01L 29/765–76891; G01S 17/00–95; H10K 39/32; H10K 30/30

See application file for complete search history.

(56) References Cited

U.S. PATENT DOCUMENTS

| | | |
|---|---|---|
| 2016/0329379 A1 | 11/2016 | Takahashi |
| 2018/0175102 A1 | 6/2018 | Togashi |

FOREIGN PATENT DOCUMENTS

| | | | | |
|---|---|---|---|---|
| EP | 2551909 A1 | | 1/2013 | |
| JP | 2011-138927 A | | 7/2011 | |
| JP | 2013-025803 A | | 2/2013 | |
| JP | 2016-063165 A | | 4/2016 | |
| JP | 2017-118016 A | | 6/2017 | |
| JP | 2019068056 A | * | 4/2019 | |
| KR | 10-2013-0012507 A | | 2/2013 | |
| KR | 10-2016-0017168 A | | 2/2016 | |
| TW | 201826582 A | | 7/2018 | |
| WO | WO-2017159609 A1 | * | 9/2017 | .............. C08F 12/30 |
| WO | WO-2019098369 A1 | * | 5/2019 | .............. C04B 35/01 |

\* cited by examiner

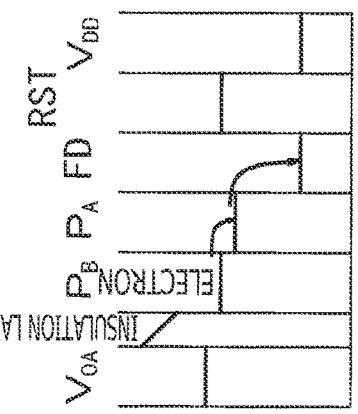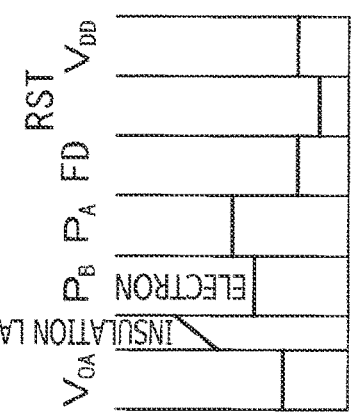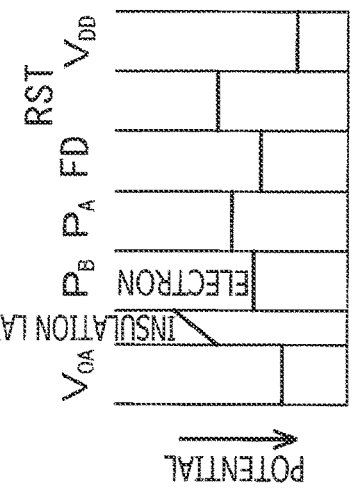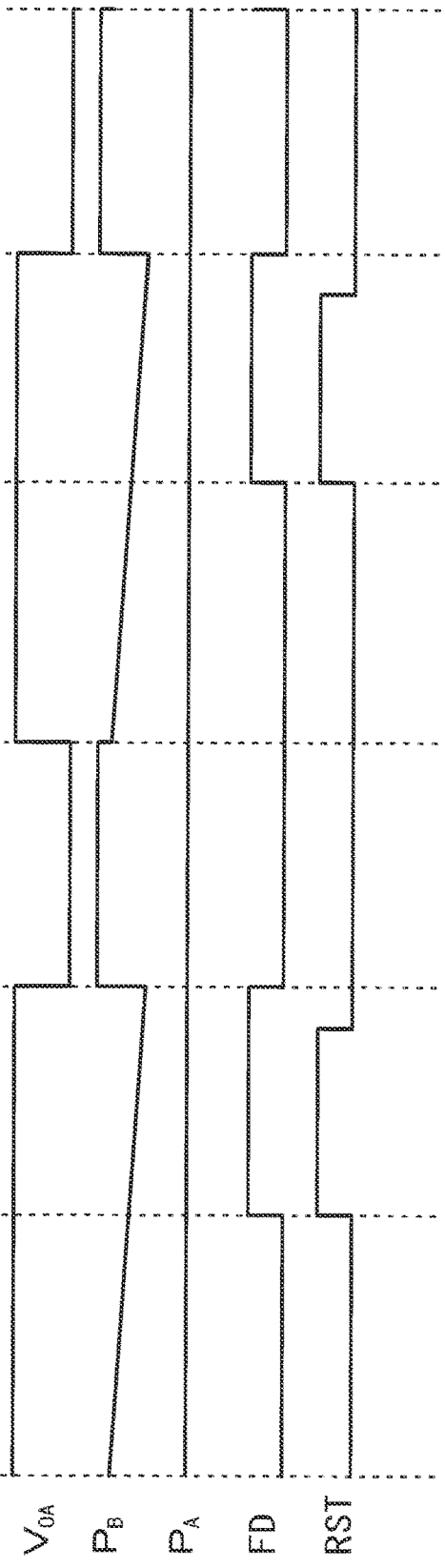
FIG. 5

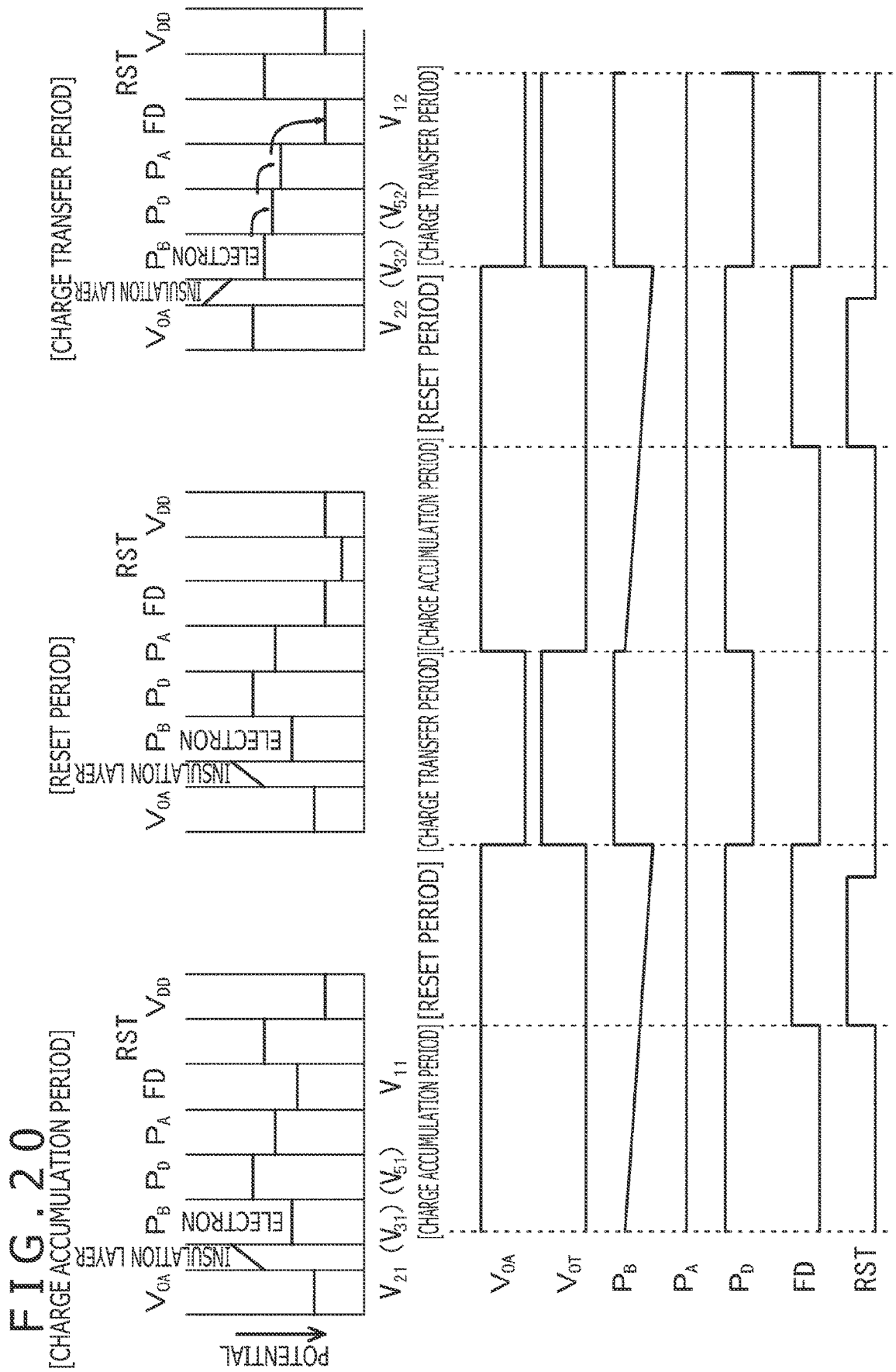

F I G. 2 1
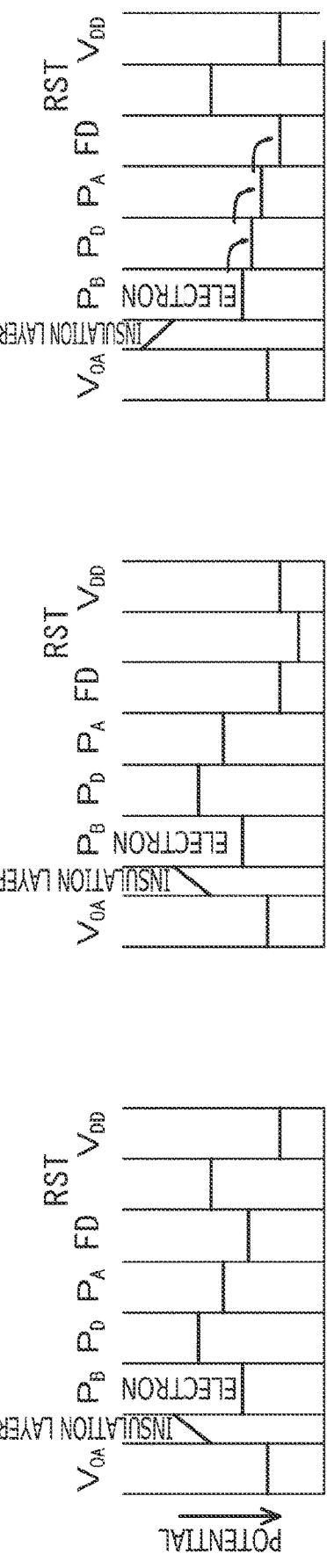
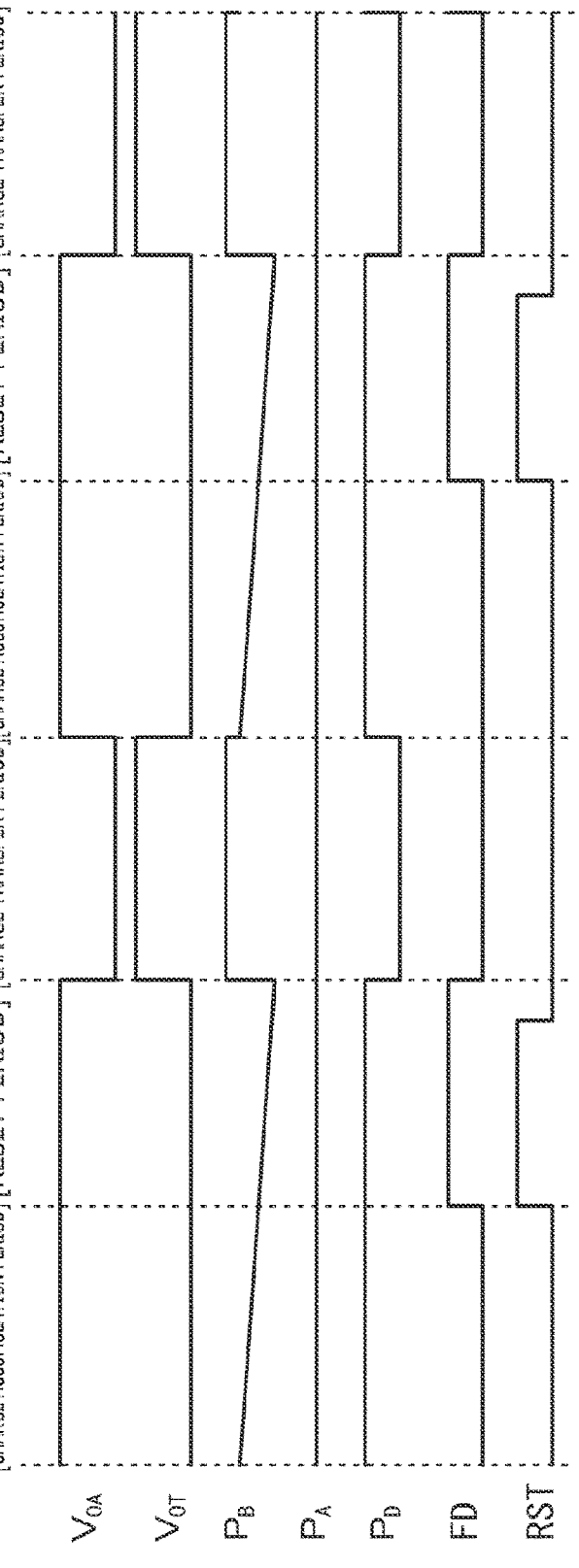

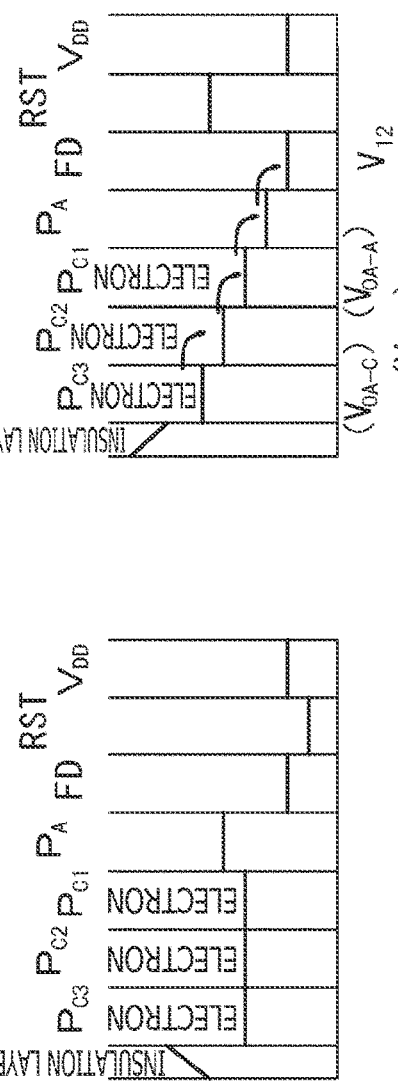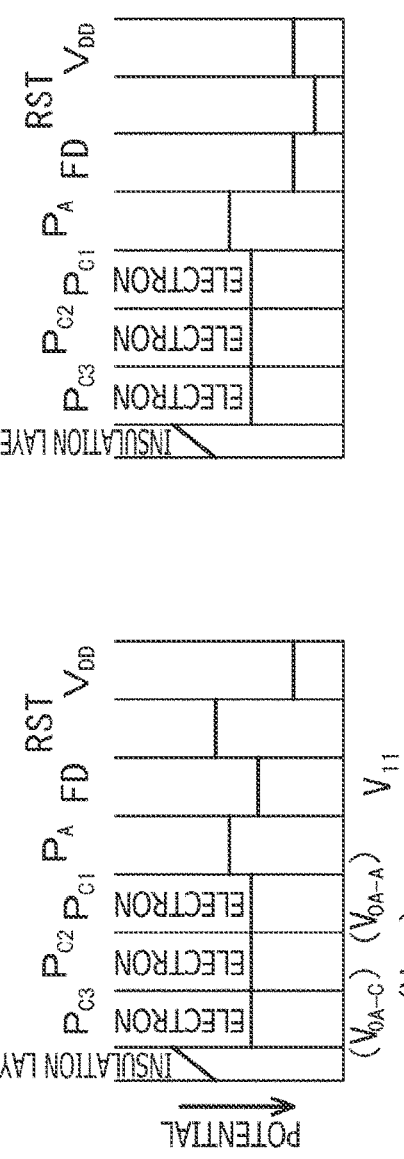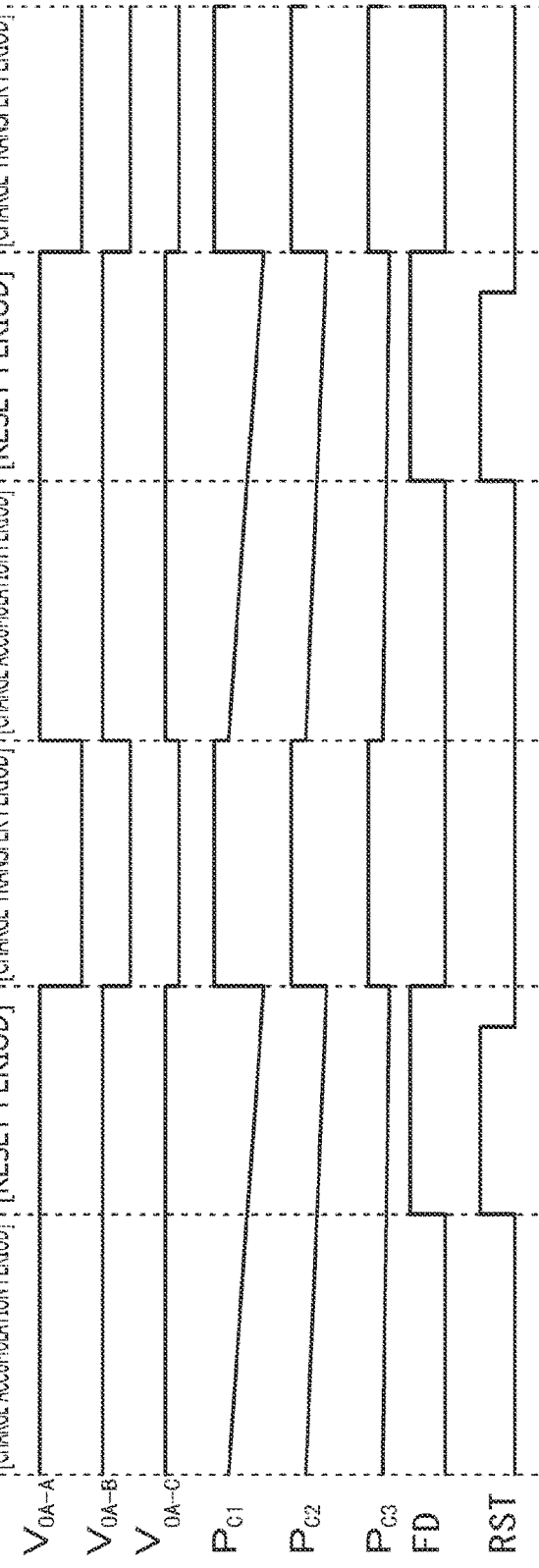
FIG. 32

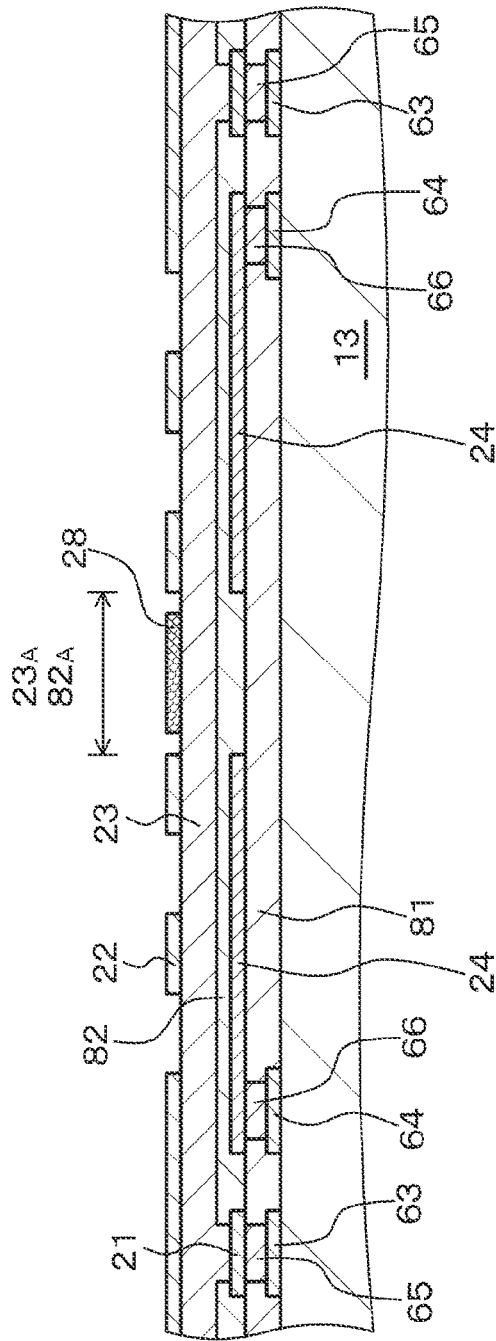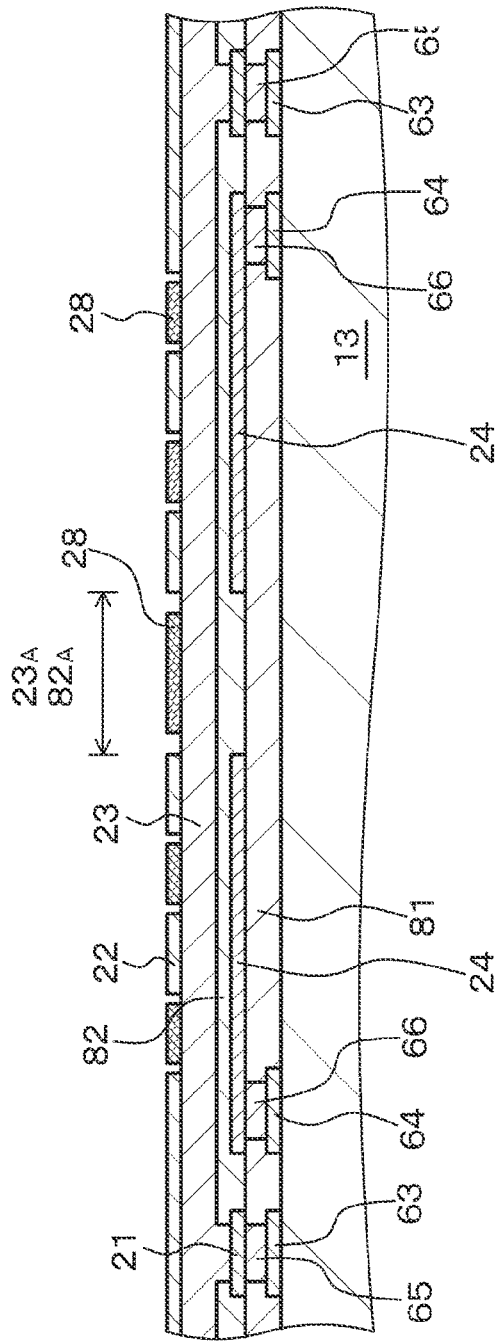

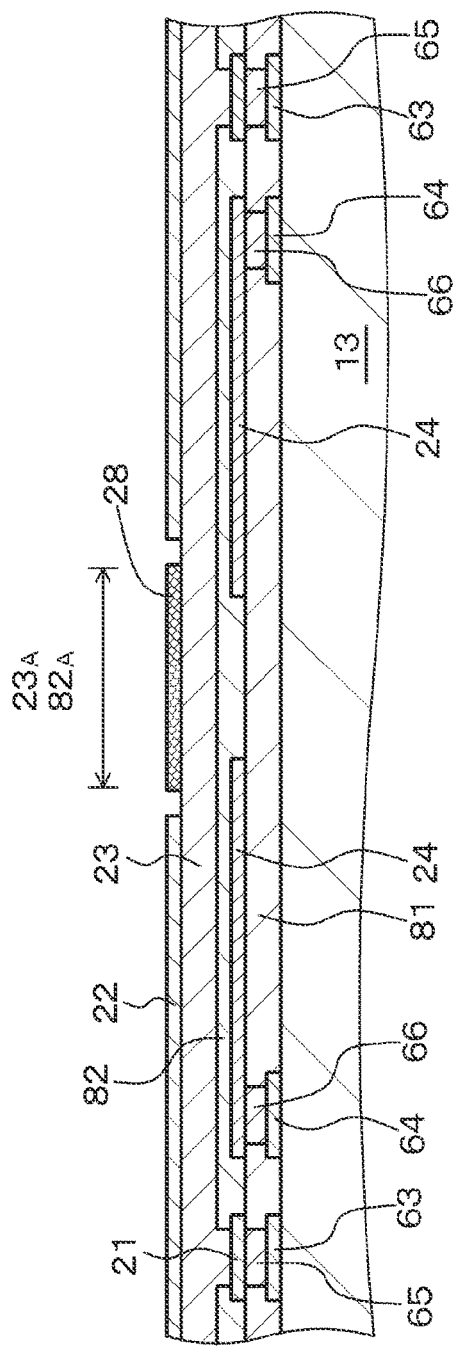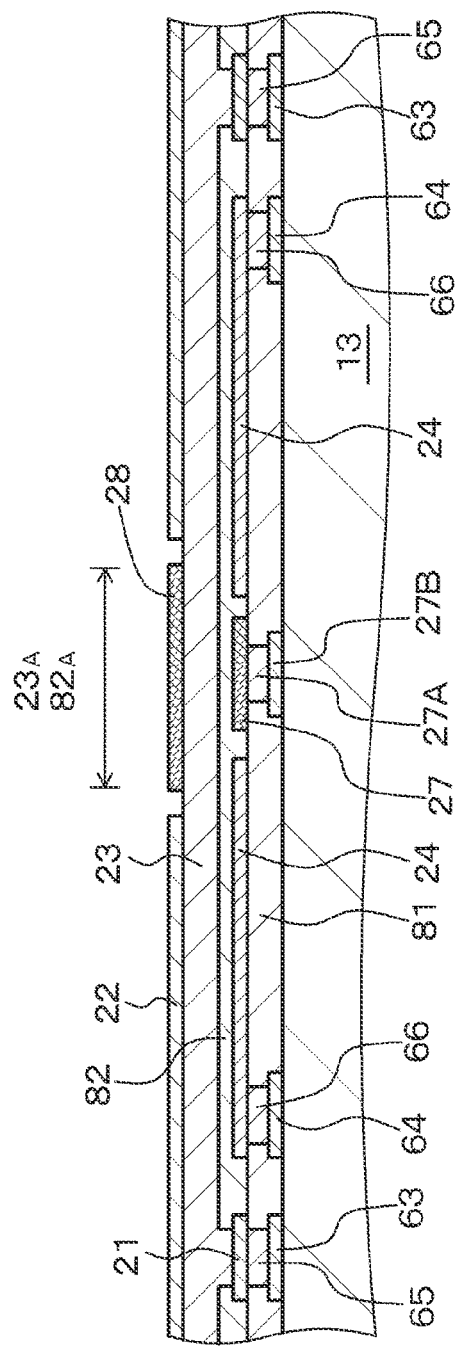

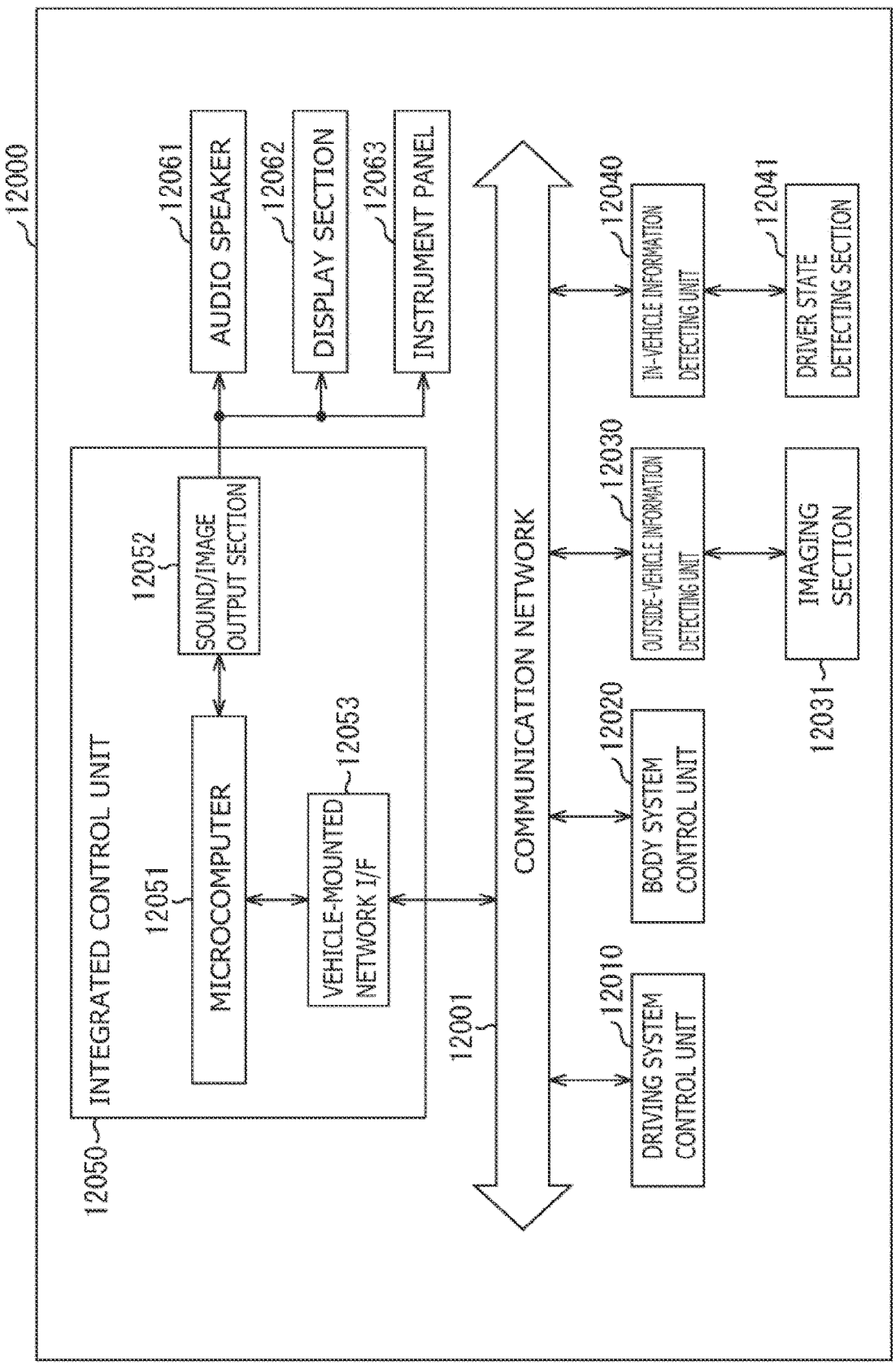
F I G . 72

IMAGING ELEMENT, STACKED IMAGING ELEMENT, AND SOLID-STATE IMAGING DEVICE

CROSS REFERENCE TO RELATED APPLICATIONS

This application is a U.S. National Phase of International Patent Application No. PCT/JP2019/034146 filed on Aug. 30, 2019, which claims priority benefit of Japanese Patent Application No. JP 2018-165081 filed in the Japan Patent Office on Sep. 4, 2018. Each of the above-referenced applications is hereby incorporated herein by reference in its entirety.

TECHNICAL FIELD

The present disclosure relates to an imaging element, a stacked imaging element, and a solid-state imaging device.

BACKGROUND ART

Recently, a stacked imaging element has been attracting attention as an imaging element constituting an image sensor or the like. The stacked imaging element has a structure which includes a photoelectric conversion layer (light receiving layer) sandwiched between two electrodes. The stacked imaging element is further required to have a structure which accumulates and transfers signal charges generated in the photoelectric conversion layer by photoelectric conversion. A conventional structure is required to have a structure which accumulates and transfers signal charges in and to an FD (Floating Diffusion) electrode and required to perform high-speed transfer of signal charges without a delay.

An imaging element (photoelectric conversion element) for meeting these requirements has been disclosed in JP 2016-63165A, for example. This imaging element includes:
an accumulation electrode formed on a first insulation layer;
a second insulation layer formed on the accumulation electrode;
a semiconductor layer so formed as to cover the accumulation electrode and the second insulation layer;
a collection electrode so formed as to come into contact with the semiconductor layer and separate from the accumulation electrode;
a photoelectric conversion layer formed on the semiconductor layer; and
an upper electrode formed on the photoelectric conversion layer.

An imaging element which includes a photoelectric conversion layer made of an organic semiconductor material is capable of photoelectrically converting a specific color (wavelength band). In addition, in a case where a solid-state imaging device includes imaging elements each constituted by this imaging element characterized as above, the solid-state imaging device is allowed to have a sub-pixel stacked structure (stacked imaging element) which includes sub pixels two-dimensionally arranged and each constituted by a combination of an on-chip color filter layer (OCCF) and the imaging element, as a structure not allowed for a conventional solid-state imaging device (e.g., JP 2011-138927A). Further, no need for demosaic processing produces such an advantage that generation of a false color is eliminated. In the following description, in some cases, an imaging element which includes a photoelectric conversion unit provided on or above a semiconductor substrate will be referred to as a "first type imaging element" for convenience, a photoelectric conversion unit constituting the first type imaging element will be referred to as a "first type photoelectric conversion unit" for convenience, an imaging element provided within the semiconductor substrate will be referred to as a "second type imaging element" for convenience, and a photoelectric conversion unit constituting the second type imaging element will be referred to as a "second type photoelectric conversion unit" for convenience.

FIG. 71 depicts a configuration example of a conventional stacked imaging element (stacked solid-state imaging device). According to an example depicted in FIG. 71, a third photoelectric conversion unit 331 and a second photoelectric conversion unit 321 as the second type photoelectric conversion units constituting a third imaging element 330 and a second imaging element 320 as the second type imaging elements, respectively, are stacked and formed within a semiconductor substrate 370. Further, a first photoelectric conversion unit 310 as the first type photoelectric conversion unit is disposed above the semiconductor substrate 370 (specifically, above the second imaging element 320). The first photoelectric conversion unit 310 here includes a first electrode 311, a photoelectric conversion layer 313 made of an organic material, and a second electrode 312, and constitutes a first imaging element which is the first type imaging element. For example, the second photoelectric conversion unit 321 and the third photoelectric conversion unit 331 photoelectrically convert blue light and red light, respectively, by a difference in absorption coefficient. In addition, for example, the first photoelectric conversion unit 310 photoelectrically converts green light.

Charges generated by photoelectric conversion of the second photoelectric conversion unit 321 and the third photoelectric conversion unit 331 are temporarily accumulated in the second photoelectric conversion unit 321 and the third photoelectric conversion unit 331, respectively, and then transferred to a second floating diffusion layer (Floating Diffusion) $FD_2$ and a third floating diffusion layer $FD_3$ by a vertical transistor (a gate portion 322 depicted in the figure) and a transfer transistor (a gate portion 332 depicted in the figure), respectively, and further output to a readout circuit (not depicted) disposed outside. These transistors and the floating diffusion layers $FD_2$ and $FD_3$ are also formed in the semiconductor substrate 370.

Charges generated by photoelectric conversion of the first photoelectric conversion unit 310 are accumulated, via a contact hole portion 361 and a wiring layer 362, in a first floating diffusion layer $FD_1$ formed in the semiconductor substrate 370. Further, the first photoelectric conversion unit 310 is also connected, via the contact hole portion 361 and the wiring layer 362, to a gate portion 318 of an amplification transistor which converts a charge amount into a voltage. In addition, the first floating diffusion layer $FD_1$ constitutes a part of a reset transistor (a gate portion 317 depicted in the figure). A reference number 371 denotes an element separation region, a reference number 372 denotes an oxide film formed on a surface of the semiconductor substrate 370, reference numbers 376 and 381 each denotes an interlayer insulation layer, a reference number 383 denotes a protection layer, and a reference number 314 denotes an on-chip micro-lens.

CITATION LIST

Patent Literature

[PTL 1]
JP 2016-63165A
[PTL 2]
JP 2011-138927A

SUMMARY

Technical Problems

However, the technology disclosed in JP 2016-63165A identified above imposes a limitation of equalization of lengths of the accumulation electrode and the second insulation layer formed on the accumulation electrode, and detailed regulations such as a clearance from the collection electrode. Accordingly, manufacturing steps may be complicated and may lower a manufacture yield. Further, several remarks concerning a material of the semiconductor layer are given, but remarks concerning more specific compositions and configurations of the material are not presented. Meanwhile, a correlation equation between mobility of the semiconductor layer and accumulated charges is mentioned. However, no remark is given concerning a matter of improvement over charge transfer as an important factor for transfer of generated charges, such as a matter of mobility of the semiconductor layer, and a matter of an energy level relation between the semiconductor layer and the photoelectric conversion layer at a portion adjacent to the semiconductor layer.

Accordingly, an object of the present disclosure is to provide an imaging element, a stacked imaging element, and a solid-state imaging device having a simple configuration and a simple structure but capable of achieving excellent characteristics in transfer of charges accumulated in a photoelectric conversion layer.

Solution to Problems

An imaging element according to a first aspect of the present disclosure for achieving the above object includes:
a first electrode;
a charge accumulation electrode disposed apart from the first electrode;
a photoelectric conversion unit formed in contact with the first electrode and above the charge accumulation electrode with an insulation layer interposed between the photoelectric conversion unit and the charge accumulation electrode; and
a second electrode formed on the photoelectric conversion unit, in which
the photoelectric conversion unit includes a photoelectric conversion layer and an inorganic oxide semiconductor material layer disposed in an order of the photoelectric conversion layer and the inorganic oxide semiconductor material layer from the second electrode side, and
the inorganic oxide semiconductor material layer contains indium (In) atoms, tin (Sn) atoms, titanium (Ti) atoms, and zinc (Zn) atoms.

An imaging element according to a second aspect of the present disclosure for achieving the above object includes:
a first electrode;
a charge accumulation electrode disposed apart from the first electrode;
a photoelectric conversion unit formed in contact with the first electrode and above the charge accumulation electrode with an insulation layer interposed between the photoelectric conversion unit and the charge accumulation electrode; and
a second electrode formed on the photoelectric conversion unit, in which
the photoelectric conversion unit includes a photoelectric conversion layer and an inorganic oxide semiconductor material layer disposed in an order of the photoelectric conversion layer and the inorganic oxide semiconductor material layer from the second electrode side,
the inorganic oxide semiconductor material layer contains indium atoms, tin atoms, titanium atoms, and zinc atoms, and
oxygen deficiency generation energy of metal atoms is 4 eV or higher.

A stacked imaging element of the present disclosure for achieving the above object includes at least the above one imaging element of the first aspect or the second aspect of the present disclosure.

A solid-state imaging device according to the first aspect of the present disclosure for achieving the above object includes a plurality of the above imaging elements of the first aspect or the second aspect of the present disclosure. In addition, a solid-state imaging device according to the second aspect of the present disclosure for achieving the above object includes a plurality of the above stacked imaging elements of the present disclosure.

BRIEF DESCRIPTION OF DRAWINGS

FIG. 5 is a diagram schematically depicting potential states of respective portions during an operation of the imaging element of Embodiment 1.

FIG. 20 is a diagram schematically depicting potential states of respective portions during an operation of the imaging element of Embodiment 4.

FIG. 21 is a diagram schematically depicting potential states of respective portions during another operation of the imaging element of Embodiment 4.

FIG. 32 is a diagram schematically depicting potential states of respective portions during an operation of the imaging element of Embodiment 6.

FIGS. 46A and 46B are schematic partial cross-sectional diagrams of a modification of the imaging elements (two imaging elements disposed side by side) of Embodiment 8.

FIGS. 47A and 47B are schematic partial cross-sectional diagrams of a modification of the imaging elements (two imaging elements disposed side by side) of Embodiment 8.

FIG. 72 is a block diagram depicting an example of schematic configuration of a vehicle control system.

DESCRIPTION OF EMBODIMENTS

Figure 1:
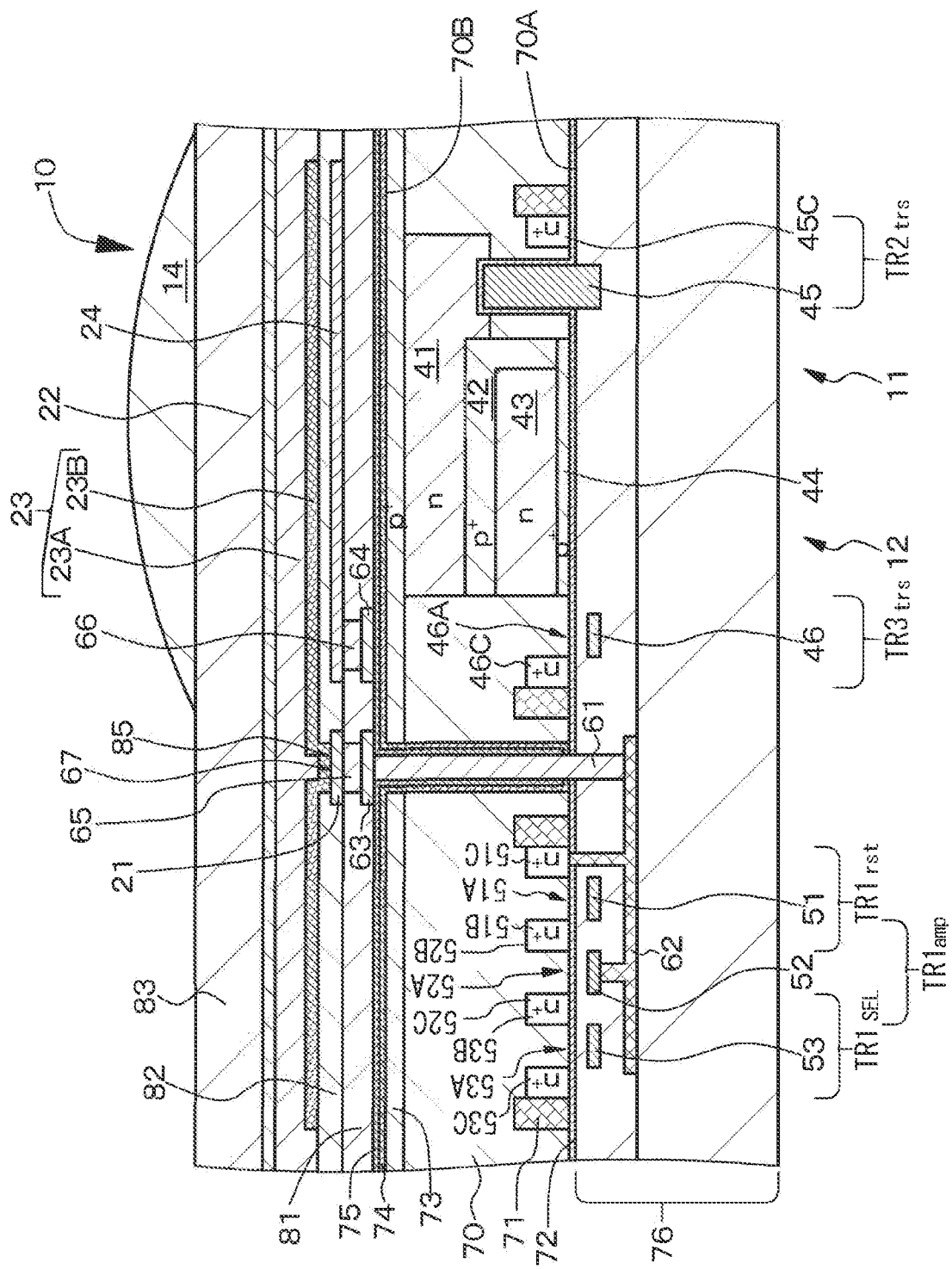
FIG. 1 is a schematic partial cross-sectional diagram of an imaging element of Embodiment 1.

The present disclosure will be hereinafter described with reference to the drawings on the basis of embodiments. However, the present disclosure is not limited to the embodiments, and various numerical values and materials specified in the embodiments are presented by way of example. Note that the description will be given in a following order.

1. General description of imaging elements according to first aspect and second aspect of present disclosure, stacked imaging element of present disclosure, and solid-state imaging devices according to first aspect and second aspect of present disclosure
2. Embodiment 1 (imaging elements according to first aspect and second aspect of present disclosure, stacked imaging element of present disclosure, and solid-state imaging device according to second aspect of present disclosure)
3. Embodiment 2 (modification of Embodiment 1)
4. Embodiment 3 (modification of Embodiment 1 and Embodiment 2 and solid-state imaging device according to first aspect of present disclosure)
5. Embodiment 4 (modification of Embodiment 1 to Embodiment 3 and imaging element including transfer control electrode)
6. Embodiment 5 (modification of Embodiment 1 to Embodiment 4 and imaging element including charge discharge electrode)
7. Embodiment 6 (modification of Embodiment 1 to Embodiment 5 and imaging element including plural charge accumulation electrode segments)
8. Embodiment 7 (modification of Embodiment 1 to Embodiment 6 and imaging element including lower charge transfer control electrode)
9. Embodiment 8 (modification of Embodiment 1 to Embodiment 6 and imaging element including upper charge transfer control electrode)
10. Embodiment 9 (solid-state imaging device having first configuration and second configuration)
11. Embodiment 10 (modification of Embodiment 9)
12. Others <General Description of Imaging Elements According to First Aspect and Second Aspect of Present Disclosure, Stacked Imaging Element of Present Disclosure, and Solid-State Imaging Devices According to First Aspect and Second Aspect of Present Disclosure>

An inorganic oxide semiconductor material layer included in an imaging element according to a first aspect of the present disclosure, an imaging element according to the first aspect of the present disclosure constituting a stacked imaging element of the present disclosure, and an imaging element according to the first aspect of the present disclosure constituting each of solid-state imaging devices of the first aspect and a second aspect of the present disclosure (these imaging elements hereinafter correctively referred to as an "imaging element and the like according to the first aspect of the present disclosure" in some cases) is made of a composite oxide constituted by an indium oxide, tin oxide, titanium oxide, and zinc oxide. However, the material of the inorganic oxide semiconductor material layer is not limited to this composite oxide. Titanium oxide may be replaced with aluminum oxide, hafnium oxide, or zirconium oxide. Specifically, adoptable is a mode where the inorganic oxide semiconductor material layer contains indium (In) atoms, tin (Sn) atoms, and aluminum (Al) and zinc (Zn) atoms, adoptable is a mode where the inorganic oxide semiconductor material layer contains indium (In) atoms, tin (Sn) atoms, and hafnium (Hf) and zinc (Zn) atoms, or adoptable is a mode where the inorganic oxide semiconductor material layer contains indium (In) atoms, tin (Sn) atoms, zirconium (Zr), and zinc (Zn) atoms. Alternatively, the inorganic oxide semiconductor material layer may contain indium (In) atoms, tin (Sn) atoms, metal atoms, and zinc (Zn) atoms. The metal atoms may be at least one type of atoms selected from a group constituted by titanium, aluminum, hafnium, and zirconium.

In the imaging element and the like according to the first aspect of the present disclosure including the above preferred mode, assuming that the composition of the inorganic oxide semiconductor material layer is expressed as $In_aSn_bTi_cZn_dO_e$, and $a+b+c+d=1.00$, $$b>d>c>0.09$$

is preferably satisfied. Alternatively, assuming that the composition of the inorganic oxide semiconductor material layer is expressed as $In_aSn_bM_fZn_dO_e$, and $a+b+f+d=1.00$, $$b>d>f>0.09$$

is preferably satisfied. In this case, M is any one of aluminum, hafnium, and zirconium. Each value of a, b, c, d, e, and f corresponds to an atomic percentage value. The composition of the inorganic oxide semiconductor material layer can be obtained using ICP emission spectral analysis (high frequency inductive coupling plasma emission spectral analysis, ICP-AES), or X-ray photoelectron spectroscopy (X-ray Photoelectron Spectroscopy, XPS), for example.

Further, in the imaging element and the like according to the first aspect of the present disclosure including the above preferred mode, assuming that the composition of the inorganic oxide semiconductor material layer is expressed as $In_aSn_bTi_cZn_dO_e$, and $a+b+c+d=1.00$, $$a<(b+c+d)\leq 0.6$$

is preferably satisfied. Further, $$0.4\leq a<(b+d)\leq 0.5$$

is preferably satisfied. Alternatively, assuming that the composition of the inorganic oxide semiconductor material layer is expressed as $In_aSn_bM_fZn_dO_e$, and $a+b+f+d=1.00$, $$a<(b+f+d)\leq 0.6$$

is preferably satisfied. In addition, $$0.4\leq a<(b+d)\leq 0.5$$

is preferably satisfied. In this case, M is any one of aluminum, hafnium, and zirconium similarly to above.

Note that other impurities such as hydrogen, other metals, and metal compounds may be mixed depending on cases during a film forming process of the inorganic oxide semiconductor material layer. However, prevention of this mixture is not needed when the amount of the mixture is small (e.g., 3% or lower molar fraction).

In a definition that an absolute value of energy (having a negative sign value) increases with farness from a vacuum level which is a zero reference in the imaging element and the like of the present disclosure including the preferred modes described above, assuming that an energy average value of maximum energy values in a conduction band of the inorganic oxide semiconductor material layer is $E_2$ and that an energy average value of LUMO values of a photoelectric conversion layer is $E_1$, $$E_1-E_2 \geq 0.1 \text{ (eV)}$$

is preferably satisfied. Further, $$E_1-E_2 > 0.1 \text{ (eV)}$$

is preferably satisfied. Note that the "minimum energy" refers to energy having a minimum absolute value of an energy value, while the "maximum energy" refers to energy having a maximum absolute value of an energy value. These are also applicable in the following description.

It is assumed that the energy average value $E_2$ of the maximum energy values in the conduction band of the inorganic oxide semiconductor material layer is an average value of the inorganic oxide semiconductor material layer. In addition, it is assumed that the energy average value $E_1$ of LUMO values of the photoelectric conversion layer is an average in a portion included in the photoelectric conversion layer and located near the inorganic oxide semiconductor material layer. The "portion included in the photoelectric conversion layer and located near the photoelectric conversion layer" here refers to a portion included in the photoelectric conversion layer and located in a region corresponding to 10% or smaller of a thickness of the photoelectric conversion layer (i.e., a region ranging from 0% to 10% of the thickness of the photoelectric conversion layer) with respect to an interface between the inorganic oxide semiconductor material layer and the photoelectric conversion layer.

Values of energy in a valence band and HOMO can be calculated on the basis of ultraviolet electron spectroscopy (UPS), for example. In addition, values in a conduction band and LUMO can be calculated from {(value of energy in valence band, HOMO)+$E_b$}. Further, band gap energy $E_b$ can be calculated from an optically absorbed wavelength A (optical absorption edge wavelength, unit: nm) using a following equation.

$$E_b=hv=h(c/\lambda)=1239.8/\lambda \text{[eV]}$$

Further, in the imaging element and the like of the present disclosure including the respective preferred modes described above, mobility of the material constituting the inorganic oxide semiconductor material layer is preferably 10 $cm^2/V \cdot s$ or higher.

In addition, in the imaging element and the like of the present disclosure including the respective preferred modes described above, adoptable is a mode where the inorganic oxide semiconductor material layer is amorphous (e.g., amorphous and having no local crystal structure). Whether or not the inorganic oxide semiconductor material layer is amorphous can be determined on the basis of X-ray diffraction analysis.

Further, in the imaging element and the like of the present disclosure including the respective preferred modes described above, the thickness of the inorganic oxide semiconductor material layer preferably ranges from $1 \times 10^{-8}$ to $1.5 \times 10^{-7}$ m, preferably from $2 \times 10^{-8}$ to $1.0 \times 10^{-7}$ m, and more preferably from $3 \times 10^{-8}$ to $1.0 \times 10^{-7}$ m.

Further, in the imaging element and the like of the present disclosure including the respective preferred modes described above, adoptable is a mode where charges generated in the photoelectric conversion layer are transferred to a first electrode via the inorganic oxide semiconductor material layer. In this case, charges are electrons.

Further, in the imaging element and the like of the present disclosure including the respective preferred modes described above, it is preferable to adopt followings.

Light enters from a second electrode.

Surface roughness Ra of a surface of the inorganic oxide semiconductor material layer in the interface between the photoelectric conversion layer and the inorganic oxide semiconductor material layer is 1.5 nm or lower, and a value of root-mean-square roughness Rq of the surface of the inorganic oxide semiconductor material layer is 2.5 nm or lower. Each of the surface roughness Ra and the surface roughness Rq conforms to regulations of JIS B0601:2013. This smoothness of the surface of the inorganic oxide semiconductor material layer in the interface between the photoelectric conversion layer and the inorganic oxide semiconductor material layer reduces scatter reflections on the surface of the inorganic oxide semiconductor material layer, thereby improving light current characteristics in photoelectric conversion. It is preferable that surface roughness Ra of a surface of a charge accumulation electrode is 1.5 nm or lower, and that root-mean-square roughness Rq of the surface of the charge accumulation electrode is 2.5 nm or lower.

Further, in the imaging element and the like of the present disclosure including the respective preferred modes described above, a carrier concentration of the inorganic oxide semiconductor material layer is preferably lower than $1 \times 10^{16}/cm^3$.

The first electrode, the second electrode, the charge accumulation electrode, and the photoelectric conversion layer will be described in detail below.

Figure 71:
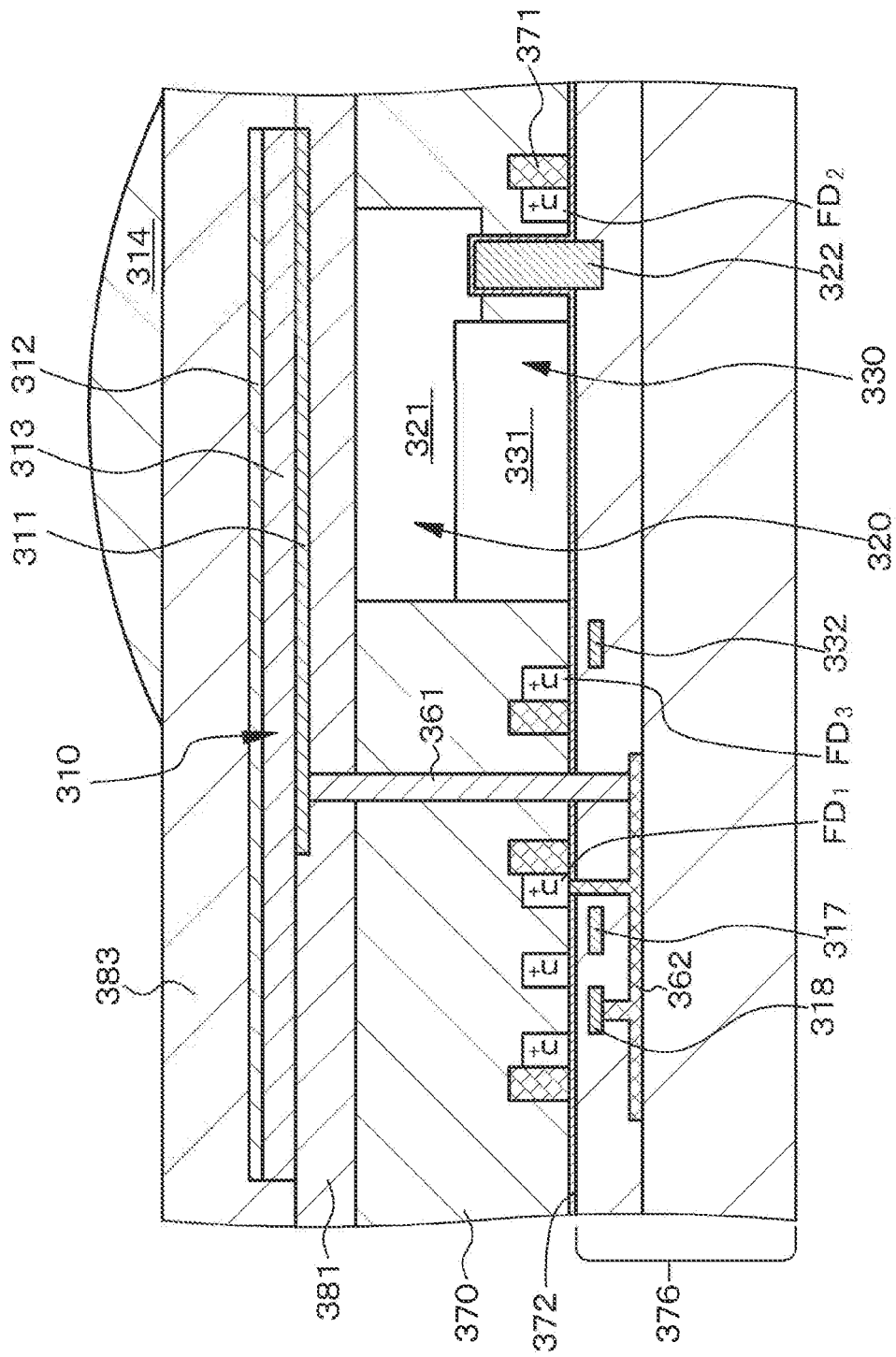
FIG. 71 is a conceptual diagram of a conventional stacked imaging element (stacked solid-state imaging device).

According to the conventional imaging element depicted in FIG. 71, charges generated by photoelectric conversion of the second photoelectric conversion unit 321 and the third photoelectric conversion unit 331 are temporarily accumulated in the second photoelectric conversion unit 321 and the third photoelectric conversion unit 331, respectively, and then transferred to the second floating diffusion layer $FD_2$ and the third floating diffusion layer $FD_3$. Accordingly, the second photoelectric conversion unit 321 and the third photoelectric conversion unit 331 can fully be depleted. However, charges generated by photoelectric conversion in the first photoelectric conversion unit 310 are directly accumulated in the first floating diffusion layer $FD_1$. Accordingly, the first photoelectric conversion unit 310 is difficult to fully deplete. In addition, as a consequence of above, kTC noise increases. In this case, random noise deteriorates, and imaging quality may lower.

As described above, the imaging element and the like of the present disclosure includes the charge accumulation electrode disposed apart from the first electrode, and so disposed as to face the inorganic oxide semiconductor material layer via an insulation layer. In this case, charges can be accumulated in the inorganic oxide semiconductor material layer (the inorganic oxide semiconductor material layer and the photoelectric conversion layer depending on cases) when photoelectric conversion is performed in the photoelectric conversion unit by irradiation of light to the photoelectric conversion unit. Accordingly, the charge accumulation unit can fully be depleted to eliminate charges at a start of exposure. As a result, a phenomenon such as lowering of imaging quality caused by random noise deterioration according to kTC noise increase can be reduced. Note that the inorganic oxide semiconductor material layer, or the inorganic oxide semiconductor material layer and the photoelectric conversion layer will be collectively referred to as the "inorganic oxide semiconductor material layer and the like" in some cases in the following description.

The inorganic oxide semiconductor material layer may have either a single-layer configuration or a multiple-layer configuration. In addition, the material constituting the inorganic oxide semiconductor material layer located above the charge accumulation electrode may be different from the material constituting the inorganic oxide semiconductor material layer located above the first electrode.

For example, the inorganic oxide semiconductor material layer may be formed by sputtering. Specifically, for example, a parallel plate sputtering device, a DC magnetron sputtering device, or an RF sputtering device may be used as a sputtering device, or argon (Ar) gas may be used as processing gas. In addition, it is sufficient that an $In_aSn_bTi_cZn_dO_e$ sintered body or an $In_aSn_bM_fZn_dO_e$ sintered body is used as a target.

Note that the energy level of the inorganic oxide semiconductor material layer is controllable by controlling an oxygen gas introduction amount (oxygen gas partial pressure) in a case where the inorganic oxide semiconductor material layer is formed by sputtering. Specifically, it is preferable that the oxygen gas partial pressure which is equal to ($O_2$ gas pressure)/(total pressure of Ar gas and $O_2$ gas) at the time of formation by sputtering ranges from 0.005 to 0.10. Further, in the imaging element and the like of the present disclosure, adoptable is a mode where a content of oxygen in the inorganic oxide semiconductor material layer is smaller than an oxygen content of a stoichiometric composition. The energy level of the inorganic oxide semiconductor material layer here can be controlled on the basis of the content of oxygen. The energy level is allowed to increase as the content of oxygen becomes lower with respect to the oxygen content of the stoichiometric composition, i.e., oxygen deficiency increases.

For example, the imaging element and the like of the present disclosure may be a CCD element, a CMOS image sensor, a CIS (Contact Image Sensor), and a CMD (Charge Modulation Device) type signal amplification image sensor. For example, each of the solid-state imaging devices according to the first aspect and the second aspect of the present disclosure, and a solid-state imaging device having a first configuration and a second configuration described below each may constitute a digital still camera or a video camera, a camcorder, a monitoring camera, a car-mounted camera, a smartphone camera, a game user interface camera, or a biometric authentication camera.

Embodiment 1

Figure 2:
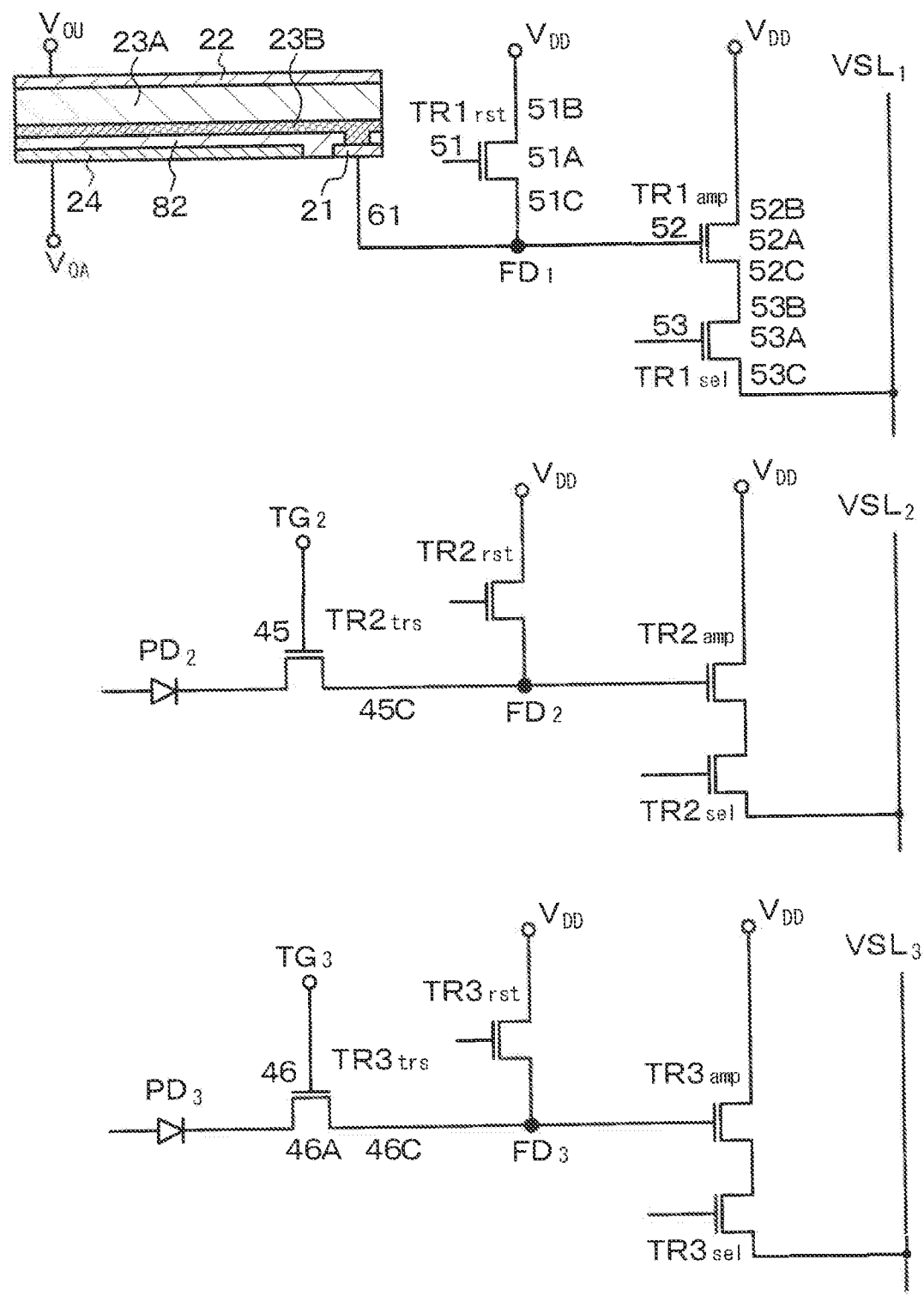
FIG. 2 is another equivalent circuit diagram of the imaging element of Embodiment 1.
Figure 3:
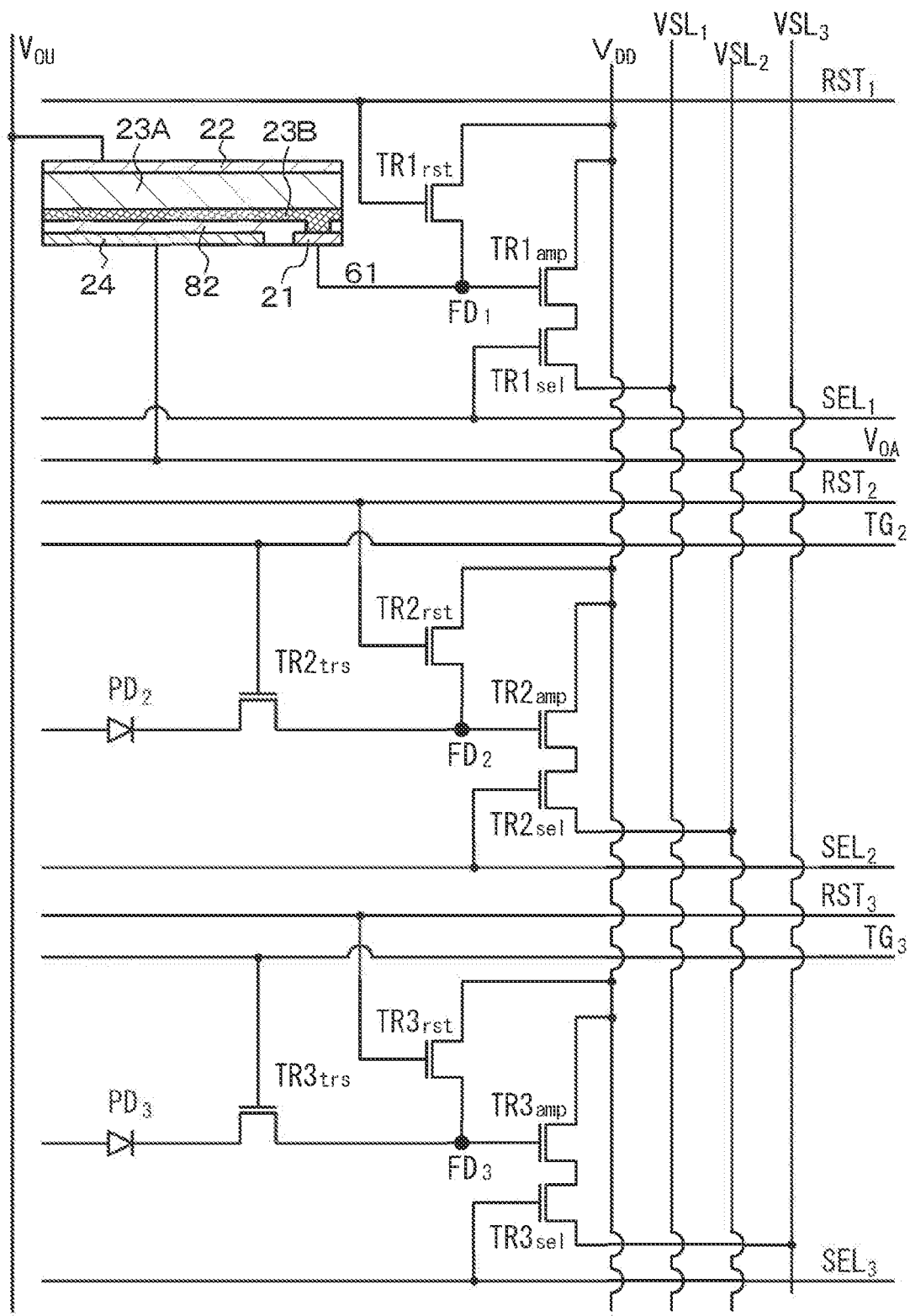
FIG. 3 is an equivalent circuit diagram of the imaging element of Embodiment 1.
Figure 4:
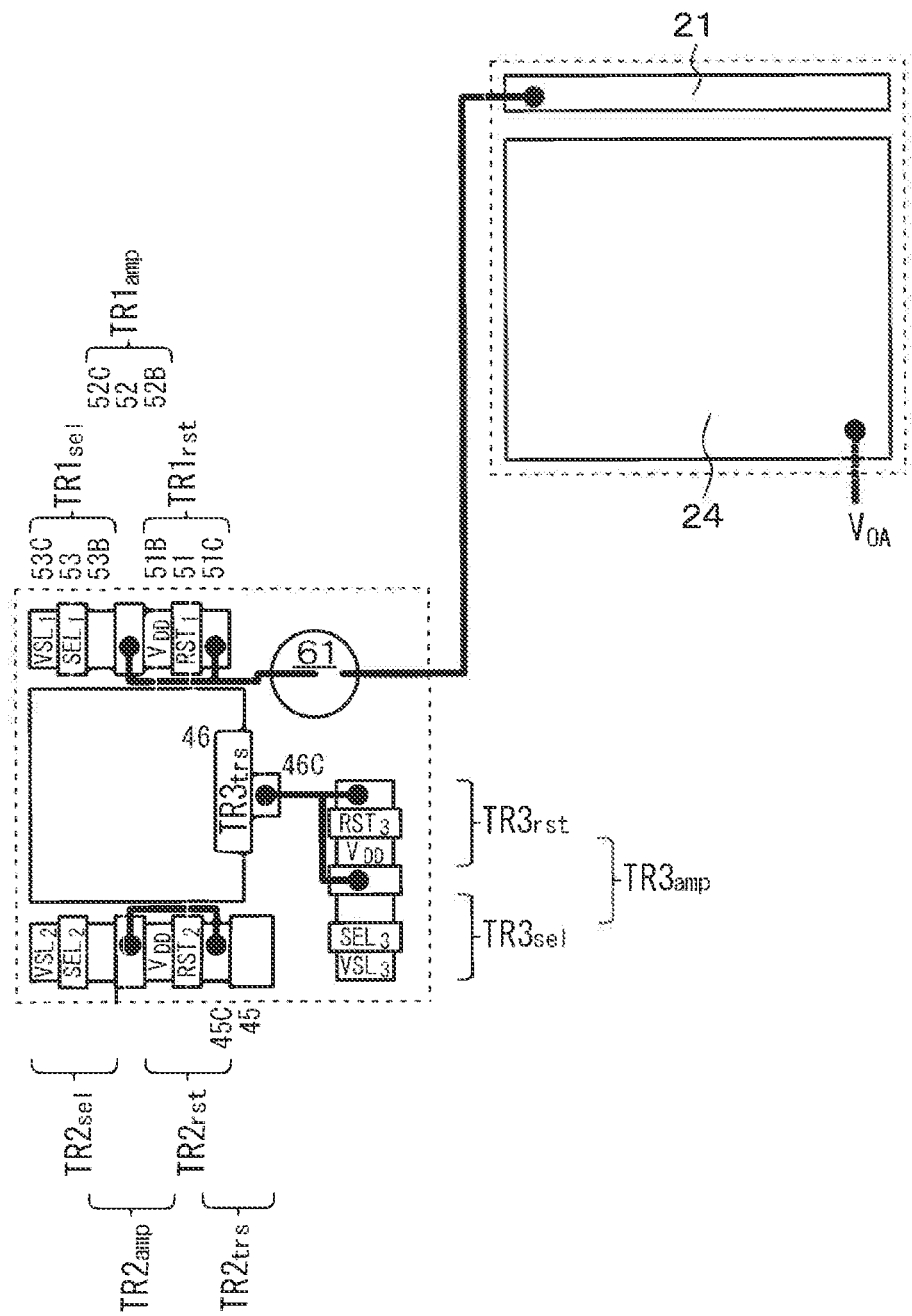
FIG. 4 is a schematic arrangement diagram of a first electrode, a charge accumulation electrode, and transistors constituting a control unit included in the imaging element of Embodiment 1.
Figure 6A:
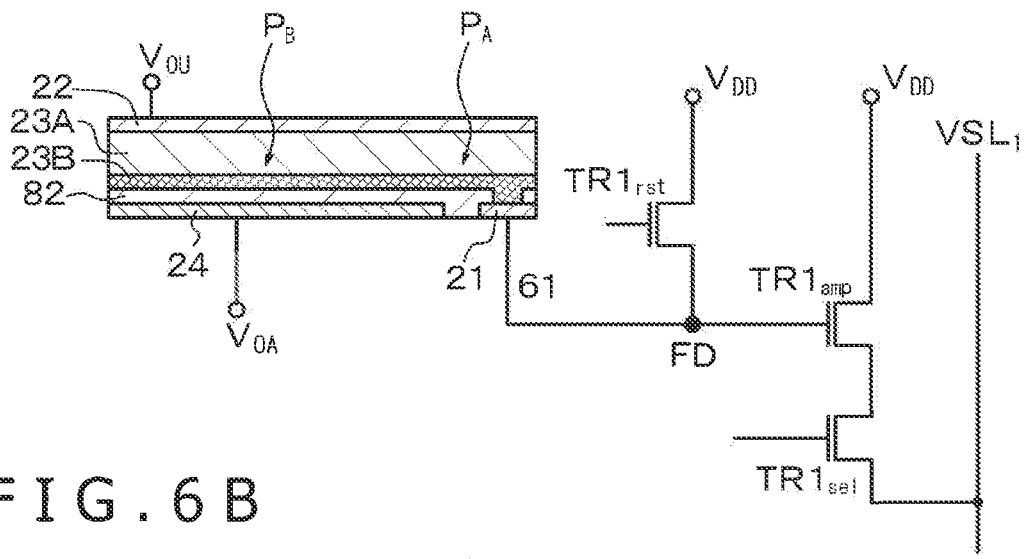
FIGS. 6A, 6B, and 6C are equivalent circuit diagrams of imaging elements of Embodiment 1, Embodiment 4, and Embodiment 6 for explaining respective portions of FIG. 5 (Embodiment 1), FIGS. 20 and 21 (Embodiment 4), and FIGS. 32 and 33 (Embodiment 6), respectively.
Figure 7:
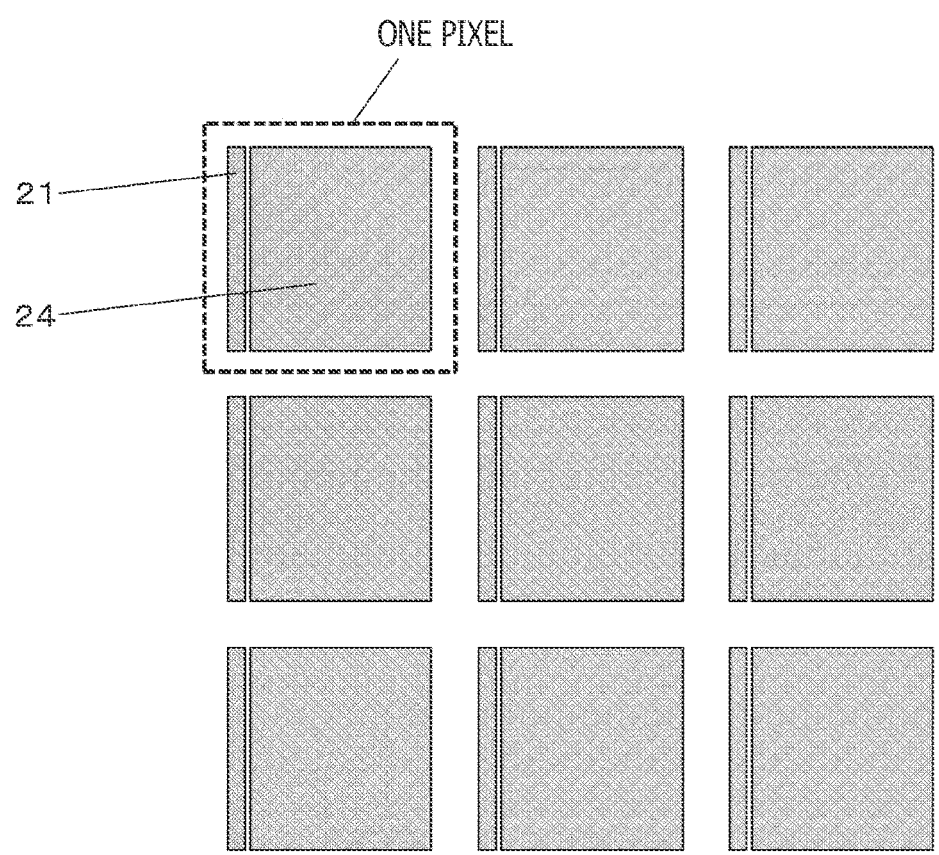
FIG. 7 is a schematic arrangement diagram of the first electrode and the charge accumulation electrode constituting the imaging element of Embodiment 1.
Figure 8:
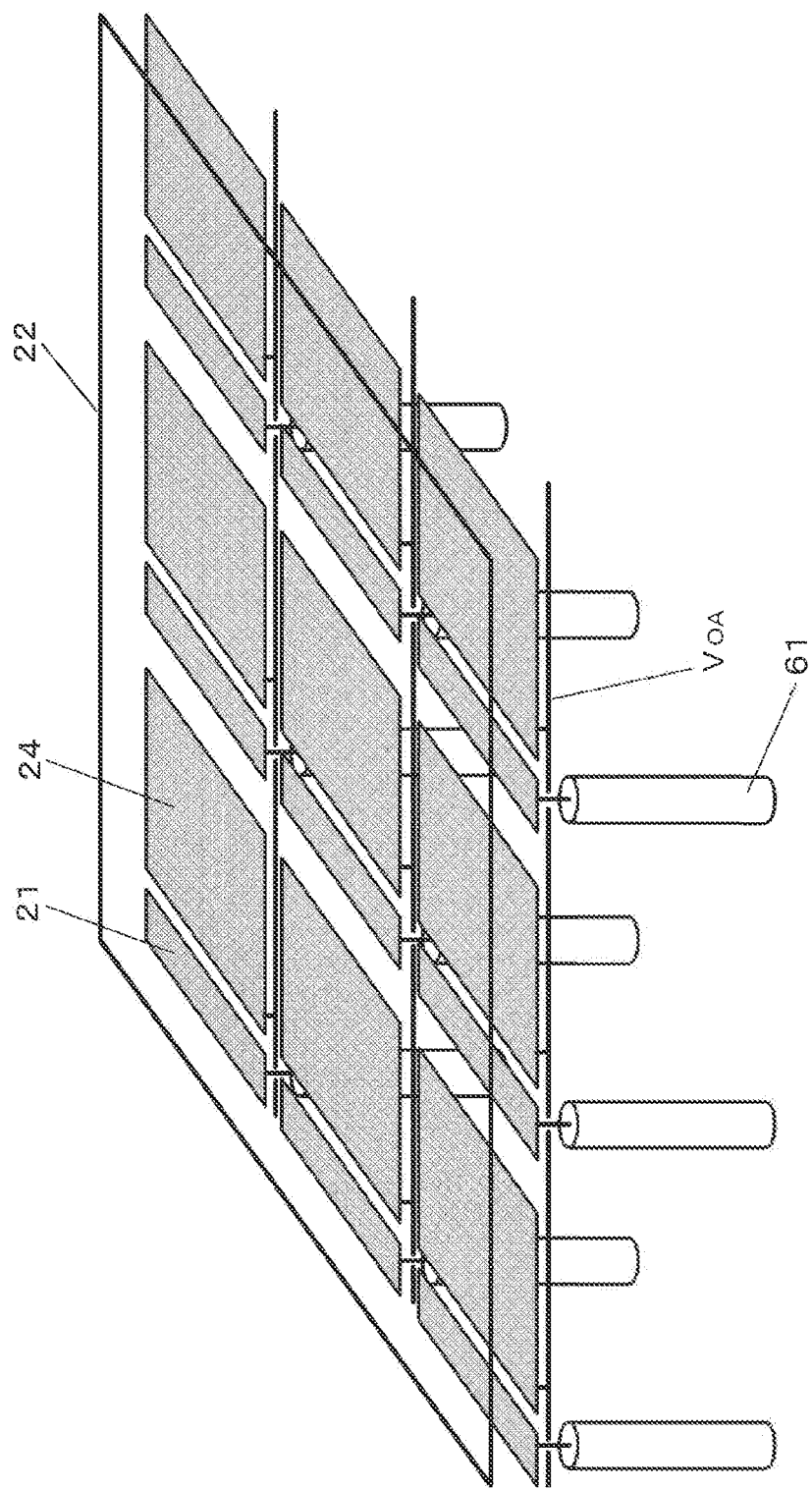
FIG. 8 is a schematic see-through perspective diagram of the first electrode, the charge accumulation electrode, a second electrode, and a contact hole portion constituting the imaging element of Embodiment 1.
Figure 68:
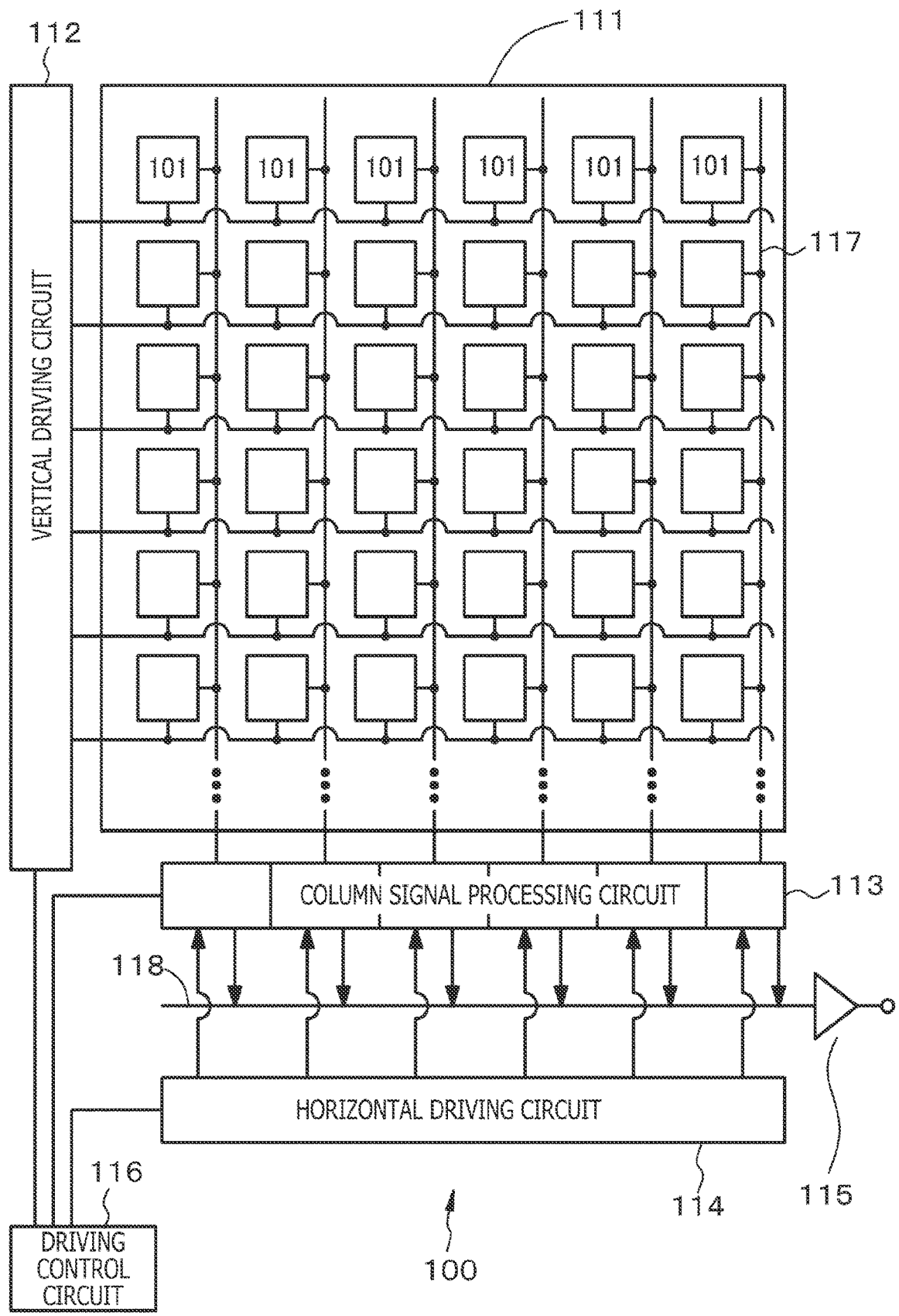
FIG. 68 is a conceptual diagram of a solid-state imaging device of Embodiment 1.

Embodiment 1 relates to the imaging elements according to the first aspect and the second aspect of the present disclosure, the stacked imaging element of the present disclosure, and the solid-state imaging device according to the second aspect of the present disclosure. FIG. 1 is a schematic partial cross-sectional diagram of the imaging element and the stacked imaging element (hereinafter simply referred to as the "imaging element") of Embodiment 1. FIGS. 2 and 3 are equivalent circuit diagrams of the imaging element of Embodiment 1. FIG. 4 is a schematic arrangement diagram of a first electrode and a charge accumulation electrode, and transistors constituting a control unit included in a photoelectric conversion unit of the imaging element of Embodiment 1, and transistors constituting a control unit. FIG. 5 schematically depicts potential states of respective portions during an operation of the imaging element of Embodiment 1. FIG. 6A is an equivalent circuit diagram for explaining respective portions of the imaging element of Embodiment 1. Further, FIG. 7 is a schematic arrangement diagram of the first electrode and the charge accumulation electrode constituting the photoelectric conversion unit of the imaging element of Embodiment 1. FIG. 8 is a schematic see-through perspective diagram of the first electrode, the charge accumulation electrode, a second electrode, and a contact hole portion. Further, FIG. 68 is a conceptual diagram of the solid-state imaging device of Embodiment 1.

The imaging element of Embodiment 1 includes:

a first electrode 21;

a charge accumulation electrode 24 disposed apart from the first electrode 21;

a photoelectric conversion unit 23 formed in contact with the first electrode 21 and above the charge accumulation electrode 24 with an insulation layer 82 interposed between the photoelectric conversion unit 23 and the charge accumulation electrode 24; and a second electrode 22 formed on the photoelectric conversion unit 23.

The photoelectric conversion unit 23 includes a photoelectric conversion layer 23A and an inorganic oxide semiconductor material layer 23B disposed in this order from the second electrode side.

Description will be now given in conformity with the imaging element according to the first aspect of the present disclosure. The inorganic oxide semiconductor material layer 23B contains indium (In) atoms, tin (Sn) atoms, titanium (Ti) atoms, and zinc (Zn) atoms. The inorganic oxide semiconductor material layer 23B does not contain gallium (Ga) atoms. Specifically, the inorganic oxide semiconductor material layer 23B is made of a composite oxide containing indium (In) atoms, tin (Sn) atoms, titanium (Ti) atoms, and zinc (Zn) atoms, specifically, made of a composite oxide containing indium oxide, tin oxide, titanium oxide, and zinc oxide. In addition, assuming that the composition of the inorganic oxide semiconductor material layer 23B is expressed as $In_a Sn_b Ti_c Zn_d O_e$, and a+b+c+d=1.00, $$b>d>c>0.09$$

is satisfied, and/or $$a<(b+c+d)\leq 0.6$$

is satisfied. Alternatively, assuming that the composition of the inorganic oxide semiconductor material layer 23B is expressed as $In_a Sn_b M_f Zn_d O_e$, and a+b+f+d=1.00, $$b>d>f>0.09$$

is satisfied, and/or $$a<(b+f+d)\leq 0.6$$

is preferably satisfied. In addition, $$0.4\leq a<(b+d)\leq 0.5$$

is preferably satisfied.

Further, the imaging element of Embodiment 1 in conformity with the imaging element according to the second aspect of the present disclosure will be given.

The inorganic oxide semiconductor material layer 23B contains indium (In) atoms, tin (Sn) atoms, metal atoms, and zinc (Zn) atoms.

Oxygen deficiency generation energy (energy required for generating oxygen deficiency) of metal atoms is 4 eV or higher (or 3.5 eV or higher in another expression).

Further, assuming that an energy average value of maximum energy values in a conduction band of the inorganic oxide semiconductor material layer 23B is $E_2$ and that an energy average value of LUMO values of the photoelectric conversion layer 23A is $E_1$, $$E_1-E_2 \geq 0.1 \text{ (eV)}$$

is satisfied, and preferably $$E_1-E_2 > 0.1 \text{ (eV)}$$

is satisfied.

Further, mobility of the material constituting the inorganic oxide semiconductor material layer 23B is 10 cm²/V·s or higher, a carrier concentration of the inorganic oxide semiconductor material layer 23B is lower than $1\times 10^{16}/cm^3$, and the inorganic oxide semiconductor material layer 23B is amorphous. In addition, a thickness of the inorganic oxide semiconductor material layer 23B ranges from $1\times 10^{-8}$ to $1.5\times 10^{-7}$ m. Charges generated in the photoelectric conversion layer are transferred to the first electrode via the inorganic oxide semiconductor material layer 23B. These charges are electrons.

The stacked imaging element of Embodiment 1 includes at least the one imaging element of Embodiment 1. In addition, the solid-state imaging device of Embodiment 1 includes a plurality of the stacked imaging elements of Embodiment 1. Besides, for example, the solid-state imaging device of Embodiment 1 constitutes a digital still camera or a video camera, a camcorder, a monitoring camera, a car-mounted camera (in-vehicle camera), a smartphone camera, a game user interface camera, a biometric authentication camera, or the like.

The inorganic oxide semiconductor material layer 23B here includes a region in contact with the first electrode 21, a region in contact with the insulation layer 82 without presence of the charge accumulation electrode 24 on the lower side, and a region in contact with the insulation layer 82 with presence of the charge accumulation electrode 24 on the lower side. In addition, light enters from the second electrode 22. Surface roughness Ra of a surface of the inorganic oxide semiconductor material layer 23B at an interface between the photoelectric conversion layer 23A and the inorganic oxide semiconductor material layer 23B is 1.5 nm or lower, and a value of root-mean-square roughness Rq of the surface of the inorganic oxide semiconductor material layer 23B is 2.5 nm or lower.

In addition, the energy level of the inorganic oxide semiconductor material layer 23B is controllable by controlling an oxygen gas introduction amount (oxygen gas partial pressure) during formation of the inorganic oxide semiconductor material layer 23B by sputtering. It is preferable that the oxygen gas partial pressure ranges from 0.005 (0.5%) to 0.10 (10%).

Following Table 1 presents a result of a relation between the oxygen gas partial pressure and the energy level obtained by inverse photoemission spectroscopy on an assumption that a film thickness of the inorganic oxide semiconductor material layer 23B is 50 nm, and that the inorganic oxide semiconductor material layer 23B is made of $In_a Sn_b Ti_c Zn_d O_e$ (where a=0.40, b=0.30, c=0.10, d=0.20). According to the imaging element of Embodiment 1, the energy level of the inorganic oxide semiconductor material layer 23B is controllable by controlling the oxygen gas introduction amount (oxygen gas partial pressure) during formation of the inorganic oxide semiconductor material layer 23B by sputtering.

TABLE 1

| Oxygen gas partial pressure | Energy level |
| --- | --- |
| 1.0% | −4.58 eV |
| 10.0% | −4.72 eV |

Subsequently, the energy level of the inorganic oxide semiconductor material layer 23B, the energy level difference between the photoelectric conversion layer 23A and the inorganic oxide semiconductor material layer 23B ($E_1-E_2$), and mobility of the material constituting the inorganic oxide semiconductor material layer 23B are examined concerning the photoelectric conversion layer 23A and the inorganic oxide semiconductor material layer 23B. Conditions are classified into three conditions as presented in Table 2. Specifically, IGZO is used as the material constituting the inorganic oxide semiconductor material layer 23B in a first condition, while $In_aSn_bTi_cZn_dO_e$ having compositions indicated in Table 2 is used as the material constituting the inorganic oxide semiconductor material layer 23B in a second condition and a third condition. In this case, a+b+c+d=1.00 is set. In addition, a film thickness of the inorganic oxide semiconductor material layer 23B is set to 50 nm. Further, the photoelectric conversion layer 23A is made of quinacridone and has a thickness of 0.1 μm. The energy average value $E_1$ of LUMO values of the photoelectric conversion layer 23A at a portion located near the inorganic oxide semiconductor material layer 23B is here set to (−4.5 eV). Note that the imaging element and the like based on each of the second condition and the third condition can be obtained by varying the composition of the target during formation of the inorganic oxide semiconductor material layer 23B by sputtering.

TABLE 2

|   | Second condition | Third condition |
|---|---|---|
| a | 0.43 | 0.44 |
| b | 0.34 | 0.31 |
| c | 0.12 | 0.13 |
| d | 0.11 | 0.12 |

In the first condition, the energy level difference ($E_1-E_2$) is 0 eV. In the second condition, the energy level difference ($E_1-E_2$) improves in comparison with the first condition. In addition, in the third condition, mobility further improves in comparison with the second condition as indicated in Table 3.

TABLE 3

|   | First condition First condition | Second Condition Second Condition | Third Condition Third Condition |
|---|---|---|---|
| Inorganic oxide semiconductor material layer 23B | −4.5 eV | −4.58 eV | −4.72 eV |
| Energy level difference ($E_1 - E_2$) | 0.0 eV | 0.08 eV | 0.22 eV |
| Mobility (unit: cm²/V · s) | 9 | 11 | 12 |

Transfer characteristics in the foregoing three conditions are evaluated by device simulation on the basis of the imaging element structured as depicted in FIG. 1. Note that the energy average value $E_1$ of LUMO values of the photoelectric conversion layer 23A is set to (−4.5 eV). A relative amount of electrons in a state where electrons are attracted toward above the charge accumulation electrode 24 is set to $1\times10^0$. In addition, a relative amount of electrons in a state where all the electrons attracted toward above the charge accumulation electrode 24 are transferred to the first electrode 21 is set to $1\times10^{-4}$. Further, a time required for transfer of all the electrons attracted and located above the charge accumulation electrode 24 toward the first electrode 21 (referred to as a "transfer time") is designated as an index for determining good-or-bad transfer characteristics. Following Table 4 presents a result of the obtained transfer time. The transfer time is shorter in the second condition than in the first condition, and shorter in the third condition than in the second condition. In other words, a more desirable transfer characteristic result is exhibited as the value ($E_1-E_2$) increases. This result indicates that a more preferable factor for further improving the transfer characteristics is such formation that an absolute value of the energy average value $E_2$ of the maximum energy values in the conduction band of the inorganic oxide semiconductor material layer 23B becomes larger than an absolute value of the energy average $E_1$ of the LUMO values of the photoelectric conversion layer 23A.

TABLE 4

|   | Transfer time |
|---|---|
| First condition | $5.1 \times 10^{-6}$ sec. |
| Second condition | $1.2 \times 10^{-7}$ sec. |
| Third condition | $2.4 \times 10^{-8}$ sec. |

A reasonable transfer time when the relative amount of electrons is $1\times10^{-4}$ is $1\times10^{-7}$ sec. to achieve such a characteristic as not to leave transfer charges as required for the imaging element. For achieving this transfer time, the second condition is preferable, and the third condition is more preferable. Specifically, the inorganic oxide semiconductor material layer 23B is constituted by $In_aSn_bTi_cZn_dO_e$, and $$b>d>c>0.09$$

is satisfied, and/or $$a<(b+c+d)\le0.6$$

is preferably satisfied. Note that depletion is difficult to achieve in a case where these ranges are not satisfied. For example, a carrier concentration increases when a value of an atom ratio "a" of indium is excessively large. On the other hand, the carrier concentration is difficult to control when this value is excessively small. These ranges are therefore required to be satisfied. Further, as described above, the energy average value $E_1$ of LUMO values in the portion included in the photoelectric conversion layer 23A and located near the inorganic oxide semiconductor material layer 23B, and the energy average value $E_2$ of the maximum energy values in the conduction band of the inorganic oxide semiconductor material layer 23B satisfy a following relation.

$$E_1-E_2 \ge 0.1 \text{ eV}$$

more preferably $$E_1-E_2 > 0.1 \text{ eV}$$

Further, mobility of the material constituting the inorganic oxide semiconductor material layer 23B is 10 cm²/V·s or higher.

Figure 70A:
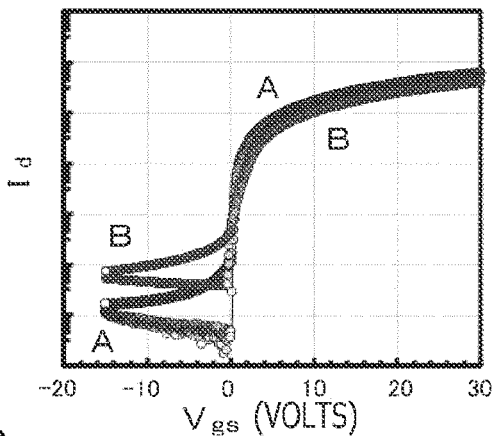
FIGS. 70A and 70B are graphs each obtaining a relation between Vgs and Id in a TFT which has a channel forming region made of InaSnbTicZndOe and IGZO.
Figure 70B:
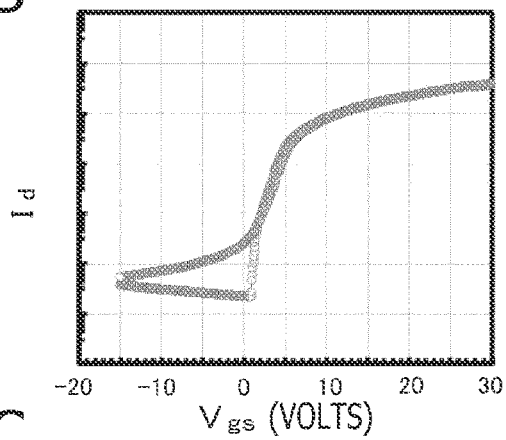

In addition, FIGS. 70A and 70B each indicate a result of evaluation of TFT characteristics in a channel forming region of TFT formed in the first condition, the second condition, and the third condition. Specifically, "A" (third condition) and "B" (second condition) in FIG. 70A indicate graphs each for obtaining a relation between $V_{gs}$ and $I_d$ in TFT in a channel forming region having a thickness of 60 nm and constituted by $In_aSn_bTi_cZn_dO_e$, while FIG. 70B indicates a graph as a comparative example for obtaining a relation between $V_{gs}$ and $I_d$ in TFT in a channel forming region having a thickness of 60 nm and constituted by IGZO. As apparent from these graphs, TFT characteristics in the second condition are more preferable than in the first condition, and are more preferable in the third condition than in the second condition.

An evaluation sample is structured such that a first electrode constituted by ITO is formed on a substrate, and that the inorganic oxide semiconductor material layer 23B, a photoelectric conversion layer, a buffer layer made of $MoO_x$, and a second electrode are sequentially stacked on the first electrode. A thickness of the inorganic oxide semiconductor material layer 23B is here set to 100 nm. Concerning dark current characteristics ($J_{dk}$), a preferable result of $1\times10^{-10}/cm^2$ or lower is exhibited when positive bias of 2 volts is applied. Note that a result of $1\times10^{-10}/cm^2$ or lower is also obtained when positive bias of 2 volts is applied to a comparison sample (not depicted) which does not have the inorganic oxide semiconductor material layer 23B. Similar characteristics are thus confirmed. In addition, external quantum efficiency characteristics (EQE) of 70% is obtained from the comparison sample (not depicted) by application of positive bias of 2 volts, while a preferable result of external quantum efficiency of 74% or higher is obtained by application of the same voltage of 2V.

In addition, it is recognized that the inorganic oxide semiconductor material layer 23B is amorphous (e.g., locally amorphous with no crystal structure) on the basis of an X-ray diffraction result of the inorganic oxide semiconductor material layer 23B. Further, the surface roughness Ra of the surface of the inorganic oxide semiconductor material layer 23B at the interface between the photoelectric conversion layer 23A and the inorganic oxide semiconductor material layer 23B is 1.5 nm or lower, and the value of root-mean-square roughness Rq of the surface of the inorganic oxide semiconductor material layer 23B is 2.5 nm or lower. Specifically, before annealing, following values are obtained.

Ra=0.5 nm
Rq=2.5 nm

After annealing, following values are obtained.

Ra=0.5 nm
Rq=1.4 nm

In addition, the surface roughness Ra of the surface of the charge accumulation electrode 24 is 1.5 nm or lower, and the root-mean-square roughness Rq of the surface of the charge accumulation electrode 24 is 2.5 nm or lower. Specifically, following values are obtained.

Ra=0.5 nm
Rq=2.4 nm

Figure 70C:
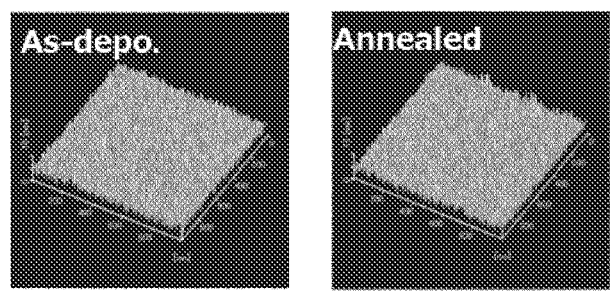
FIG. 70C presents electron micrographs indicating a surface roughness evaluation result of an evaluation sample in Embodiment 1.

FIG. 70C depicts electron micrographs each indicating a surface roughness evaluation result of the evaluation sample in Embodiment 1. An electron micrograph in a left part of FIG. 70C is taken immediately after film formation, while an electron micrograph in a right part of FIG. 70C is taken after annealing at 350° C. for 120 minutes. In addition, light transmittance of the inorganic oxide semiconductor material layer 23B for light having a wavelength in a range of 400 to 660 nm is 65% or higher (specifically, 79%), and light transmittance of the charge accumulation electrode 24 for light having a wavelength in a range of 400 to 660 nm is also 65% or higher (specifically, 70%). A sheet resistance value of the charge accumulation electrode 24 ranges from $3\times10$ to $1\times10^3 \Omega/\square$ (specifically, $68\Omega/\square$).

Figure 70D:
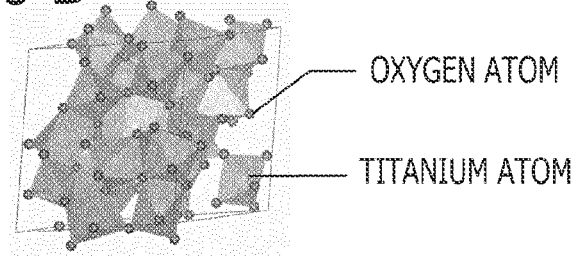
FIG. 70D is a diagram depicting a crystal structure of titanium oxide.

The inorganic oxide semiconductor material layer of the imaging element of Embodiment 1 contains indium (In) atoms, tin (Sn) atoms, titanium (Ti) atoms, and zinc (Zn) atoms. Accordingly, optimization of the carrier concentration of the inorganic oxide semiconductor material layer (optimization of the degree of depletion of the inorganic oxide semiconductor material layer), achievement of high mobility of the material constituting the inorganic oxide semiconductor material layer, control over the energy average value $E_2$ of the maximum energy values in the conduction band of the inorganic oxide semiconductor material layer, and reduction of oxygen deficiency of the inorganic oxide semiconductor material layer are achievable in a balanced manner. As a result, an imaging element, a stacked imaging element, and a solid-state imaging device each having a simple configuration and a simple structure but achieving excellent transfer characteristics of charges accumulated in a photoelectric conversion layer are providable. In other words, mobility of the inorganic oxide semiconductor material layer, and conductivity are controllable by controlling a ratio of indium atoms in atoms constituting the inorganic oxide semiconductor material layer. Further, it is estimated that control over an amorphous state of the inorganic oxide semiconductor material layer, control over surface smoothness, and control over the energy average value $E_2$ of the maximum energy values in the conduction band of the inorganic oxide semiconductor material layer are controllable by controlling a ratio of tin atoms. Further, the carrier concentration of the inorganic oxide semiconductor material layer (the degree of depletion of the inorganic oxide semiconductor material layer) is controllable by controlling a ratio of zinc atoms. In addition, oxygen deficiency energy of titanium oxide obtained from a first principle calculation is 5.1 eV which is a value considerably higher than IGZO oxygen deficiency energy of 3.3 eV, for example. Note that FIG. 70D depicts a crystal structure of titanium oxide. In FIG. 70D, dots indicate oxygen atoms, and oxygen deficiency generation energy is energy for separating these oxygen atoms from titanium atoms. It is considered that oxygen atoms are more difficult to separate as a value of oxygen deficiency generation energy increases. In this case, oxygen atoms or oxygen molecules, and other atoms or molecules are difficult to introduce, and stability is considered to increases. Accordingly, oxygen atoms or oxygen molecules become difficult to introduce into the inorganic oxide semiconductor material layer when the inorganic oxide semiconductor material layer contains titanium atoms, i.e., a part of the inorganic oxide semiconductor material layer is constituted by titanium oxide. In this manner, a stable inorganic oxide semiconductor material layer can be obtained. Further, the photoelectric conversion unit has a double-layer structure constituted by the inorganic oxide semiconductor material layer and the photoelectric conversion layer. Accordingly, recombination during charge accumulation is avoidable, and charge transfer efficiency of charges accumulated in the photoelectric conversion layer toward the first electrode can further increase. Further, control over transfer timing and the like, and reduction of dark current are achievable by temporarily retaining charges generated in the photoelectric conversion layer.

General description of the imaging elements according to the first aspect and the second aspect of the present disclosure, the stacked imaging element of the present disclosure, and the solid-state imaging device according to the second aspect of the present disclosure will be hereinafter presented. Subsequently, the imaging element and the solid-state imaging device of Embodiment 1 will be described in detail. Following Table 5 presents reference signs of potentials applied to various types of electrodes in the following description.

TABLE 5

| | Charge accumulation period | Charge transfer period |
|---|---|---|
| First electrode | $V_{11}$ | $V_{12}$ |
| Second electrode | $V_{21}$ | $V_{22}$ |
| Charge accumulation electrode | $V_{31}$ | $V_{32}$ |
| Charge transfer control electrode | $V_{41}$ | $V_{42}$ |
| Transfer control electrode | $V_{51}$ | $V_{52}$ |
| Charge discharge electrode | $V_{61}$ | $V_{62}$ |

The imaging element and the like of the present disclosure including the preferred modes described above, and having the charge accumulation electrode will be hereinafter referred to as an "imaging element and the like including the charge accumulation electrode of the present disclosure" in some cases for convenience.

In the imaging element and the like of the present disclosure, light transmittance of the inorganic oxide semiconductor material layer for light having a wavelength in a range of 400 to 660 nm is preferably 65% or higher. In addition, light transmittance of the charge accumulation electrode for light having a wavelength in a range of 400 to 660 nm is also preferably 65% or higher. A sheet resistance value of the charge accumulation electrode is preferably in a range of $3\times10$ to $1\times10^3 \Omega/\square$.

In the imaging element and the like of the present disclosure, adoptable is a mode where a semiconductor substrate is further provided. In this case, the photoelectric conversion unit is disposed above the semiconductor substrate. Note that the first electrode, the charge accumulation electrode, the second electrode, and various types of electrodes are connected to a driving circuit described below.

The second electrode located on the light entrance side may be commonized for a plurality of imaging elements. Specifically, the second electrode may be provided as a solid electrode for imaging elements except for the imaging element and the like having an upper charge transfer control electrode of the present disclosure described below. The photoelectric conversion layer may be commonized for a plurality of the imaging elements, i.e., one photoelectric conversion layer may be formed for a plurality of the imaging elements, or may be provided for each of the imaging elements. The inorganic oxide semiconductor material layer is preferably provided for each of the imaging elements, but may be commonized for a plurality of the imaging elements depending on cases. Specifically, for example, a charge transfer control electrode described below may be provided between the imaging elements to form the one inorganic oxide semiconductor material layer for a plurality of the imaging elements. In a case where the one inorganic oxide semiconductor material layer is commonized for a plurality of the imaging elements, an end of the inorganic oxide semiconductor material layer is preferably covered at least by the photoelectric conversion layer in view of protection of the end of the inorganic oxide semiconductor material layer.

Further, in the imaging element and the like of the present disclosure including the respective preferred modes described above, adoptable is a mode where the first electrode may be in a mode extends inside an opening formed in an insulation layer and connects to the inorganic oxide semiconductor material layer. Alternatively, adoptable is a mode where the inorganic oxide semiconductor material layer extends inside the opening formed in the insulation layer and connects to the first electrode. In this case, a following mode may be adopted.

An edge of a top surface of the first electrode is covered with the insulation layer.

The first electrode is exposed on a bottom surface of the opening.

Assuming that a surface of the insulation layer in contact with the top surface of the first electrode is a first surface, and that a surface of the insulation layer in contact with a portion included in the inorganic oxide semiconductor material layer and facing the charge accumulation electrode is a second surface, a side surface of the opening has an inclination expanding from the first surface to the second surface. Further, a side surface of the opening having the inclination expanding from the first surface to the second surface is located on the charge accumulation electrode side.

Further, in the imaging element and the like of the present disclosure including the respective preferred modes described above, a following configuration may be adopted.

A control unit provided on the semiconductor substrate and including a driving circuit is further provided.

The first electrode and the charge accumulation electrode are connected to the driving circuit.

During a charge accumulation period, a potential $V_{11}$ is applied from the driving circuit to the first electrode, a potential $V_{31}$ is applied from the driving circuit to the charge accumulation electrode, and charges are accumulated in the inorganic oxide semiconductor material layer (or the inorganic oxide semiconductor material layer and the photoelectric conversion layer).

During a charge transfer period, a potential $V_{12}$ is applied from the driving circuit to the first electrode, a potential $V_{32}$ is applied from the driving circuit to the charge accumulation electrode, and the charges accumulated in the inorganic oxide semiconductor material layer (or the inorganic oxide semiconductor material layer and the photoelectric conversion layer) are read out to the control unit via the first electrode. In this case, the potential of the first electrode is higher than the potential of the second electrode.

In addition, $V_{31} \geq V_{11}$ and $V_{32} < V_{12}$ are satisfied.

Further, in the imaging element and the like of the present disclosure including the respective preferred modes described above, adoptable is a mode where a charge transfer control electrode is provided in a region facing, via the insulation layer, a region included in the photoelectric conversion layer and located between the adjoining imaging elements. Note that such a mode will be hereinafter referred to as an "imaging element and the like including a lower charge transfer control electrode of the present disclosure" in some cases for convenience. Alternatively, adoptable is a mode where the charge transfer control electrode is provided on the region included in the photoelectric conversion layer and located between the adjoining imaging elements in place of the second electrode. Note that such a mode will be hereinafter referred to as an "imaging element and the like including an upper charge transfer control electrode of the present disclosure" in some cases for convenience.

In the following description, the "region included in the photoelectric conversion layer and located between the adjoining imaging elements" will be referred to as a "region-A of the photoelectric conversion layer" for convenience, while the "region included in the insulation layer and located between the adjoining imaging elements" will be referred to as a "region-A of the insulation layer" for convenience. The region-A of the photoelectric conversion layer corresponds to the region-A of the insulation layer. In addition, the "region between the adjoining imaging elements" will be referred to as a "region-a" for convenience.

In the imaging element and the like including the lower charge transfer control electrode of the present disclosure (lower and charge transfer control electrode as a charge transfer control electrode located on the side opposite to the light entrance side with respect to the photoelectric conversion layer), the lower charge transfer control electrode is provided in a region facing the region-A of the photoelectric conversion layer via the insulation layer. In other words, the lower charge transfer control electrode is provided below a portion (region-A of the insulation layer) included in the insulation layer and located in a region (region-a) sandwiched between charge accumulation electrodes constituting the adjoining imaging elements, respectively. The lower charge transfer control electrode is provided apart from the charge accumulation electrodes. Alternatively, in other words, the lower charge transfer control electrode is provided apart from the charge accumulation electrode and surrounds the charge accumulation electrode. The lower charge transfer control electrode is so disposed as to face the region-A of the photoelectric conversion layer via the insulation layer.

In addition, in the imaging element and the like including the lower charge transfer control electrode of the present disclosure, a following mode is adoptable.

A control unit disposed on the semiconductor substrate and including a driving circuit is further provided.

The first electrode, the second electrode, the charge accumulation electrode, and the lower charge transfer control electrode are connected to the driving circuit.

During a charge accumulation period, a potential $V_{11}$ is applied from the driving circuit to the first electrode, a potential $V_{31}$ is applied from the driving circuit to the charge accumulation electrode, a potential $V_{41}$ is applied from the driving circuit to the lower charge transfer control electrode, and charges are accumulated in the inorganic oxide semiconductor material layer (or the inorganic oxide semiconductor material layer and the photoelectric conversion layer).

During a charge transfer period, a potential $V_{12}$ is applied from the driving circuit to the first electrode, a potential $V_{32}$ is applied from the driving circuit to the charge accumulation electrode, a potential $V_{42}$ is applied from the driving circuit to the lower charge transfer control electrode, and the charges accumulated in the inorganic oxide semiconductor material layer (or the inorganic oxide semiconductor material layer and the photoelectric conversion layer) are read out to the control unit via the first electrode. In this case, $$V_{31} \geq V_{11}, V_{31} > V_{41}, \text{ and } V_{12} > V_{32} > V_{42}$$

are satisfied. The lower charge transfer control electrode may be either at the same level as the level of the first electrode or the charge accumulation electrode, or at a difference level.

In the imaging element and the like including the upper charge transfer control electrode of the present disclosure (upper and charge transfer control electrode as a charge transfer control electrode located on the light entrance side with respect to the photoelectric conversion layer), the upper electrode control electrode is provided on the region included in the photoelectric conversion layer and located between the adjoining imaging elements in place of the second electrode. In this case, the upper charge transfer control electrode is provided apart from the second electrode. In other words, a following mode may be adopted.

[A] The second electrode is provided for each of the imaging elements. The upper charge transfer control electrode is provided apart from the second electrode and disposed on the region-A of the photoelectric conversion layer and surround at least a part of the second electrode. Alternatively, a following mode may be adopted.

[B] The second electrode is provided for each of the imaging elements. The upper charge transfer control electrode is provided apart from the second electrode and surround at least a part of the second electrode. A part of the charge accumulation electrode is present below the upper charge transfer control electrode. Alternatively, a following mode may be adopted.

[C] The second electrode is provided for each of the imaging elements. The upper charge transfer control electrode is provided apart from the second electrode and surround at least a part of the second electrode. A part of the charge accumulation electrode is present below the upper charge transfer control electrode. Further, the lower charge transfer control electrode is provided below the upper charge transfer control electrode. A potential generated by coupling of the upper charge transfer control electrode and the second electrode is applied to the region included in the photoelectric conversion layer and located below the region between the upper charge transfer control electrode and the second electrode in some cases.

In addition, in the imaging element and the like including the upper charge transfer control electrode of the present disclosure, a following mode may be adopted. A control unit provided on the semiconductor substrate and including a driving circuit is further provided.

The first electrode, the second electrode, the charge accumulation electrode, and the upper charge transfer control electrode are connected to the driving circuit.

During a charge accumulation period, a potential $V_{21}$ is applied from the driving circuit to the second electrode, a potential $V_{41}$ is applied from the driving circuit to the upper charge transfer control electrode, and charges are accumulated in the inorganic oxide semiconductor material layer (or the inorganic oxide semiconductor material layer and the photoelectric conversion layer).

During a charge transfer period, a potential $V_{22}$ is applied from the driving circuit to the second electrode, a potential $V_{42}$ is applied from the driving circuit to the upper charge transfer control electrode, and the charges accumulated in the inorganic oxide semiconductor material layer (or the inorganic oxide semiconductor material layer and the photoelectric conversion layer) are read out to the control unit via the first electrode. In this case, $$V_{21} \geq V_{41} \text{ and } V_{22} \geq V_{42}$$

are satisfied. The upper charge transfer control electrode is provided at the same level as the level of the second electrode.

Further, in the imaging element and the like of the present disclosure including the respective preferred modes described above, adoptable is a mode where a transfer control electrode (charge transfer electrode) is disposed between the first electrode and the charge accumulation electrode and apart from the first electrode and the charge accumulation electrode, and so disposed as to face the inorganic oxide semiconductor material layer via the insulation layer. The imaging element and the like of the present disclosure in such a mode will be referred to as an "imaging element and the like including the transfer control electrode of the present disclosure" for convenience.

In addition, the imaging element and the like including the transfer control electrode of the present disclosure may have a following configuration.

A control unit provided on the semiconductor substrate and including a driving circuit is further provided.

The first electrode, the charge accumulation electrode, and the transfer control electrode are connected to the driving circuit.

During a charge accumulation period, a potential $V_{11}$ is applied from the driving circuit to the first electrode, a potential $V_{31}$ is applied from the driving circuit to the charge accumulation electrode, a potential $V_{51}$ is applied from the driving circuit to the transfer control electrode, and charges are accumulated in the inorganic oxide semiconductor material layer (or the inorganic oxide semiconductor material layer and the photoelectric conversion layer).

During a charge transfer period, a potential $V_{12}$ is applied from the driving circuit to the first electrode, a potential $V_{32}$ is applied from the driving circuit to the charge accumulation electrode, a potential $V_{52}$ is applied from the driving circuit to the transfer control electrode, and the charges accumulated in the inorganic oxide semiconductor material layer (or the inorganic oxide semiconductor material layer and the photoelectric conversion layer) are read out to the control unit via the first electrode. In this case, the potential of the first electrode is higher than the potential of the second electrode, and $$V_{31} > V_{51} \text{ and } V_{32} \leq V_{52} \leq V_{12}$$

are satisfied.

Further, in the imaging element and the like of the present disclosure including the respective preferred modes described above, adoptable is a mode where a charge discharge electrode connected to the inorganic oxide semiconductor material layer and disposed apart from the first electrode and the charge accumulation electrode is further provided. The imaging element and the like of the present disclosure in such a mode will be hereinafter referred to as an "imaging element and the like including the charge discharge electrode of the present disclosure" in some cases for convenience. In addition, in the imaging element and the like including the charge discharge electrode of the present disclosure, adoptable is a mode where the charge discharge electrode is so disposed as to surround the first electrode and the charge accumulation electrode (i.e., in a frame shape). The charge discharge electrode may be shared (commonized) by a plurality of the imaging elements. Further, in this case, a following mode may be adopted.

The inorganic oxide semiconductor material layer extends inside a second opening formed in the insulation layer and connects to the charge discharge electrode.

An edge of a top surface of the charge discharge electrode is covered with the insulation layer.

The charge discharge electrode is exposed on a bottom surface of the second opening.

Assuming that a surface of the insulation layer in contact with the top surface of the charge discharge electrode is a third surface, and that a surface of the insulation layer in contact with a region included in the inorganic oxide semiconductor material layer and facing the charge accumulation electrode is a second surface, a side surface of the second opening has an inclination expanding from the third surface to the second surface.

In addition, in the imaging element and the like including the charge discharge electrode of the present disclosure, a following configuration may be adopted.

A control unit provided on the semiconductor substrate and including a driving circuit is further provided.

The first electrode, the charge accumulation electrode, and the charge discharge electrode are connected to the driving circuit.

During a charge accumulation period, a potential $V_{11}$ is applied from the driving circuit to the first electrode, a potential $V_{31}$ is applied from the driving circuit to the charge accumulation electrode, a potential $V_{61}$ is applied from the driving circuit to the charge discharge electrode, and charges are accumulated in the inorganic oxide semiconductor material layer (or the inorganic oxide semiconductor material layer and the photoelectric conversion layer).

During a charge transfer period, a potential $V_{12}$ is applied from the driving circuit to the first electrode, a potential $V_{32}$ is applied from the driving circuit to the charge accumulation electrode, a potential $V_{62}$ is applied from the driving circuit to the charge discharge electrode, and the charges accumulated in the inorganic oxide semiconductor material layer (or the inorganic oxide semiconductor material layer and the photoelectric conversion layer) are read out to the control unit via the first electrode. In this case, the potential of the first electrode is higher than the potential of the second electrode, and $$V_{61} > V_{11} \text{ and } V_{62} < V_{12}$$

are satisfied.

Further, in the imaging element and the like of the present disclosure including the respective preferred modes described above, adoptable is a mode where the charge accumulation electrode includes a plurality of charge accumulation electrode segments. The imaging element and the like of the present disclosure in such a mode will be referred to as an "imaging element and the like including a plurality of charge accumulation electrode segments of the present disclosure" for convenience. It is sufficient if the number of the charge accumulation electrode segments is two or larger. Further, in a case where a different potential is applied to each of the N charge accumulation electrode segments in the imaging element and the like including the plurality of charge accumulation electrode segments of the present disclosure, a following mode may be adopted.

In a case where the potential of the first electrode is higher than the potential of the second electrode, a potential applied to the charge accumulation electrode segment located nearest the first electrode (first photoelectric conversion unit segment) during a charge transfer period is higher than a potential applied to the charge accumulation electrode segment located farthest from the first electrode (N-th photoelectric conversion unit segment).

In a case where the potential of the first electrode is lower than the potential of the second electrode, a potential applied to the charge accumulation electrode segment located nearest the first electrode (first photoelectric conversion unit segment) during the charge transfer period is lower than a potential applied to the charge accumulation electrode segment located farthest from the first electrode (N-th photoelectric conversion unit segment).

In the imaging element and the like of the present disclosure including the respective preferred modes described above, a following configuration may be adopted.

At least a floating diffusion layer or an amplification transistor constituting the control unit is provided on the semiconductor substrate.

The first electrode is connected to the floating diffusion layer and a gate portion of the amplification transistor. Further, in this case, a following configuration may be adopted.

A reset transistor and a selection transistor constituting the control unit are further provided on the semiconductor substrate.

The floating diffusion layer is connected to one source/drain region of the reset transistor.

One source/drain region of the amplification transistor is connected to one source/drain region of the selection transistor, while the other source/drain region of the selection transistor is connected to a signal line.

Further, in the imaging element and the like of the present disclosure including the respective preferred modes described above, adoptable is a mode where the charge accumulation electrode is larger in size than the first electrode. Assuming that an area of the charge accumulation electrode is $s_1'$, and that an area of the first electrode is $s_1$, a following relation is preferably satisfied, but not required to be satisfied.

$$4 \leq s_1'/s_1$$

Alternatively, imaging elements having a first configuration to a sixth configuration may be presented as modifications of the imaging element and the like of the present disclosure including the respective preferred modes described above. Specifically, the imaging elements having the first configuration to the sixth configuration as the imaging element and the like of the present disclosure including the respective preferred modes described above have following configurations.

The photoelectric conversion unit includes N (N≥2) photoelectric conversion unit segments.

Each of the inorganic oxide semiconductor material layer and the photoelectric conversion layer includes N photoelectric conversion layer segments.

The insulation layer includes N insulation layer segments.

In each of the imaging elements having the first configuration to the third configuration, the charge accumulation electrode includes N charge accumulation electrode segments.

In each of the imaging elements having the fourth configuration to the fifth configuration, the charge accumulation electrode includes N charge accumulation electrode segments disposed apart from each other.

The nth (n=1, 2, 3, and up to N) photoelectric conversion unit segment includes the nth charge accumulation electrode segment, the nth insulation layer segment, and the nth photoelectric conversion layer segment.

The photoelectric conversion unit segment is located farther from the first electrode as the value of n increases. The "photoelectric conversion layer segment" here refers to a segment constituted by the photoelectric conversion layer and the inorganic oxide semiconductor material layer stacked on each other.

Further, in the imaging element having the first configuration, a thickness of the insulation layer segment gradually changes from the first photoelectric conversion unit segment to the Nth photoelectric conversion unit segment. In addition, in the imaging element having the second configuration, a thickness of the photoelectric conversion layer segment gradually changes from the first photoelectric conversion unit segment to the Nth photoelectric conversion unit segment. Note that the thickness of the photoelectric conversion layer segment may be changed by changing the thickness of the portion of the photoelectric conversion layer in the photoelectric conversion layer and maintaining a constant thickness of the portion of the inorganic oxide semiconductor material layer, that the thickness of the photoelectric conversion layer segment may be changed by maintaining the constant thickness of the portion of the photoelectric conversion layer and changing the thickness of the portion of the inorganic oxide semiconductor material layer, or that the thickness of the photoelectric conversion layer segment may be changed by changing the thickness of the portion of the photoelectric conversion layer and changing the thickness of the portion of the inorganic oxide semiconductor material layer. Further, in the imaging element having the third configuration, materials constituting the insulation layers in the adjoining photoelectric conversion unit segments differ from each other. Further, in the imaging element having the fourth configuration, materials constituting the charge accumulation electrode segments in the adjoining photoelectric conversion unit segments differ from each other. In addition, in the imaging element having the fifth configuration, an area of the charge accumulation electrode segment gradually decreases from the first photoelectric conversion unit segment to the Nth photoelectric conversion unit segment. The area may decrease either continuously or stepwise.

Alternatively, in the imaging element and the like of the present disclosure having the sixth configuration and including the respective preferred modes described above, assuming that a stacking direction of the charge accumulation electrode, the insulation layer, the inorganic oxide semiconductor material layer, and the photoelectric conversion layer is a Z direction, and that a direction away from the first electrode is an X direction, a cross-sectional area taken at a stacked portion where the charge accumulation electrode, the insulation layer, the inorganic oxide semiconductor material layer, and the photoelectric conversion layer are stacked in a Y-Z virtual plane changes depending on a distance from the first electrode. The change of the cross-sectional area may be either continuously or stepwise.

In each of the imaging elements having the first configuration and the second configuration, the N photoelectric conversion layer segments are continuously provided, the N insulation layer segments are also continuously provided, and the N charge accumulation electrode segments are also continuously provided. In each of the imaging elements having the third configuration to the fifth configuration, the N photoelectric conversion layer segments are continuously provided. In addition, in each of the imaging elements having the fourth configuration and the fifth configuration, the N insulation layer segments are continuously provided. However, in the imaging element having the third configuration, the N insulation layer segments are provided in correspondence with the respective photoelectric conversion unit segments. Further, in each of the imaging elements having the fourth configuration and the fifth configuration, and in the imaging element having the third configuration depending on cases, the N charge accumulation electrode segments are provided in correspondence with the respective photoelectric conversion unit segments. Further, in each of the imaging elements having the first configuration to the sixth configuration, the same potential is applied to all of the charge accumulation electrode segments. Alternatively, in each of the imaging elements having the fourth configuration and the fifth configuration, and in the imaging element having the third configuration depending on cases, a different potential may be applied to each of the N charge accumulation electrode segments.

According to each of the imaging element and the like of the present disclosure having the first to sixth configurations, the thickness of the insulation layer segments is specified, the thickness of the photoelectric conversion layer segments is specified, the material constituting the insulation layer segment is different, the material constituting the charge accumulation electrode segments is different, the area of the charge accumulation electrode segments is specified, or the cross-sectional area of the stacked portion is specified. Accordingly, a type of charge transfer inclination is formed and allows further easier and reliable transfer of charges generated by photoelectric conversion toward the first electrode. As a result, generation of an after image and a leftover of charge transfer are thus avoidable.

In each of the imaging elements having the first configuration to the fifth configuration, the photoelectric conversion unit segment is located farther from the first electrode as the value of n increases. In this case, whether or not the respective segments are located away from the first electrode is determined on the basis of the respective positions in the X direction. In addition, while the direction away from the first electrode is the X direction in the imaging element having the sixth configuration, the "X direction" is here defined as follows. Specifically, a pixel region where a plurality of imaging elements or stacked imaging elements is arranged is constituted by a plurality of pixels arranged in a two-dimensional array, i.e., regularly in the X direction and the Y direction. In a case where a planar shape of each pixel is rectangular, a direction where the side closest to the first electrode extends is designated as the Y direction, while a direction perpendicular to the Y direction is designated as the X direction. Alternatively, in a case where a planar shape of each pixel is any shape, a general direction containing a line segment closest to the first electrode and a curved line is designated as the Y direction, while a direction perpendicular to the Y direction is designated as the X direction.

Described hereinafter will be a case where the potential of the first electrode is higher than the potential of the second electrode in the imaging elements having the first configuration to the sixth configuration.

In the imaging element having the first configuration, a thickness of the insulation layer segment gradually changes from the first photoelectric conversion unit segment to the Nth photoelectric conversion unit segment. It is preferable that the thickness of the insulation layer segment gradually increases. In this manner, a type of charge transfer inclination is formed. In addition, in a state of $V_{31} \geq V_{11}$ during a charge accumulation period, the nth photoelectric conversion unit segment can accumulate more charges than the (n+1)th photoelectric conversion unit segment. Further, a more intense electric field is applied, and a flow of charges from the first photoelectric conversion unit segment to the first electrode can reliably be prevented. Further, in a state of $V_{32} \leq V_{12}$ during a charge transfer period, a flow of charges from the first photoelectric conversion unit segment to the first electrode, and a flow of charges from the (n+1)th photoelectric conversion unit segment to the nth photoelectric conversion unit segment can reliably be produced.

In the imaging element having the second configuration, a thickness of the photoelectric conversion layer segment gradually changes from the first photoelectric conversion unit segment to the Nth photoelectric conversion unit segment. It is preferable that the thickness of the photoelectric conversion layer segment gradually increases. In this manner, a type of charge transfer inclination is formed. In addition, in a state of $V_{31} \geq V_{11}$ during a charge accumulation period, a more intense electric field is applied to the nth photoelectric conversion unit segment than to the (n+1)th photoelectric conversion unit segment, and a flow of charges from the first photoelectric conversion unit segment to the first electrode can reliably be prevented. Further, in a state of $V_{32} < V_{12}$ during s charge transfer period, a flow of charges from the first photoelectric conversion unit segment to the first electrode, and a flow of charges from the (n+1)th photoelectric conversion unit segment to the nth photoelectric conversion unit segment can reliably be produced.

In the imaging element having the third configuration, the materials constituting the insulation layer segments in the adjoining photoelectric conversion unit segments differ from each other. In this manner, a type of charge transfer inclination is formed. It is preferable that a dielectric constant value of the material constituting the insulation layer segment gradually decreases from the first photoelectric conversion unit segment to the Nth photoelectric conversion unit segment. Further, by adopting such a configuration in a state of $V_{31} \geq V_{11}$ during a charge accumulation period, the nth photoelectric conversion unit segment can accumulate more charges than the (n+1)th photoelectric conversion unit segment. Further, in a state of $V_{32} < V_{12}$ during a charge transfer period, a flow of charges from the first photoelectric conversion unit segment to the first electrode, and a flow of charges from the (n+1)th photoelectric conversion unit segment to the nth photoelectric conversion unit segment can reliably be produced.

In the imaging element having the fourth configuration, the materials constituting the charge accumulation electrode segments in the adjoining photoelectric conversion unit segments differ from each other. In this manner, a type of charge transfer inclination is formed. It is preferable that a value of a work function of the material constituting the insulation layer segment gradually increases from the first photoelectric conversion unit segment to the Nth photoelectric conversion unit segment. In addition, by adopting such a configuration, a potential inclination advantageous for signal charge transfer can be formed regardless of a positive sign and a negative sign of voltage (potential).

In the imaging element having the fifth configuration, an area of the charge accumulation electrode segment gradually decreases from the first photoelectric conversion unit segment to the Nth photoelectric conversion unit segment. In this manner, a type of charge transfer inclination is formed. Accordingly, in a state of $V_{31} \geq V_{11}$ during a charge accumulation period, the nth photoelectric conversion unit segment can accumulate more charges than the (n+1)th photoelectric conversion unit segment. Further, in a state of $V_{32} < V_{12}$ during a charge transfer period, a flow of charges from the first photoelectric conversion unit segment to the first electrode, and a flow of charges from the (n+1)th photoelectric conversion unit segment to the nth photoelectric conversion unit segment can reliably be produced.

In the imaging element having the sixth configuration, the cross-sectional area of the stacked portion changes depending on the distance from the first electrode. In this manner, a type of charge transfer inclination is formed. Specifically, a thickness of the cross section of the stacked portion is kept constant, while a width of the cross section of the stacked portion decreases with farness from the first electrode. When this configuration is adopted in the state of $V_{31} \geq V_{11}$ during a charge accumulation period, the region nearer the first electrode can accumulate more charges than the region farther from the first electrode similarly to the imaging element having the fifth configuration described above. Accordingly, in a state of $V_{32} < V_{12}$ during a charge transfer period, a flow of charges from the region near the first electrode to the first electrode, and a flow of charges from the far region to the near region can reliably be produced. On the other hand, the width of the cross section of the stacked portion is kept constant, while the thickness of the cross section of the stacked portion, specifically the thickness of the insulation layer segment gradually increases. When this configuration is adopted in the state of $V_{31} \geq V_{11}$ during a charge accumulation period, the region nearer the first electrode can accumulate more charges than the region farther from the first electrode similarly to the imaging element having the first configuration described above. In addition, an intense electric field is applied, and a flow of charges from the region near the first electrode to the first electrode can reliably be prevented. Further, in a state of $V_{32} < V_{12}$ during a charge transfer period, a flow of charges from the region near the first electrode to the first electrode, and a flow of charges from the far region to the near region can reliably be produced. Further, when a configuration where the thickness of the photoelectric conversion layer segment gradually increases is adopted in the state of $V_{31} \geq V_{11}$ during the charge accumulation period, a more intense electric field is applied to the region nearer the first electrode than to the region farther from the first electrode similarly to the imaging element having the second configuration described above. Accordingly, a flow of charges from the region near the first electrode to the first electrode can reliably be prevented. Further, in the state of $V_{32} < V_{12}$ during the charge transfer period, a flow of charges from the region near the first electrode to the first electrode, and a flow of charges from the far region to the near region can reliably be produced.

Two or more of the imaging elements having the first configuration to the sixth configuration including the preferred modes described above can appropriately be combined as necessary.

In a modification of the solid-state imaging devices according to the first aspect and the second aspect of the present disclosure, a following solid-state imaging device may be adopted.

Plural the imaging elements having the first configuration to the sixth configuration are included.

An imaging element block is constituted by the plurality of imaging elements.

The first electrode is shared by the plurality of imaging elements constituting the imaging element block. The solid-state imaging device having such a configuration will be referred to as a "solid-state imaging device having a first configuration" for convenience. Alternatively, in a modification of the solid-state imaging devices according to the first aspect and the second aspect of the present disclosure, a following solid-state imaging device may be adopted.

Plural the imaging elements having the first configuration to the sixth configuration, or plural stacked imaging elements each including at least one of the imaging elements having the first configuration to the sixth configuration are included.

An imaging element block is constituted by the plurality of imaging elements or stacked imaging elements.

The first electrode is shared by the plurality of imaging elements or stacked imaging elements constituting the imaging element block. The solid-state imaging device having such a configuration will be referred to as a "solid-state imaging device having a second configuration" for convenience. In addition, a configuration and a structure of a pixel region where a plurality of imaging elements are arranged can be simplified and miniaturized when the first electrode is shared by the plurality of imaging elements constituting the imaging element block as described above.

In each of the solid-state imaging devices having the first configuration and the second configuration, one floating diffusion layer is provided for the plurality of imaging elements (one imaging element block). The plurality of imaging elements provided for the one floating diffusion layer may be constituted by a plurality of first type imaging elements described below, or may be constituted by at least the one first type imaging element or one, two, or more second type imaging elements described below. In addition, the one floating diffusion layer can be shared by the plurality of imaging elements by controlling charge transfer period timing in an appropriate manner. The plurality of imaging elements is operated in cooperation with each other, and connected to the driving circuit described below as an imaging element block. In other words, the plurality of imaging elements constituting the imaging element block is connected to the one driving circuit. However, the charge accumulation electrode is controlled for each of the imaging elements. Further, one contact hole portion may be shared by the plurality of imaging elements. An arrangement relation between the first electrode shared by the plurality of imaging elements and the charge accumulation electrodes of the respective imaging elements may be such a relation that the first electrode is disposed adjacent to the charge accumulation electrodes of the respective imaging elements. Alternatively, the first electrode may be disposed adjacent to a part of the charge accumulation electrodes of the plurality of imaging elements, and not disposed adjacent to the rest of the charge accumulation electrodes. In this case, charges from the rest of the plurality of imaging elements to the first electrode are transferred via the part of the plurality of imaging elements. For reliably achieving charge transfer from the respective imaging elements to the first electrode, it is preferable that a distance between the charge accumulation electrodes constituting the imaging elements (referred to as a "distance A" for convenience) is longer than a distance between the first electrode and the charge accumulation electrode in the imaging element adjacent to the first electrode (referred to as a "distance B" for convenience). In addition, it is preferable to increase the distance A as the location of the imaging element is farther from the first electrode. Note that the above description is applicable not only to the solid-state imaging devices having the first configuration and the second configuration, but also to the solid-state imaging devices of the first aspect and the second aspect of the present disclosure.

Further, in the imaging elements and the like of the present disclosure including the respective preferred modes described above, adoptable is a mode where light enters from the second electrode side. In this case, a light shield layer is formed on the light entrance side near the second electrode. Alternatively, adoptable is a mode where light enters from the second electrode side, but is prohibited from entering the first electrode (the first electrode and the transfer control electrode depending on cases). In this case, adoptable is a configuration where a light shield layer is formed on the light entrance side near the second electrode and above the first electrode (the first electrode and the transfer control electrode depending on cases). Alternatively, adoptable is a configuration where an on-chip micro-lens is provided above the charge accumulation electrode and the second electrode, and light entering the on-chip micro-lens is converged on the charge accumulation electrode. The light shield layer here may be disposed either above a light entrance side surface of the second electrode, or on the light entrance side surface of the second electrode. Depending on cases, the light shield layer may be formed on the second electrode. Examples of the material constituting the light shield layer include chromium (Cr), copper (Cu), aluminum (Al), tungsten (W), and resin not transmitting light (e.g., polyimide resin).

Specific examples of the imaging element and the like of the present disclosure include an imaging element (referred to as a "first type blue light imaging element" for convenience) which has sensitivity to blue light and includes a photoelectric conversion layer or a photoelectric conversion unit absorbing blue light (light ranging from 425 to 495 nm) (referred to as a "first type blue light photoelectric conversion layer" or a "first type blue light photoelectric conversion unit" for convenience), an imaging element (referred to as a "first type green light imaging element" for convenience) which has sensitivity to green light and includes a photoelectric conversion layer or a photoelectric conversion unit absorbing green light (light ranging from 495 to 570 nm) (referred to as a "first type green light photoelectric conversion layer" or a "first type green light photoelectric conversion unit" for convenience), and an imaging element (referred to as a "first type red light imaging element" for convenience) which has sensitivity to red light and includes a photoelectric conversion layer or a photoelectric conversion unit absorbing red light (light ranging from 620 to 750 nm) (referred to as a "first type red light photoelectric conversion layer" or a "first type red light photoelectric conversion unit" for convenience). In addition, a conventional imaging element not including the charge accumulation electrode and having sensitivity to blue light will be referred to as a "second type blue light imaging element" for convenience, a conventional imaging element not including the charge accumulation electrode and having sensitivity to green light will be referred to as a "second type green light imaging element" for convenience, a conventional imaging element not including the charge accumulation electrode and having sensitivity to red light will be referred to as a "second type red light imaging element" for convenience, a photoelectric conversion layer or a photoelectric conversion unit constituting the second type blue light imaging element will be referred to as a "second type blue light photoelectric conversion layer" or a "second type blue light photoelectric conversion unit" for convenience, a photoelectric conversion layer or a photoelectric conversion unit constituting the second type green light imaging element will be referred to as a "second type green light photoelectric conversion layer" or a "second type green light photoelectric conversion unit" for convenience, and a photoelectric conversion layer or a photoelectric conversion unit constituting the second type red light imaging element will be referred to as a "second type red light photoelectric conversion layer" or a "second type red light photoelectric conversion unit" for convenience.

The stacked imaging element of the present disclosure includes at least the one imaging element or the like (photoelectric conversion element) of the present disclosure. Specific structure examples include following structures.

[A] The first type blue light photoelectric conversion unit, the first type green light photoelectric conversion unit, and the first type red light photoelectric conversion unit are stacked in a vertical direction.

Each of control units of the first type blue light imaging element, the first type green light imaging element, and the first type red light imaging element is provided on the semiconductor substrate.

[B] The first type blue light photoelectric conversion unit and the first type green light photoelectric conversion unit are stacked in a vertical direction.

The second type red light photoelectric conversion unit is disposed below the two layers of the first type photoelectric conversion units.

Each of control units of the first type blue light imaging element, the first type green light imaging element, and the second type red light imaging element is provided on the semiconductor substrate.

[C] The second type blue light photoelectric conversion unit and the second type red light photoelectric conversion unit are disposed below the first type green light photoelectric conversion unit.

Each of control units of the first type green light imaging element, the second type blue light imaging element, and the second type red light imaging element is provided on the semiconductor substrate.

[D] The second type green light photoelectric conversion unit and the second type red light photoelectric conversion unit are disposed below the first type blue light photoelectric conversion unit.

Each of control units of the first type blue light imaging element, the second type green light imaging element, and the second type red light imaging element is provided on the semiconductor substrate.

The photoelectric conversion units of these imaging elements in the vertical direction are preferably arranged in an order of the blue light photoelectric conversion unit, the green light photoelectric conversion unit, and the red light photoelectric conversion unit in a light incident direction, or in an order of the green light photoelectric conversion unit, the blue light photoelectric conversion unit, and the red light photoelectric conversion unit in the light incident direction. These arrangements are preferred in view of a point that light having a shorter wavelength is more efficiently absorbed on the light entrance surface side. Red has the longest wavelength in the three colors. Accordingly, it is preferable to position the red light photoelectric conversion unit in a lowest layer as viewed from the light entrance surface. One pixel is constituted by a stacked structure of these imaging elements. In addition, a first type near infrared light photoelectric conversion unit (or infrared light photoelectric conversion unit) may be provided. It is preferable here that the photoelectric conversion layer of the first type infrared light photoelectric conversion unit is made of an organic material, for example, and disposed in the lowest layer of the stacked structure of the first type imaging element, and above the second type imaging element. Alternatively, a second type near infrared light photoelectric conversion unit (or infrared light photoelectric conversion unit) may be provided below the first type photoelectric conversion unit.

For example, the first electrode is formed on an interlayer insulation layer formed on the semiconductor substrate in the first type imaging element. The imaging element formed on the semiconductor substrate may be either of a back-illuminated type or of a front-illuminated type.

In a case where a photoelectric conversion layer is made of an organic material, any one of following four aspects is adoptable.

(1) The photoelectric conversion layer is constituted by a p-type organic semiconductor.

(2) The photoelectric conversion layer is constituted by an n-type organic semiconductor.

(3) The photoelectric conversion layer is constituted by: a stacked structure of a p-type organic semiconductor layer or an n-type organic semiconductor layer; a stacked structure of a mixed layer including a p-type organic semiconductor layer or a p-type organic semiconductor and an n-type organic semiconductor (bulk heterostructure), or an n-type organic semiconductor layer; a stacked structure of a mixed layer of a p-type organic semiconductor layer or a p-type organic semiconductor, and an n-type organic semiconductor (bulk heterostructure); or a stacked structure of a mixed layer of an n-type organic semiconductor layer or a p-type organic semiconductor, and an n-type organic semiconductor (bulk heterostructure).

(4) The photoelectric conversion layer is constituted by a mixture of a p-type organic semiconductor and an n-type organic semiconductor (bulk heterostructure).

Note that the stacking order is configured to be switchable to any order.

Examples of the p-type organic semiconductor include naphthalene derivative, anthracene derivative, phenanthrene derivative, pyrene derivative, perylene derivative, tetracene derivative, pentacene derivative, quinacridone derivative, thiophene derivative, thienothiophene derivative, benzothiophene derivative, benzothieno benzothiophene derivative, triallylamine derivative, carbazole derivative, perylene derivative, picene derivative, chrysene derivative, fluoranthene derivative, phthalocyanine derivative, subphthalocyanine derivative, subporphyrazine derivative, metal complex having a heterocyclic compound as a ligand, polythiophene derivative, polybenzothiadiazole derivative, and polyfluorene derivative. Examples of the n-type organic semiconductor include fullerene and fullerene derivative <e.g., fullerene such as C60, C70, and C74 (higher fullerene), and encapsulated fullerene), or fullerene derivative (e.g., fullerene fluoride, PCBM fullerene compound, and fullerene multimer)>, organic semiconductor having larger (deeper) HOMO and LUMO than those of p-type organic semiconductor, and transparent inorganic metal oxide. Specific examples of the n-type organic semiconductor include a heterocyclic compound containing nitrogen atoms, oxygen atoms, and sulfur atoms, such as pyridine derivative, pyrazine derivative, pyrimidine derivative, triazine derivative, quinoline derivative, quinoxaline derivative, isoquinoline derivative, acridine derivative, phenazine derivative, phenanthroline derivative, tetrazole derivative, pyrazole derivative, imidazole derivative, thiazole derivative, oxazole derivative, imidazole derivative, benzimidazole derivative, benzotriazole derivative, benzoxazole derivative, benzoxazole derivative, carbazole derivative, benzofuran derivative, dibenzofuran derivative, subporphyrazine derivative, polyphenylene vinylene derivative, polybenzothiazole derivative, organic molecule having polyfluorene derivative or the like as a part of a molecular framework, organic metal complex, and subphthalocyanine derivative. Examples of a group contained in fullerene derivative include halogen atoms; straight chain, branched or ring-shaped alkyl group or phenyl group; group containing straight chain or ring-fused aromatic compound; group containing halogen compound; partial fluoroalkyl group; perfluoroalkyl group; silyl alkyl group; silyl alkoxy group; aryl silyl group; aryl surfanyl group; aryl surfonyl group; alkyl surfonyl group; aryl sulfide group; alkyl surfide group; amino group; alkyl amino group; aryl amino group; hydroxy group; alkoxy group; acylamino group; acyloxy group; carbonyl group; carboxy group; carboxamido group; carboalkoxy group; acyl group; surfonyl group; cyano group; nitro group; group containing chalcogenide; phosphine group; phosphone group; and derivatives of these. The thickness of the photoelectric conversion layer made of an organic material (referred to as an "organic photoelectric conversion layer" in some cases) is not limited to a specific thickness. For example, the thickness may be in a range of $1\times10^{-8}$ to $5\times10^{-7}$ m, preferably of $2.5\times10^{-8}$ to $3\times10^{-7}$ m, more preferably of $2.5\times10^{-8}$ to $2\times10^{-7}$ m, and further preferably of $1\times10^{-7}$ to $1.8\times10^{-7}$ m. Note that the organic semiconductor is often classified into p-type and n-type. In this case, the p-type refers to a type easily transporting holes, while the n-type refers to a type easily transporting electrons. It is therefore not interpreted that the organic semiconductor has holes or electrons as a large number of thermal excitation carriers like an inorganic semiconductor.

Alternatively, examples of a material constituting an organic photoelectric conversion layer photoelectrically converting green light include rhodamine dye, merocyanine dye, and quinacridone derivative, subphthalocyanine dye (subphthalocyanine derivative). Examples of a material constituting an organic photoelectric conversion layer photoelectrically converting blue light include coumaric acid dye, tris-8-hydroxyquinoli aluminum (Alq3), and merocyanine dye. Examples of a material constituting an organic photoelectric conversion layer photoelectrically converting red light include phthalocyanine dye, and subphthalocyanine dye (subphthalocyanine derivative).

Alternatively, examples of an inorganic material constituting the photoelectric conversion layer include crystalline silicon, amorphous silicon, microcrystalline silicon, crystalline selenium, amorphous selenium, and chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, AgInSe$_2$, and further include group III-V compounds such as GaAs, InP, AlGaAs, InGap, AlGaInP, and InGaAsP, and still further include compound semiconductors such as CdSe, CdS, In$_2$Se$_3$, In$_2$S$_3$, Bi$_2$Se$_3$, Bi$_2$S$_3$, ZnSe, ZnS, PbSe, and PbS. In addition, quantum dots made of these materials may be used for constituting the photoelectric conversion layer.

Each of the solid-state imaging devices of the first aspect and the second aspect, or the solid-state imaging devices having the first configuration and the second configuration may constitute a single-panel color solid-state imaging device.

According to the solid-state imaging device of the second aspect of the present disclosure including the stacked imaging element, imaging elements having sensitivity to a plurality of wavelengths in a light incident direction within the same pixel are stacked to constitute one pixel, unlike a solid-state imaging device including imaging elements arranged in a Bayer array (i.e., not performing spectral diffraction of blue, green, and red using a color filter layer). Accordingly, sensitivity and pixel density per unit volume can improve. Further, the organic materials have higher absorption coefficients. Accordingly, the film thickness of the organic photoelectric conversion layer can be more reduced than that of a conventional Si photoelectric conversion layer, and therefore light leakage from adjacent pixels and a limitation to a light incident angle decrease. Further, false colors are produced by the conventional Si imaging element which generates color signals by interpolation between pixels in three colors. However, the solid-state imaging device including the stacked imaging element according to the second aspect of the present disclosure can reduce false colors. The organic photoelectric conversion layer itself also functions as a color filter layer. Accordingly, color separation is achievable without using a color filter layer.

Meanwhile, the solid-state imaging device according to the first aspect of the present disclosure is capable of reducing requirement for spectral characteristics of blue, green, and red, and also achieving high mass-productivity by using a color filter layer. Examples of arrangement of the imaging elements of the solid-state imaging device according to the first aspect of the present disclosure include not only Bayer array, but also interline array, G-stripe RB checkered array, G-stripe RB complete checkered array, checkered complementary color array, stripe array, diagonal stripe array, primary color chrominance array, field chrominance sequential array, frame chrominance sequential array, MOS type array, improved MOS type array, frame interleave array, and field interleave array. One imaging element here constitutes one pixel (or sub-pixel).

The color filter layer (wavelength selection means) may be a filter layer which transmits not only red, green, blue, but also specific wavelengths such as cyan, magenta, and yellow. The color filter layer may be constituted not only by an organic material color filter layer containing organic compounds such as pigments and dyes, but also a thin film made of inorganic material such as photonic crystals, a wavelength selection element utilizing plasmon (a color filter layer having a conducting grid structure where a grid-shaped hole structure is formed in a conducting thin film, e.g., see JP 2008-177191A), and amorphous silicon.

A pixel region where a plurality of the imaging elements or the like of the present disclosure or the stacked imaging elements or the like of the present disclosure is arranged is constituted by a plurality of pixels regularly arranged in a two-dimensional array. The pixel region is generally constituted by an effective pixel region which actually receives light, amplifies a signal charge generated by photoelectric conversion, and reads and outputs the signal charge to the driving circuit, and a black reference pixel region (also referred to as an optical black pixel region (OPB)) for outputting optical black corresponding to a reference of black level. The black reference pixel region is usually disposed in an outer peripheral portion of the effective pixel region.

In the imaging element and the like of the present disclosure including the respective preferred modes described above, photoelectric conversion is caused in the photoelectric conversion layer according to irradiation of light, and carrier separation of holes and electrons is performed. In addition, an electrode from which holes are extracted is designated as an anode, and an electrode from which electrons are extracted is designated as a cathode. The first electrode constitutes a cathode, while the second electrode constitutes an anode.

Each of the first electrode, the charge accumulation electrode, the transfer control electrode, the charge transfer control electrode, the charge discharge electrode, and the second electrode may be made of a transparent conductive material. The first electrode, the charge accumulation electrode, the transfer control electrode, and the charge discharge electrode will be collectively referred to as a "first electrode and the like" in some cases. Alternatively, in a case where the imaging element and the like of the present disclosure are disposed in a flat plane such as in Bayer array, for example, the second electrode may be configured to be made of a transparent conductive material, and each of the first electrode and the like may be configured to be made of a metal material. In this case, specifically, the second electrode disposed on the light entrance side may be configured to be made of a transparent conductive material, while each of the first electrode and the like may be configured to be made of Al—Nd (alloy of aluminum and neodymium) or ASC (alloy of aluminum, samarium, and copper), for example. The electrode made of a transparent conductive material will be referred to as a "transparent electrode" in some cases. Band-gap energy of the transparent conductive material here is preferably 2.5 eV or higher, preferably 3.1 eV or higher. The transparent conductive material constituting the transparent electrode may be a conductive metal oxide, for example. Specific examples of the transparent conductive material include indium oxide, indium-tin oxide (ITO, including Sn-doped $In_2O_3$, crystalline ITO, and amorphous ITO), indium-zinc oxide (IZO, Indium Zinc Oxide) containing zinc oxide to which indium is added as a dopant, indium-gallium oxide (IGO) containing gallium oxide to which indium is added as a dopant, indium-gallium-zinc oxide (IGZO, In—$GaZnO_4$) containing zinc oxide to which indium and gallium are added as dopants, indium-tin-zinc oxide (ITZO) containing zinc oxide to which indium and tin are added as dopants, IFO (F-doped $In_2O_3$), tin oxide ($SnO_2$), ATO (Sb-doped $SnO_2$), FTO (F-doped $SnO_2$), zinc oxide (including ZnO to which another element is doped), aluminum-zinc oxide (AZO) containing zinc oxide to which aluminum is added as a dopant, gallium-zinc oxide (GZO) containing zinc oxide to which gallium is added as a dopant, titanium oxide ($TiO_2$), niobium-titanium oxide (TNO) containing titanium oxide to which niobium is added as a dopant, antimony oxide, CuI, $InSbO_4$, ZnMgO, $CuInO_2$, $MgIn_2O_4$, CdO, $ZnSnO_3$, spinel oxide, and oxide having $YbFe_2O_4$ structure. Alternatively, examples of the transparent conductive material include a transparent electrode which has a base layer made of gallium oxide, titanium oxide, niobium oxide, nickel oxide, or others. The transparent electrode may have a thickness ranging from $2\times10^{-8}$ to $2\times10^{-7}$ m, preferably from $3\times10^{-8}$ to $1\times10^{-7}$ m. In a case where the first electrode is required to have transparency, it is preferable that the charge discharge electrode is also made of a transparent conductive material in view of simplification of a manufacturing process.

Alternatively, in a case where transparency is unnecessary, the cathode having a function as an electrode from which electrons are extracted is preferably made of a conductive material having a low work function (e.g., $\phi=3.5$ to 4.5 eV). Specific examples of the conductive material constituting the cathode include conductive materials such as alkali metal (e.g., Li, Na, K and the like) and a fluoride of or an oxide of alkali metal, alkali earth metal (e.g., Mg, Ca and the like) and a fluoride or an oxide of alkali earth metal, aluminum (Al), zinc (Zn), tin (Sn), thallium (Tl), sodium-potassium alloy, aluminum-lithium alloy, magnesium-silver alloy, indium, rare earth metal such as ytterbium, and alloys of these. Alternatively, examples of the material constituting the cathode include metal such as platinum (Pt), gold (Au), palladium (Pd), chrome (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), or alloys containing these metal elements, conductive particles constituted by these metals, alloy conductive particles containing these metals, polysilicon containing impurities, carbon material, oxide semiconductor material, carbon nanotube, and graphene, or include stacked structure containing these elements. Further, examples of the material constituting the cathode include organic material (conductive macromolecules) such as poly (3,4-ethylene dioxythiophene)/polystyrene sulfonic acid [PEDOT/PSS]. Further, these conductive materials may be mixed with binders (macromolecules) into a paste or ink form, and then hardened to be used as an electrode.

Films of the first electrode and the like and the second electrode (cathode and anode) may be formed by a dry method or wet method. Examples of the dry method include physical vapor deposition (PVD), and chemical vapor deposition (CVD). Examples of film forming method utilizing the principle of PVD include vacuum evaporation using resistance heating or high-frequency heating, EB (electron beam) evaporation, various types of sputtering (magnetron sputtering, RF-DC coupled bias sputtering, ECR sputtering, facing target sputtering, and high-frequency sputtering), ion-plating, laser abrasion, molecular beam epitaxy, and laser transfer. Further, examples of CVD include plasma CVD, thermal CVD, organic metal (MO) CVD, and light CVD. On the other hand, examples of the wet method include electroplating, electroless plating, spin-coating, ink-jet, spray coating, stamping, microcontact printing, flexographic printing, offset printing, photogravure printing, and dipping. Examples of patterning include chemical etching such as shadow masking, laser transfer, and photolithography, and physical etching using ultraviolet light, lasers, and the like. Examples of a flattening technique for the first electrode and the like and the second electrode include laser flattening, reflow, and CMP (Chemical Mechanical Polishing).

Examples of the material constituting the insulation layer not only include inorganic insulation materials such as: silicon oxide material; silicon nitride ($SiN_y$); metal oxide high dielectric insulation material such as aluminum oxide ($Al_2O_3$), but also include organic insulation material (organic polymer) such as: polymethylmethacrylate (PMMA); polyvinyl phenol (PVP); polyvinyl alcohol (PVA); polyimide; polycarbonate (PC); polyethylene terephthalate (PET); polystyrene; silanol derivative (silane coupling agent) such as N-2 (aminoethyl) 3-aminoporopyltrimethoxysilane (AEAPTMS), 3-mercaptopropyltrimethoxysilane (MPTMS), and octadecyltrichlorosilane (OTS); novolac phenol resin; fluorine-based resin; and straight chain hydrocarbon having a functional group disposed at one end and allowed to be coupled with a control electrode, such as octadecane thiol, dodecyl isocyanate. These materials may be combined for use. Examples of the silicon oxide material include silicon oxide ($SiO_x$), BPSG, PSG, BSG, AsSG, PbSG, silicon oxynitride (SiON), SOG (spin on glass), low dielectric constant insulation material (e.g., polyaryl ether, cycloperfluorocarbon polymer and benzocyclobutene, cyclic fluororesin, polytetrafluoroethylene, aryl fluoride ether, polyimide fluoride, amorphous carbon, and organic SOG). The insulation layer may have either a single-layer configuration or a configuration where plural layers (e.g., two layers) are stacked. In the latter case, it is sufficient if layers are formed in a following manner. An insulation lower layer is formed at least on the charge accumulation electrode, or in a region between the charge accumulation electrode and the first electrode. The insulation lower layer is left at least in the region between the charge accumulation electrode and the first electrode by flattening the insulation lower layer. An insulation upper layer is formed on the left insulation lower layer and the charge accumulation electrode. In this manner, sufficient flatness of the insulation layer is reliably achievable. It is sufficient if materials constituting a protection layer, respective interlayer insulation layers, and an insulation material film are selected from the above materials in an appropriate manner.

Configurations and structures of the floating diffusion layer, the amplification transistor, the reset transistor, and the selection transistor constituting the control unit may be similar to configurations and structures of a conventional floating diffusion layer, a conventional amplification transistor, a conventional reset transistor, and a conventional selection transistor. The driving circuit may have a known configuration and a known structure.

The first electrode is connected to the floating diffusion layer and a gate portion of the amplification transistor. It is sufficient if a contact hole portion is formed for connection between the first electrode, the floating diffusion layer, and the gate portion of the amplification transistor. Examples of a material constituting the contact hole portion include polysilicon to which impurities are doped, high melting point metal and metal silicide such as tungsten, Ti, Pt, Pd, Cu, TiW, TiN, TiNW, $WSi_2$, and $MoSi_2$, and a stacked structure constituted by layers made of these materials (e.g., Ti/TiN/W).

A first carrier blocking layer may be provided between the inorganic oxide semiconductor material layer and the first electrode, and a second carrier blocking layer may be provided between the organic photoelectric conversion layer and the second electrode. Further, a first charge injection layer may be provided between the first carrier blocking layer and the first electrode, and a second charge injection layer may be provided between the second carrier blocking layer and the second electrode. Examples of a material constituting the electron injection layer include alkali metals such as lithium (Li), sodium (Na), and potassium (K), and fluoride and oxide of these metals, and alkali earth metals such as magnesium (Mg) and calcium (Ca), and fluoride and oxide of these metals.

Examples of a film forming method of the respective organic layer include a dry film forming method and a wet film forming method. Examples of the dry film forming method include vacuum evaporation using resistance heating or high-frequency heating, and electron beam heating, flash evaporation, plasma evaporation, EB evaporation, various types of sputtering (bipolar sputtering, DC sputtering, DC magnetron sputtering, high-frequency sputtering, magnetron sputtering, RF-DC coupled bias sputtering, ECR sputtering, facing target sputtering, high-frequency sputtering, and ion-beam sputtering), DC (Direct Current) method, RF method, multi-cathode method, activated reaction method, electric field evaporation, various types of ion plating such as high-frequency ion-plating and reactive ion-plating, laser abrasion, molecular beam epitaxy, and laser transfer, and molecular bean epitaxy (MBE). Further, examples of CVD include plasma CVD, thermal CVD, MOCVD, and light CVD. On the other hand, specific examples of the dry method include: spin-coating; immersion; casting; microcontact printing; drop casting; various types of printing such as screen printing, ink jet printing, offset printing, gravure printing, and flexographic printing; stamping; spraying; and various types of coating such as air doctor coater, blade coater, rod coater, knife coater, squeeze coater, reverse roll coater, transfer roll coater, gravure coater, kiss coater, cast coater, spray coater, slit-orifice coater, calendar coater. Examples of a solvent used for an application method include organic solvents non-polar or having low polarity, such as toluene, chloroform, hexane, and ethanol. Examples of patterning include chemical etching such as shadow masking, laser transfer, and photolithography, and physical etching using ultraviolet light, lasers, and the like. Examples of a flattening technique for the respective organic layers include laser flattening and reflowing.

As described above, an on-chip micro-lens and a light shield layer may be provided on the imaging element or the solid-state imaging device as necessary. A driving circuit and wiring for driving the imaging element are provided. A shutter for controlling light entrance into the imaging element may be provided as necessary, or an optical cut filter may be provided depending on purposes of use of the solid-state imaging device.

Further, in each of the solid-state imaging devices having the first configuration and the second configuration, adoptable is a mode where one on-chip micro-lens is provided above the one imaging element or the like of the present disclosure in a mode, or a mode where one on-chip micro-lens is provided above an imaging element block constituted by the two imaging elements or the like of the present disclosure.

For example, in a case where the solid-state imaging device is stacked on a readout integrated circuit (ROIC), these components may be stacked by overlapping a driving substrate which has a connection portion constituted by the readout integrated circuit and copper (Cu), and an imaging element which has a connection portion such that the respective connection portions come into contact with each other, and joining the respective connection portions. Alternatively, the respective connection portions may be joined using solder bump or the like.

In addition, a driving method for driving each of the solid-state imaging devices according to the first aspect and the second aspect of the present disclosure may be a following driving method of the solid-state imaging device.

In all of the imaging elements, charges in the first electrode are simultaneously discharged to the outside of the system while accumulating charges in the inorganic oxide semiconductor material layer (or the inorganic oxide semiconductor material layer and the photoelectric conversion layer).

Subsequently, in all of the imaging elements, the charges accumulated in the inorganic oxide semiconductor material layer (or the inorganic oxide semiconductor material layer and the photoelectric conversion layer) are simultaneously transferred to the first electrode. After completion of transfer, the charges transferred to the first electrode are sequentially read out in each of the imaging elements. The respective steps are repeated.

According to the driving method of the solid-state imaging device described above, each of the imaging elements has such a structure where light having entered from the second electrode side does not enter the first electrode. In addition, in all of the imaging elements, charges in the first electrode are simultaneously discharged to the outside of the system while accumulating charges in the inorganic oxide semiconductor material layer and the like. Accordingly, the first electrodes of all the imaging elements can simultaneously and reliably be reset. Subsequently, in all of the imaging elements, the charges accumulated in the inorganic oxide semiconductor material layer and the like are simultaneously transferred to the first electrode. After completion of transfer, the charges transferred to the first electrode are sequentially read out in each of the imaging elements. Accordingly, what is generally called a global shutter function can easily be achieved.

The imaging element and the solid-state imaging device of Embodiment 1 will be hereinafter described in detail.

An imaging element 10 of Embodiment 1 further includes a semiconductor substrate (more specifically, silicon semiconductor layer) 70. In this case, a photoelectric conversion unit is disposed above the semiconductor substrate 70. In addition, the imaging element 10 further includes a control unit provided on the semiconductor substrate 70 and having a driving circuit to which a first electrode 21 and a second electrode 22 are connected. It is assumed here that a light entrance surface of the semiconductor substrate 70 is located on an upper side, and that the side opposite to the semiconductor substrate 70 is a lower side. A wiring layer 62 constituted by a plurality of wires is provided below the semiconductor substrate 70.

At least a floating diffusion layer $FD_1$ or an amplification transistor $TR1_{amp}$ constituting the control unit is provided on the semiconductor substrate 70. The first electrode 21 is connected to the floating diffusion layer $FD_1$ and a gate portion of the amplification transistor $TR1_{amp}$. A reset transistor $TR1_{rst}$ and a selection transistor $TR1_{sel}$ constituting the control unit are further provided on the semiconductor substrate 70. The floating diffusion layer $FD_1$ is connected to one source/drain region of the reset transistor $TR1_{rst}$. The other source/drain region of the amplification transistor $TR1_{amp}$ is connected to one source/drain region of the selection transistor $TR1_{sel}$. The other source/drain region of the selection transistor $TR1_{sel}$ is connected to a signal $VSL_1$. The amplification transistor $TR1_{amp}$, the reset transistor $TR1_{rst}$, and the selection transistor $TR1_{sel}$ described above constitute the driving circuit.

Specifically, the imaging element and the stacked imaging element of Embodiment 1 are a back-illuminated imaging element and a back-illuminated stacked imaging element, respectively, and has a structure which includes three stacked imaging elements constituted by a first type green light imaging element of Embodiment 1 (hereinafter referred to as a "first imaging element") having sensitivity to green light and including a first type green light photoelectric conversion layer for absorbing green light, a second type conventional blue light imaging element (hereinafter referred to as a "second imaging element") having sensitivity to blue light and including a second type blue light photoelectric conversion layer for absorbing blue light, and a second type conventional red imaging element (hereinafter referred to as a "third imaging element") having sensitivity to red light and including a second type red light photoelectric conversion layer for absorbing red light. A red light imaging element (third imaging element) 12 and a blue light imaging element (second imaging element) 11 are provided within the semiconductor substrate 70. The second imaging element 11 is located closer to the light entrance side than the third imaging element 12 is. In addition, the green light imaging element (first imaging element 10) is provided above the blue light imaging element (second imaging element 11). One pixel has a stacked structure constituted by the first imaging element 10, the second imaging element 11, and the third imaging element 12. A color filter layer is not provided.

In the first imaging element 10, the first electrode 21 and the charge accumulation electrode 24 are formed on an interlayer insulation layer 81 and disposed at positions apart from each other. The interlayer insulation layer 81 and the charge accumulation electrode 24 are covered by the insulation layer 82. The inorganic oxide semiconductor material layer 23B and the photoelectric conversion layer 23A are formed on the insulation layer 82. The second electrode 22 is formed on the photoelectric conversion layer 23A. A protection layer 83 is formed on an entire surface including the second electrode 22. An on-chip micro-lens 14 is provided on the protection layer 83. A color filter layer is not provided. For example, each of the first electrode 21, the charge accumulation electrode 24, and the second electrode 22 is constituted by a transparent electrode made of ITO (work function: approximately 4.4 eV). The inorganic oxide semiconductor material layer 23B is made of $In_aSn_bTi_c Zn_dO_e$. The photoelectric conversion layer 23A is constituted by a layer containing a known organic photoelectric conversion material having sensitivity to at least green light (e.g., rhodamine dye, merocyanine dye, and organic material such as quinacridone). Each of the interlayer insulation layer 81, the insulation layer 82, and the protection layer 83 is made of a known insulation material (e.g., $SiO_2$ and SiN). The inorganic oxide semiconductor material layer 23B and the first electrode 21 are connected to each other via a connection portion 67 formed in the insulation layer 82. The inorganic oxide semiconductor material layer 23B extends within the connection portion 67. Specifically, the inorganic oxide semiconductor material layer 23B extends within an opening 85 formed in the insulation layer 82, and is connected to the first electrode 21.

The charge accumulation electrode 24 is connected to the driving circuit. Specifically, the charge accumulation electrode 24 is connected to a vertical driving circuit 112 constituting the driving circuit via a connection hole 66, a pad portion 64, and a wire $V_{OA}$ formed within the interlayer insulation layer 81.

The charge accumulation electrode 24 is larger in size than the first electrode 21. Assuming that an area of the charge accumulation electrode 24 is $s_1'$, and that an area of the first electrode 21 is $s_1$, a following relation is preferably satisfied, but not required to be satisfied.

$$4 \leq s_1'/s_1$$

In Embodiment 1, a following value is adopted, for example, but not required to be adopted.

$$s_1'/s_1 = 8$$

An element separation region 71 is formed on a first surface (front surface) 70A side of the semiconductor substrate 70. Further, an oxide film 72 is formed on the first surface 70A of the semiconductor substrate 70. Further, the reset transistor $TR1_{rst}$, the amplification transistor $TR1_{amp}$, and the selection transistor $TR1_{sel}$ constituting the control unit of the first imaging element 10 are provided on the first surface side of the semiconductor substrate 70. The first floating diffusion layer $FD_1$ is further formed on the first surface side of the semiconductor substrate 70.

The reset transistor $TR1_{rst}$ is constituted by a gate portion 51, a channel forming region 51A, and source/drain regions 51B and 51C. The gate portion 51 of the reset transistor $TR1_{rst}$ is connected to a reset line $RST_1$. The one source/drain region 51C of the reset transistor $TR1_{rst}$ also functions as the first floating diffusion layer $FD_1$, while the other source/drain region 51B is connected to a power source $V_{DD}$.

The first electrode 21 is connected to the one source/drain region 51C (first floating diffusion layer $FD_1$) of the reset transistor $TR1_{rst}$ via a connection hole 65 and a pad portion 63 formed within the interlayer insulation layer 81, a contact hole portion 61 formed in the semiconductor substrate 70 and the interlayer insulation layer 76, and the wiring layer 62 formed in the interlayer insulation layer 76.

The amplification transistor $TR1_{amp}$ is constituted by a gate portion 52, a channel forming region 52A, and source/drain regions 52B and 52C. The gate portion 52 is connected to the first electrode 21 and the one source/drain region 51C (first floating diffusion layer $FD_1$) of the reset transistor $TR1_{rst}$ via the wiring layer 62. In addition, the one source/drain region 52B is connected to the power source $V_{DD}$.

The selection transistor $TR1_{sel}$ is constituted by a gate portion 53, a channel forming region 53A, and source/drain regions 53B and 53C. The gate portion 53 is connected to a selection line $SEL_1$. Further, the one source/drain region 53B has a region shared with the other source/drain region 52C constituting the amplification transistor $TR1_{amp}$. The other source/drain region 53C is connected to a signal line (data output line) $VSL_1$ (117).

The second imaging element 11 includes, as a photoelectric conversion layer, an n-type semiconductor region 41 formed in the semiconductor substrate 70. A gate portion 45 of a transfer transistor $TR2_{trs}$ constituted by a vertical transistor extends up to the n-type semiconductor region 41, and also connects to a transfer gate line $TG_2$. Further, a second floating diffusion layer $FD_2$ is formed in a region 45C included in the semiconductor substrate 70 and located near the gate portion 45 of the transfer transistor $TR2_{trs}$. Charges accumulated in the n-type semiconductor region 41 are read out to the second floating diffusion layer $FD_2$ via a transfer channel formed along the gate portion 45.

Further, in the second imaging element 11, a reset transistor $TR2_{rst}$, an amplification transistor $TR2_{amp}$, and a selection transistor $TR2_{sel}$ constituting the control unit of the second imaging element 11 are provided on the first surface side of the semiconductor substrate 70.

The reset transistor $TR2_{rst}$ is constituted by a gate portion, a channel forming region, and source/drain regions. The gate portion of the reset transistor $TR2_{rst}$ is connected to a reset line $RST_2$. The one source/drain region of the reset transistor $TR2_{rst}$ is connected to the power source $V_{DD}$, while the other source/drain region functions as the second floating diffusion layer $FD_2$.

The amplification transistor $TR2_{amp}$ is constituted by a gate portion, a channel forming region, and source/drain regions. The gate portion is connected to the other source/drain region (second floating diffusion layer $FD_2$) of the reset transistor $TR2_{rst}$. In addition, the one source/drain region is connected to the power source $V_{DD}$.

The selection transistor $TR2_{sel}$ is constituted by a gate portion, a channel forming region, and source/drain regions. The gate portion is connected to a selection line $SEL_2$. Further, the one source/drain region has a region shared with the other source/drain region constituting the amplification transistor $TR2_{amp}$. The other source/drain region is connected to a signal line (data output line) $VSL_2$.

The third imaging element 12 includes, as a photoelectric conversion layer, an n-type semiconductor region 43 formed in the semiconductor substrate 70. A gate portion 46 of a transfer transistor $TR3_{trs}$ is connected to a transfer gate line $TG_3$. Further, a third floating diffusion layer $FD_3$ is formed in a region 46C included in the semiconductor substrate 70 and located near the gate portion 46 of the transfer transistor $TR3_{trs}$. Charges accumulated in the n-type semiconductor region 43 are read out to the third floating diffusion layer $FD_3$ via a transfer channel 46A formed along the gate portion 46.

Further, in the third imaging element 12, a reset transistor $TR3_{rst}$, an amplification transistor $TR3_{amp}$, and a selection transistor $TR3_{sel}$ constituting the control unit of the third imaging element 12 are provided on the first surface side of the semiconductor substrate 70.

The reset transistor $TR3_{rst}$ is constituted by a gate portion, a channel forming region, and source/drain regions. The gate portion of the reset transistor $TR3_{rst}$ is connected to a reset line $RST_3$. The one source/drain region of the reset transistor $TR3_{rst}$ is connected to the power source $V_{DD}$, while the other source/drain region functions as the third floating diffusion layer $FD_3$.

The amplification transistor $TR3_{amp}$ is constituted by a gate portion, a channel forming region, and source/drain regions. The gate portion is connected to the other source/ drain region (third floating diffusion layer $FD_3$) of the reset transistor $TR3_{rst}$. In addition, the one source/drain region is connected to the power source $V_{DD}$.

The selection transistor $TR3_{sel}$ is constituted by a gate portion, a channel forming region, and source/drain regions. The gate portion is connected to a selection line $SEL_3$. Further, the one source/drain region has a region shared with the other source/drain region constituting the amplification transistor $TR3_{amp}$. The other source/drain region is connected to a signal line (data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical driving circuit 112 constituting the driving circuit, while the signal lines (data output lines) $VSL_1$, $VSL_2$, and $VSL_3$ are connected to column signal processing circuits 113 constituting the driving circuit.

A $p^+$ layer 44 is formed between the n-type semiconductor region 43 and the surface 70A of the semiconductor substrate 70 to reduce generation of dark currents. A $p^+$ layer 42 is formed between the n-type semiconductor region 41 and the n-type semiconductor region 43. In addition, a part of a side surface of the n-type semiconductor region 43 is surrounded by the $p^+$ layer 42. A $p^+$ layer 73 is formed on a rear surface 70B side of the semiconductor substrate 70. An $HfO_2$ film 74 and an insulation material film 75 are formed on a portion extending from the $p^+$ layer 73 to a region where the contact hole portion 61 is to be formed inside the semiconductor substrate 70. Wiring is formed through a plurality of layers in the interlayer insulation layer 76, but is not depicted in the figures.

The $HfO_2$ film 74 is a film having a negative fixed charge. The film thus formed is capable of reducing generation of dark currents. Examples adoptable instead of the $HfO_2$ film include aluminum oxide ($Al_2O_3$) film, zirconium oxide ($ZrO_2$) film, tantalum oxide ($Ta_2O_5$) film, titanium oxide ($TiO_2$) film, lanthanum oxide ($La_2O_3$) film, praseodymium oxide ($Pr_2O_3$) film, cerium oxide ($CeO_2$) film, neodymium oxide ($Nd_2O_3$) film, promethium oxide ($Pm_2O_3$) film, samarium oxide ($Sm_2O_3$) film, europium oxide ($Eu_2O_3$) film, gadolinium oxide ($Gd_2O_3$) film, terbium oxide ($Tb_2O_3$) film, dysprosium oxide ($Dy_2O_3$) film, holmium oxide ($Ho_2O_3$) film, thulium oxide ($Tm_2O_3$) film, ytterbium oxide ($Yb_2O_3$) film, lutetium oxide ($Lu_2O_3$) film, yttrium oxide ($Y_2O_3$) film, hafnium nitride film, aluminum nitride film, hafnium oxynitride film, and aluminum oxynitride film. These films may be formed by CVD, PVD, ALD, or other film forming method, for example.

An operation of the stacked imaging element (first imaging element 10) including the charge accumulation electrode of Embodiment 1 will be hereinafter described with reference to FIGS. 5 and 6A. The imaging element of Embodiment 1 further includes a control unit provided on the semiconductor substrate 70 and having a driving circuit. The first electrode 21, the second electrode 22, and the charge accumulation electrode 24 are connected to the driving circuit. The potential of the first electrode 21 is here set to a potential higher than the potential of the second electrode. Specifically, for example, the first electrode 21 has a positive potential, and the second electrode 22 has a negative potential. Electrons generated by photoelectric conversion in the photoelectric conversion layer 23A are read out to the floating diffusion layer. This is applicable to other embodiments.

Figure 33:
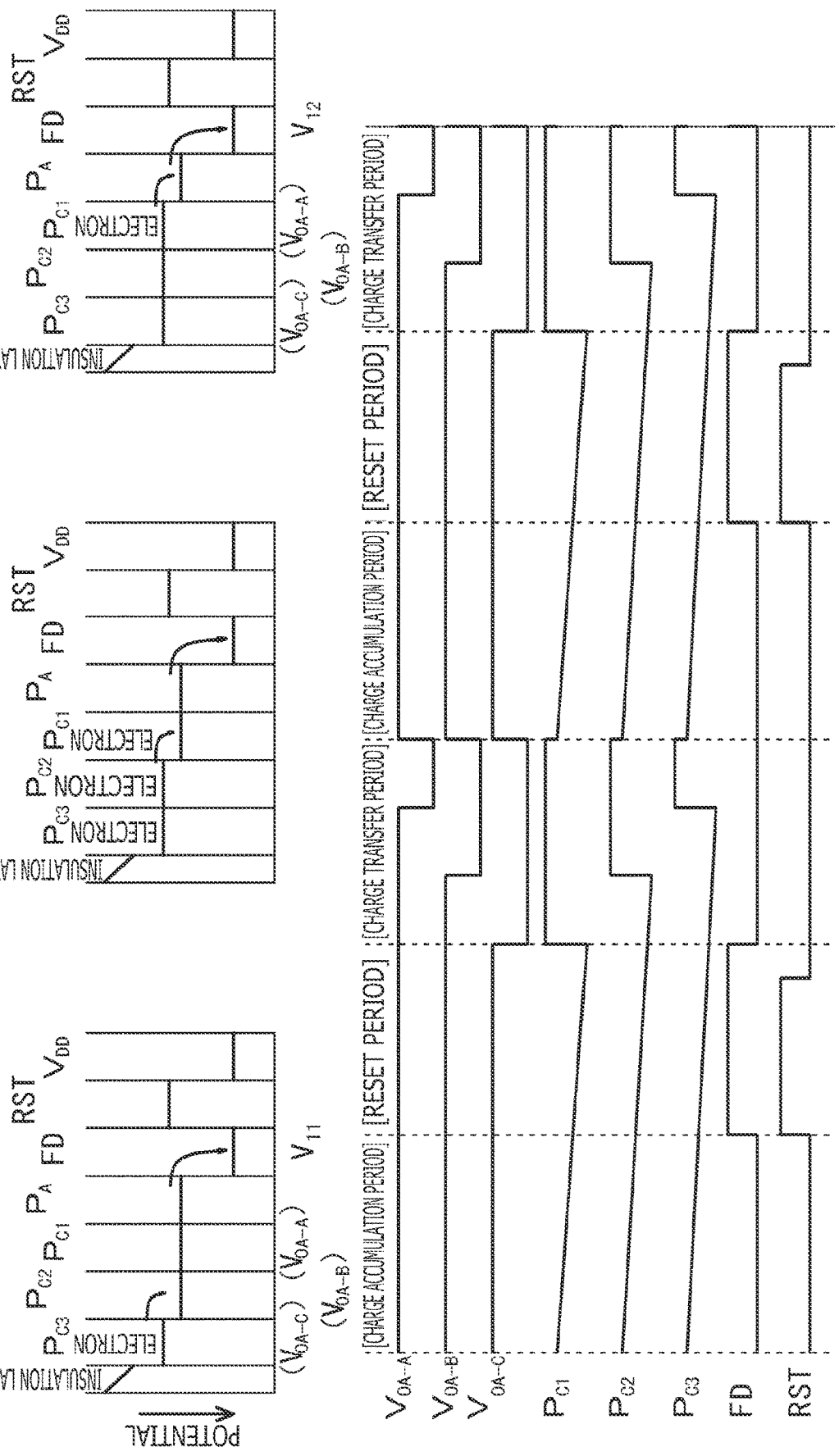
FIG. 33 is a diagram schematically depicting potential states of respective portions during another operation (transfer) of the imaging element of Embodiment 6.

Reference signs used in FIG. 5, in FIGS. 20 and 21 of Embodiment 4 described below, and in FIGS. 32 and 33 of Embodiment 6 are defined as follows.

$P_A$: a potential at a point $P_A$ in a region included in the inorganic oxide semiconductor material layer 23B and facing a region located at an intermediate position between the charge accumulation electrode 24 or a transfer control electrode (charge transfer electrode) 25 and the first electrode 21

$P_B$: a potential at a point $P_B$ in a region included in the inorganic oxide semiconductor material layer 23B and facing the charge accumulation electrode 24

$P_{C1}$: a potential at a point $P_{C1}$ in a region included in the inorganic oxide semiconductor material layer 23B and facing a charge accumulation electrode segment 24A $P_{C2}$: a potential at a point $P_{C2}$ in a region included in the inorganic oxide semiconductor material layer 23B and facing a charge accumulation electrode segment 24B $P_{C3}$: a potential at a point $P_{C3}$ included in a region of the inorganic oxide semiconductor material layer 23B and facing a charge accumulation electrode segment 24C $P_D$: a potential at a point $P_D$ in a region included in the inorganic oxide semiconductor material layer 23B and facing the transfer control electrode (charge transfer electrode) 25

FD: a potential at the first floating diffusion layer $FD_1$ $V_{OA}$: a potential at the charge accumulation electrode 24

$V_{OA-A}$: a potential at the charge accumulation electrode segment 24A $V_{OA-B}$: a potential at the charge accumulation electrode segment 24B $V_{OA-C}$: a potential at the charge accumulation electrode segment 24C $V_{OT}$: a potential at the transfer control electrode (charge transfer electrode) 25

RST: a potential at the gate portion 51 of the reset transistor $TR1_{rst}$ $V_{DD}$: a potential at the power source $VSL_1$: signal line (data output line) $VSL_1$ $TR1_{rst}$: reset transistor $TR1_{rst}$ $TR1_{amp}$: amplification transistor $TR1_{amp}$ $TR1_{sel}$: selection transistor $TR1_{sel}$ During a charge accumulation period, a potential $V_{11}$ is applied from the driving circuit to the first electrode 21, and a potential $V_{31}$ is applied from the driving circuit to the charge accumulation electrode 24. Photoelectric conversion is performed in the photoelectric conversion layer 23A by entrance of light into the photoelectric conversion layer 23A. Holes generated by the photoelectric conversion are sent from the second electrode 22 to the driving circuit via a wire $V_{OU}$. Meanwhile, the potential of the first electrode 21 is set to a potential higher than the potential of the second electrode 22, i.e., for example, a positive potential is applied to the first electrode 21, and a negative potential is applied to the second electrode 22. Accordingly, $V_{31} \geq V_{11}$, preferably $V_{31} > V_{11}$ is set. In this manner, electrodes generated by the photoelectric conversion are attracted toward the charge accumulation electrode 24, and stay in a region included in the inorganic oxide semiconductor material layer 23B, or the inorganic oxide semiconductor material layer 23B and the photoelectric conversion layer 23A (hereinafter collectively referred to as the "inorganic oxide semiconductor material layer 23B and the like") and facing the charge accumulation electrode 24. In other words, charges are accumulated in the inorganic oxide semiconductor material layer 23B and the like. In a state of $V_{31} > V_{11}$, electrodes generated within the photoelectric conversion layer 23A are not transferred toward the first electrode 21. The value of the potential at the region included in the inorganic oxide semiconductor material layer 23B and the like and facing the charge accumulation electrode 24 shifts toward the negative side with an elapse of the photoelectric conversion time.

A reset operation is performed in a latter part of the charge accumulation period. As a result, the potential of the first floating diffusion layer $FD_1$ is reset, and becomes the potential $V_{DD}$ of the power source.

After completion of the reset operation, charges are read out. Specifically, during a charge transfer period, a potential $V_{12}$ is applied from the driving circuit to the first electrode 21, and a potential $V_{32}$ is applied from the driving circuit to the charge accumulation electrode 24. A state $V_{32} < V_{12}$ is set herein. In this manner, electrodes staying in the region included in the inorganic oxide semiconductor material layer 23B and the like and facing the charge accumulation electrode 24 are read out to the first electrode 21, and further to the first floating diffusion layer $FD_1$. In other words, charges accumulated in the inorganic oxide semiconductor material layer 23B and the like are read out to the control unit.

A series of operations such as charge accumulation, reset operation, and charge transfer are now completed.

Operations of the amplification transistor $TR1_{amp}$ and the selection transistor $TR1_{sel}$ after the electrons are read out to the first floating diffusion layer $FD_1$ are similar to those operations of conventional transistors. Further, a series of operations such as charge accumulation, reset operation, and charge transfer performed by the second imaging element 11 and the third imaging element 12 are similar to a series of conventional operations such as charge accumulation, reset operation, and charge transfer. Further, removal of reset noise of the first floating diffusion layer $FD_1$ is achievable by correlated double sampling (CDS, Correlated Double Sampling) similarly to a conventional removal process of this noise.

As described above, there is provided the charge accumulation electrode disposed apart from the first electrode and so disposed as to face the photoelectric conversion layer via the insulation layer in the Embodiment 1. Accordingly, during photoelectric conversion in the photoelectric conversion layer in response to irradiation of light to the photoelectric conversion layer, a type of capacitor is formed by the inorganic oxide semiconductor material layer and the like, the insulation layer, and the charge accumulation electrode, and charges are allowed to be accumulated in the inorganic oxide semiconductor material layer and the like. Accordingly, the charge accumulation unit can fully be depleted to eliminate charges at a start of exposure. This depletion of the charge accumulation unit consequently reduces a phenomenon such as lowering of imaging quality caused by random noise deterioration according to kTC noise increase. Further, all pixels are allowed to be simultaneously reset. Accordingly, what is generally called a global shutter function is achievable.

FIG. 68 is a conceptual diagram of the solid-state imaging device of Embodiment 1. A solid-state imaging device 100 of Embodiment 1 includes an imaging region 111 where stacked imaging elements 101 are arranged in a two-dimensional array, and further includes the vertical driving circuit 112, the column signal processing circuits 113, a horizontal driving circuit 114, an output circuit 115, a driving control circuit 116, and the like as driving circuits (peripheral circuits) of the imaging region 111. Needless to say, these circuits can be constituted by known circuits, or other circuit configurations (e.g., various types of circuits included in a conventional CCD imaging device and a conventional CMOS imaging device). In FIG. 68, only one row is given a reference number "101" indicating the stacked imaging element 101.

The driving control circuit 116 generates clock signals and control signals as reference for operations of the vertical driving circuit 112, the column signal processing circuits 113, and the horizontal driving circuit 114 on the basis of vertical synchronized signals, horizontal synchronized signals, and master clocks. Thereafter, the generated clock signals and control signals are input to the vertical driving circuit 112, the column signal processing circuits 113, and the horizontal driving circuit 114.

For example, the vertical driving circuit 112 is constituted by a shift register, and sequentially selects and scans the respective stacked imaging elements 101 of the imaging region 111 in units of row in the vertical direction. In addition, a pixel signal (image signal) based on a current (signal) generated according to a light reception amount at each of the stacked imaging elements 101 is sent to the corresponding column signal processing circuit 113 via the signal line (data output line) 117 and VSL.

For example, the column signal processing circuits 113 are provided one for each column of the stacked imaging elements 101, and each perform signal processing of noise removal and signal amplification for image signals output from one row of the stacked imaging elements 101 for each imaging element according to a signal received from a black reference pixel (not depicted but formed around the effective pixel region). A horizontal selection switch (not depicted) is provided and connected between each output stage of the column signal processing circuit 113 and the horizontal signal line 118.

For example, the horizontal driving circuit 114 is constituted by a shift register, and sequentially outputs a horizontal scanning pulse to sequentially select the respective column signal processing circuits 113 and output a signal received from each of the column signal processing circuits 113 to the horizontal signal line 118.

The output circuit 115 performs signal processing for signals sequentially supplied from the respective column signal processing circuits 113 via the horizontal signal line 118, and outputs the processed signals.

Figure 9:
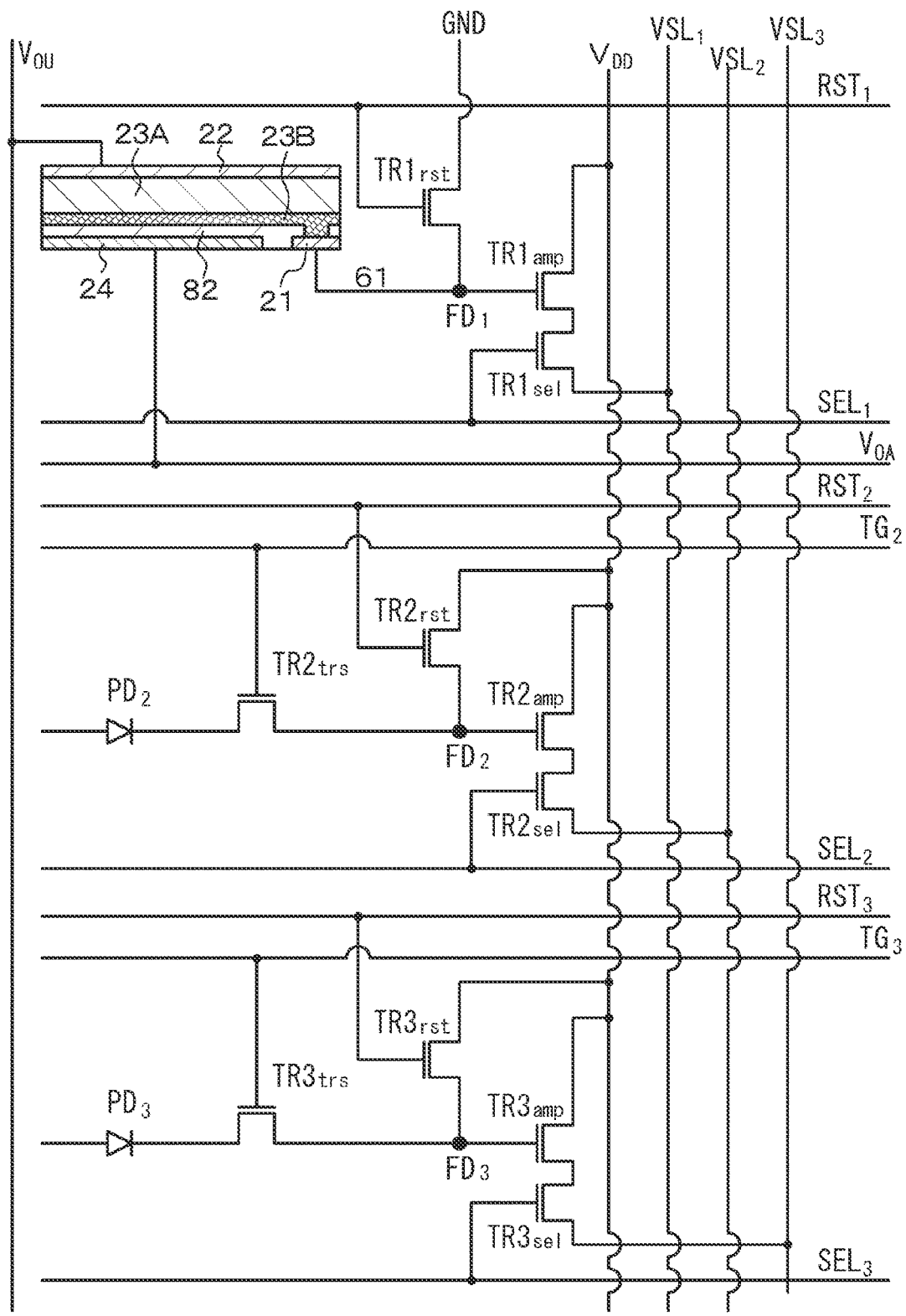
FIG. 9 is an equivalent circuit diagram of a modification of the imaging element of Embodiment 1.
Figure 10:
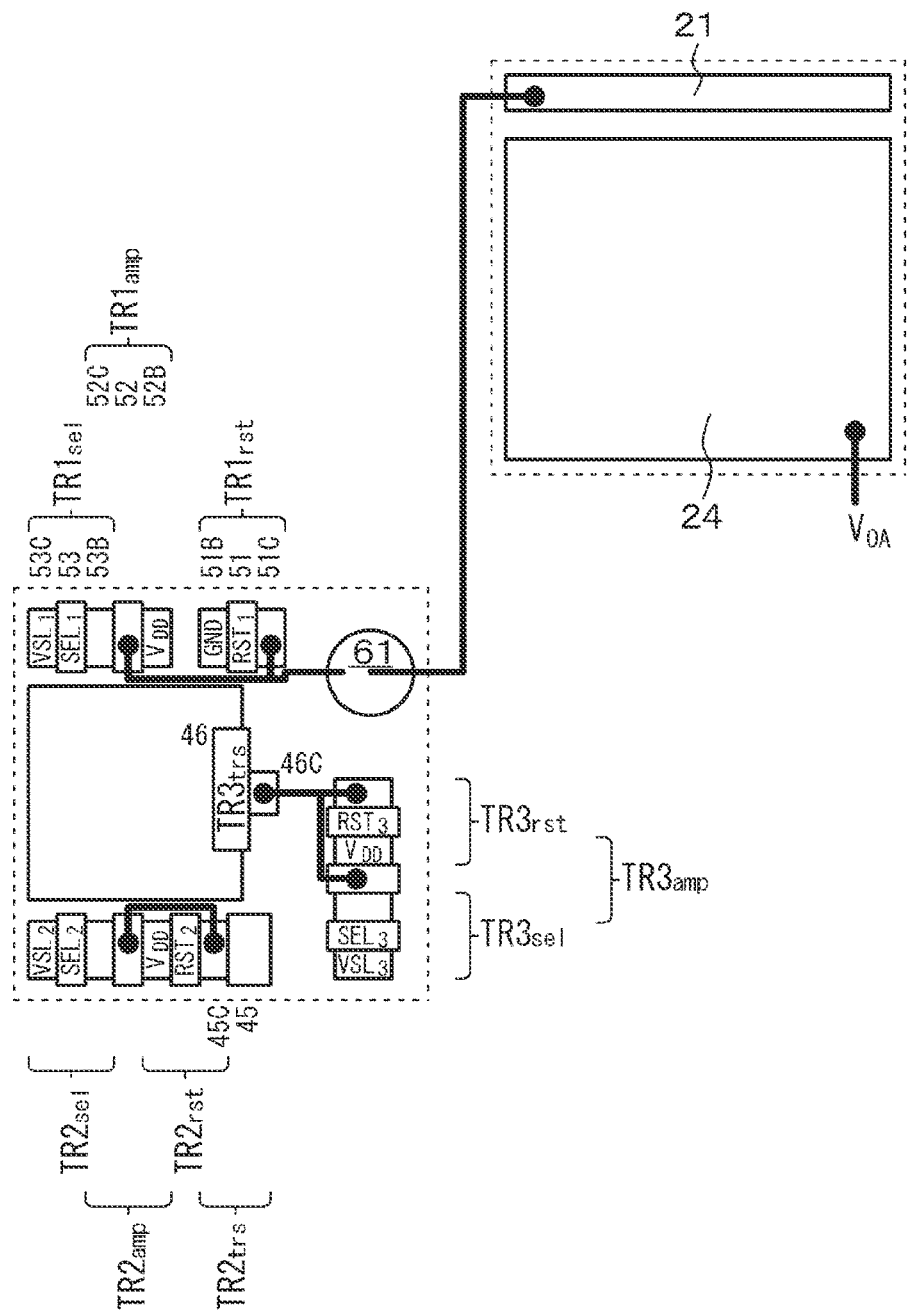
FIG. 10 is a schematic arrangement diagram of a first electrode, a charge accumulation electrode, and transistors constituting a control unit included in the modification of the imaging element of Embodiment 1 depicted in FIG. 9.

FIG. 9 is an equivalent circuit diagram of a modification of the imaging element and the stacked imaging element of Embodiment 1. As depicted in a schematic arrangement diagram of a first electrode, a charge accumulation electrode, and transistors constituting a control unit in FIG. 10, the other source/drain region 51B of the reset transistor $TR1_{rst}$ may be grounded rather than connected to the power source $V_{DD}$.

For example, the imaging element and the stacked imaging element of Embodiment 1 can be manufactured by a following method. Specifically, an SOI substrate is initially prepared. Subsequently, a first silicon layer is formed on a surface of the SOI substrate by epitaxial growth. The p+ layer 73 and the n-type semiconductor region 41 are formed on the first silicon layer. Thereafter, a second silicon layer is formed on the first substrate by epitaxial growth. The element separation region 71, the oxide film 72, the $p^+$ layer 42, the n-type semiconductor region 43, and the $p^+$ layer 44 are formed on the second silicon layer. In addition, various types of transistors and the like constituting the control unit of the imaging element are formed on the second silicon layer, and the wiring layer 62, the interlayer insulation layer 76, and respective types of wiring are further formed on the transistors and the like. Then, the interlayer insulation layer 76 and a support substrate (not depicted) are affixed to each other. Thereafter, the SOI substrate is removed to allow exposure of the first silicon layer. A surface of the second silicon layer corresponds to the surface 70A of the semiconductor substrate 70, while a surface of the first silicon layer corresponds to the rear surface 70B of the semiconductor substrate 70. In addition, the first silicon layer and the second silicon layer are collectively expressed as the semiconductor substrate 70. Subsequently, an opening is formed on the rear surface 70B side of the semiconductor substrate 70 to form the contact hole portion 61. The HfO$_2$ film 74, the insulation material film 75, and the contact hole portion 61 are formed. Further, the pad portions 63 and 64, the interlayer insulation layer 81, the connection holes 65 and 66, the first electrode 21, the charge accumulation electrode 24, and the insulation layer 82 are formed. Then, the connection portion 67 is opened, and the inorganic oxide semiconductor material layer 23B, the photoelectric conversion layer 23A, the second electrode 22, the protection layer 83, and the on-chip micro-lens 14 are formed. The imaging element and the stacked imaging element of Embodiment 1 can be obtained in the manner described above.

In addition, while not depicted in the figure, the insulation layer 82 may have a double-layer configuration constituted by an insulation lower layer and an insulation upper layer. Specifically, it is sufficient if the insulation layer 82 is produced by forming the insulation lower layer at least on the charge accumulation electrode 24, or in a region between the charge accumulation electrode 24 and the first electrode 21 (more specifically, forming the insulation lower layer on the interlayer insulation layer 81 including the charge accumulation electrode 24), flattening the insulation lower layer, and then forming the insulation upper layer on the insulation lower layer and the charge accumulation electrode 24. In this manner, sufficient flatness of the insulation layer 82 can reliably be obtained. Then, it is sufficient if the connection portion 67 is opened in the insulation layer 82 thus formed.

Embodiment 2

Figure 11:
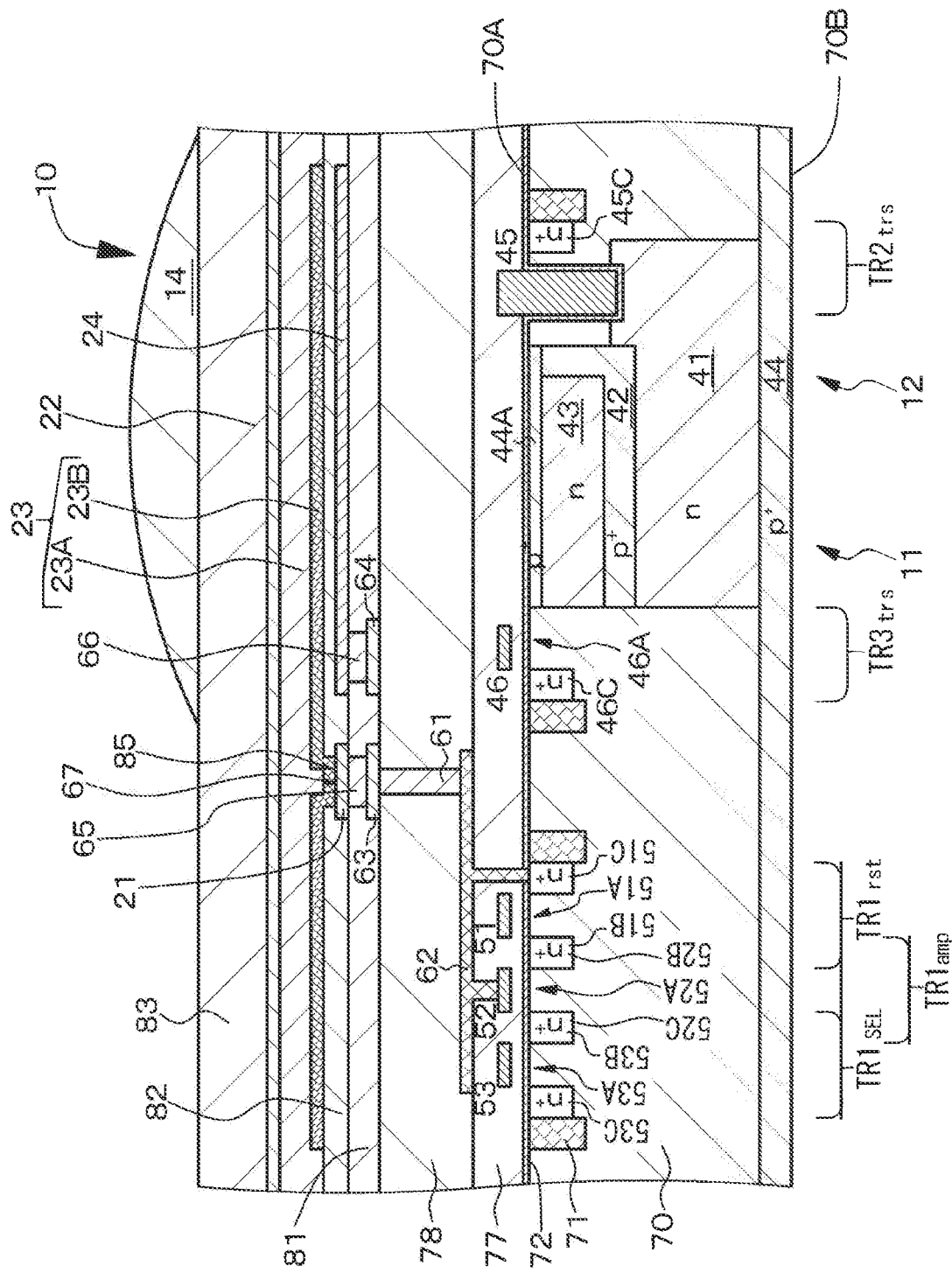
FIG. 11 is a schematic partial cross-sectional diagram of an imaging element of Embodiment 2.

Embodiment 2 is a modification of Embodiment 1. An imaging element and a stacked imaging element of Embodiment 2 as depicted in a schematic partial cross-sectional diagram of FIG. 11 is a front-illuminated imaging element and a front-illuminated stacked imaging element, respectively, and has a structure of three stacked imaging elements constituted by the first type green light imaging element of Embodiment 1 (first imaging element 10) having sensitivity to green light and including the first type green light photoelectric conversion layer for absorbing green light, the second type conventional blue light imaging element (second imaging element 11) having sensitivity to blue light and including the second type blue light photoelectric conversion layer for absorbing blue light, and the second type conventional red light imaging element (third imaging element 12) having sensitivity to red light and including the second type red light photoelectric conversion layer for absorbing red light. The red light imaging element (third imaging element 12) and the blue light imaging element (second imaging element 11) are provided within the semiconductor substrate 70. The second imaging element 11 is located closer to the light entrance side than the third imaging element 12 is. In addition, the green light imaging element (first imaging element 10) is provided above the blue light imaging element (second imaging element 11).

Various types of transistors constituting a control unit are provided on the front surface 70A side of the semiconductor substrate 70 similarly to Embodiment 1. These transistors have configurations and structures substantially similar to those of the transistors described in Embodiment 1. Further, the second imaging element 11 and the third imaging element 12 are provided on the semiconductor substrate 70. These imaging elements may also have configurations and structures substantially similar to those of the second imaging element 11 and the third imaging element 12 described in Embodiment 1.

The interlayer insulation layer 81 is formed above the surface 70A of the semiconductor substrate 70. The first electrode 21, the inorganic oxide semiconductor material layer 23B, the photoelectric conversion layer 23A, and the second electrode 22, and further the charge accumulation electrode 24 and others are provided above the interlayer insulation layer 81 similarly to the imaging element of Embodiment 1.

As apparent from above, the imaging element and the stacked imaging element of Embodiment 2 are allowed to have configurations and structures similar to the configurations and the structures of the imaging element and the stacked imaging element of Embodiment 1 except for a point that the front-illuminated type is adopted. Accordingly, detailed description is omitted.

Embodiment 3

Embodiment 3 is a modification of Embodiment 1 and Embodiment 2.

Figure 12:
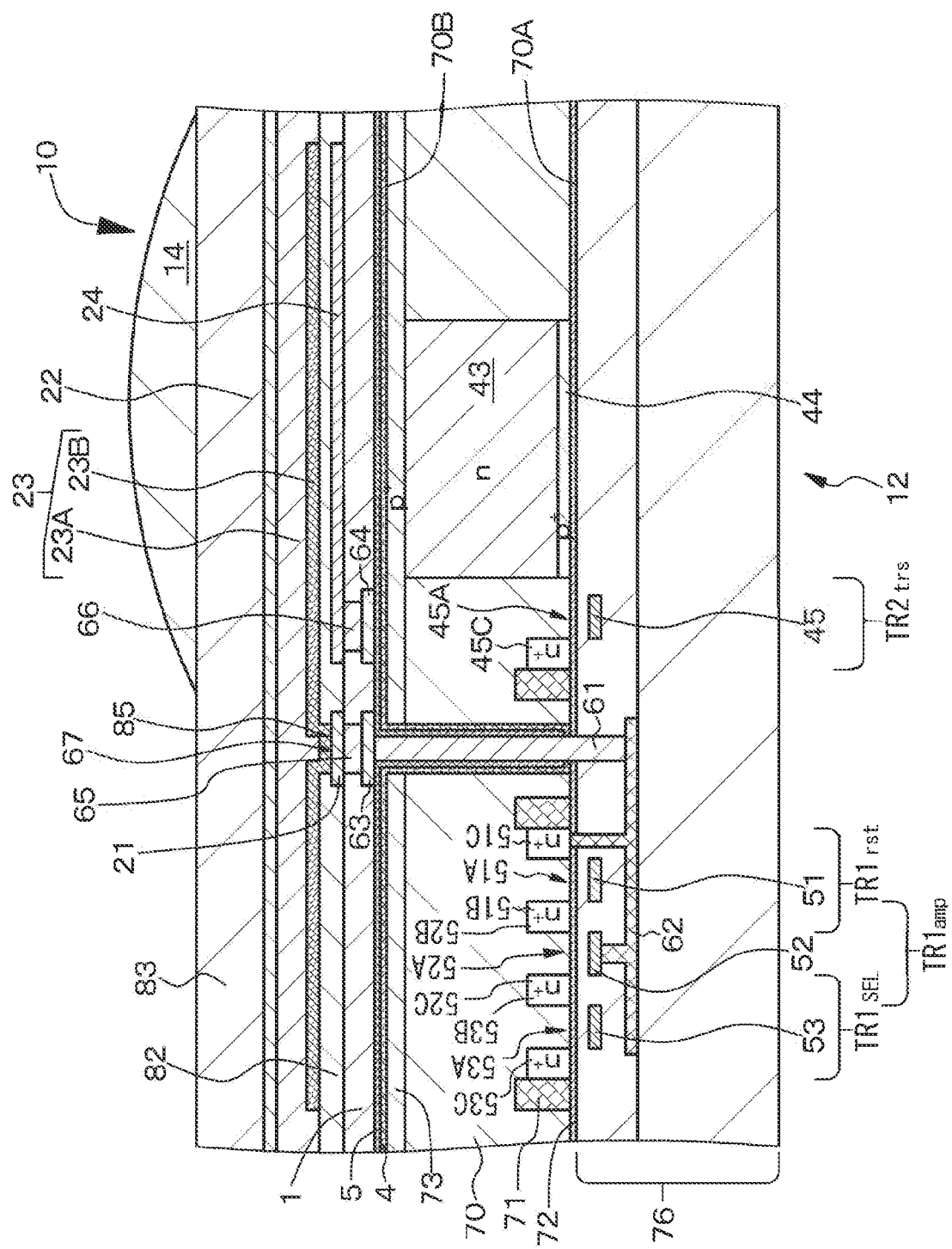
FIG. 12 is a schematic partial cross-sectional diagram of an imaging element of Embodiment 3.
Figure 13:
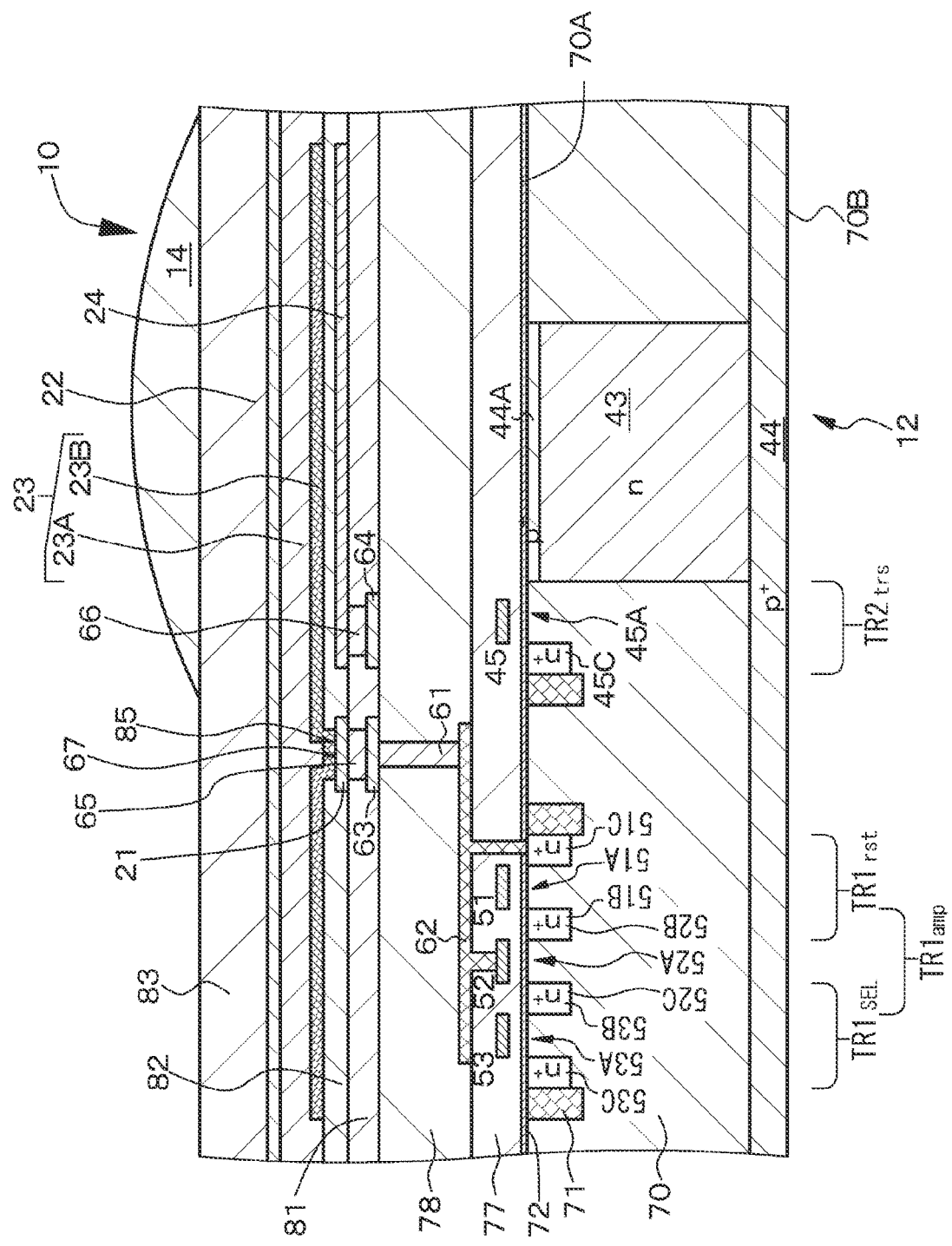
FIG. 13 is a schematic partial cross-sectional diagram of a modification of the imaging element of Embodiment 3.

An imaging element and a stacked imaging element of Embodiment 3 as depicted in a schematic partial cross-sectional diagram of FIG. 12 is a back-illuminated imaging element and a back-illuminated stacked imaging element, respectively, and has a structure of two stacked imaging elements constituted by the light imaging element 10 of the first type of Embodiment 1, and the third imaging element 12 of the second type. In addition, an imaging element and a stacked imaging element as a modification of Embodiment 3 as depicted in a schematic partial cross-sectional diagram of FIG. 13 is a front-illuminated imaging element and a front-illuminated stacked imaging element, respectively, and has a structure of two stacked imaging elements constituted by the light imaging element 10 of the first type of Embodiment 1, and the third imaging element 12 of the second type. The first imaging element 10 here absorbs lights in primary colors, while the third imaging element 12 absorbs lights in complementary colors. Alternatively, the first imaging element 10 absorbs white light, while the third imaging element 12 absorbs infrared light.

Figure 14:
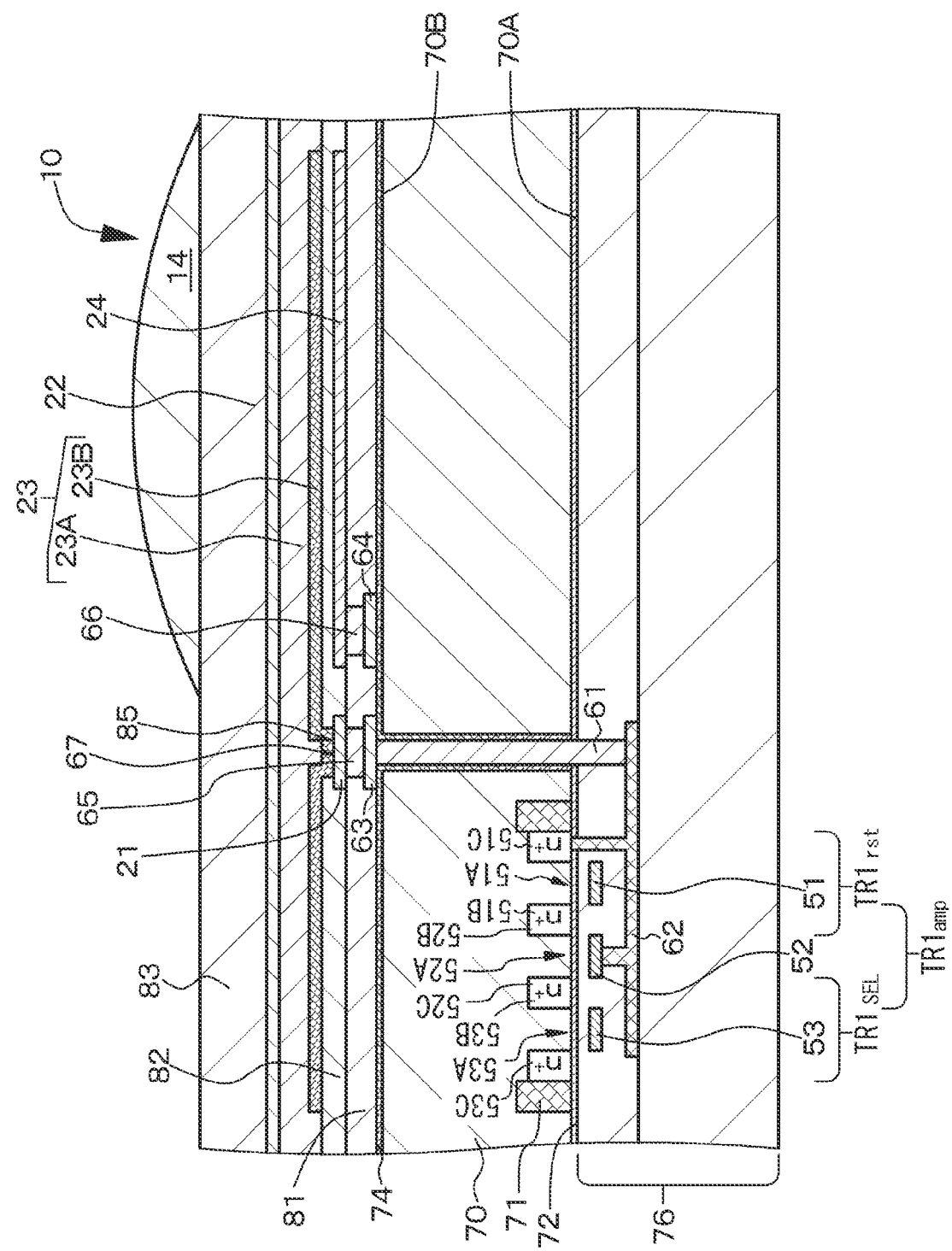
FIG. 14 is a schematic partial cross-sectional diagram of another modification of the imaging element of Embodiment 3.
Figure 15:
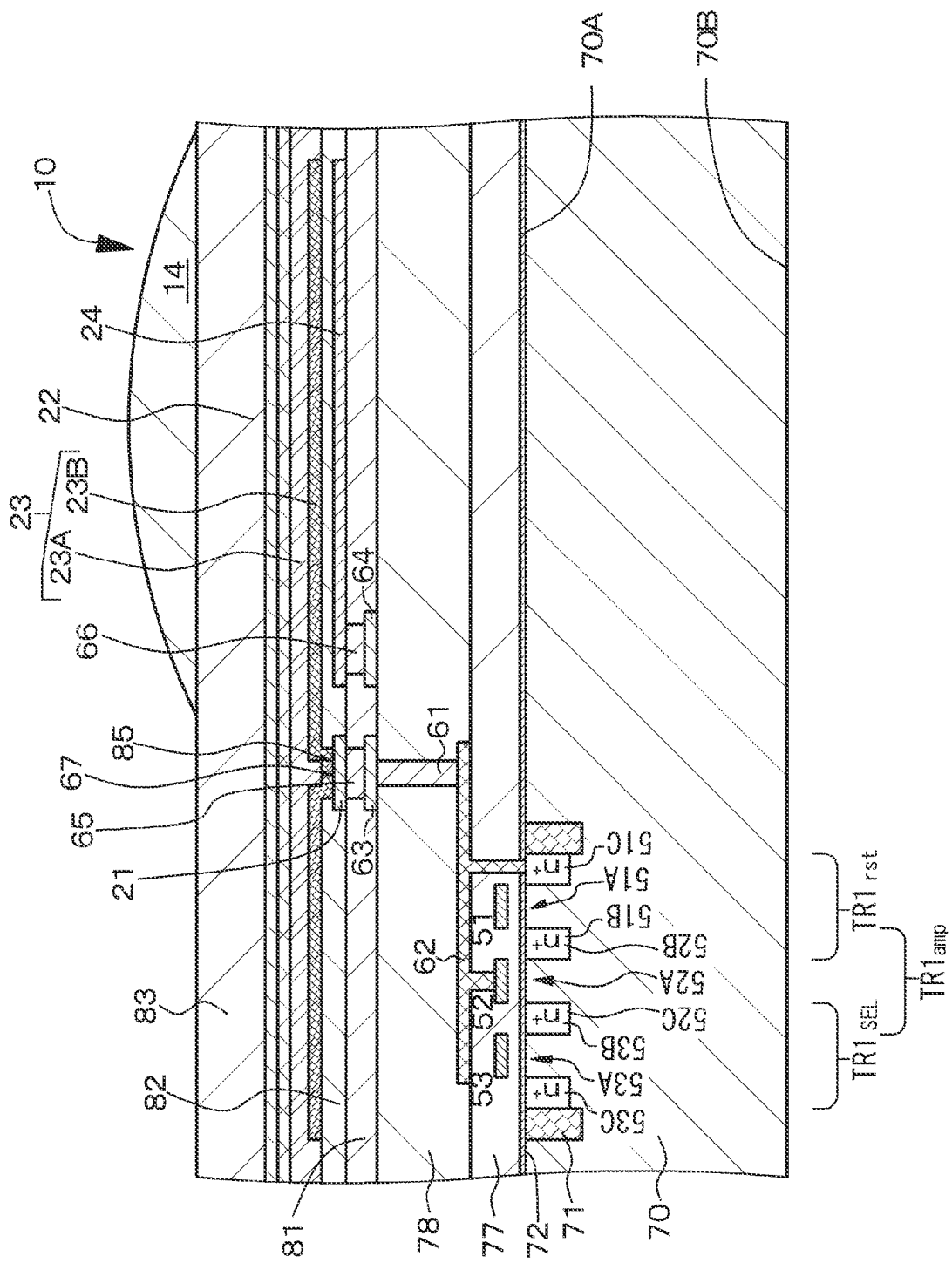
FIG. 15 is a schematic partial cross-sectional diagram of a further modification of the imaging element of Embodiment 3.

An imaging element as a modification of Embodiment 3 as depicted in a schematic partial cross-sectional diagram of FIG. 14 is a back-illuminated imaging element, and constituted by the first imaging element 10 of the first type of Embodiment 1. Further, an imaging element as a modification of Embodiment 3 as depicted in a schematic partial cross-sectional diagram of FIG. 15 is a front-illuminated imaging element, and constituted by the first imaging element 10 of the first type of Embodiment 1. The first imaging element 10 here includes three types of imaging elements constituted by an imaging element absorbing red light, an imaging element absorbing green light, and an imaging element absorbing blue light. Further, the solid-state imaging device according to the first aspect of the present disclosure includes a plurality of the imaging elements described above. For example, the plurality of imaging elements may be arranged in Bayer array. Color filter layers for dispersing light into blue light, green light, and red light are disposed on the light entrance side of each of the imaging elements as necessary.

Instead of providing the one imaging element of the first type of Embodiment 1, a two-stacked mode (specifically, two photoelectric conversion units are stacked, and control units of the two photoelectric conversion units are provided on the semiconductor substrate), or a three-stacked mode (specifically, three photoelectric conversion units are stacked, and control units of the three photoelectric conversion units are provided on the semiconductor substrate) may be adopted. Stacked structure examples of the first type imaging elements and the second type imaging elements are presented in a following table by way of example.

|  | first type | second type |
|---|---|---|
| back-illuminated type and front-illuminated type | 1<br>green<br>1<br>primary color<br>1<br>white<br>1<br>blue, green, or red<br>2<br>green + infrared<br>2<br>green + blue<br>2<br>white + infrared<br>3<br>green + blue + red<br>3<br>green + blue + red<br>3<br>blue + green + red | 2<br>blue + red<br>1<br>complementary color<br>1<br>infrared<br>0<br><br>2<br>blue + red<br>1<br>red<br>0<br><br>2<br>blue green (emerald color) + infrared<br>1<br>infrared<br>0 |

Embodiment 4

Figure 6B:
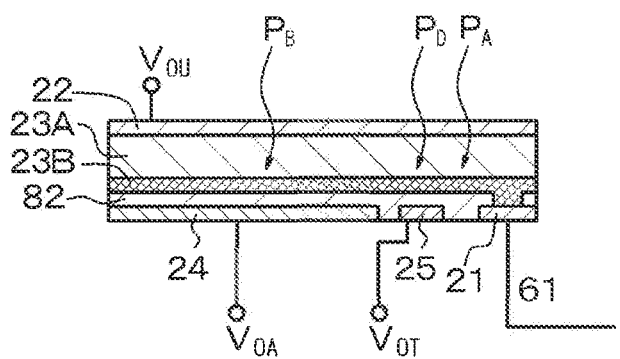
Figure 16:
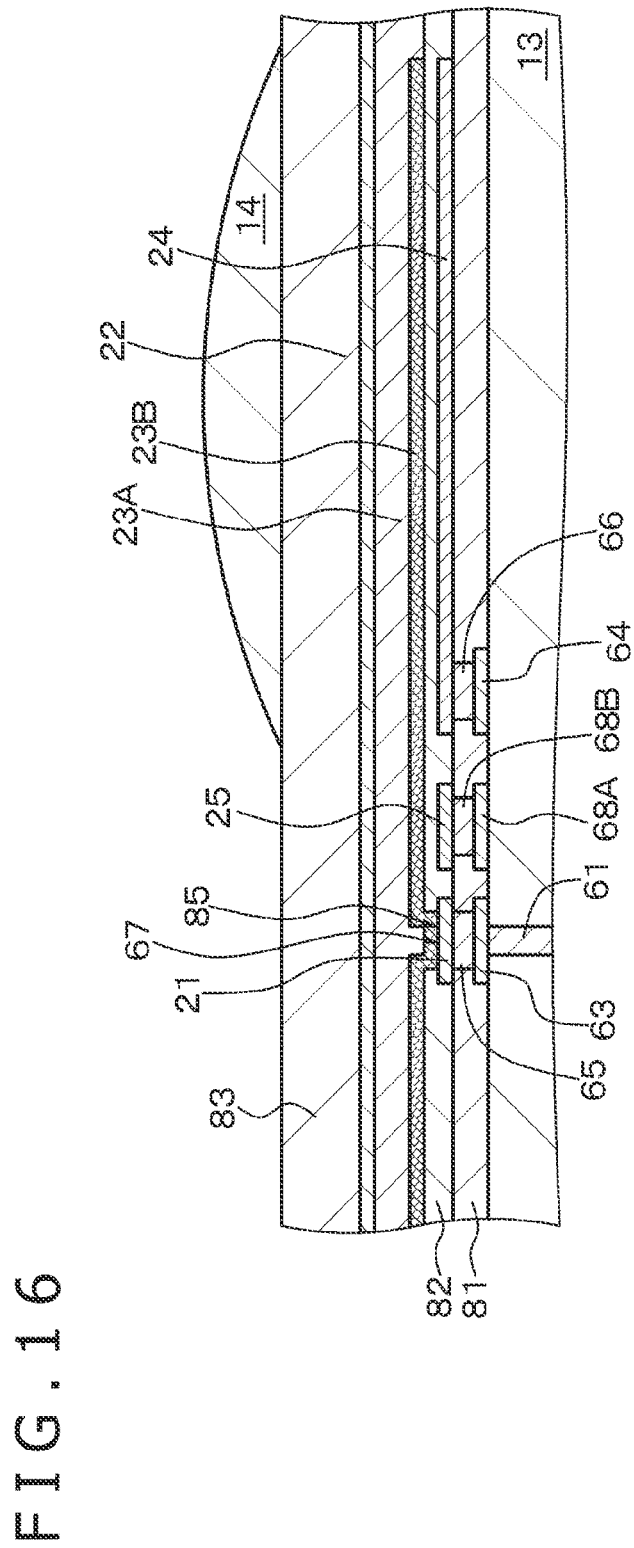
FIG. 16 is a schematic partial cross-sectional diagram of a part of an imaging element of Embodiment 4.
Figure 17:
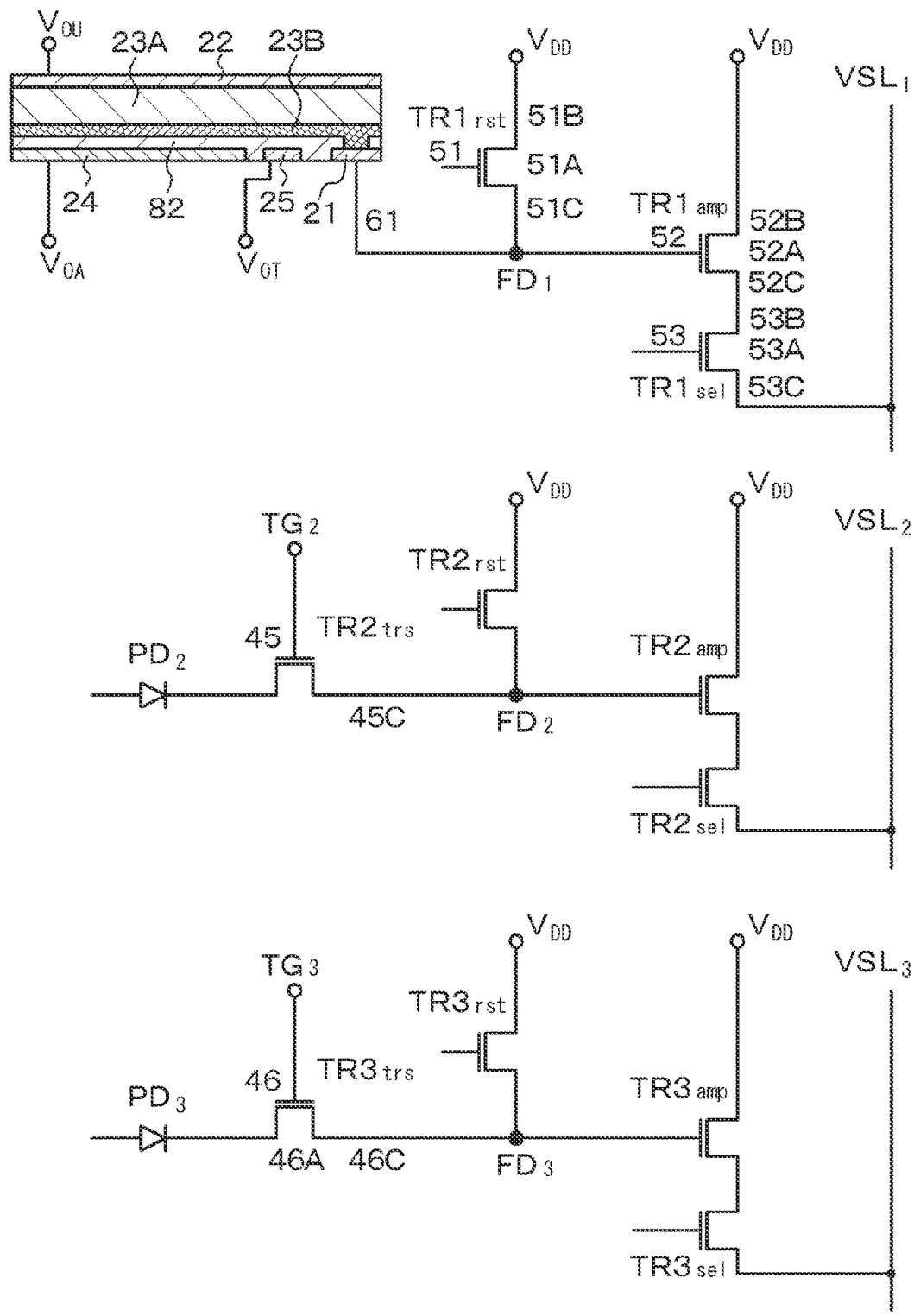
FIG. 17 is an equivalent circuit diagram of the imaging element of Embodiment 4.
Figure 18:
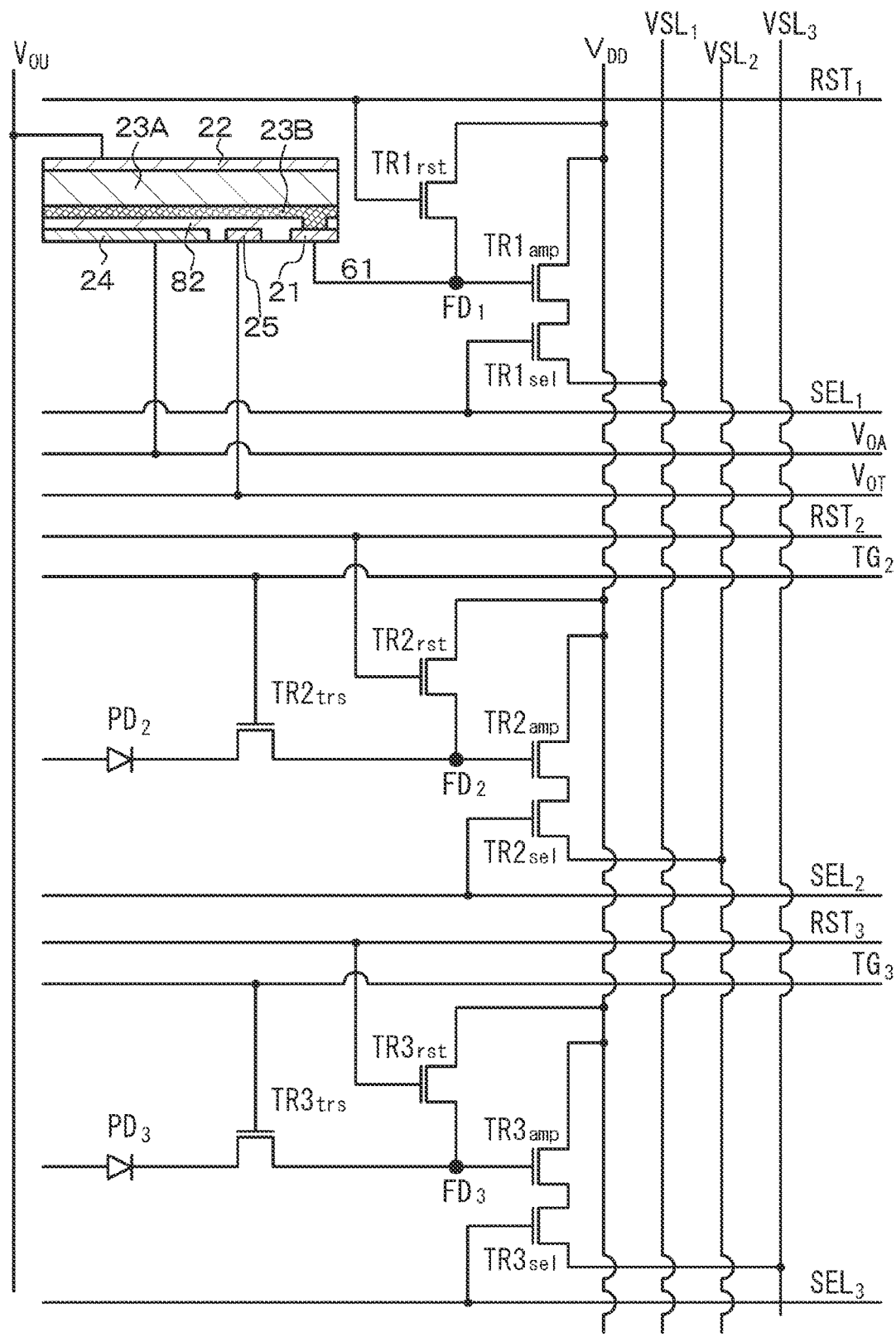
FIG. 18 is another equivalent circuit diagram of the imaging element of Embodiment 4.
Figure 19:
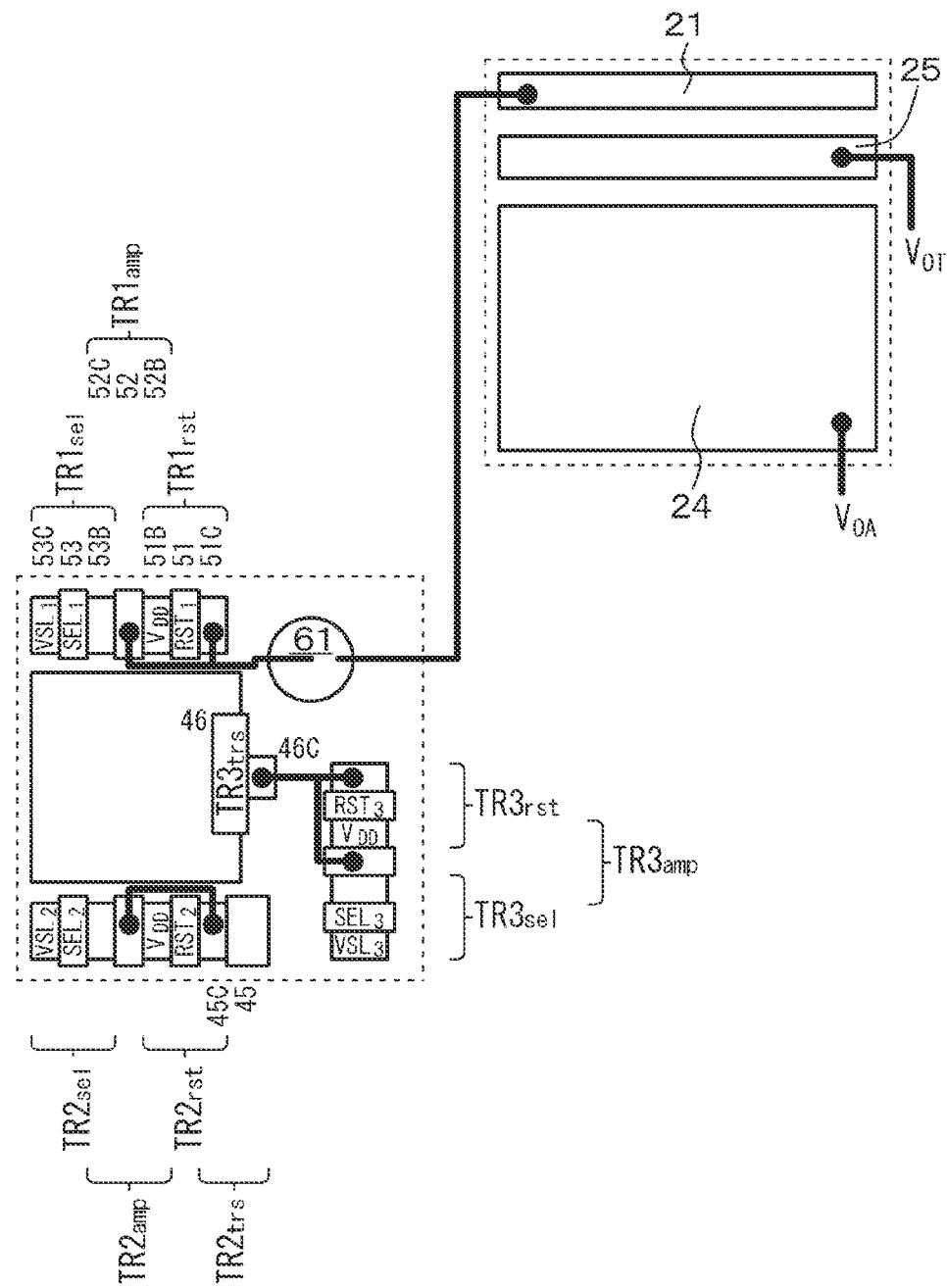
FIG. 19 is a schematic arrangement diagram of a first electrode, a transfer control electrode, a charge accumulation electrode, and transistors constituting a control unit included in the imaging element of Embodiment 4.
Figure 22:
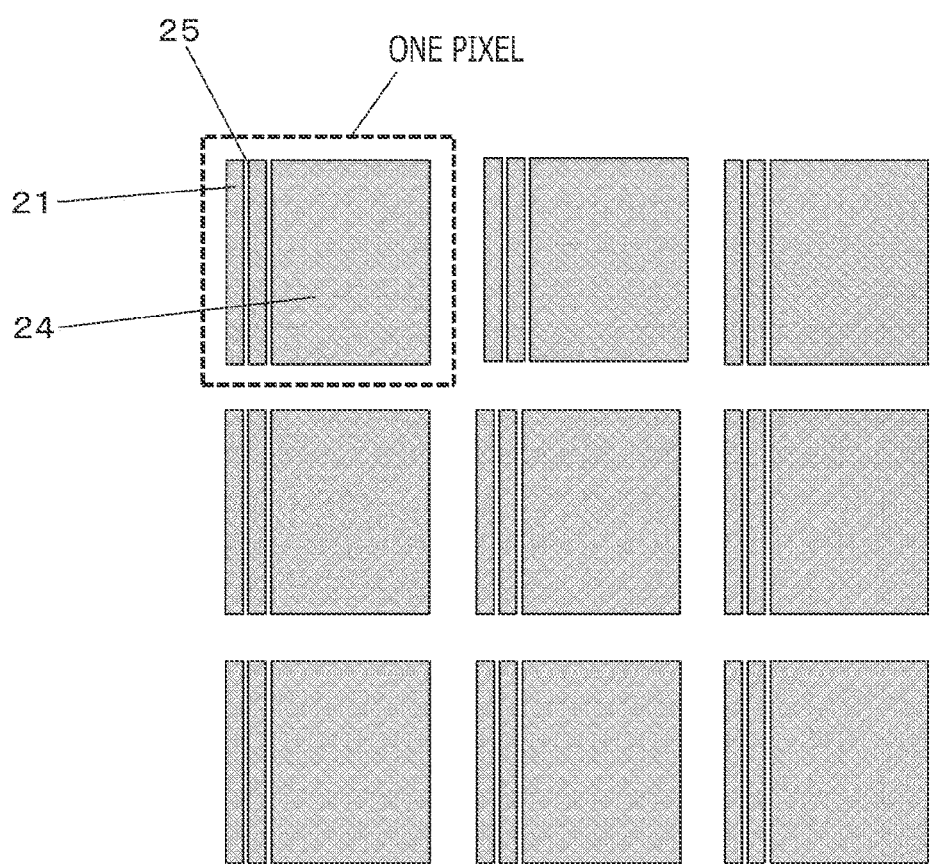
FIG. 22 is a schematic arrangement diagram of a first electrode, a transfer control electrode, and a charge accumulation electrode constituting the imaging element of Embodiment 4.
Figure 23:
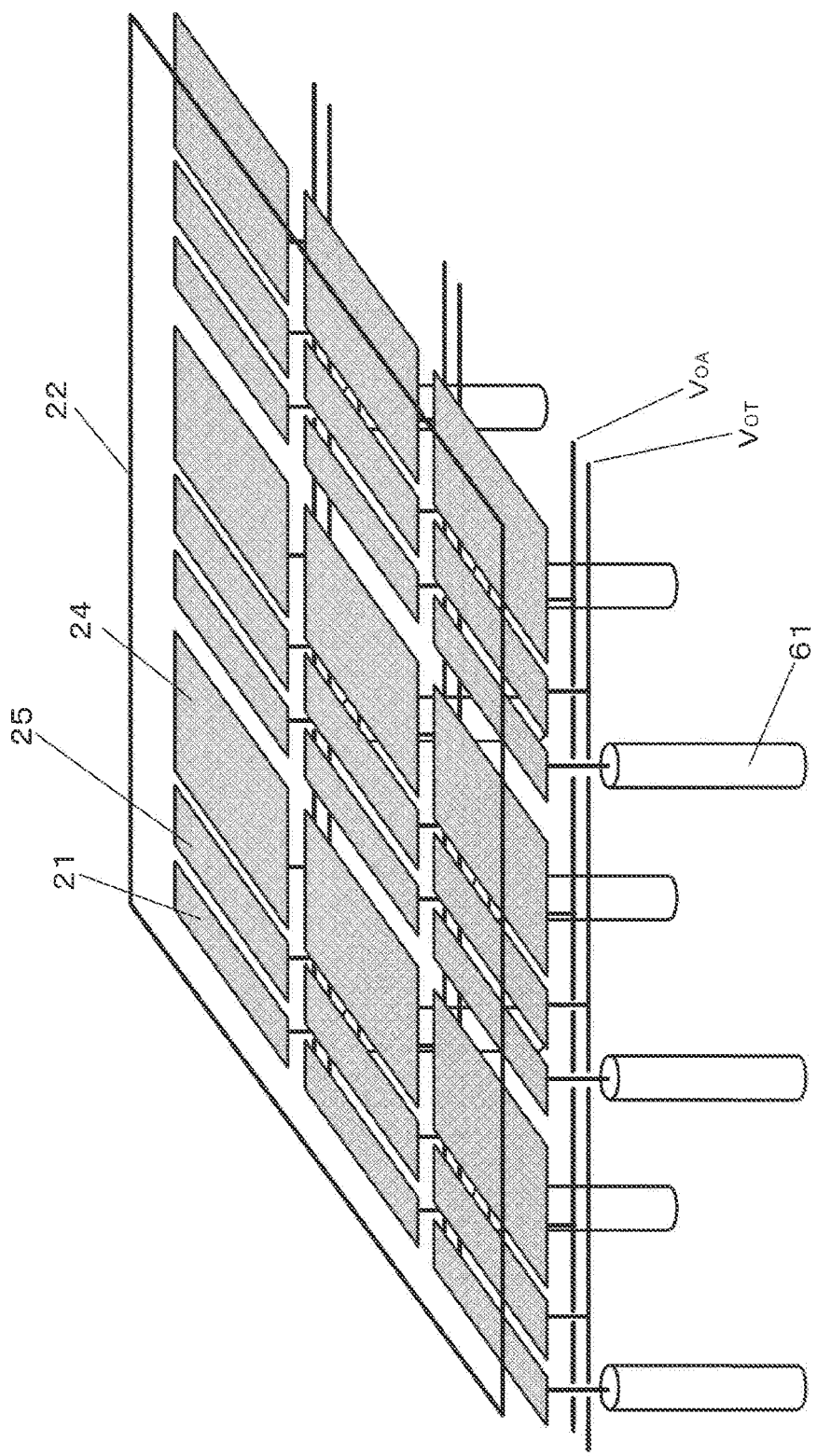
FIG. 23 is a schematic see-through perspective diagram of the first electrode, the transfer control electrode, the charge accumulation electrode, a second electrode, and a contact hole portion constituting the imaging element of Embodiment 4.

Embodiment 4 is a modification of Embodiment 1 to Embodiment 3, and relates to an imaging element and the like including a transfer control electrode (charge transfer electrode) of the present disclosure. FIG. 16 is a schematic partial cross-sectional diagram of a part of the imaging element and the stacked imaging element of Embodiment 4. FIGS. 17 and 18 are equivalent circuit diagrams of the imaging element and the stacked imaging element of Embodiment 4. FIG. 19 is a schematic arrangement diagram of a first electrode, a transfer control electrode, a charge accumulation electrode, and transistors constituting a control unit included in the imaging element of Embodiment 4, and transistors constituting a control unit, FIGS. 20 and 21 schematically depict potential states of respective portions of the imaging element of Embodiment 4 during an operation, and FIG. 6B is an equivalent circuit diagram for explaining the respective portions of the imaging element of Embodiment 4. Further, FIG. 22 is a schematic arrangement diagram of the first electrode, the transfer control electrode, and the charge accumulation electrode constituting the photoelectric conversion unit of the imaging element of Embodiment 4. FIG. 23 is a schematic see-through perspective diagram of the first electrode, the transfer control electrode, the charge accumulation electrode, a second electrode, and a contact hole portion.

According to the imaging element and the stacked imaging element of Embodiment 4, the transfer control electrode (charge transfer electrode) 25 is further disposed between the first electrode 21 and the charge accumulation electrode 24 at positions apart from the first electrode 21 and the charge accumulation electrode 24, and so disposed as to face the inorganic oxide semiconductor material layer 23B via the insulation layer 82. The transfer control electrode 25 is connected to a pixel driving circuit constituting a driving circuit via a connection hole 68B, a pad portion 68A, and a wire $V_{OT}$ formed within the interlayer insulation layer 81. Note that various types of imaging element components located below the interlayer insulation layer 81 are collectively indicated by a reference number 13 for simplification of the drawings for convenience in each of FIGS. 16, 25, 28, 37, 43, 46A, 46B, 47A, 47B, 66, and 67.

An operation of the imaging element (first imaging element 10) of Embodiment 4 will be hereinafter described with reference to FIGS. 20 and 21. Note that FIGS. 20 and 21 are different from each other particularly in values of a potential applied to the charge accumulation electrode 24 and a potential at the point $P_D$.

During a charge accumulation period, a potential $V_{11}$ is applied from the driving circuit to the first electrode 21, a potential $V_{31}$ is applied from the driving circuit to the charge accumulation electrode 24, and a potential $V_{51}$ is applied from the driving circuit to the transfer control electrode 25. Photoelectric conversion is performed in the photoelectric conversion layer 23A by entrance of light into the photoelectric conversion layer 23A. Holes generated by the photoelectric conversion are sent from the second electrode 22 to the driving circuit via the wire $V_{OU}$. Meanwhile, the potential of the first electrode 21 is higher than the potential of the second electrode 22, i.e., for example, a positive potential is applied to the first electrode 21, and a negative potential is applied to the second electrode 22. Accordingly, $V_{31} > V_{51}$ (e.g., $V_{31} > V_{11} > V_{51}$, or $V_{11} > V_{31} > V_{51}$) is set. In this manner, electrodes generated by the photoelectric conversion are attracted toward the charge accumulation electrode 24, and stay in a region included in the inorganic oxide semiconductor material layer 23B and the like and facing the charge accumulation electrode 24. In other words, charges are accumulated in the inorganic oxide semiconductor material layer 23B and the like. In the state of $V_{31} > V_{51}$, transfer of electrodes generated within the photoelectric conversion layer 23A toward the first electrode 21 can reliably be prevented. The value of the potential at the region included in the inorganic oxide semiconductor material layer 23B and the like and facing the charge accumulation electrode 24 shifts toward the negative side with an elapse of the photoelectric conversion time.

A reset operation is performed in a latter part of the charge accumulation period. As a result, the potential of the first floating diffusion layer $FD_1$ is reset, and becomes the potential $V_{DD}$ of the power source.

After completion of the reset operation, charges are read out. Specifically, during a charge transfer period, a potential $V_{12}$ is applied from the driving circuit to the first electrode 21, a potential $V_{32}$ is applied from the driving circuit to the charge accumulation electrode 24, and a potential $V_{52}$ is applied from the driving circuit to the transfer control electrode 25. In this case, $V_{32} \leq V_{52} \leq V_{12}$ (preferably $V_{32} < V_{52} < V_{12}$). In this manner, electrodes staying in the region included in the inorganic oxide semiconductor material layer 23B and the like and facing the charge accumulation electrode 24 are reliably read out to the first electrode 21, and further to the first floating diffusion layer $FD_1$. In other words, charges accumulated in the inorganic oxide semiconductor material layer 23B and the like are read out to the control unit.

A series of operations such as charge accumulation, reset operation, and charge transfer are now completed.

Operations of the amplification transistor $TR1_{amp}$ and the selection transistor $TR1_{sel}$ after the electrons are read out to the first floating diffusion layer $FD_1$ are the same as those operations of conventional transistors. Further, for example, a series of operations such as charge accumulation, reset operation, and charge transfer performed by the second imaging element 11 and the third imaging element 12 are similar to a series of conventional operations such as charge accumulation, reset operation, and charge transfer.

Figure 24:
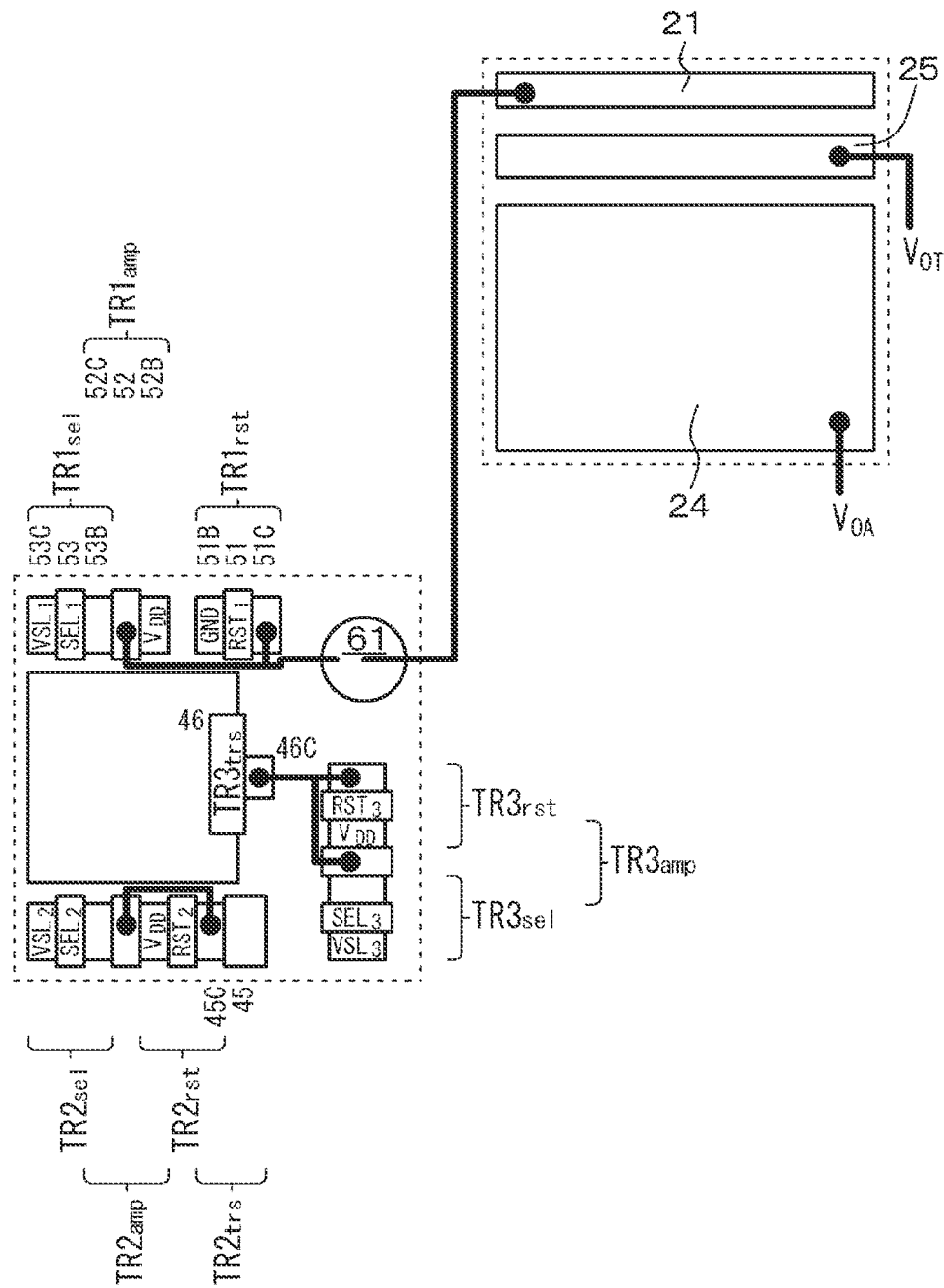
FIG. 24 is a schematic arrangement diagram of a first electrode, a transfer control electrode, a charge accumulation electrode, and transistors constituting a control unit included in a modification of the imaging element of Embodiment 4.

As depicted in a schematic arrangement diagram of a first electrode, a charge accumulation electrode, and transistors constituting a control unit constituting a modification of the imaging element of Embodiment 4 in FIG. 24, the other source/drain region 51B of the reset transistor $TR1_{rst}$ may be grounded rather than connected to the power source $V_{DD}$.

Embodiment 5

Figure 25:
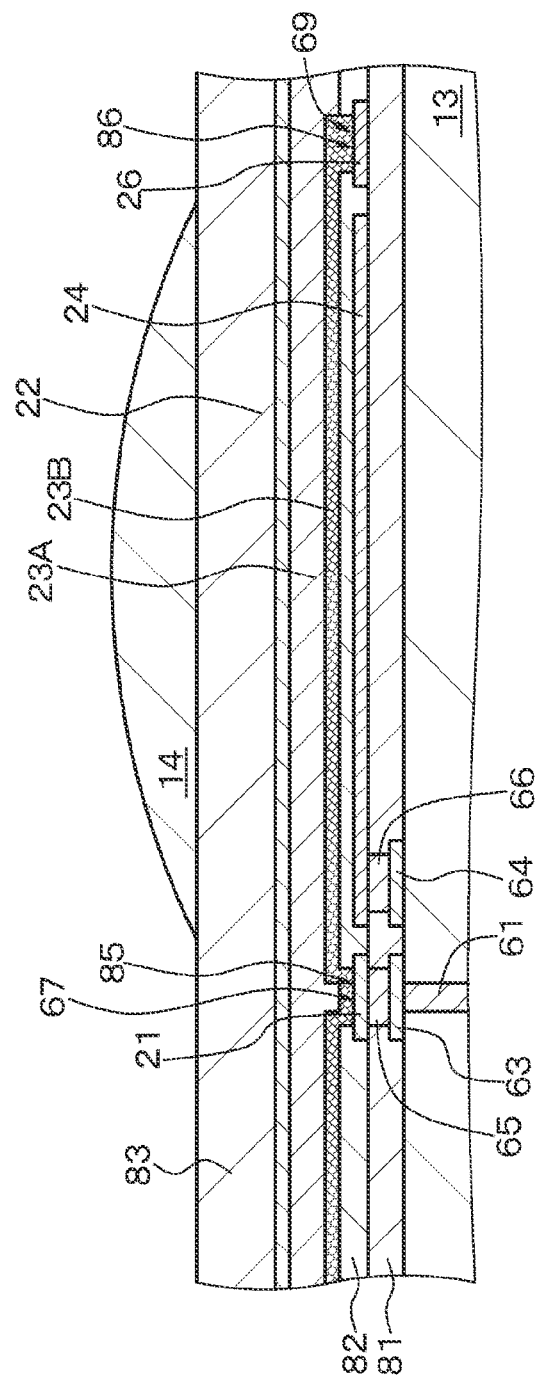
FIG. 25 is a schematic partial cross-sectional diagram of a part of an imaging element of Embodiment 5.
Figure 26:
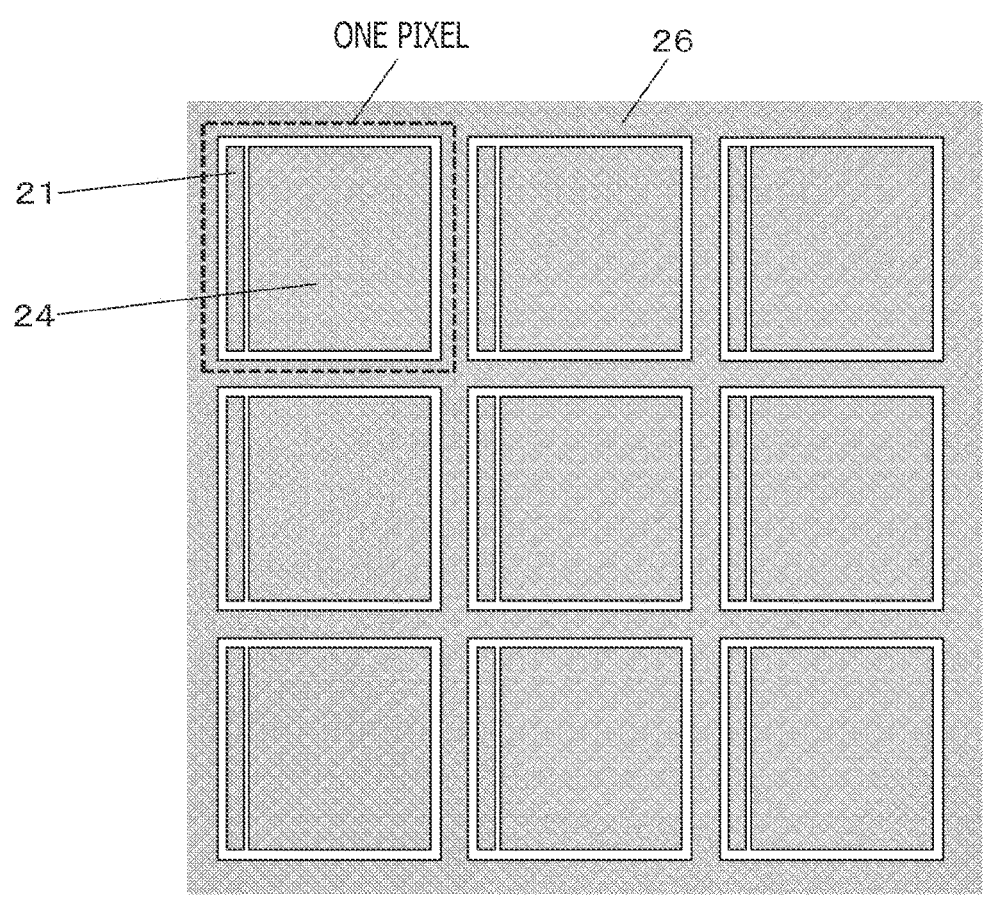
FIG. 26 is a schematic arrangement diagram of a first electrode, a charge accumulation electrode, and a charge discharge electrode constituting the imaging element of Embodiment 5.
Figure 27:
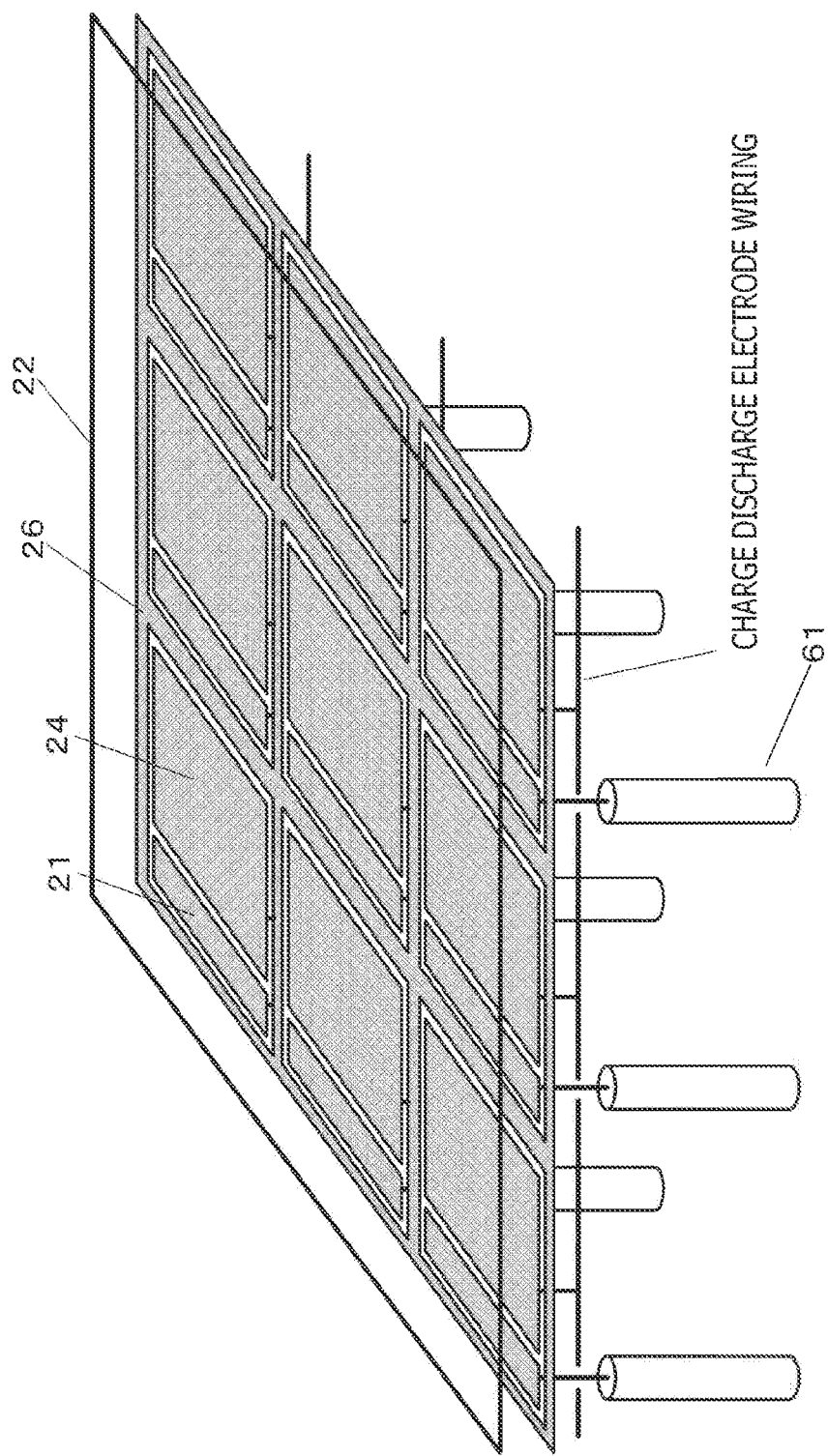
FIG. 27 is a schematic see-through perspective diagram of the first electrode, the charge accumulation electrode, the charge discharge electrode, a second electrode, and a contact hole portion constituting the imaging element of Embodiment 5.

Embodiment 5 is a modification of Embodiment 1 to Embodiment 4, and relates to an imaging element and the like including a charge discharge electrode of the present disclosure. FIG. 25 is a schematic partial cross-sectional diagram of the imaging element of Embodiment 5, FIG. 26 is a schematic arrangement diagram of a first electrode, a charge accumulation electrode, and a charge discharge electrode constituting a photoelectric conversion unit which includes the charge accumulation electrode of the imaging element of Embodiment 5, and FIG. 27 is a schematic see-through perspective diagram of the first electrode, the charge accumulation electrode, the charge discharge electrode, a second electrode, and a contact hole portion.

According to the imaging element of Embodiment 5, a charge discharge electrode 26 connected to the inorganic oxide semiconductor material layer 23B via a connection portion 69, and disposed apart from the first electrode 21 and the charge accumulation electrode 24 is further provided. The charge discharge electrode 26 here is so disposed as to surround the first electrode 21 and the charge accumulation electrode 24 (i.e., in a frame shape). The charge discharge electrode 26 is connected to a pixel driving circuit constituting a driving circuit. The inorganic oxide semiconductor material layer 23B extends within the connection portion 69. Specifically, the inorganic oxide semiconductor material layer 23B extends within a second opening 86 formed in the insulation layer 82, and is connected to the charge discharge electrode 26. The charge discharge electrode 26 is shared (commonized) by a plurality of the imaging elements. A side surface of the second opening 86 may have an inclination expanding toward above. For example, the charge discharge electrode 26 may be used as a floating diffusion or an overflow drain of the photoelectric conversion unit 23.

In Embodiment 5, during a charge accumulation period, a potential $V_{11}$ is applied from the driving circuit to the first electrode 21, a potential $V_{31}$ is applied from the driving circuit to the charge accumulation electrode 24, and a potential $V_{61}$ is applied from the driving circuit to the charge discharge electrode 26, and charges are accumulated in the inorganic oxide semiconductor material layer 23B and the like. Photoelectric conversion is performed in the photoelectric conversion layer 23A by entrance of light into the photoelectric conversion layer 23A. Holes generated by the photoelectric conversion are sent from the second electrode 22 to the driving circuit via the wire $V_{OU}$. Meanwhile, the potential of the first electrode 21 is higher than the potential of the second electrode 22, i.e., for example, a positive potential is applied to the first electrode 21, and a negative potential is applied to the second electrode 22. Accordingly, $V_{61} > V_{11}$ (e.g., $V_{31} > V_{61} > V_{11}$) is set. In this manner, electrodes generated by the photoelectric conversion are attracted toward the charge accumulation electrode 24, and stay in a region included in the inorganic oxide semiconductor material layer 23B and the like and facing the charge accumulation electrode 24. Accordingly, transfer of the electrons toward the first electrode 21 can reliably be prevented. However, electrons not sufficiently attracted by the charge accumulation electrode 24, or electrons in excess of a limit of accumulation in the inorganic oxide semiconductor material layer 23B (what is generally called overflowing electrodes) are sent out to the driving circuit via the charge discharge electrode 26.

A reset operation is performed in a latter part of the charge accumulation period. As a result, the potential of the first floating diffusion layer $FD_1$ is reset, and becomes the potential $V_{DD}$ of the power source.

After completion of the reset operation, charges are read out. Specifically, during a charge transfer period, a potential $V_{12}$ is applied from the driving circuit to the first electrode 21, a potential $V_{32}$ is applied from the driving circuit to the charge accumulation electrode 24, and a potential $V_{62}$ is applied from the driving circuit to the charge discharge electrode 26. In this case, $V_{62} < V_{12}$ (e.g., $V_{62} < V_{32} < V_{12}$) is set. In this manner, electrodes staying in the region included in the inorganic oxide semiconductor material layer 23B and the like and facing the charge accumulation electrode 24 are reliably read out to the first electrode 21, and further to the first floating diffusion layer $FD_1$. In other words, charges accumulated in the inorganic oxide semiconductor material layer 23B and the like are read out to the control unit.

A series of operations such as charge accumulation, reset operation, and charge transfer are now completed.

Operations of the amplification transistor $TR1_{amp}$ and the selection transistor $TR1_{sel}$ after the electrons are read out to the first floating diffusion layer $FD_1$ are the same as those operations of conventional transistors. Further, for example, a series of operations such as charge accumulation, reset operation, and charge transfer performed by the second imaging element and the third imaging element are similar to a series of conventional operations such as charge accumulation, reset operation, and charge transfer.

According to Embodiment 5, what is generally called overflowing electrodes are sent out to the driving circuit via the charge discharge electrode 26. Accordingly, leakage of the adjacent pixel into the charge accumulation portion can decrease, and reduction of blooming is thus achievable. Further, imaging performance of the imaging element can thus improve.

Embodiment 6

Embodiment 6 is a modification of Embodiment 1 to Embodiment 5, and relates to an imaging element and the like including a plurality of charge accumulation electrode segments of the present disclosure.

Figure 6C:
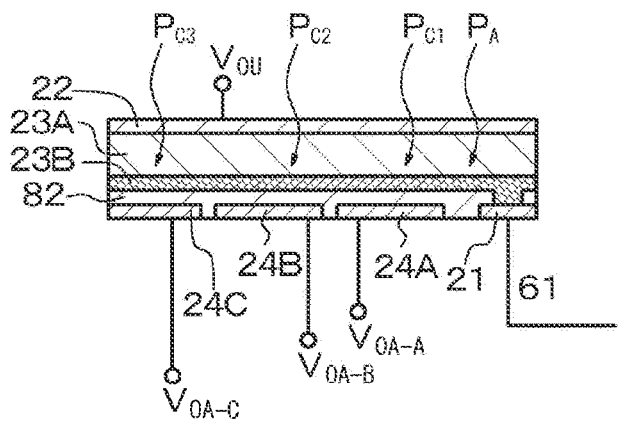
Figure 28:
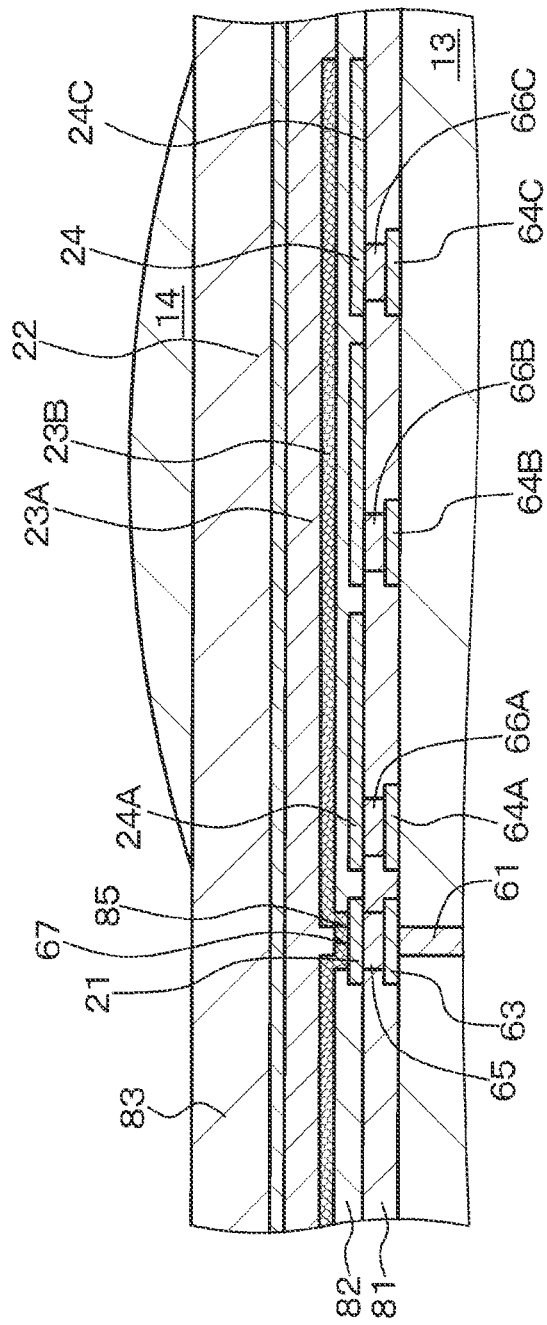
FIG. 28 is a schematic partial cross-sectional diagram of an imaging element of Embodiment 6.
Figure 29:
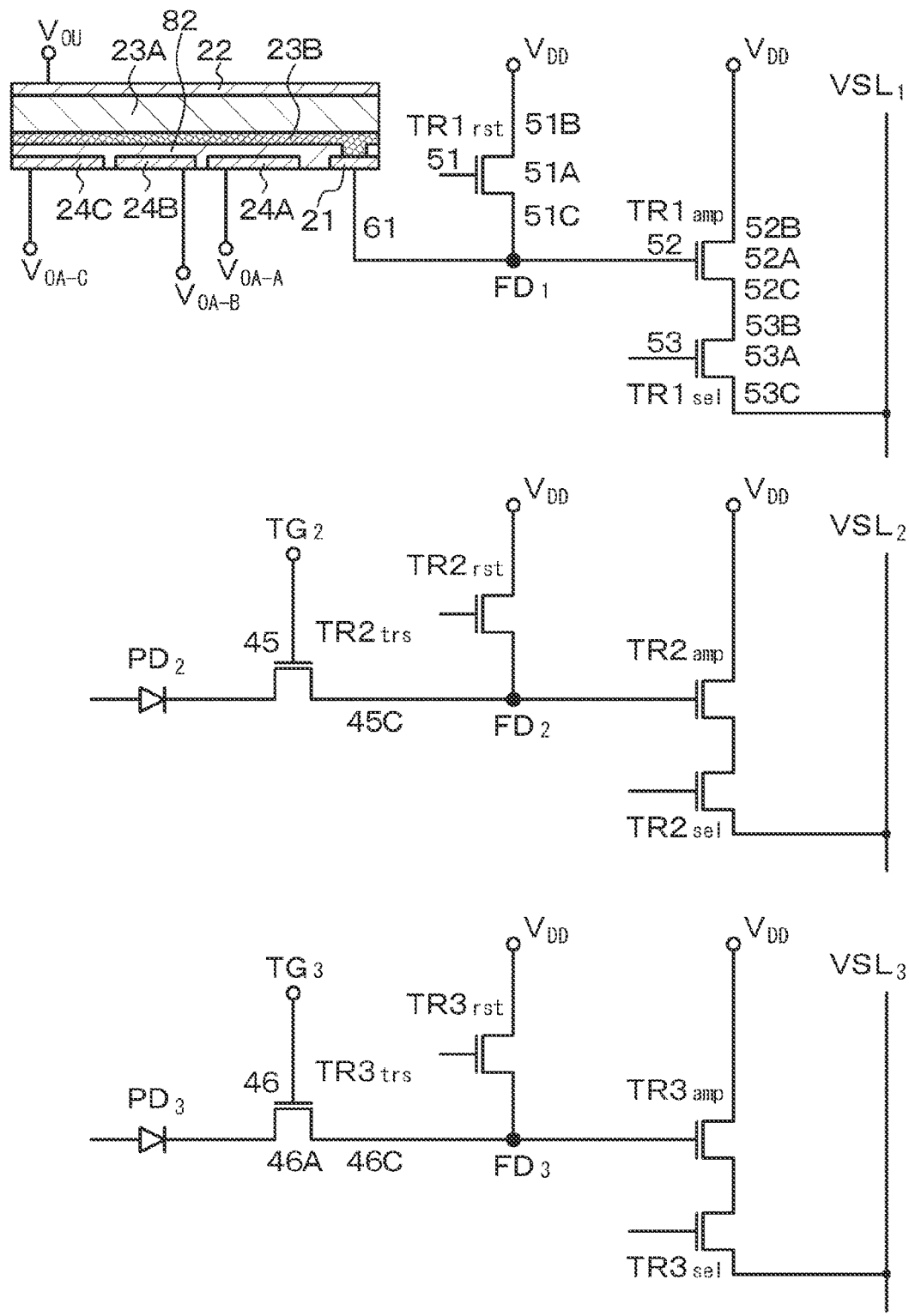
FIG. 29 is an equivalent circuit diagram of the imaging element of Embodiment 6.
Figure 30:
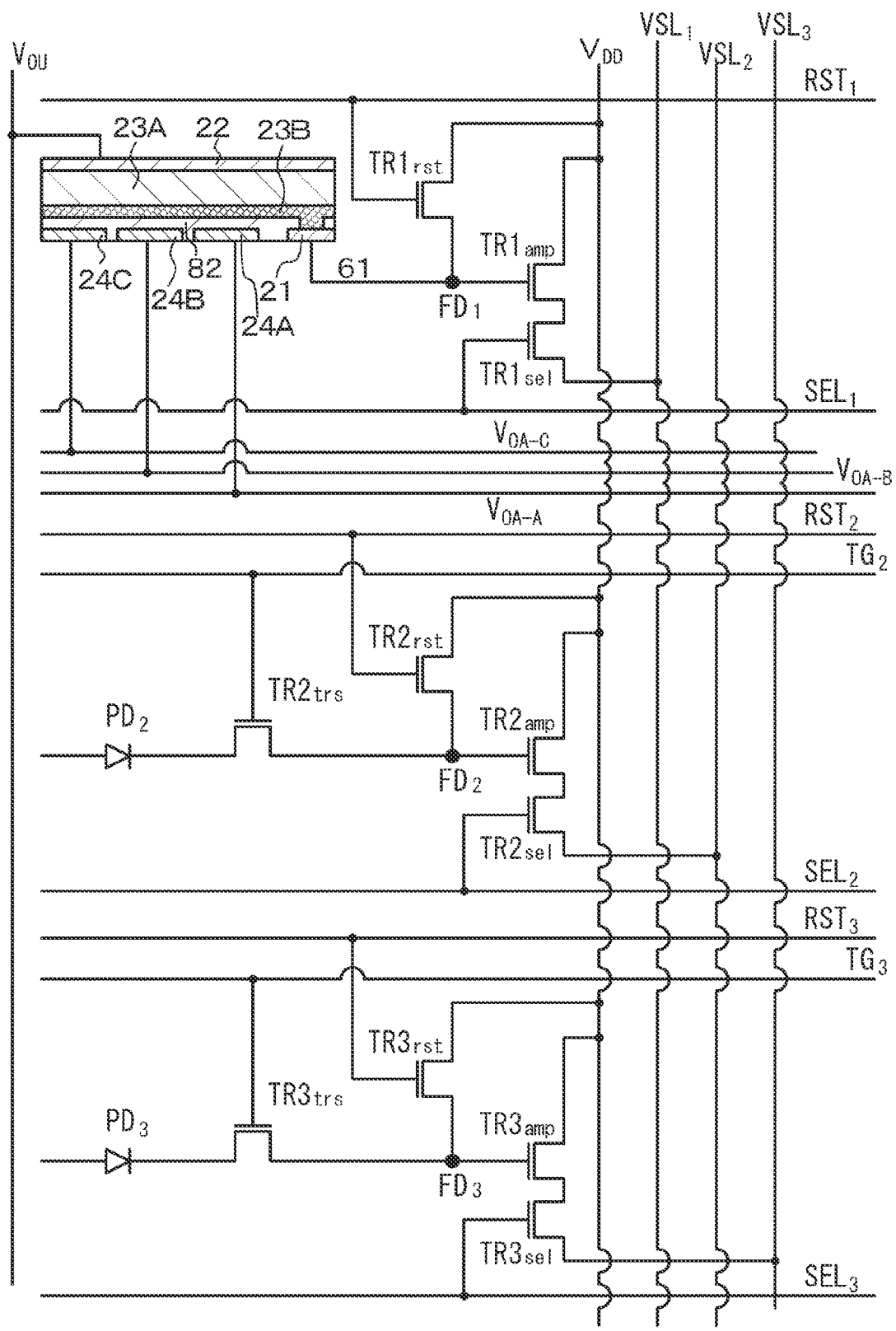
FIG. 30 is another equivalent circuit diagram of the imaging element of Embodiment 6.
Figure 31:
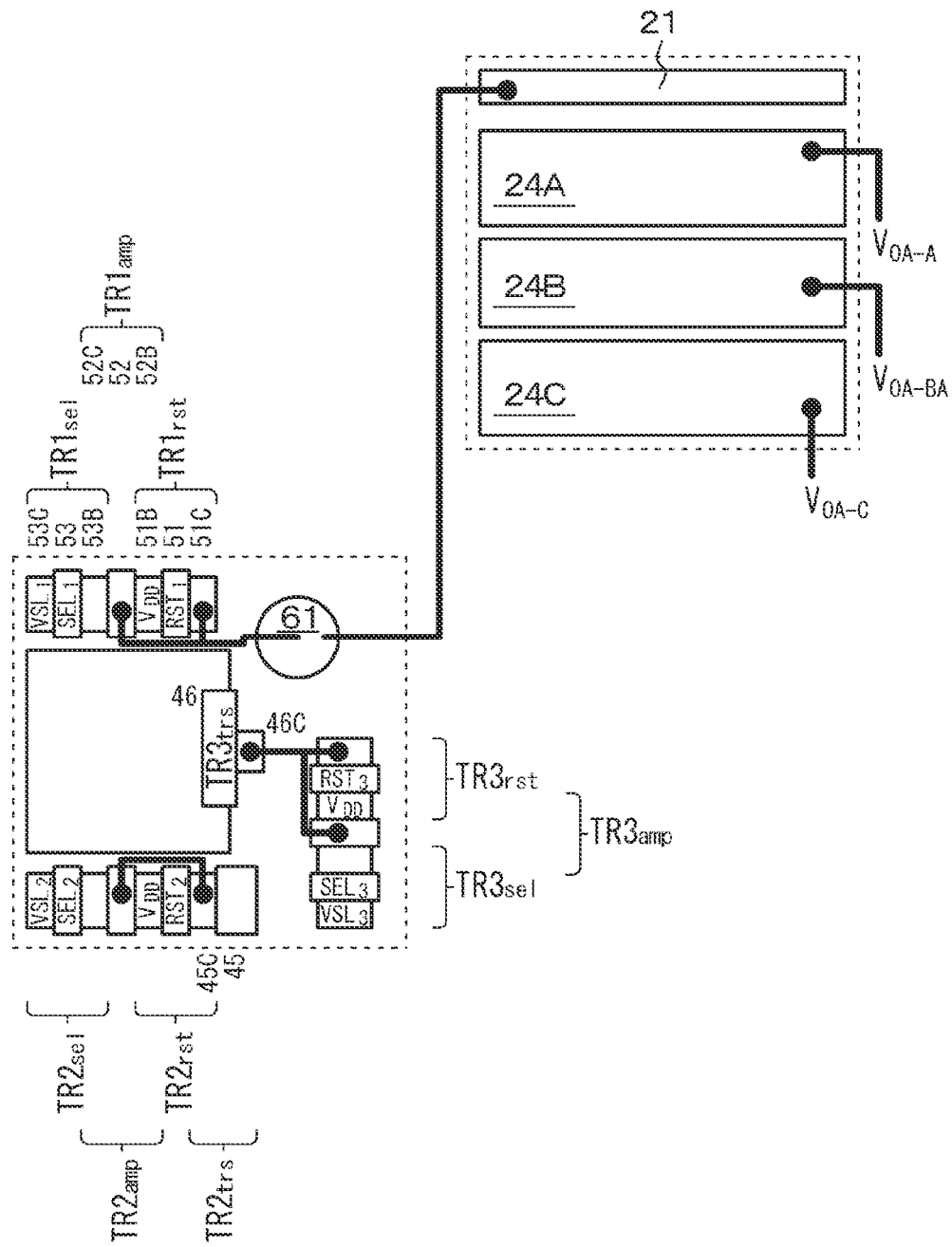
FIG. 31 is a schematic arrangement diagram of a first electrode, a charge accumulation electrode, and transistors constituting a control unit included in the imaging element of Embodiment 6.
Figure 34:
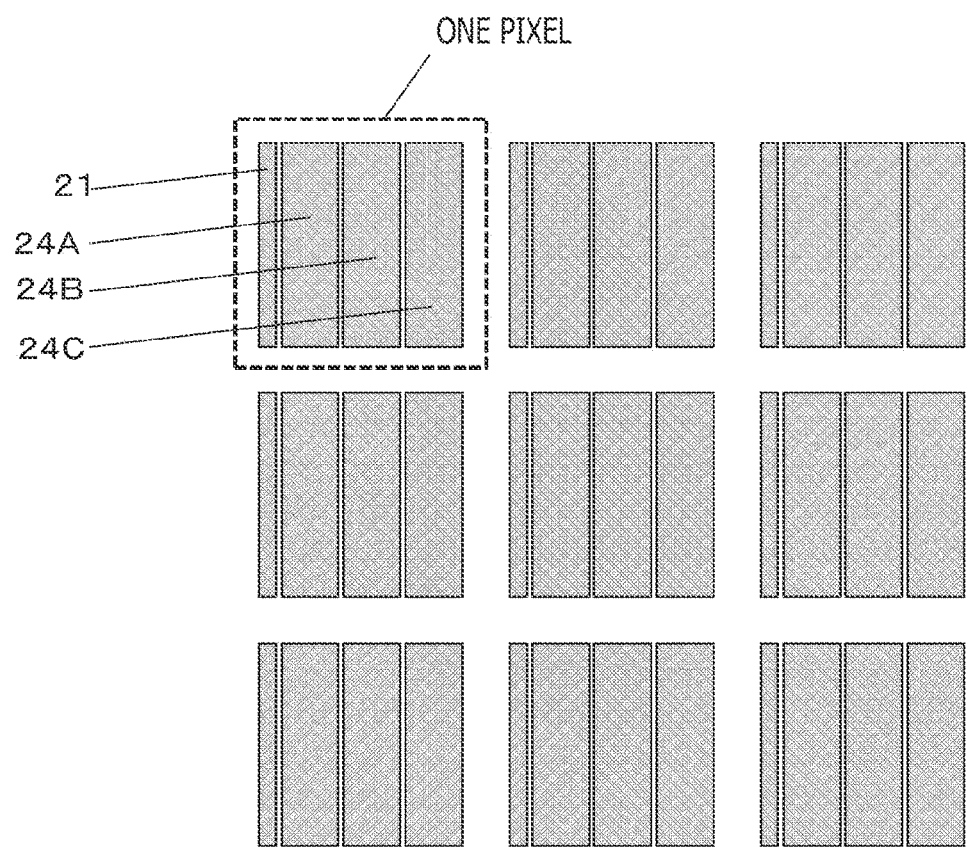
FIG. 34 is a schematic arrangement diagram of a first electrode and a charge accumulation electrode constituting the imaging element of Embodiment 6.
Figure 35:
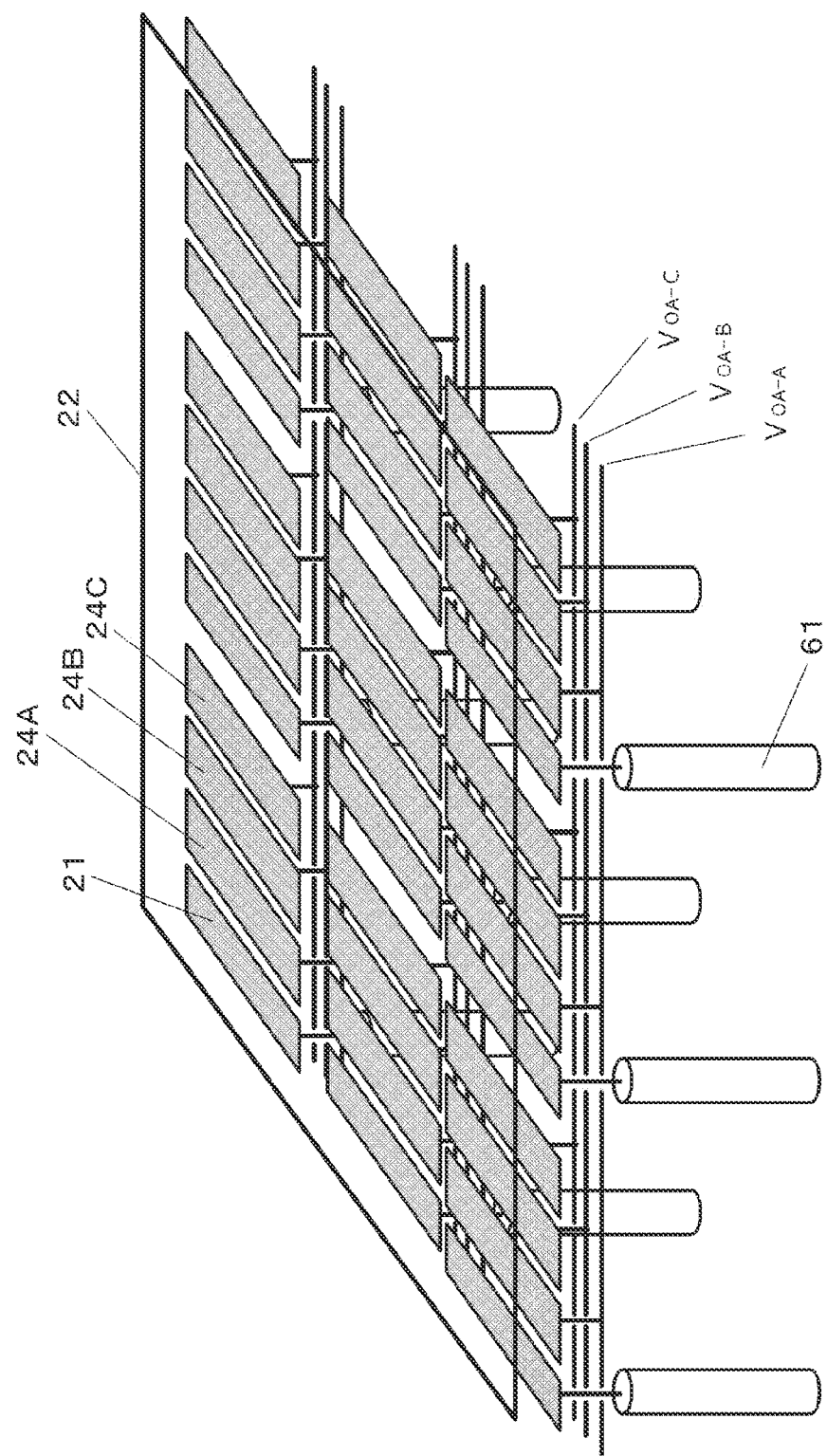
FIG. 35 is a schematic see-through perspective diagram of the first electrode, the charge accumulation electrode, a second electrode, and a contact hole portion constituting the imaging element of Embodiment 6.

FIG. 28 is a schematic partial cross-sectional diagram of a part of the imaging element of Embodiment 6. FIGS. 29 and 30 are equivalent circuit diagrams of the imaging element of Embodiment 6. FIG. 31 is a schematic arrangement diagram of a first electrode, a charge accumulation electrode, and transistors constituting a control unit included in a photoelectric conversion unit including the charge accumulation electrode of the imaging element of Embodiment 6. FIGS. 32 and 33 schematically depict potential states of respective portions of the imaging element of Embodiment 6 during an operation. FIG. 6C is an equivalent circuit diagram for explaining the respective portions of the imaging element of Embodiment 6. Further, FIG. 34 is a schematic arrangement diagram of the first electrode and the charge accumulation electrode constituting the photoelectric conversion unit which includes the charge accumulation electrode of the imaging element of Embodiment 6. FIG. 35 is a see-through perspective diagram of the first electrode, the charge accumulation electrode, a second electrode, and a contact hole portion.

In Embodiment 6, the charge accumulation electrode 24 includes a plurality of charge accumulation electrode segments 24A, 24B, and 24C. It is sufficient if the number of the charge accumulation electrode segments is two or larger. This number is set to "3" in Embodiment 6. In addition, in the imaging element of Embodiment 6, the potential of the first electrode 21 is set to a potential higher than the potential of the second electrode 22, i.e., for example, a positive potential is applied to the first electrode 21, and a negative potential is applied to the second electrode 22. Further, a potential applied to the charge accumulation electrode segment 24A located nearest the first electrode 21 during the charge transfer period is higher than a potential applied to the charge accumulation electrode segment 24C located farthest from the first electrode 21. In such a manner, electrodes staying in the region included in the inorganic oxide semiconductor material layer 23B and the like and facing the charge accumulation electrode 24 are further reliably read out to the first electrode 21, and further to the first floating diffusion layer $FD_1$ by giving a potential gradient to the charge accumulation electrode 24. In other words, charges accumulated in the inorganic oxide semiconductor material layer 23B and the like are read out to the control unit.

According to an example depicted in FIG. 32, a relation "potential of charge accumulation electrode segment 24C"<"potential of charge accumulation electrode segment 24B"<"potential of charge accumulation electrode segment 24A" is set during the charge transfer period. In this manner, electrons staying in regions of the inorganic oxide semiconductor material layer 23B and the like are simultaneously read out to the first floating diffusion layer $FD_1$. Meanwhile, according to an example depicted in FIG. 33, the potential of the charge accumulation electrode segment 24C, the potential of the charge accumulation electrode segment 24B, and the potential of the charge accumulation electrode segment 24A are gradually changed (i.e., changed in a stepped or sloped manner) during the charge transfer period. In this manner, electrons staying in regions included in the inorganic oxide semiconductor material layer 23B and the like and facing the charge accumulation electrode segment 24C are transferred to regions included in the inorganic oxide semiconductor material layer 23B and the like and facing the charge accumulation electrode segment 24B, and then electrons staying in regions included in the inorganic oxide semiconductor material layer 23B and the like and facing the charge accumulation electrode segment 24B are transferred to regions included in the inorganic oxide semiconductor material layer 23B and the like and facing the charge accumulation electrode segment 24A. Thereafter, electrons staying in regions included in the inorganic oxide semiconductor material layer 23B and the like and facing the charge accumulation electrode segment 24A are reliably read out to the first floating diffusion layer $FD_1$.

Figure 36:
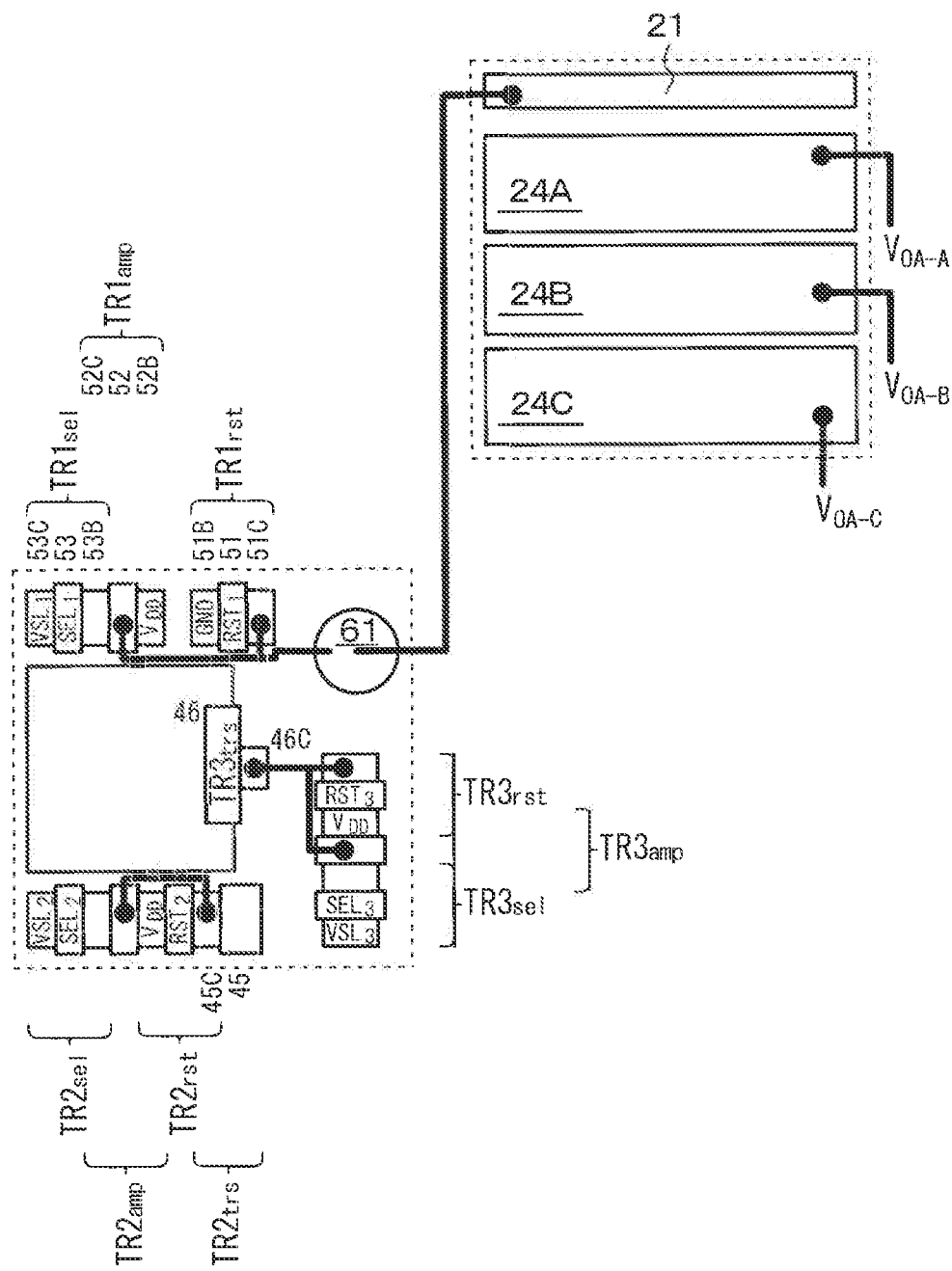
FIG. 36 is a schematic arrangement diagram of a first electrode and a charge accumulation electrode constituting a modification of the imaging element of Embodiment 6.

As depicted in a schematic arrangement diagram of a first electrode, a charge accumulation electrode, and transistors constituting a control unit included in a modification of the imaging element of Embodiment 6 in FIG. 36, the other source/drain region 51B of the reset transistor $TR1_{rst}$ may be grounded rather than connected to the power source $V_{DD}$.

Embodiment 7

Figure 37:
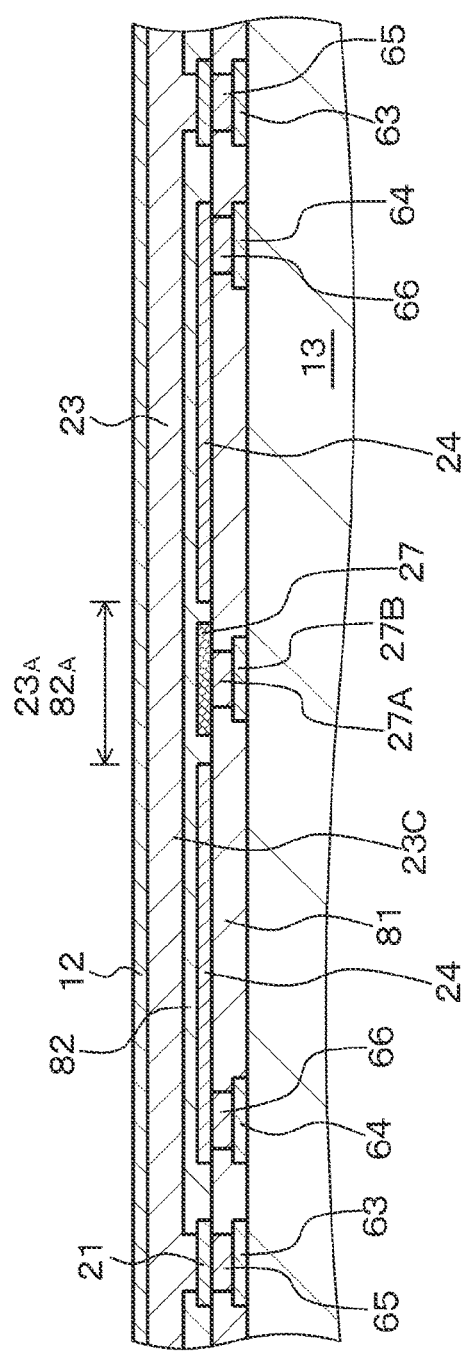
FIG. 37 is a schematic partial cross-sectional diagram of imaging elements (two imaging elements disposed side by side) of Embodiment 7.
Figure 38:
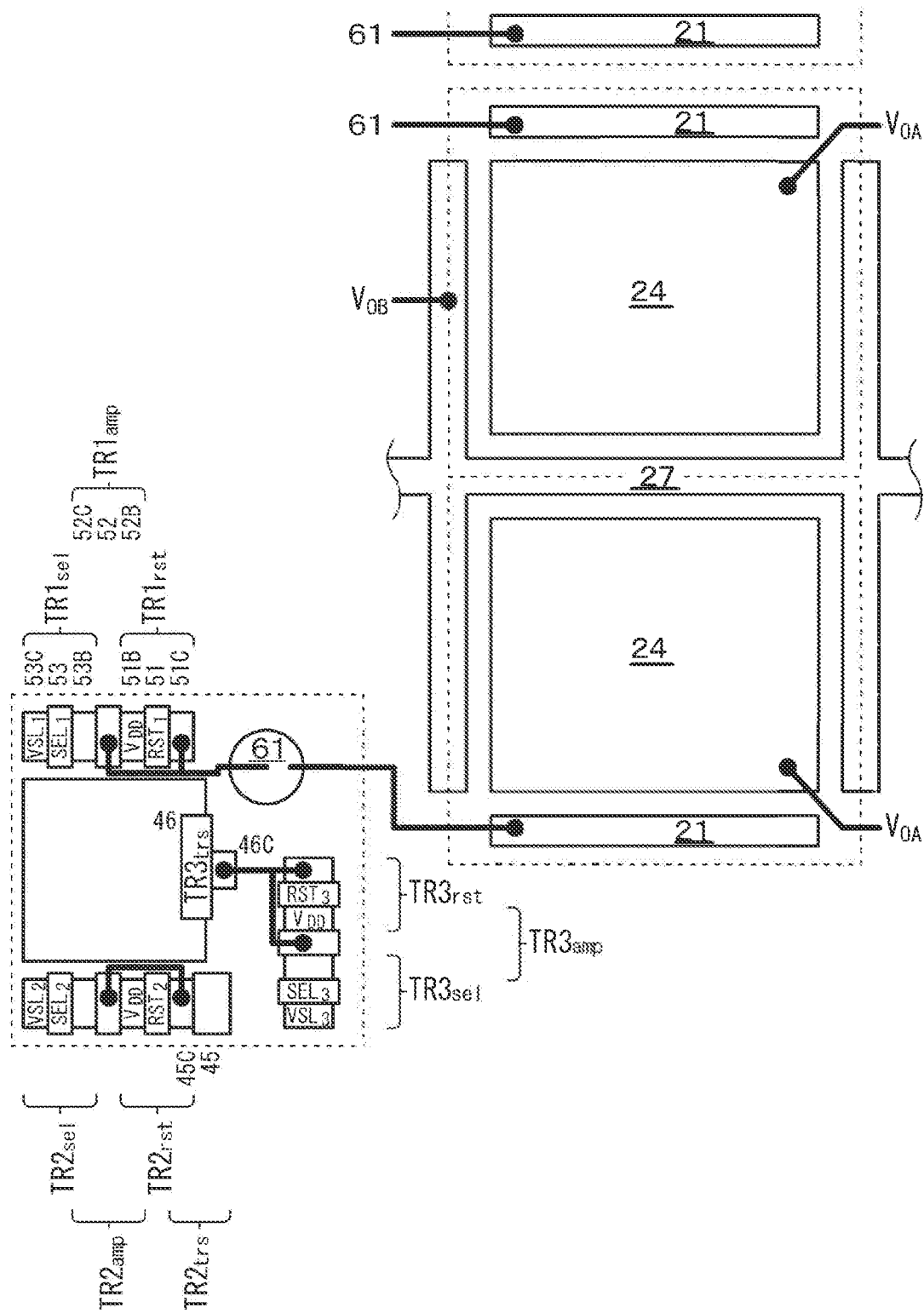
FIG. 38 is a schematic arrangement diagram of a first electrode, a charge accumulation electrode, and the like, and transistors constituting a control unit included in the imaging element of Embodiment 7.
Figure 39:
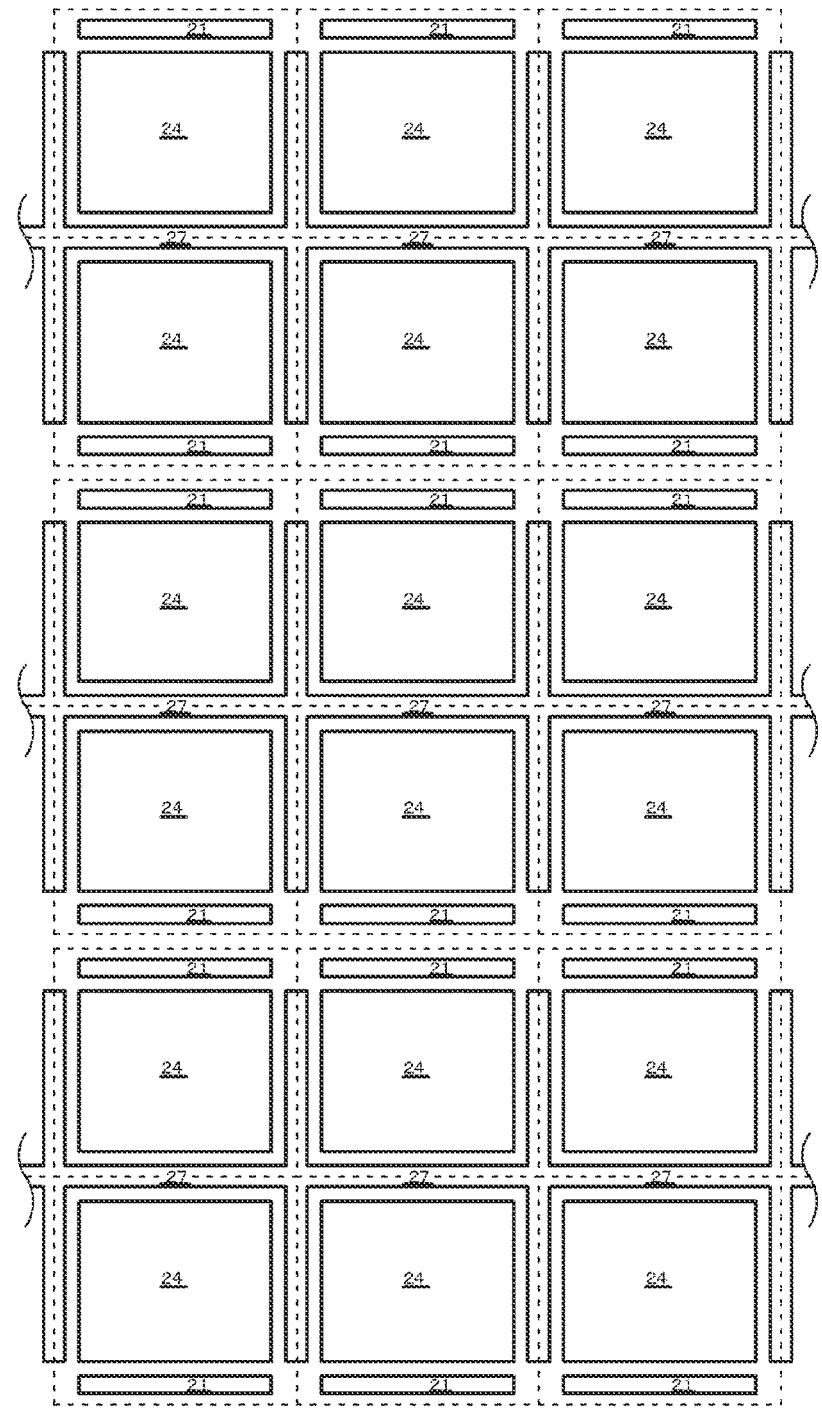
FIG. 39 is a schematic arrangement diagram of the first electrode, the charge accumulation electrode, and the like constituting the imaging element of Embodiment 7.
Figure 40:
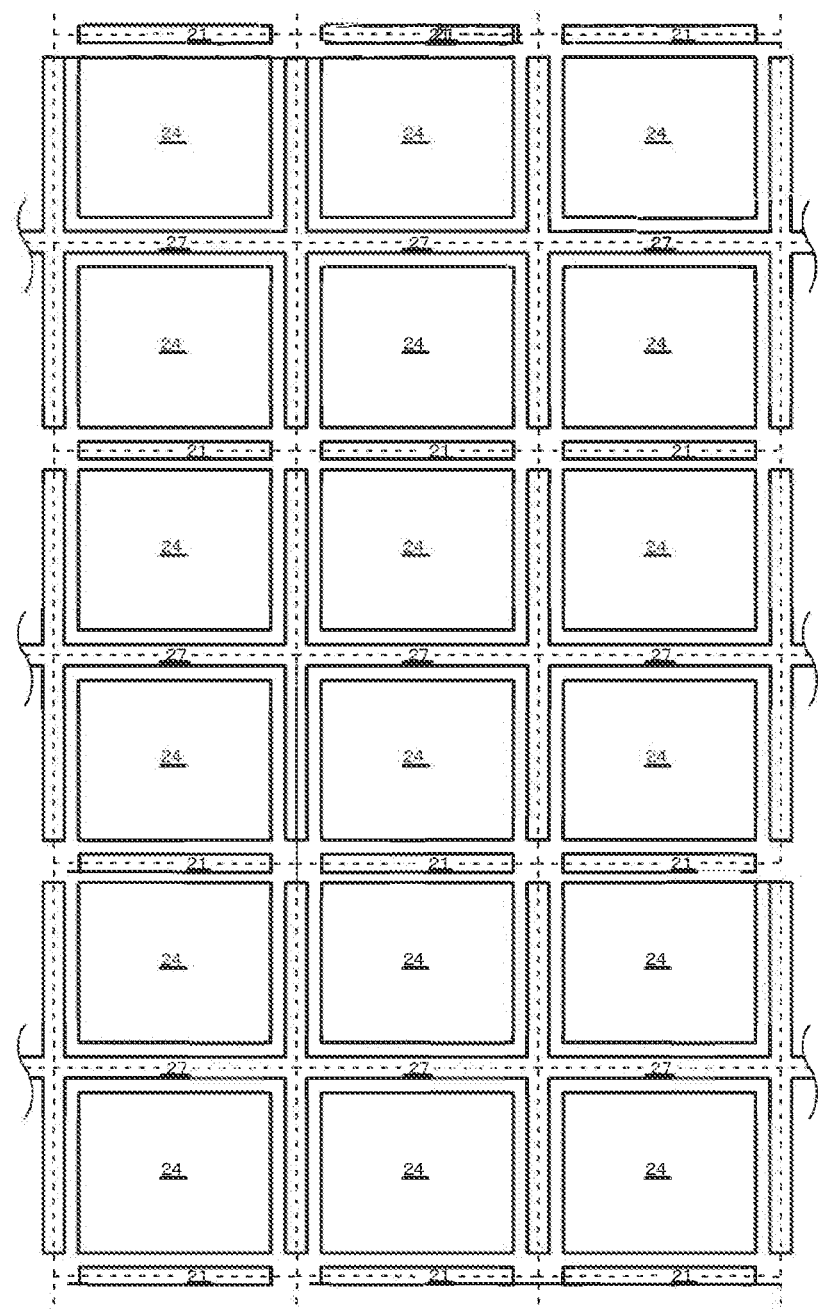
FIG. 40 is a schematic arrangement diagram of a modification of the first electrode, the charge accumulation electrode, and the like constituting the imaging element of Embodiment 7.

Embodiment 7 is a modification of Embodiment 1 to Embodiment 6, and relates to an imaging element and the like including a charge transfer control electrode of the present disclosure, specifically, an imaging element and the like including a lower charge transfer control electrode (lower and charge transfer control electrode) of the present disclosure. FIG. 37 is a schematic partial cross-sectional diagram of an imaging element of Embodiment 7, FIG. 38 is a schematic arrangement diagram of a first electrode, a charge discharge electrode, and transistors constituting a control unit included in the imaging element of Embodiment 7, and FIGS. 39 and 40 are schematic arrangement diagrams of the first electrode, the charge accumulation electrode, and a lower charge transfer control electrode constituting a photoelectric conversion unit including the charge accumulation electrode of the imaging element of Embodiment 7. Note that a reference number 23 is collectively given to the photoelectric conversion layer 23A and the inorganic oxide semiconductor material layer 23B in FIGS. 37, 43, 46A, 46B, 47A, and 47B.

According to the imaging element of Embodiment 7, a lower charge transfer control electrode 27 is formed in a region facing, via the insulation layer 82, a region (a region-A of the photoelectric conversion layer) 23A included in the photoelectric conversion unit 23 and located between the imaging element and the adjacent imaging element. In other words, the lower charge transfer control electrode 27 is formed below a portion (a region-A of the insulation layer 82) 82A included in the insulation layer 82 and located in a region (region-a) sandwiched between the charge accumulation electrodes 24 constituting the adjoining imaging elements, respectively. The lower charge transfer control electrode 27 is provided apart from the charge accumulation electrode 24. Alternatively, in other words, the lower charge transfer control electrode 27 is provided apart from the charge accumulation electrode 24 and surrounds the charge accumulation electrode 24. The lower charge transfer control electrode 27 is so disposed as to face the region-A ($23_A$) of the photoelectric conversion layer via the insulation layer 82. The lower charge transfer control electrode 27 is commonized for the imaging elements. In addition, the lower charge transfer control electrode 27 is also connected to the driving circuit. Specifically, the lower charge transfer control electrode 27 is connected to the vertical driving circuit 112 constituting the driving circuit via a connection hole 27A, a pad portion 27B, and a wire $V_{OB}$ formed within the interlayer insulation layer 81. The lower charge transfer control electrode 27 may be either at the same level as the level of the first electrode 21 or the charge accumulation electrode 24, or at a different level (specifically, at a level lower than the first electrode 21 or the charge accumulation electrode 24). In the former case, a distance between the charge transfer control electrode 27 and the photoelectric conversion layer 23A can be reduced. Accordingly, potential control is easily achievable. On the other hand, in the latter case, a distance between the charge transfer control electrode 27 and the charge accumulation electrode 24 can be reduced. Accordingly, the latter case is advantageous for miniaturization.

According to the imaging element of Embodiment 7, an absolute value of a potential applied to a portion included in the photoelectric conversion layer 23A and facing the charge accumulation electrode 24 is larger than an absolute value of a potential applied to the region-A of the photoelectric conversion layer 23A during photoelectric conversion caused in the photoelectric conversion layer 23A by entrance of light into the photoelectric conversion layer 23A. Accordingly, a charge generated by the photoelectric conversion is strongly attracted toward the portion included in the inorganic oxide semiconductor material layer 23B and facing the charge accumulation electrode 24. As a result, a flow of the charge generated by the photoelectric conversion into the adjacent imaging element can be reduced, and therefore quality of a captured picture (image) does not deteriorate. Alternatively, the lower charge transfer control electrode 27 is formed in a region facing the region-A of the photoelectric conversion layer 23A via the insulation layer. Accordingly, an electric field and a potential in the region-A included in the photoelectric conversion layer 23A and located above the lower charge transfer control electrode 27 are controllable. As a result, a flow of the charge generated by the photoelectric conversion into the adjacent imaging element can be reduced by the lower charge transfer control electrode 27, and therefore quality of a captured picture (image) does not deteriorate.

Figure 41:
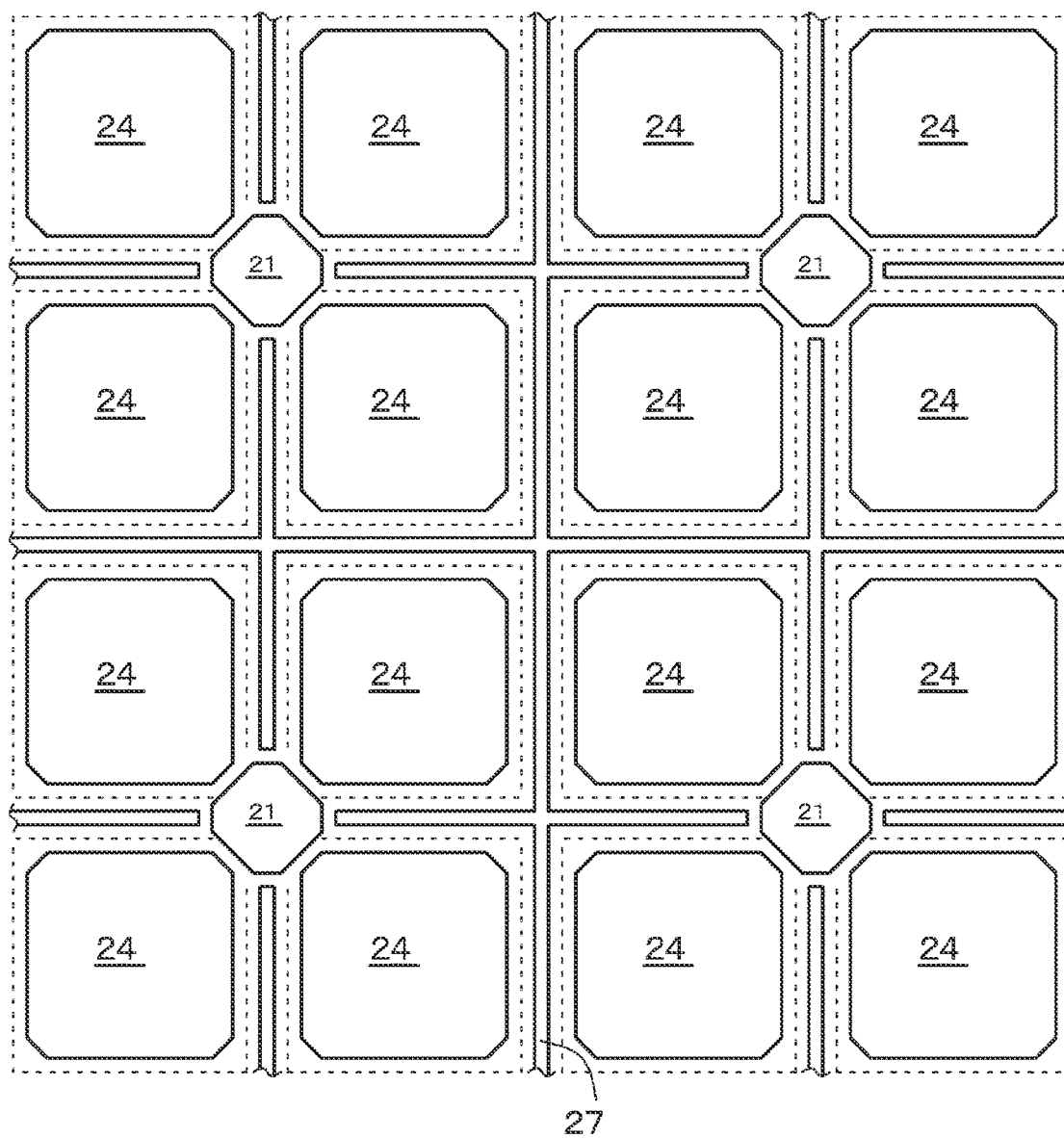
FIG. 41 is a schematic arrangement diagram of a modification of the first electrode, the charge accumulation electrode, and the like constituting the imaging element of Embodiment 7.
Figure 42A:
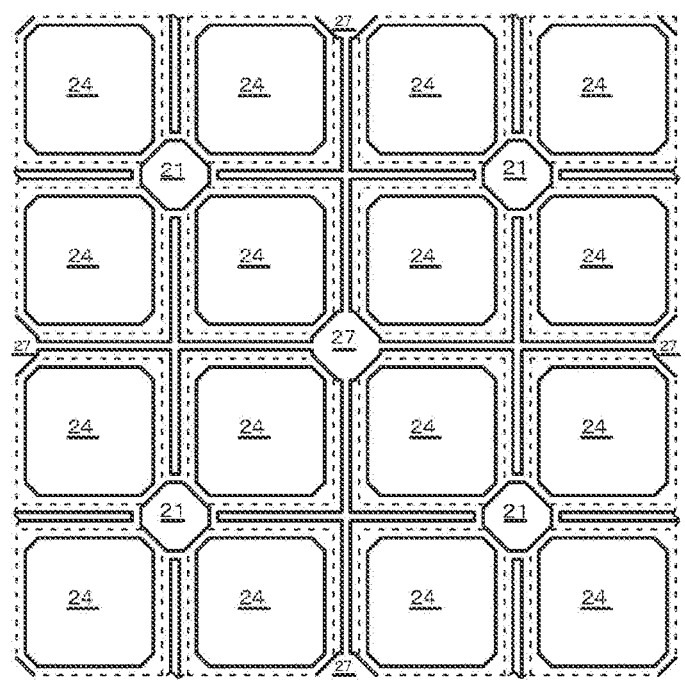
FIGS. 42A and 42B are schematic arrangement diagrams of a modification of the first electrode, the charge accumulation electrode, and the like constituting the imaging element of Embodiment 7.

According to the example depicted in FIGS. 39 and 40, the lower charge transfer control electrode 27 is formed in a region (region-a) sandwiched between the charge accumulation electrodes 24 and below the portion 82A included in the insulation layer 82. Meanwhile, according to the examples depicted in FIGS. 41, 42A, and 42B, the lower charge transfer control electrode 27 is formed in a region surrounded by the four charge accumulation electrodes 24 and below a portion included in the insulation layer 82. Note that the examples depicted in FIGS. 41, 42A, and 42B correspond to the solid-state imaging devices having the first configuration and the second configuration. In addition, the common one first electrode 21 is provided in correspondence with the four charge accumulation electrodes 24 in the four imaging elements.

Figure 42B:
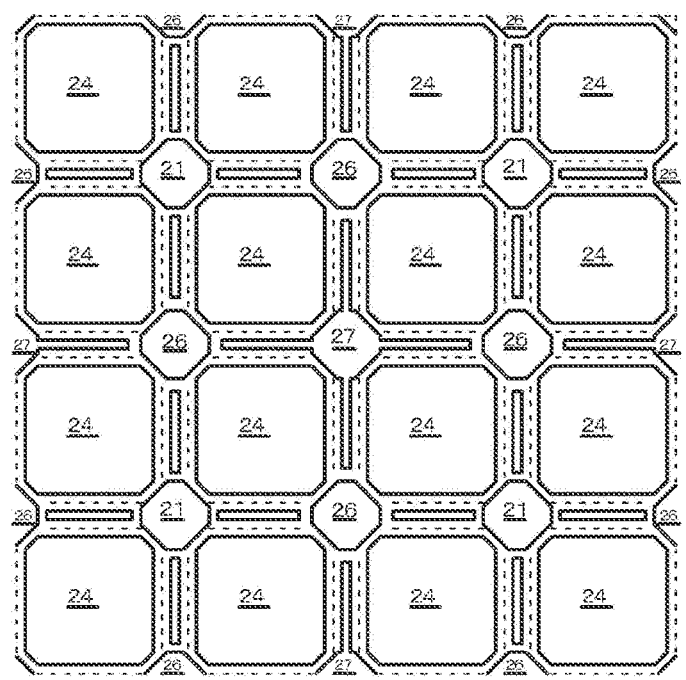

According to the example depicted in FIG. 42B, the one common first electrode 21 is provided in correspondence with the four charge accumulation electrodes 24 in the four imaging elements. The lower charge transfer control electrode 27 is formed in a region surrounded by the four charge accumulation electrodes 24 and below a portion included in the insulation layer 82, and also the charge discharge electrode 26 is formed in a region surrounded by the four charge accumulation electrodes 24 and below a portion included in the insulation layer 82. As described above, for example, the charge discharge electrode 26 may be used as a floating diffusion or an overflow drain of the photoelectric conversion unit 23.

Embodiment 8

Figure 43:
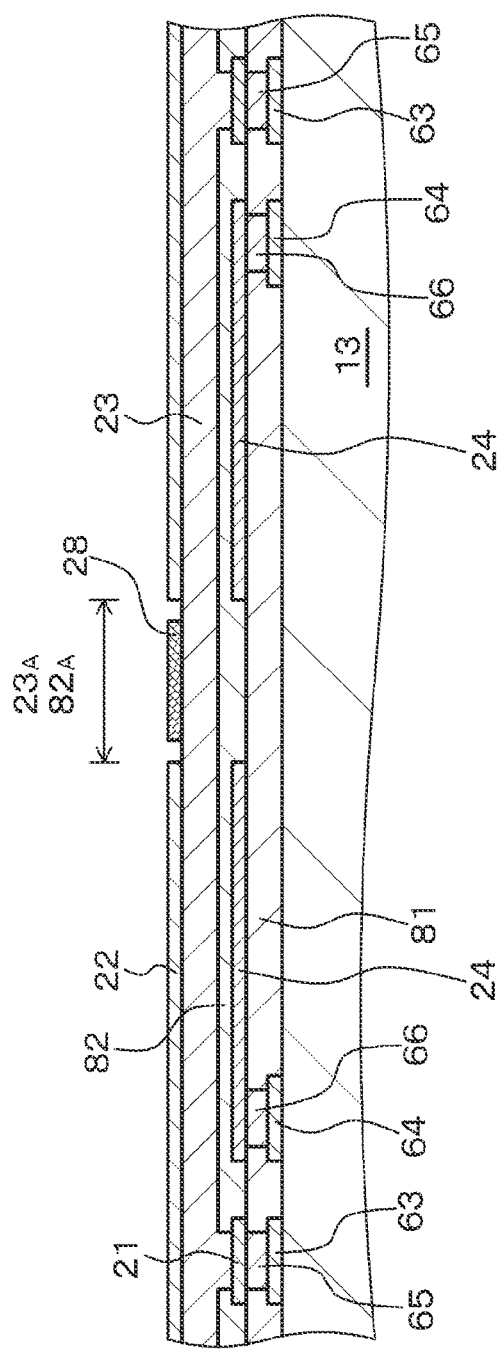
FIG. 43 is a schematic partial cross-sectional diagram of imaging elements (two imaging elements disposed side by side) of Embodiment 8.
Figure 44:
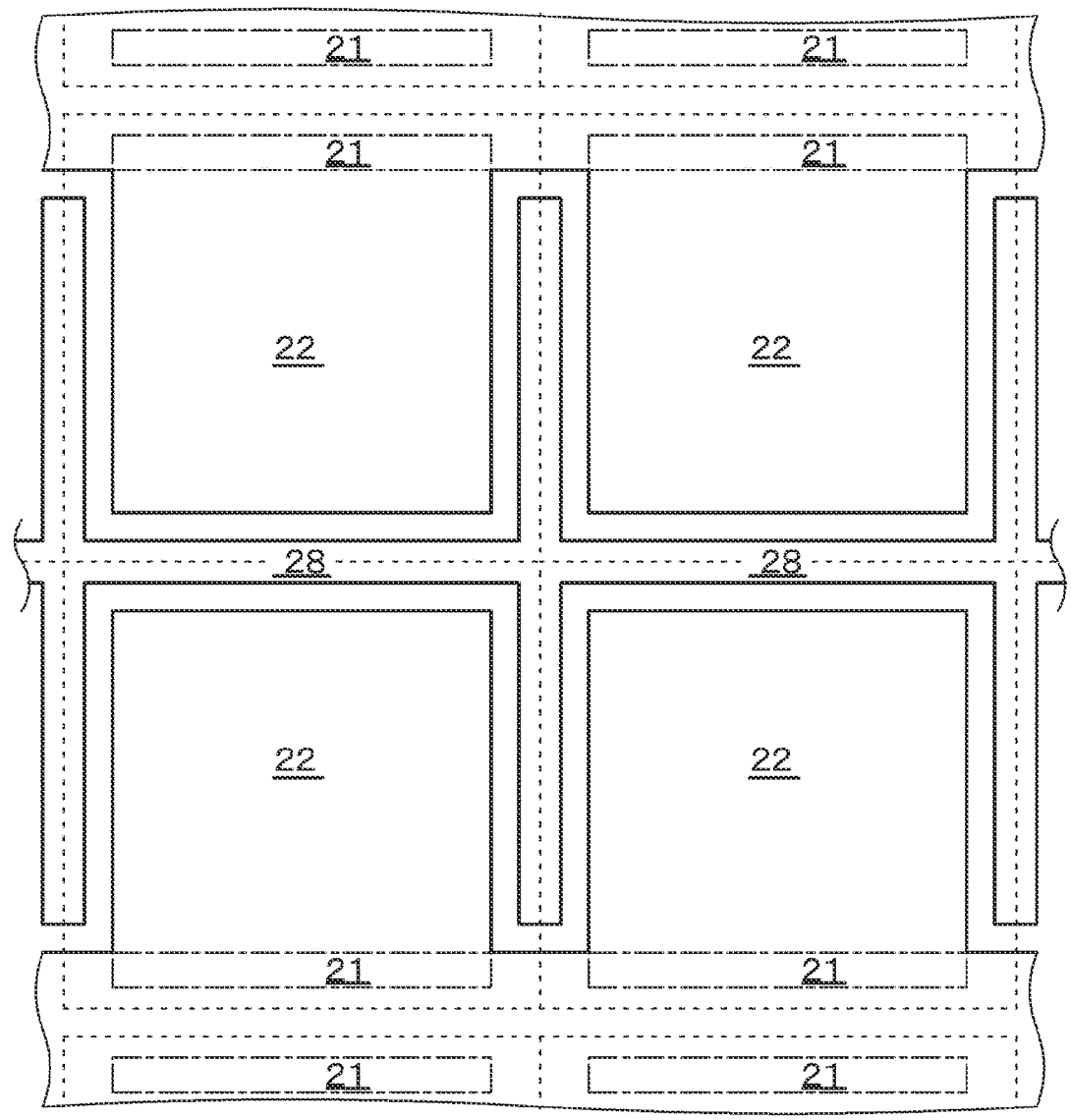
FIG. 44 is a schematic partial plan diagram of imaging elements (2×2 imaging elements disposed side by side) of Embodiment 8.
Figure 45:
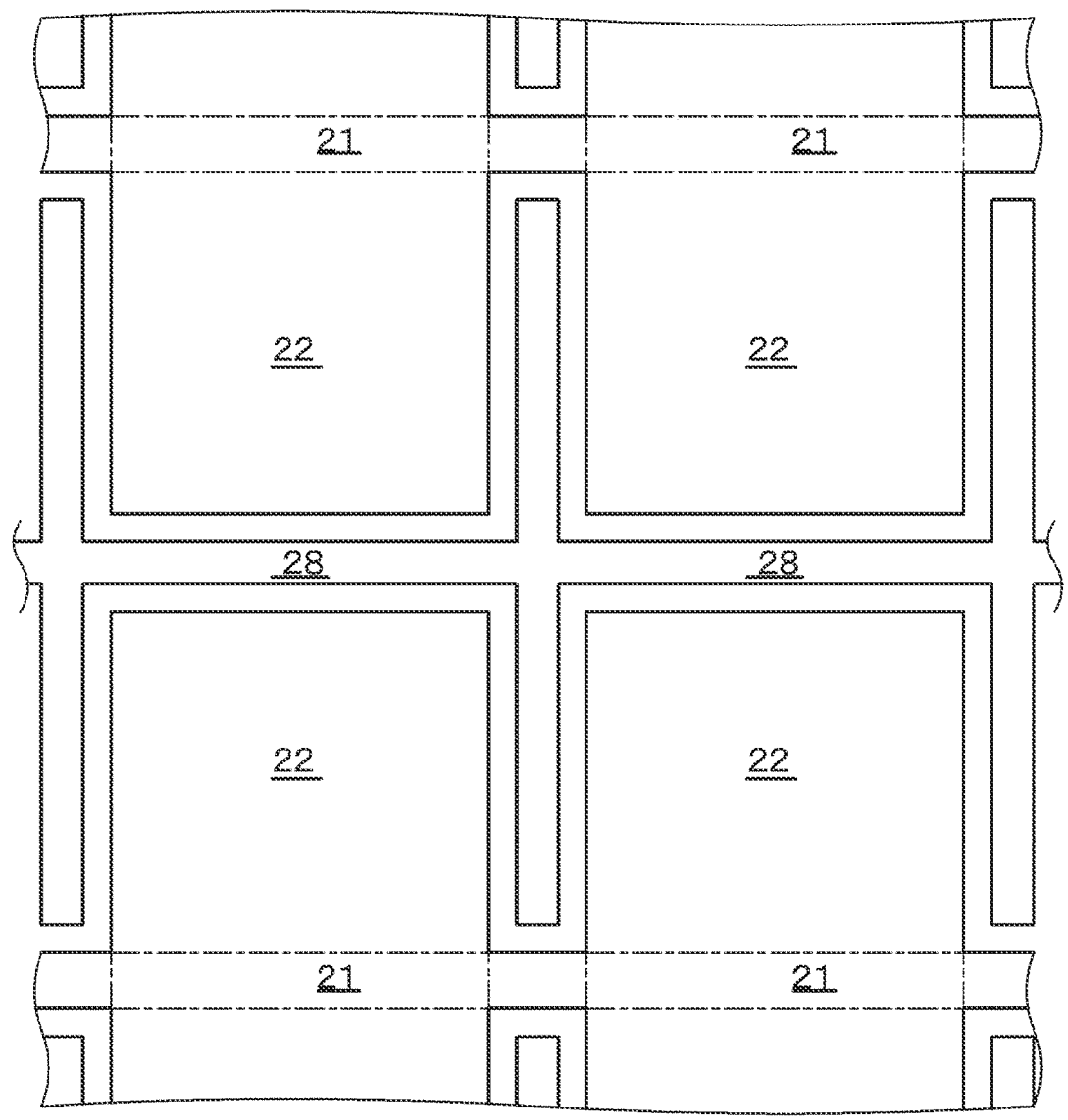
FIG. 45 is a schematic partial plan diagram of a modification of the imaging elements (2×2 imaging elements disposed side by side) of Embodiment 8.

Embodiment 8 relates to an imaging element and the like including an upper charge transfer control electrode (upper and charge transfer control electrode) of the present disclosure. FIG. 43 is a schematic partial cross-sectional diagram of imaging elements (two imaging elements disposed side by side) of Embodiment 8, while FIGS. 44 and 45 are schematic partial plan diagrams of the imaging elements (2×2 imaging elements disposed side by side) of Embodiment 8. According to the imaging element of Embodiment 8, an upper charge transfer control electrode 28 is formed in place of the second electrode 22 on the region 23A included in the photoelectric conversion unit 23 and located between the adjoining imaging elements. The upper charge transfer control electrode 28 is provided apart from the second electrode 22. In other words, the second electrode 22 is provided for each of the imaging elements, and the upper charge transfer control electrode 28 is provided on the region-A of the photoelectric conversion unit 23, and is so disposed as to surround at least a part of the second electrode 22 at a position apart from the second electrode 22. The upper charge transfer control electrode 28 is formed at the same level as the level of the second electrode 22.

Note that the one charge accumulation electrode 24 is provided in correspondence with the one first electrode 21 in the one imaging element according to the example depicted in FIG. 44. On the other hand, according to the modification depicted in FIG. 45, the common one first electrode 21 is provided in correspondence with the two charge accumulation electrodes 24 in the two imaging elements. A schematic partial cross-sectional diagram of the imaging elements (two imaging elements disposed side by side) of Embodiment 8 depicted in FIG. 43 corresponds to FIG. 45.

Further, as depicted in a schematic partial cross-sectional diagram of the imaging elements (two imaging elements disposed side by side) of Embodiment 8 in FIG. 46A, the second electrode 22 may be divided into a plurality of pieces, and different potentials may be individually applied to the respective second electrodes 22 thus divided. Further, as depicted in FIG. 46B, the upper charge transfer control electrode 28 may be provided between the divided second electrodes 22.

According to Embodiment 8, the second electrode 22 located on the light entrance side is commonized for the imaging elements arranged in the left-right direction in the plane of paper of FIG. 44, and also commonized for a pair of the imaging elements arranged in the up-down direction in the plane of paper of FIG. 44. Further, the upper charge transfer control electrode 28 is also commonized for the imaging elements arranged in the left-right direction in the plane of paper of FIG. 44, and also commonized for a pair of the imaging elements arranged in the up-down direction in the plane of paper of FIG. 44. The second electrode 22 and the upper charge transfer control electrode 28 can be produced by forming films of material layers constituting the second electrode 22 and the upper charge transfer control electrode 28 on the photoelectric conversion unit 23, and then patterning these material layers. Each of the second electrode 22 and the upper charge transfer control electrode 28 is individually connected to a wire (not depicted), and these wires are connected to the driving circuit. The wire connected to the second electrode 22 is commonized for a plurality of the imaging elements. The wire connected to the upper charge transfer control electrode 28 is also commonized for a plurality of the imaging elements.

According to the imaging element of Embodiment 8, during a charge accumulation period, a potential $V_{21}$ is applied from the driving circuit to the second electrode 22, a potential $V_{41}$ is applied from the driving circuit to the upper charge transfer control electrode 28, and charges are accumulated in the photoelectric conversion unit 23. During a charge transfer period, a potential $V_{22}$ is applied from the driving circuit to the second electrode 22, a potential $V_{42}$ is applied from the driving circuit to the upper charge transfer control electrode 28, and the charges accumulated in the photoelectric conversion unit 23 are read out to the control unit via the first electrode 21. The first electrode 21 has a higher potential than the potential of the second electrode herein.

Accordingly, $$V_{21} \geq V_{41} \text{ and } V_{22} \geq V_{42}$$

are satisfied.

As described above, according to the imaging element of Embodiment 8, the charge transfer control electrode is formed on the region included in the photoelectric conversion layer and located between the adjoining imaging elements in place of the second electrode. Accordingly, a flow of charges generated by photoelectric conversion into the adjacent imaging element can be reduced by the charge transfer control electrode, and therefore quality of a captured picture (image) does not deteriorate.

Figure 48A:
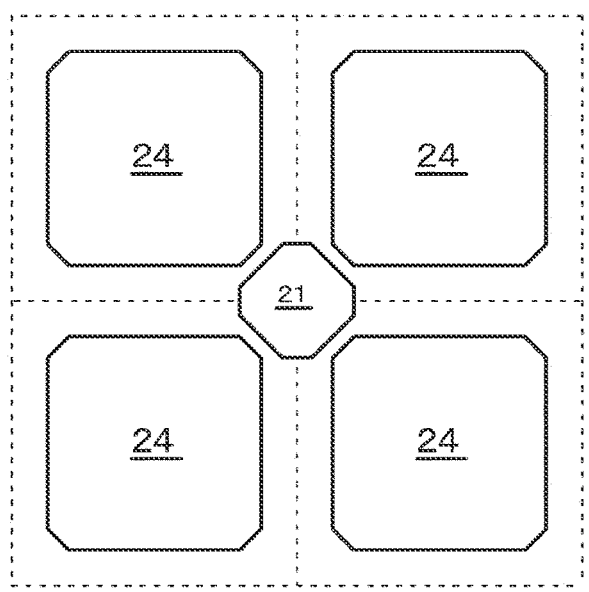
FIGS. 48A and 48B are schematic partial plan diagrams of a modification of the imaging elements of Embodiment 8.
Figure 48B:
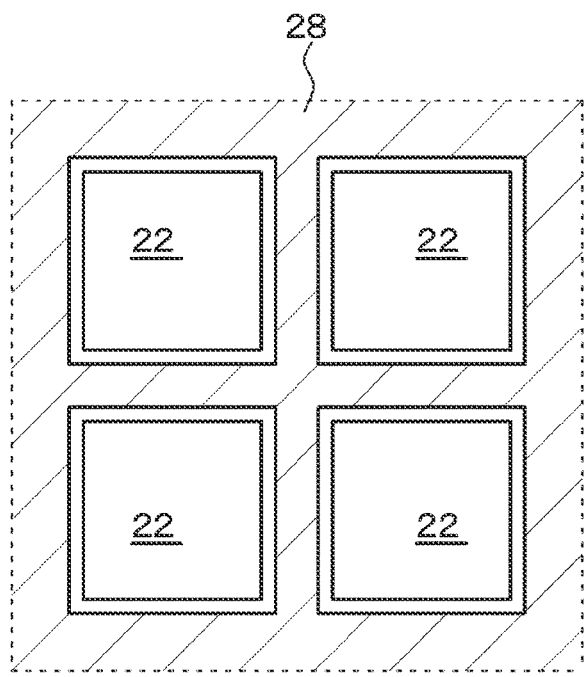

FIG. 47A is a schematic partial cross-sectional diagram of a modification of the imaging elements (two imaging elements disposed side by side) of Embodiment 8, while FIGS. 48A and 48B are schematic partial plan diagrams. According to this modification, the second electrode 22 is provided for each of the imaging elements. The upper charge transfer control electrode 28 is provided apart from the second electrode 22 and surround at least a part of the second electrode 22. A part of the charge accumulation electrode 24 is present below the upper charge transfer control electrode 28. The second electrode 22 is smaller in size than the charge accumulation electrode 24, and provided above the charge accumulation electrode 24.

Figure 49A:
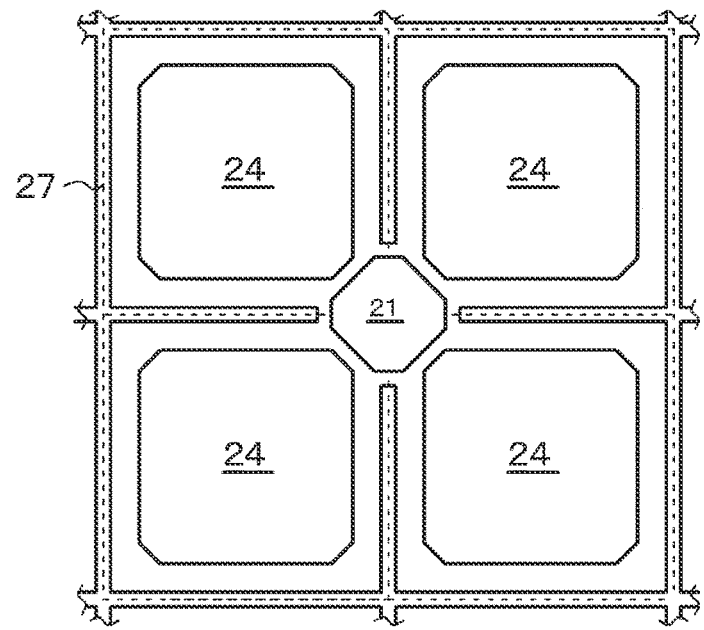
FIGS. 49A and 49B are schematic partial plan diagrams of a modification of the imaging elements of Embodiment 8.
Figure 49B:
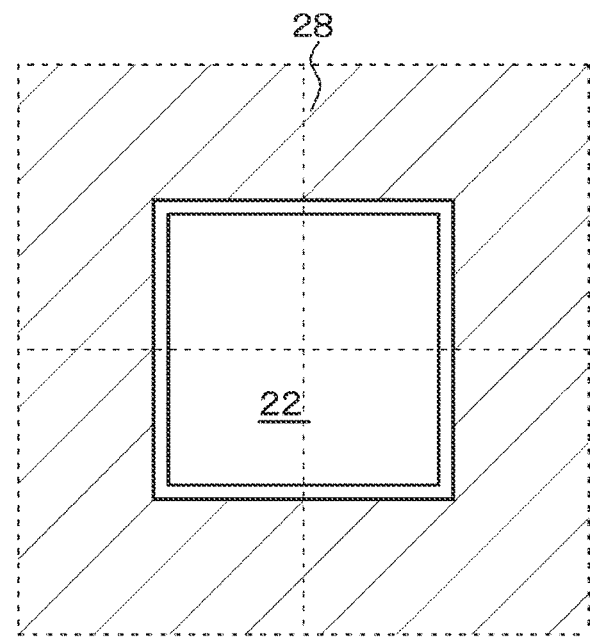

FIG. 47B is a schematic partial cross-sectional diagram of a modification of the imaging elements (two imaging elements disposed side by side) of Embodiment 8, while FIGS. 49A and 49B are schematic partial plan diagrams. According to this modification, the second electrode 22 is provided for each of the imaging elements. The upper charge transfer control electrode 28 is provided apart from the second electrode 22 and surround at least a part of the second electrode 22. A part of the charge accumulation electrode 24 is present below the upper charge transfer control electrode 28. Further, the lower charge transfer control electrode (lower and charge transfer control electrode) 27 is provided below the upper charge transfer control electrode (upper and charge transfer control electrode) 28. The second electrode 22 is smaller in size than that of the modification depicted in FIG. 47A. Specifically, the region included in the second electrode 22 and facing the upper charge transfer control electrode 28 is located nearer the first electrode 21 side than the region included in the second electrode 22 and facing the upper charge transfer control electrode 28 of the modification depicted in FIG. 47A is. The charge accumulation electrode 24 is surrounded by the lower charge transfer control electrode 27.

Embodiment 9

Embodiment 9 relates to solid-state imaging devices having the first configuration and the second configuration.

The solid-state imaging device of Embodiment 9 includes the first electrode 21, the inorganic oxide semiconductor material layer 23B, and a photoelectric conversion unit which includes the photoelectric conversion layer 23A and the second electrode 22 stacked on each other.

The photoelectric conversion unit further includes a plurality of imaging elements each disposed apart from the first electrode 21, and including the charge accumulation electrode 24 so disposed as to face the inorganic oxide semiconductor material layer 23B with the insulation layer 82 interposed between the charge accumulation electrode 24 and the inorganic oxide semiconductor material layer 23B.

An imaging element block is constituted by the plurality of imaging elements.

The first electrode 21 is shared by the plurality of imaging elements constituting the imaging element block.

Alternatively, the solid-state imaging device of Embodiment 9 includes a plurality of the imaging elements described in Embodiment 1 to Embodiment 8.

According to Embodiment 9, one floating diffusion layer is provided for the plurality of imaging elements. In addition, the one floating diffusion layer can be shared by the plurality of imaging elements by controlling charge transfer period timing in an appropriate manner. Further, in this case, one contact hole portion can be shared by the plurality of imaging elements.

Note that the solid-state imaging device of Embodiment 9 has a configuration and a structure substantially similar to those of the solid-state imaging devices described in Embodiment 1 to Embodiment 8 except that the first electrode 21 is shared by the plurality of imaging elements constituting the imaging element block.

Figure 50:
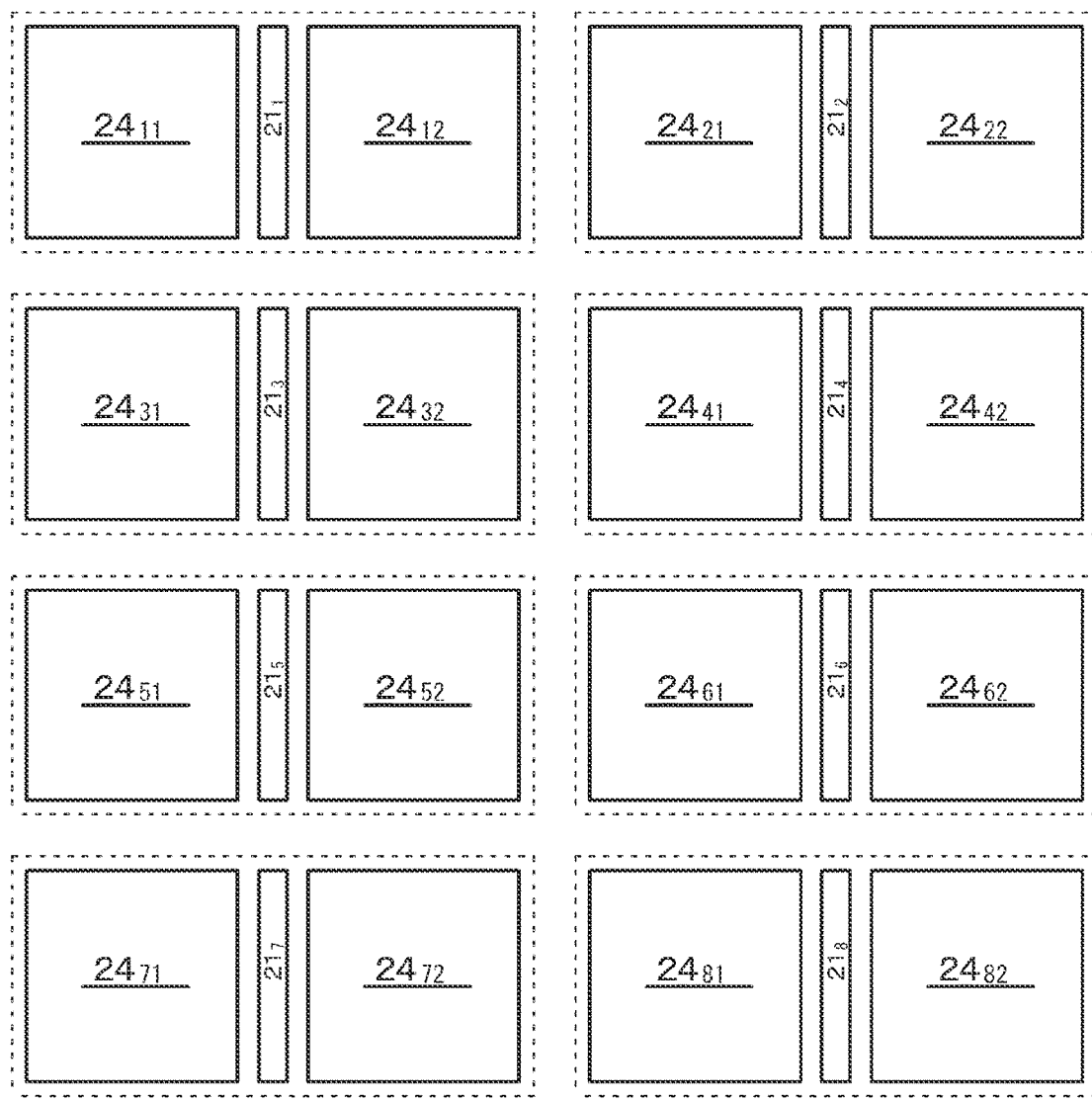
FIG. 50 is a schematic plan diagram of first electrodes and charge accumulation electrode segments included in a solid-state imaging device of Embodiment 9.
Figure 51:
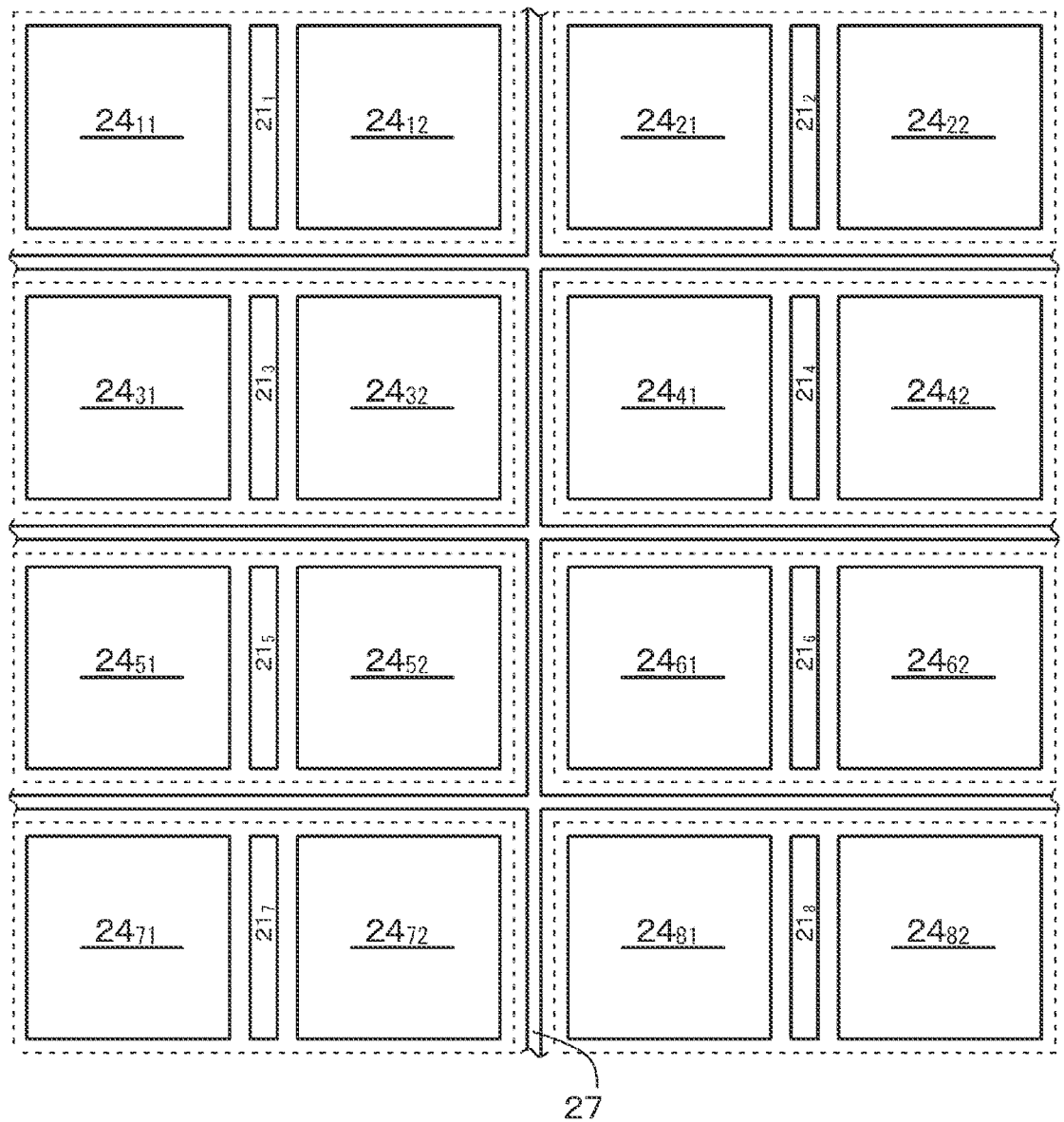
FIG. 51 is a schematic plan diagram of first electrodes and charge accumulation electrode segments included in a first modification of the solid-state imaging device of Embodiment 9.
Figure 52:
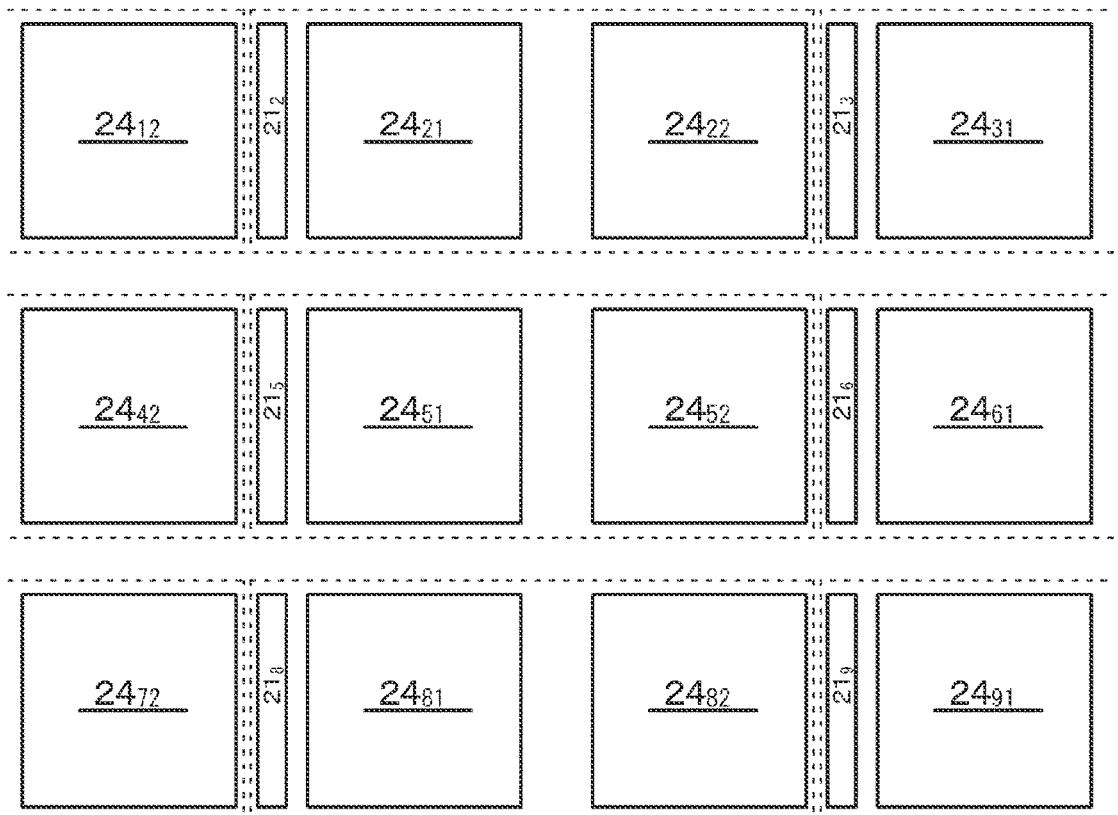
FIG. 52 is a schematic plan diagram of first electrodes and charge accumulation electrode segments included in a second modification of the solid-state imaging device of Embodiment 9.
Figure 53:
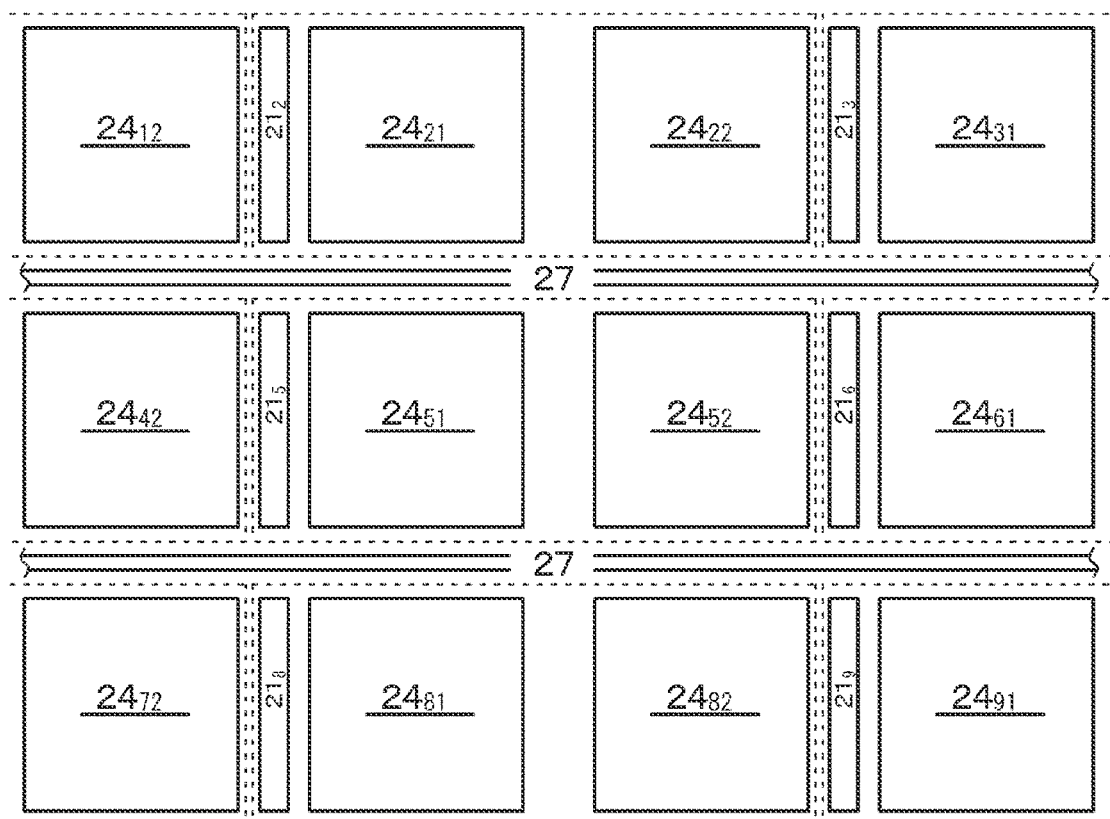
FIG. 53 is a schematic plan diagram of first electrodes and charge accumulation electrode segments included in a third modification of the solid-state imaging device of Embodiment 9.
Figure 54:
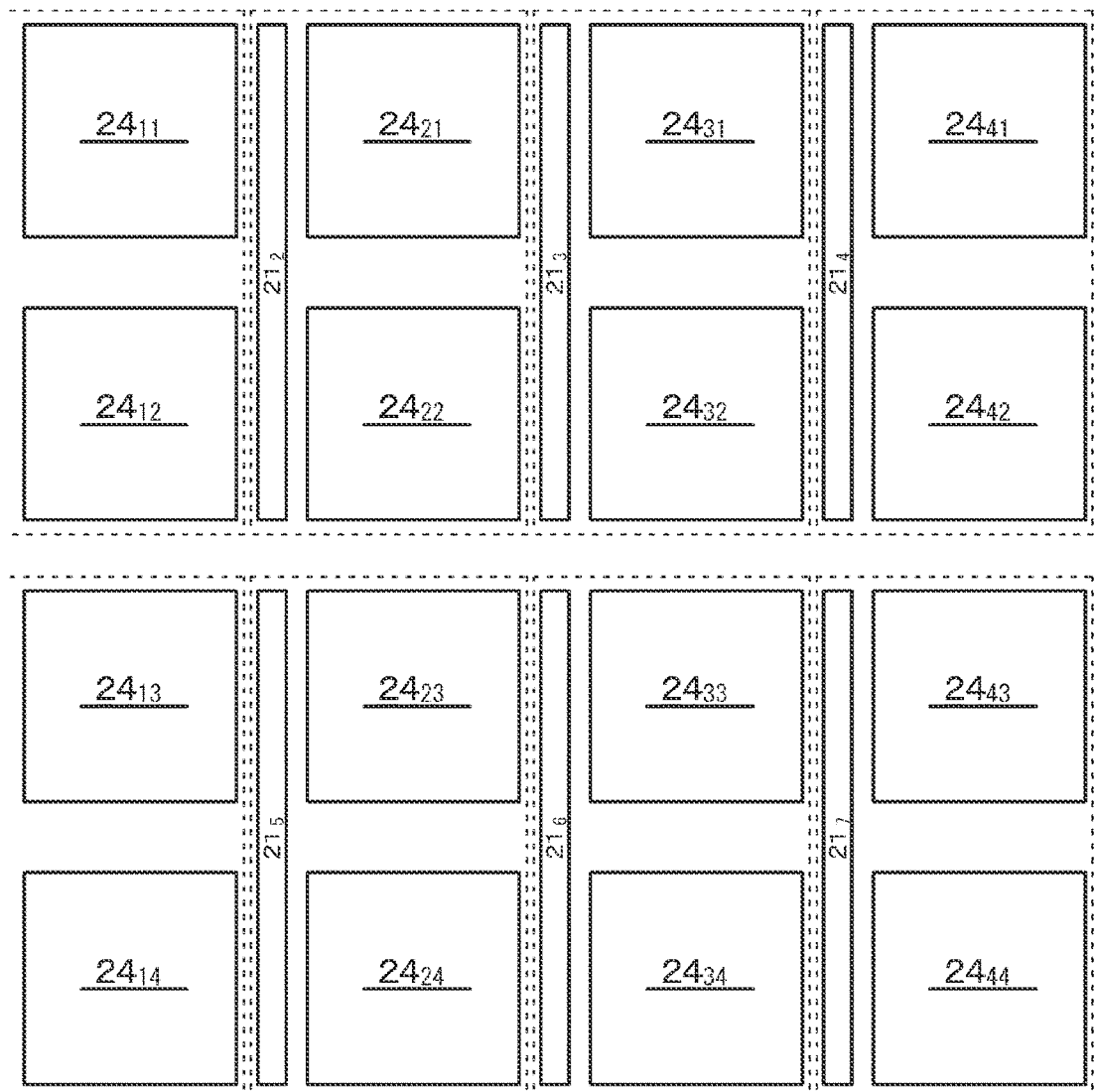
FIG. 54 is a schematic plan diagram of first electrodes and charge accumulation electrode segments included in a fourth modification of the solid-state imaging device of Embodiment 9.
Figure 55:
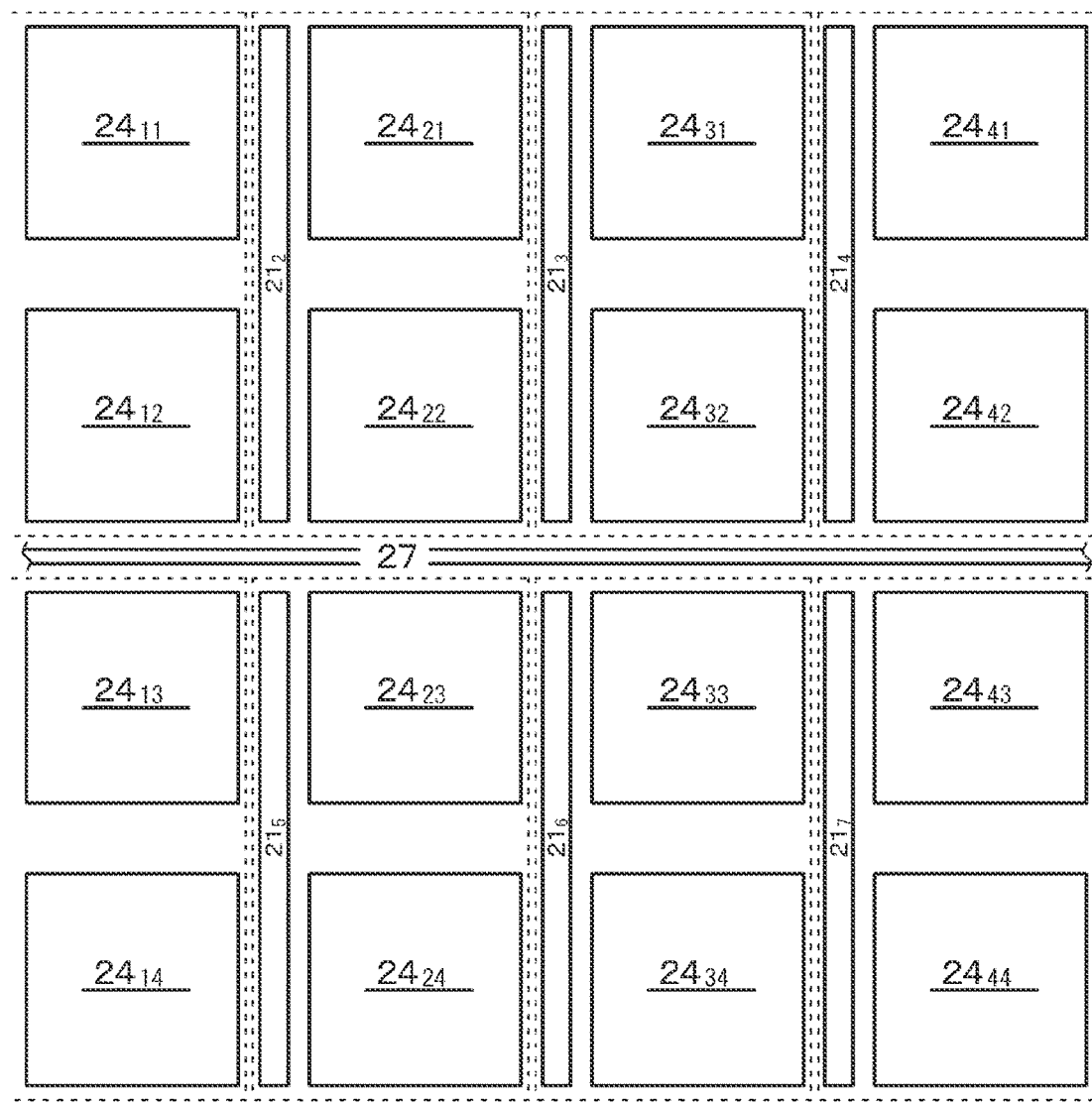
FIG. 55 is a schematic plan diagram of first electrodes and charge accumulation electrode segments included in a fifth modification of the solid-state imaging device of Embodiment 9.

FIG. 50 (Embodiment 9), FIG. 51 (first modification of Embodiment 9), FIG. 52 (second modification of Embodiment 9), FIG. 53 (third modification of Embodiment 9), and FIG. 54 (fourth modification of Embodiment 9) each schematically depict arrangement states of the first electrodes 21 and the charge accumulation electrodes 24 of the solid-state imaging device of Embodiment 9. FIGS. 50, 51, 54, and 55 each depicts 16 imaging elements, while FIGS. 52 and 53 each depicts 12 imaging elements. Further, an imaging element block is constituted by two imaging elements. The imaging element block is indicated by a dotted line surrounding the imaging element block. A suffix is given to each of the first electrode 21 and the charge accumulation electrode 24 for distinction of respective pieces of the first electrode 21 and the charge accumulation electrode 24. This is applicable in the following description. Further, one on-chip micro-lens (not depicted in FIGS. 50 to 57) is disposed above the one imaging element. In addition, the two charge accumulation electrodes 24 are provided in the one imaging element block with the first electrode 21 interposed between the charge accumulation electrodes 24 (see FIGS. 50 and 51). Alternatively, the one first electrode 21 is so disposed as to face the two charge accumulation electrodes 24 provided side by side (see FIGS. 54 and 55). Specifically, the first electrode is disposed adjacent to the charge accumulation electrodes of the respective imaging elements. Alternatively, the first electrode is disposed adjacent to a part of the charge accumulation electrodes of the plurality of imaging elements, and not disposed adjacent to the rest of the charge accumulation electrodes (see FIGS. 52 and 53). In this case, charges are transferred from the rest of the plurality of imaging elements to the first electrode via the part of the plurality of imaging elements. For reliably achieving charge transfer from the respective imaging elements to the first electrode, it is preferable that a distance A between the charge accumulation electrode constituting the imaging element and the charge accumulation electrode constituting the imaging element is longer than a distance B between the first electrode and the charge accumulation electrode in the imaging element adjacent to the first electrode. In addition, it is preferable to increase the distance A as the location of the imaging element is farther from the first electrode. Further, according to the example depicted in FIGS. 51, 53, and 55, the charge transfer control electrode 27 is disposed between the plurality of imaging elements constituting the imaging element block. Charge transfer between the imaging element blocks located with the charge transfer control electrode 27 interposed therebetween can reliably be reduced by providing the charge transfer control electrode 27. It is sufficient if $V_{31} > V_{17}$ is set on an assumption that a potential applied to the charge transfer control electrode 27 is $V_{17}$.

The charge transfer control electrode 27 may be disposed on the first electrode side either at the same level as the level of the first electrode 21 or the charge accumulation electrode 24, or at a different level (specifically, at a level lower than the first electrode 21 or the charge accumulation electrode 24). In the former case, a distance between the charge transfer control electrode 27 and the photoelectric conversion layer can be reduced. Accordingly, potential control is easily achievable. On the other hand, in the latter case, a distance between the charge transfer control electrode 27 and the charge accumulation electrode 24 can be reduced. Accordingly, the latter case is advantageous for miniaturization.

Described hereinafter will be an operation of the imaging element block constituted by the first electrode $21_2$ and the two charge accumulation electrodes $24_{21}$ and $24_{22}$.

During a charge accumulation period, a potential $V_{11}$ is applied from the driving circuit to the first electrode $21_2$, and a potential $V_{31}$ is applied from the driving circuit to the charge accumulation electrodes $24_{21}$ and $24_{22}$. Photoelectric conversion is performed in the photoelectric conversion layer 23A by entrance of light into the photoelectric conversion layer 23A. Holes generated by the photoelectric conversion are sent from the second electrode 22 to the driving circuit via the wire $V_{OU}$. Meanwhile, the potential $V_{11}$ of the first electrode $21_2$ is set to a potential higher than the potential $V_{21}$ of the second electrode 22, i.e., for example, a positive potential is applied to the first electrode $21_2$, and a negative potential is applied to the second electrode 22. Accordingly, $V_{31} \geq V_{11}$, preferably $V_{31} > V_{11}$ is set. In this manner, electrodes generated by the photoelectric conversion are attracted toward the charge accumulation electrodes $24_{21}$ and $24_{22}$, and stay in a region included in the inorganic oxide semiconductor material layer 23B and the like and facing the charge accumulation electrodes $24_{21}$ and $24_{22}$. Specifically, charges are accumulated in the inorganic oxide semiconductor material layer 23B and the like. In the state of $V_{31} \geq V_{11}$, electrodes generated within the photoelectric conversion layer 23A are not transferred toward the first electrode $21_2$. The value of the potential in the region included in the inorganic oxide semiconductor material layer 23B and the like and facing the charge accumulation electrodes $24_{21}$ and $24_{22}$ shifts toward the negative side with an elapse of the photoelectric conversion time.

A reset operation is performed in a latter part of the charge accumulation period. As a result, the potential of the first floating diffusion layer is reset, and becomes the potential $V_{DD}$ of the power source.

After completion of the reset operation, charges are read out. Specifically, during a charge transfer period, a potential $V_{21}$ is applied from the driving circuit to the first electrode $21_2$, a potential $V_{32\text{-}A}$ is applied from the driving circuit to the charge accumulation electrode $24_{21}$, and a potential $V_{32\text{-}B}$ is applied from the driving circuit to the charge accumulation electrode $24_{22}$. In this case, $V_{32\text{-}A} < V_{21} < V_{32\text{-}B}$ is set herein. In such a manner, electrodes staying in the region included in the inorganic oxide semiconductor material layer 23B and the like and facing the charge accumulation electrode $24_{21}$ are read out to the first electrode $21_2$, and further to the first floating diffusion layer. Specifically, charges accumulated in the regions included in the inorganic oxide semiconductor material layer 23B and the like and facing the charge accumulation electrode $24_{21}$ are read out to the control unit. After completion of the read out, $V_{32\text{-}B} \leq V_{32\text{-}A} < V_{21}$ is set. Note that $V_{32\text{-}B} < V_{21} < V_{32\text{-}A}$ may be set in the example depicted in FIGS. 54 and 55. In this manner, electrodes staying in the region included in the inorganic oxide semiconductor material layer 23B and the like and facing the charge accumulation electrode $24_{22}$ are read out to the first electrode $21_2$, and further to the first floating diffusion layer. In addition, according to the example depicted in FIGS. 52 and 53, electrodes staying in the region included in the inorganic oxide semiconductor material layer 23B and the like and facing the charge accumulation electrode $24_{22}$ may be read out to the first floating diffusion layer via the first electrode $21_3$ adjacent to the charge accumulation electrode $24_{22}$. In this manner, charges accumulated in the region included in the inorganic oxide semiconductor material layer 23B and the like and facing the charge accumulation electrode $24_{22}$ and the like are read out to the control unit. Note that the potential of the first floating diffusion layer may be reset after completion of read out of charges accumulated in the region included in the inorganic oxide semiconductor material layer 23B and the like and facing the charge accumulation electrode $24_{21}$ to the control unit.

Figure 58A:
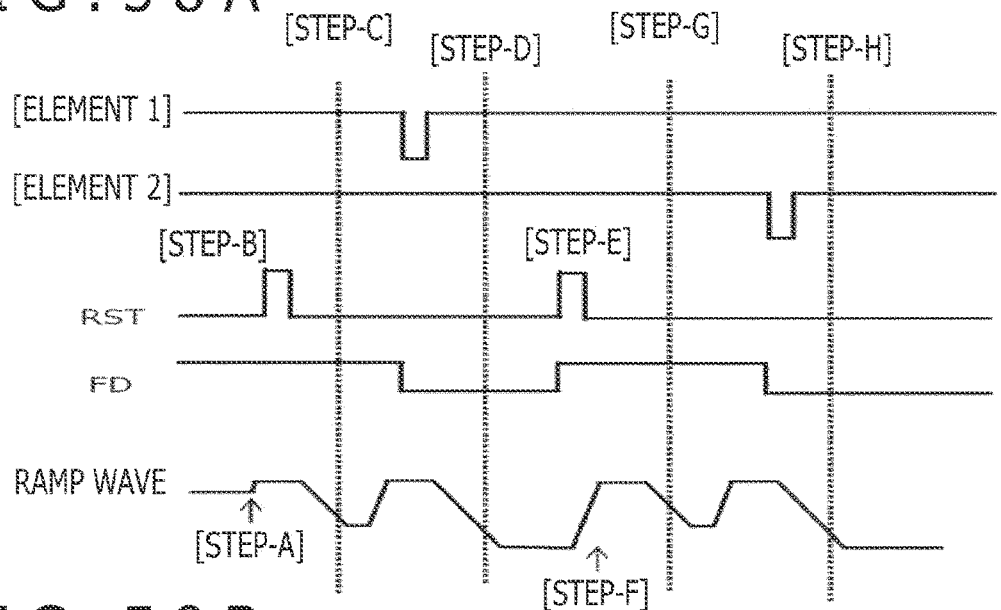
FIGS. 58A, 58B, and 58C are charts indicating read-out driving examples performed in an imaging element block of Embodiment 9.

FIG. 58A depicts a read-out driving example performed in the imaging element block of Embodiment 9.

[Step-A]
  auto-zero signal input to a comparator
[Step-B]
  reset operation of one shared floating diffusion layer
[Step-C]
  P-phase read-out in the imaging element corresponding to the charge accumulation electrode $24_{21}$, and charge transfer to the first electrode $21_2$
[Step-D]
  D-phase read-out in the imaging element corresponding to the charge accumulation electrode $24_{21}$, and charge transfer to the first electrode $21_2$
[Step-E]
  reset operation of one shared floating diffusion layer
[Step-F]
  auto-zero signal input to a comparator
[Step-G]
  P-phase read-out in the imaging element corresponding to the charge accumulation electrode $24_{22}$, and charge transfer to the first electrode $21_2$
[Step-H]
  D-phase read-out in the imaging element corresponding to the charge accumulation electrode $24_{22}$, and charge transfer to the first electrode $21_2$ According to the foregoing flow, signals are read out from the two imaging elements corresponding to the charge accumulation electrode $24_{21}$ and the charge accumulation electrode $24_{22}$. On the basis of correlated double sampling (CDS) processing, a difference between the P-phase read out in [Step-C] and the D-phase read out in [Step-D] corresponds to a signal from the imaging element corresponding to the charge accumulation electrode $24_{21}$, and a difference between the P-phase read out in [Step-G] and the D-phase read out in [Step-H] corresponds to a signal from the imaging element corresponding to the charge accumulation electrode $24_{22}$.

Figure 58B:
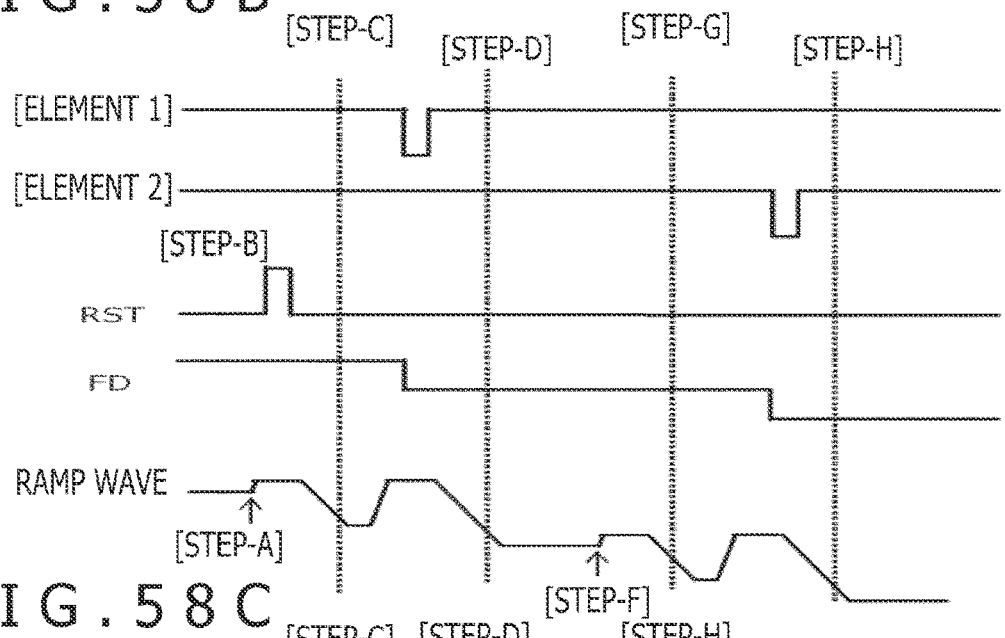
Figure 58C:
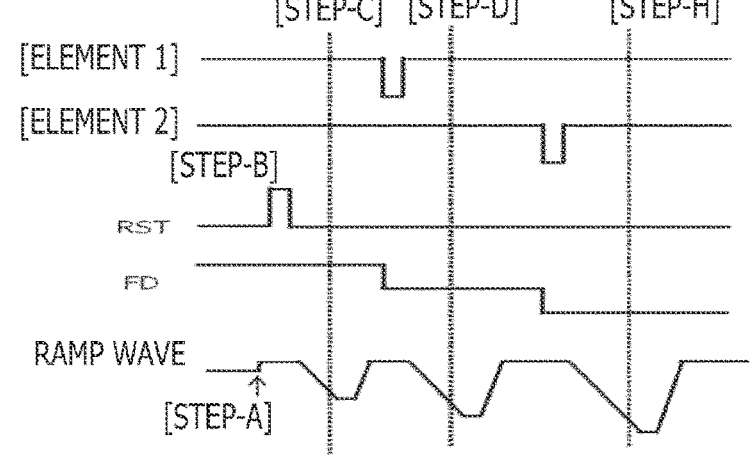
Figure 59:
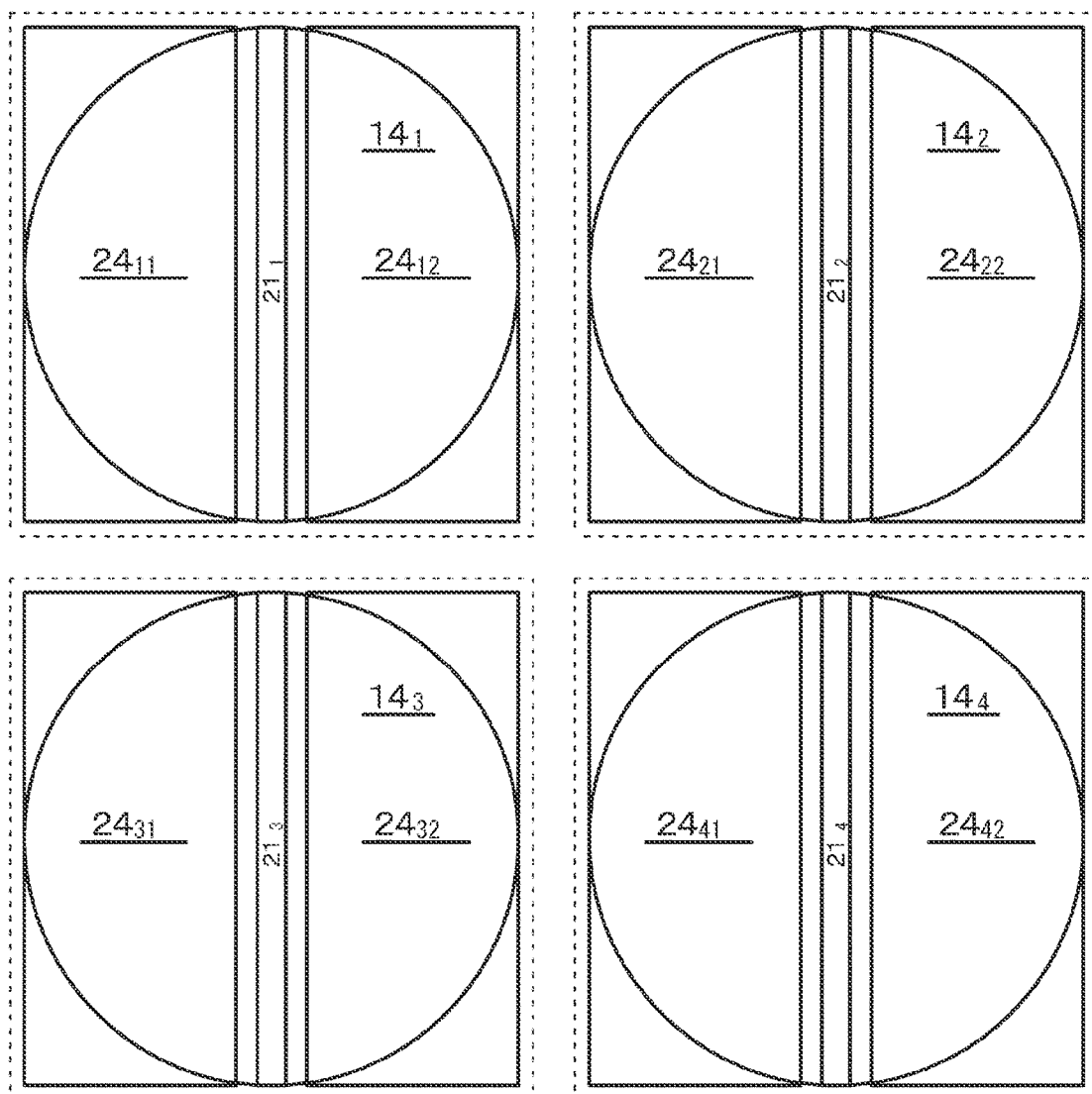
FIG. 59 is a schematic plan diagram of first electrodes and charge accumulation electrode segments included in a solid-state imaging device of Embodiment 10.

Note that the operation of [Step-E] may be omitted (see FIG. 58B). Further, the operation of [Step-F] may be omitted. In this case, [Step-G] may be further omitted (see FIG. 58C). The difference between the P-phase read out in [Step-C] and the D-phase read out in [Step-D] corresponds to a signal from the imaging element corresponding to the charge accumulation electrode $24_{21}$, and a difference between the D-phase read out in [Step-D] and the D-phase read out in [Step-H] corresponds to a signal from the imaging element corresponding to the charge accumulation electrode $24_{22}$.

Figure 56:
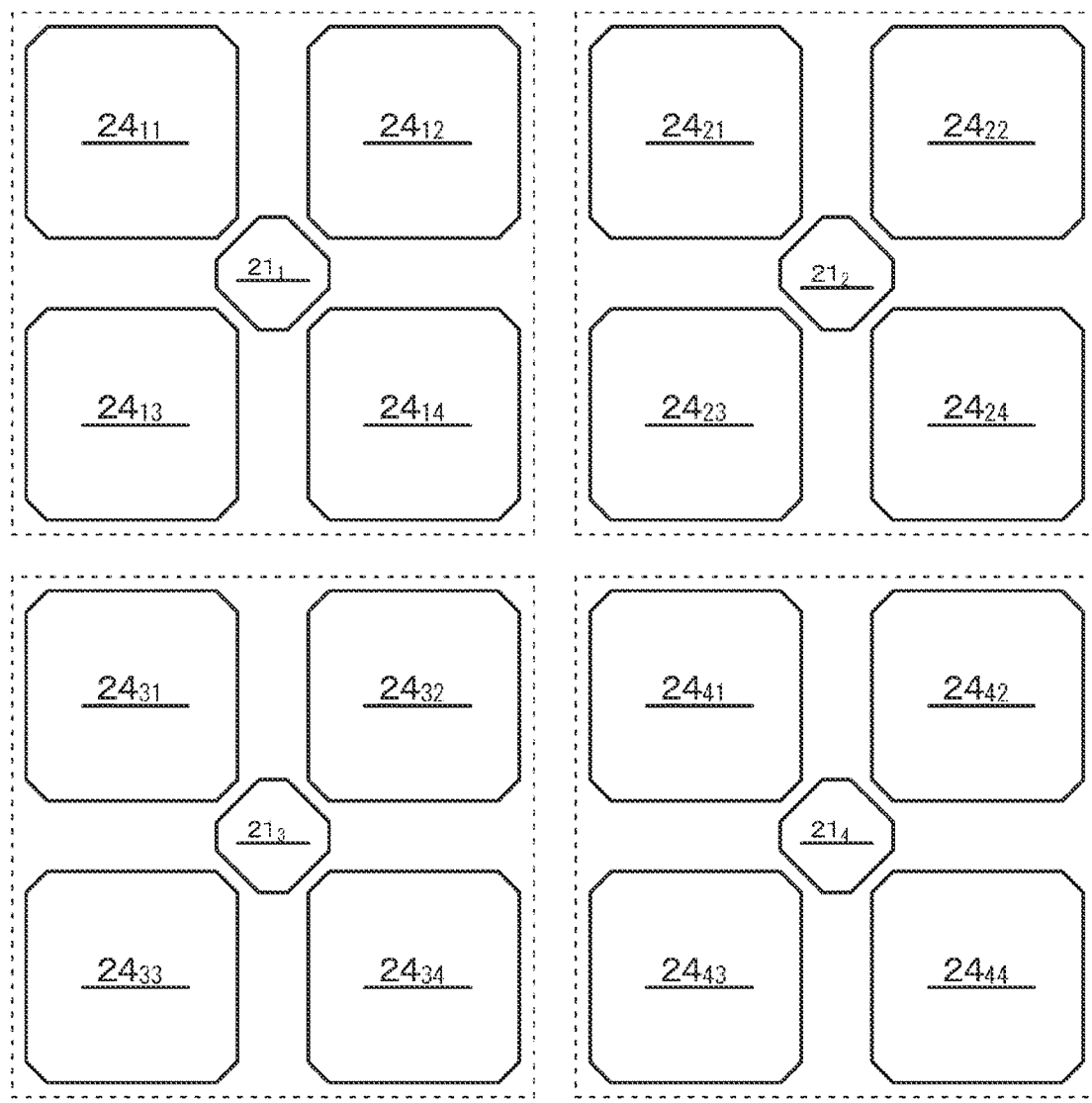
FIG. 56 is a schematic plan diagram of first electrodes and charge accumulation electrode segments included in a sixth modification of the solid-state imaging device of Embodiment 9.
Figure 57:
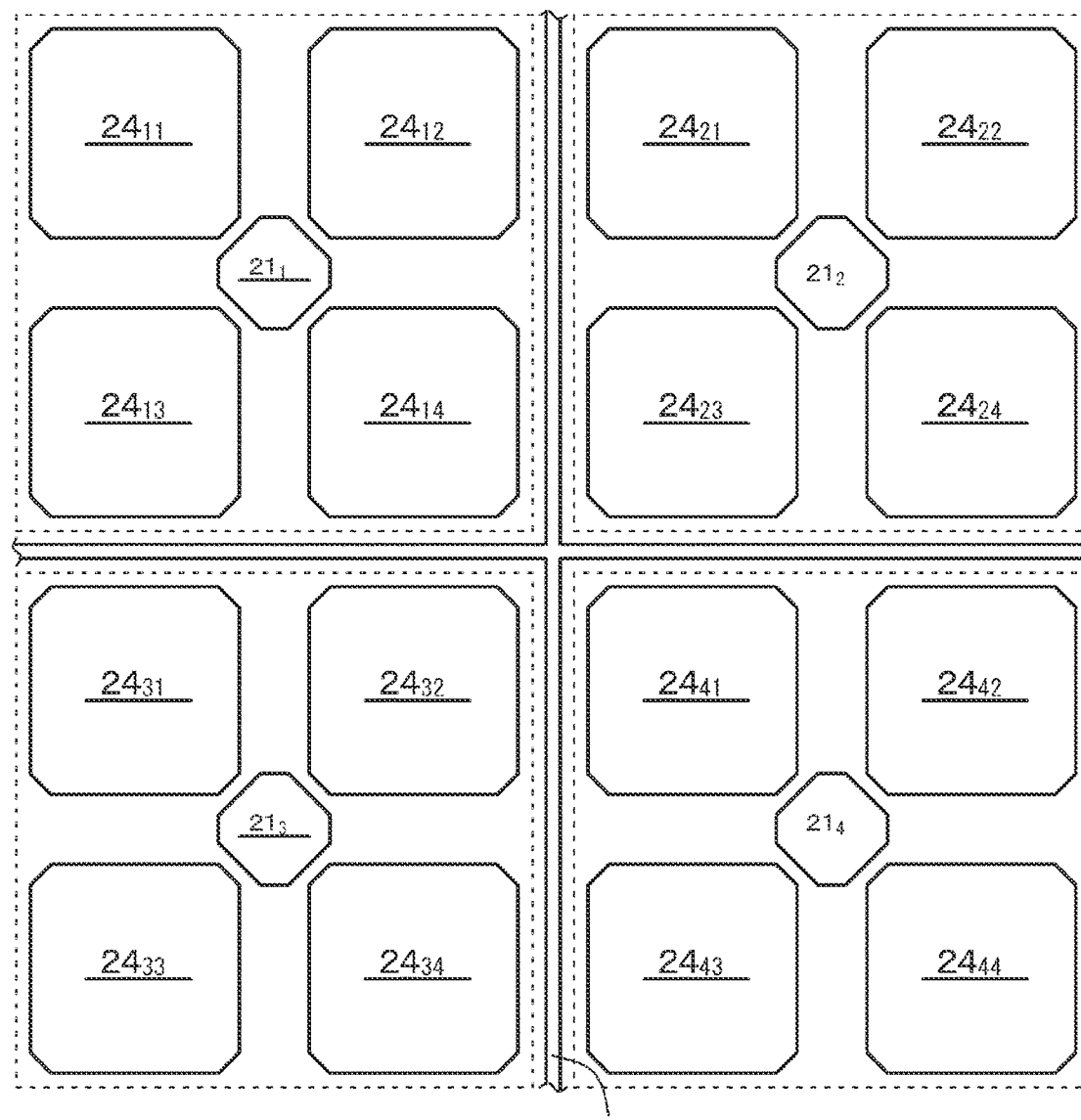
FIG. 57 is a schematic plan diagram of first electrodes and charge accumulation electrode segments included in a seventh modification of the solid-state imaging device of Embodiment 9.

According to a modification depicted in FIG. 56 (sixth modification of Embodiment 9) and FIG. 57 (seventh modification of Embodiment 9) where arrangement states of the first electrode 21 and the charge accumulation electrode 24 are schematically depicted, the imaging element block includes four imaging elements. Operations of these solid-state imaging devices may be substantially similar to the operations of the solid-state imaging devices depicted in FIGS. 50 to 55.

According to the solid-state imaging device of Embodiment 9, the first electrode is shared by the plurality of imaging elements constituting the imaging element block. Accordingly, a configuration and a structure of a pixel region where the plurality of imaging elements is arranged can be simplified and miniaturized. Note that the plurality of imaging elements provided for the one floating diffusion layer may be constituted by a plurality of the imaging elements of the first type, or may be constituted by at least the one first type imaging element, or the one, two, or more second type imaging elements.

Embodiment 10

Figure 60:
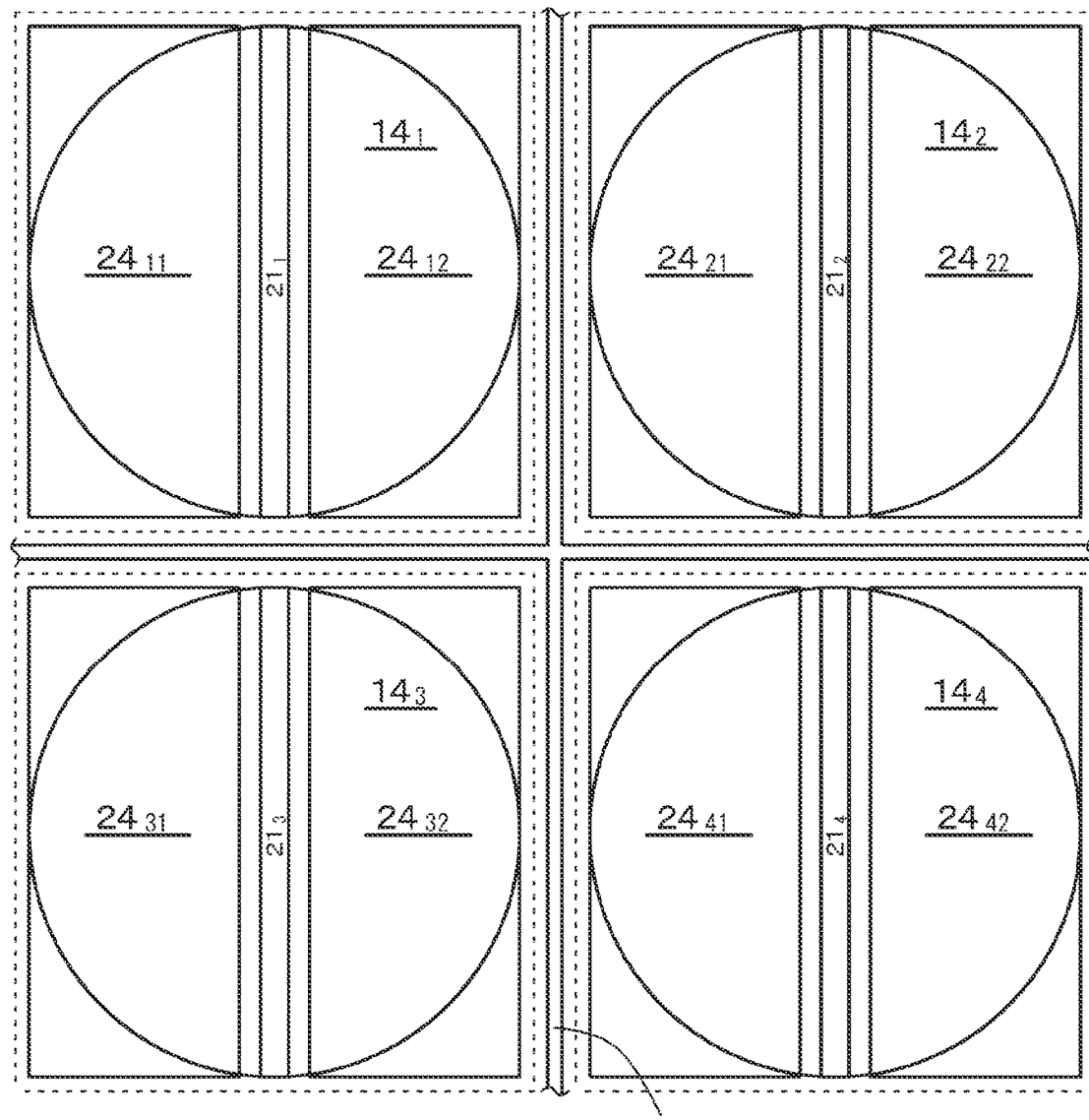
FIG. 60 is a schematic plan diagram of first electrodes and charge accumulation electrode segments included in a modification of the solid-state imaging device of Embodiment 10.
Figure 61:
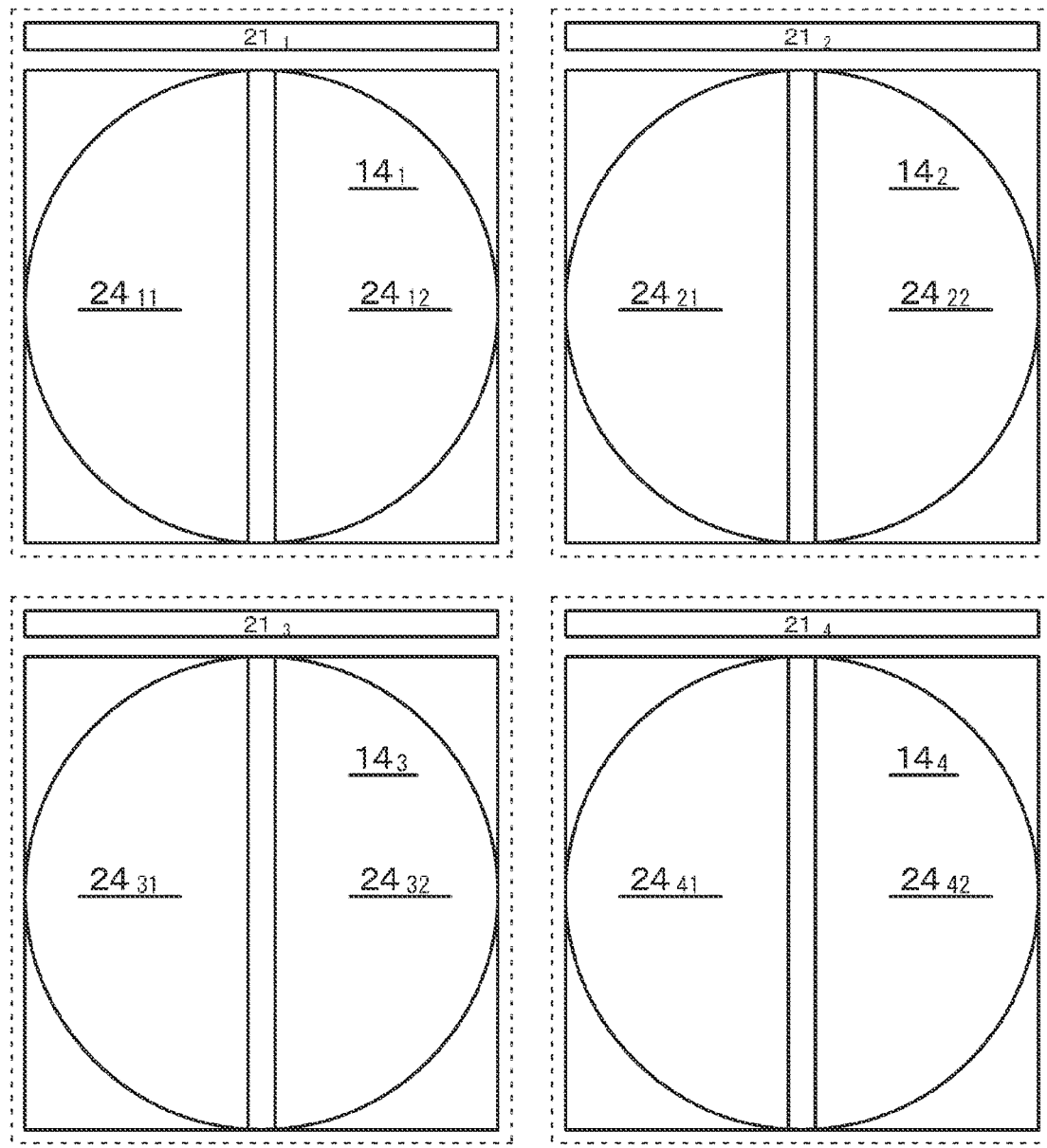
FIG. 61 is another schematic plan diagram of first electrodes and charge accumulation electrode segments included in a modification of the solid-state imaging device of Embodiment 10.
Figure 62:
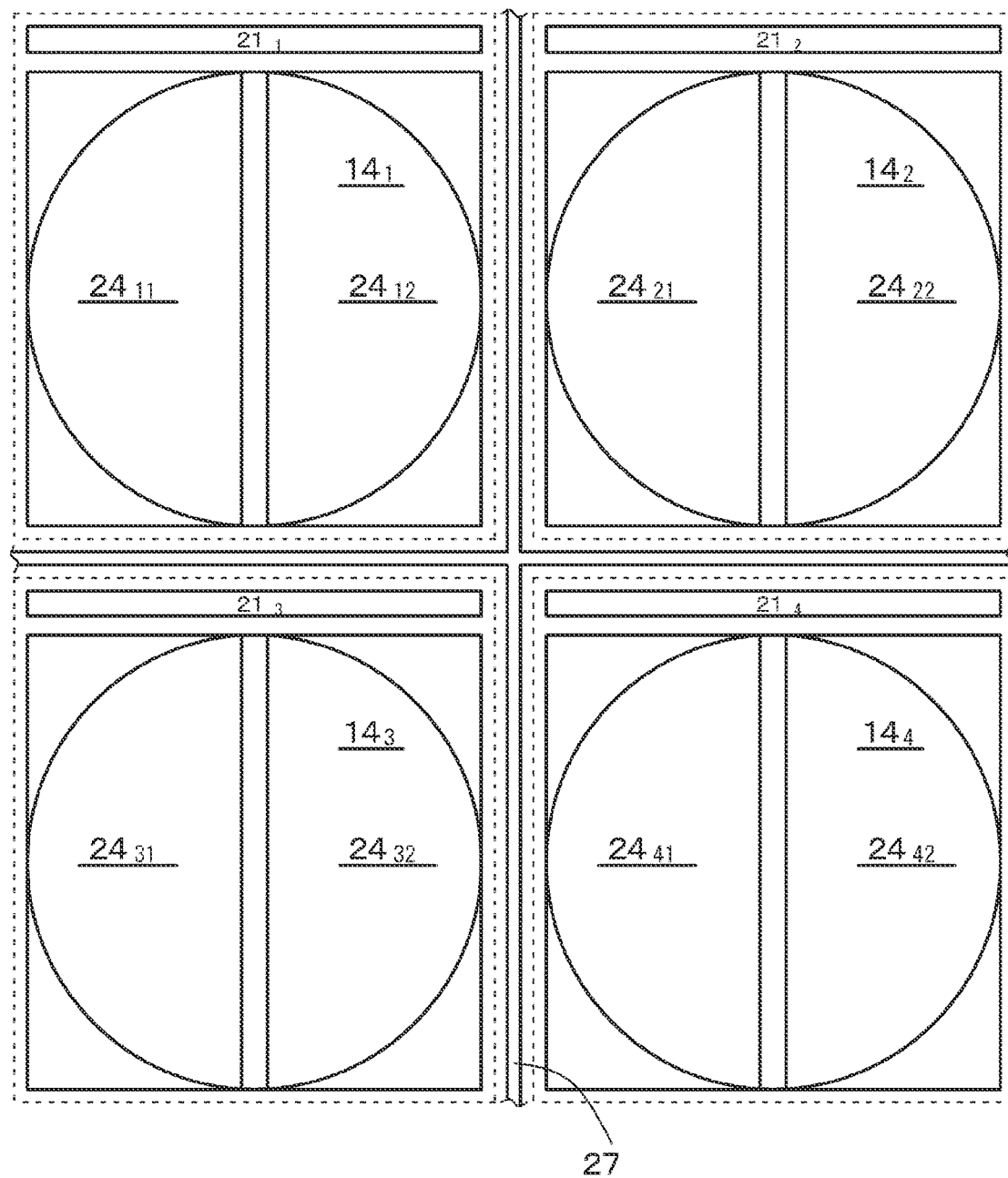
FIG. 62 is still another schematic plan diagram of first electrodes and charge accumulation electrode segments included in a modification of the solid-state imaging device of Embodiment 10.

Embodiment 10 is a modification of Embodiment 9. According to a solid-state imaging device of Embodiment 10 depicted in FIGS. 59, 60, 61, and 62 where arrangement states of the first electrodes 21 and the charge accumulation electrodes 24 are schematically depicted, the imaging element block is constituted by two imaging elements. Further, the one on-chip micro-lens 14 is disposed above the imaging element block. According to the example depicted in FIGS. 60 and 62, note that the charge transfer control electrode 27 is disposed between the plurality of imaging elements constituting the imaging element block.

For example, each of photoelectric conversion layers corresponding to the charge accumulation electrodes $24_{11}$, $24_{21}$, $24_{31}$, and $24_{41}$ constituting the imaging element block has high sensitivity to incident light coming from diagonally upper right in the figure. On the other hand, each of photoelectric conversion layers corresponding to the charge accumulation electrodes $24_{12}$, $24_{22}$, $24_{32}$, and $24_{42}$ constituting the imaging element block has high sensitivity to incident light coming from diagonally upper left in the figure. Accordingly, for example, an image surface phase difference signal can be acquired by combining the imaging element having the charge accumulation electrode $24_{11}$, and the imaging element having the charge accumulation electrode $24_{12}$. Further, one imaging element can be produced by combining the imaging element having the charge accumulation electrode $24_{11}$ and the imaging element having the charge accumulation electrode $24_{12}$ on the basis of a sum of signals received from these imaging elements. According to the example depicted in FIG. 59, the first electrode 21₁ is disposed between the charge accumulation electrode $24_{11}$ and the charge accumulation electrode $24_{12}$. However, as in an example depicted in FIG. 61, the one first electrode 21₁ may be so disposed as to face the two charge accumulation electrodes $24_{11}$ and $24_{12}$ disposed side by side to further improve sensitivity.

While the present disclosure has been described on the basis of the preferred embodiments, the present disclosure is not limited to these embodiments. The structures and configurations, the manufacturing conditions, the manufacturing method, and the used materials of the imaging element, the stacked imaging element, and the solid-state imaging device described in the embodiments are presented by way of example, and may be changed in appropriate manners. The imaging elements of the respective embodiments may be combined in appropriate manners. For example, the configuration and the structure of the imaging element of the present disclosure are applicable to a light emitting element such as an organic EL element, or to a channel forming region of a thin-film transistor.

Depending on cases, each of the floating diffusion layers $FD_1$, $FD_2$, $FD_3$, 51C, 45C, and 46C may be shared as described above.

Figure 63:
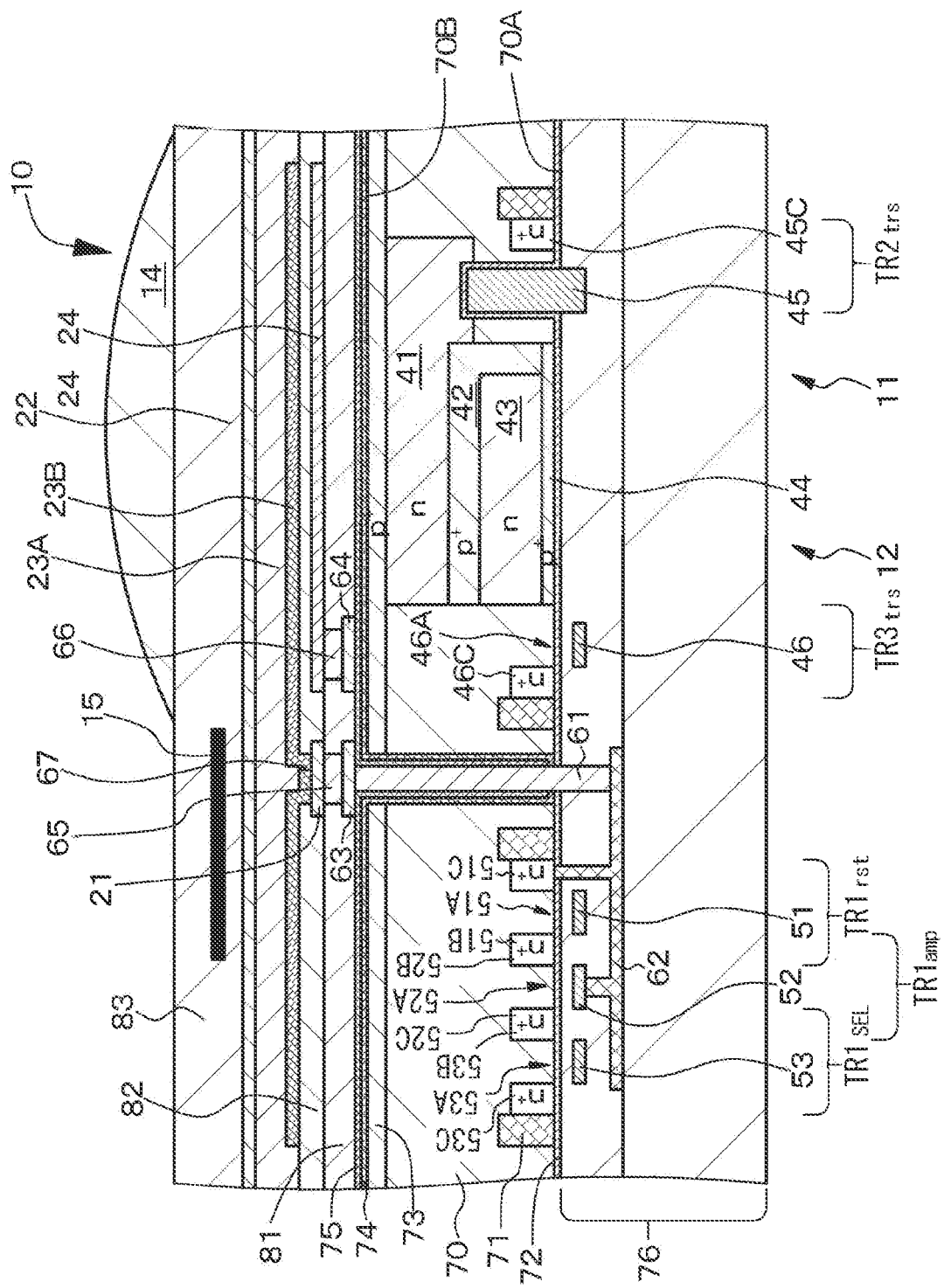
FIG. 63 is a schematic partial cross-sectional diagram of still another modification of the imaging element and a stacked imaging element of Embodiment 1.

Further, as depicted in a modification of the imaging element and the stacked imaging element described in Embodiment 1 in FIG. 63, for example, adoptable is a configuration where light enters from the second electrode 22 side. In this case, the light shield layer 15 is formed on the light entrance side near the second electrode 22. Note that various types of wires provided on the light entrance side of the photoelectric conversion layer may function as the light shield layer.

Figure 64:
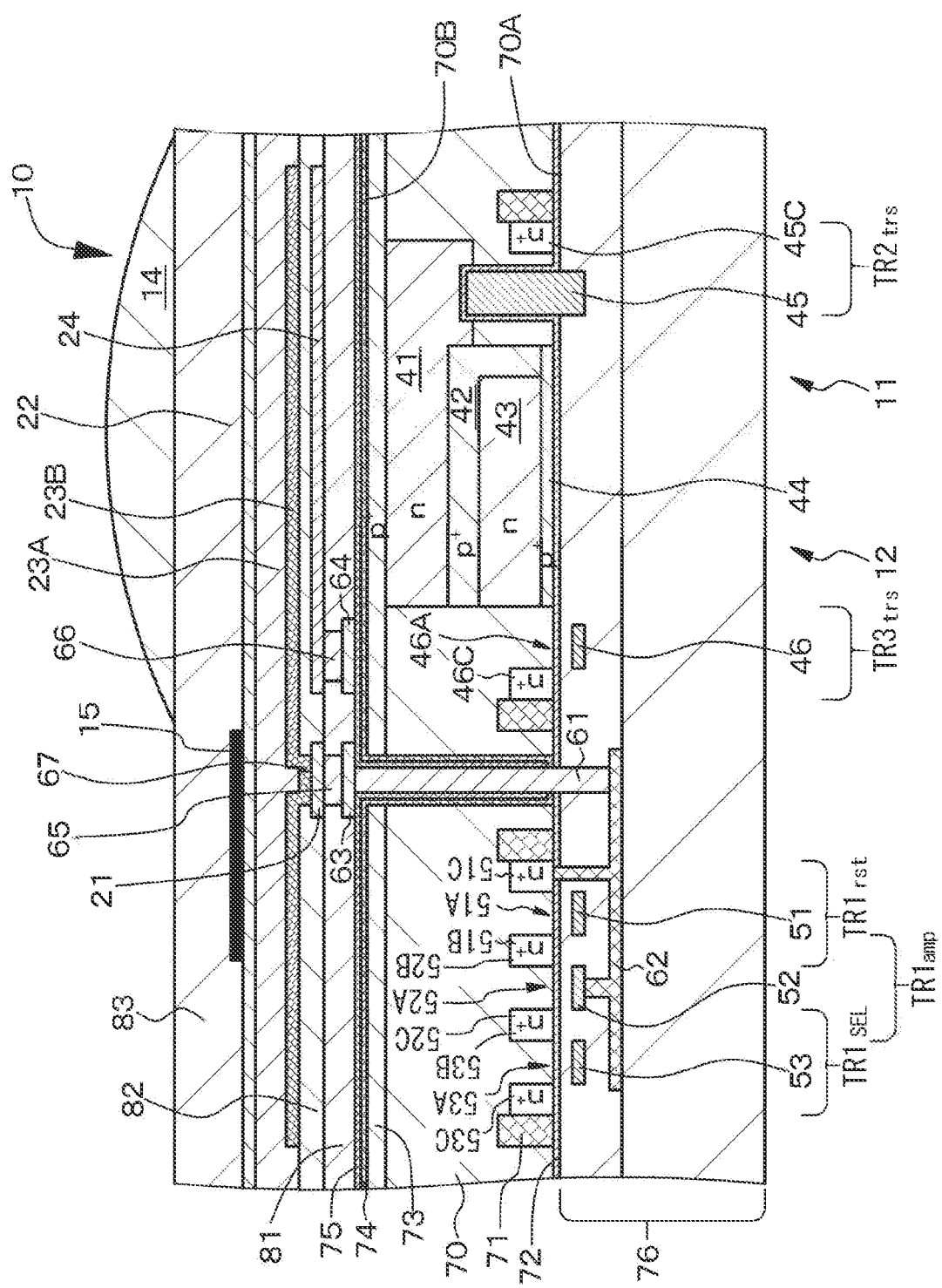
FIG. 64 is a schematic partial cross-sectional diagram of yet another modification of the imaging element and the stacked imaging element of Embodiment 1.
Figure 65:
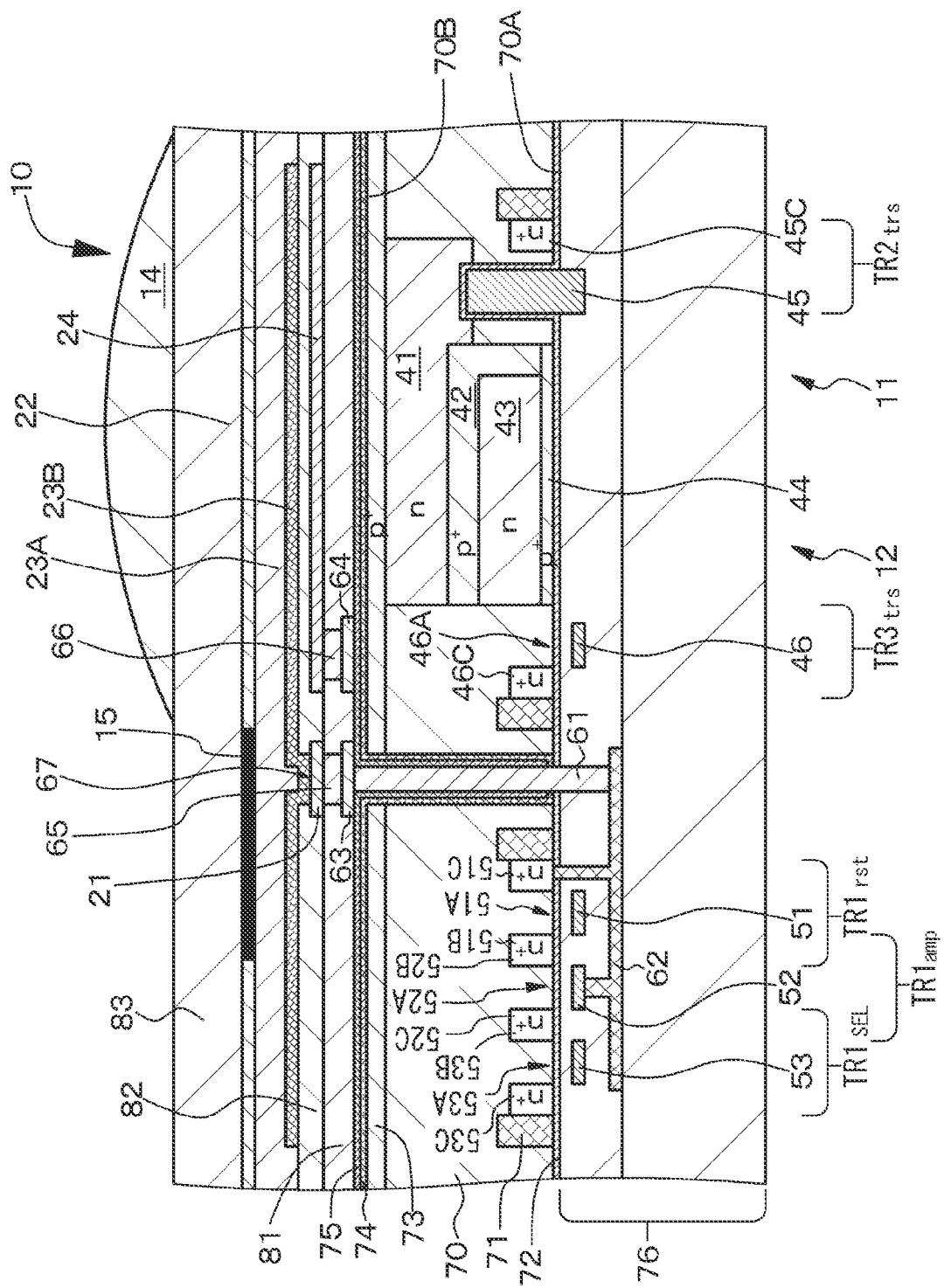
FIG. 65 is a schematic partial cross-sectional diagram of a further modification of the imaging element and the stacked imaging element of Embodiment 1.

While the light shield layer 15 is formed above the second electrode 22 in the example depicted in FIG. 63, i.e., the light shield layer 15 is formed on the light entrance side near the second electrode 22 and above the first electrode 21, the light shield layer 15 may be formed on the light entrance side surface of the second electrode 22 as depicted in FIG. 64. In addition, depending on cases, the light shield layer 15 may be formed in the second electrode 22 as depicted in FIG. 65.

Figure 66:
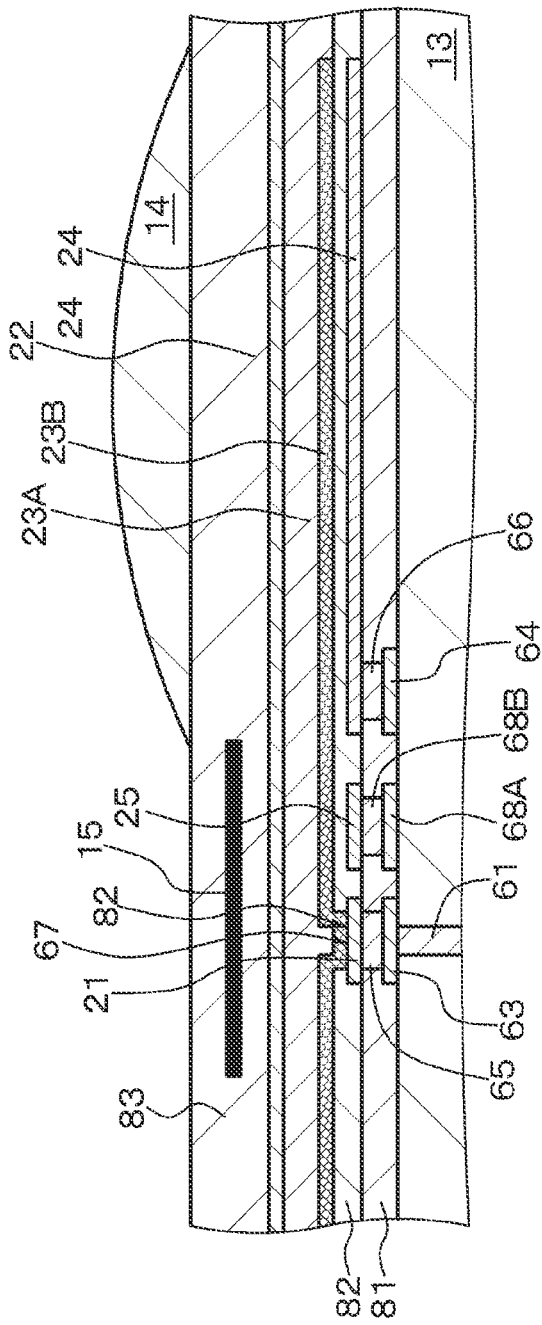
FIG. 66 is a schematic partial cross-sectional diagram of a different modification of the imaging element and the stacked imaging element of Embodiment 1.
Figure 67:
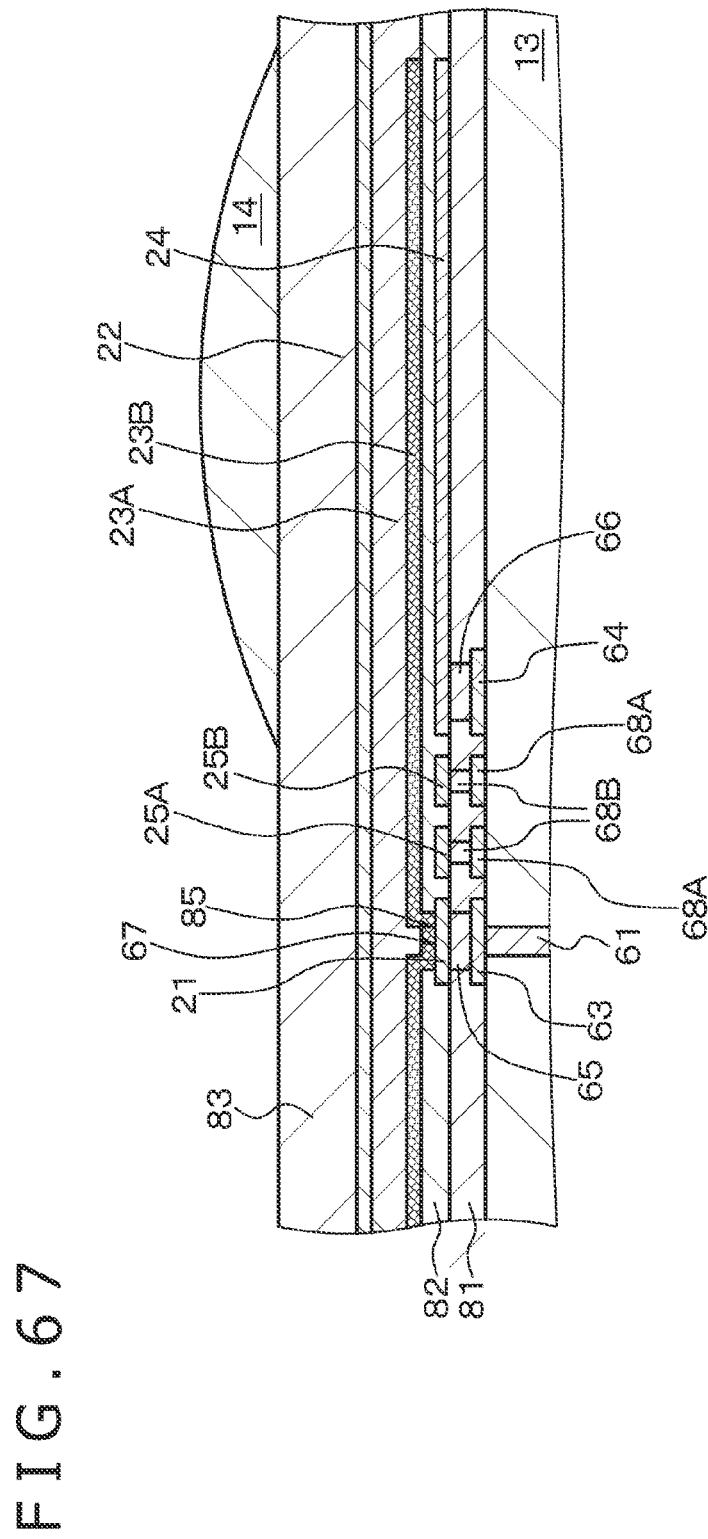
FIG. 67 is a schematic partial cross-sectional diagram of a further modification of the imaging element of Embodiment 4.

Alternatively, light may enter from the second electrode 22 side, but may be prohibited from entering the first electrode 21. Specifically, as depicted in FIG. 63, the light shield layer 15 is formed on the light entrance side near the second electrode 22 and above the first electrode 21. Alternatively, as depicted in FIG. 67, adoptable is a structure where the on-chip micro-lens 14 is provided above the charge accumulation electrode 24 and the second electrode 22. In this case, light entering the on-chip micro-lens 14 is converged on the charge accumulation electrode 24 and prohibited from reaching the first electrode 21. As described in Embodiment 4, in a case where the transfer control electrode 25 is provided, adoptable is a mode where light does not enter the first electrode 21 and the transfer control electrode 25. More specifically, as depicted in FIG. 66, adoptable is a structure where the light shield layer 15 is formed above the first electrode 21 and the transfer control electrode 25. Alternatively, adoptable is a structure where light entering the on-chip micro-lens 14 does not reach the first electrode 21, or the first electrode 21 and the transfer control electrode 25.

Contribution to photoelectric conversion by a portion included in the photoelectric conversion unit 23 and located above the first electrode 21 (or above the first electrode 21 and the transfer control electrode 25) is eliminated by adopting these configurations and structures, providing the light shield layer 15 such that light enters only the portion included in the photoelectric conversion unit 23 and located above the charge accumulation electrode 24, or designing the on-chip micro-lens 14. Accordingly, all pixels can be more reliably and simultaneously reset, and therefore the global shutter function can be more easily achieved. Specifically, according to a driving method of the solid-state imaging device which includes a plurality of imaging elements having the foregoing configurations and structures, following steps are repeated.

In all of the imaging elements, charges in the first electrode 21 are discharged to the outside of the system while simultaneously accumulating charges in the inorganic oxide semiconductor material layer 23B and the like.

Subsequently, in all of the imaging elements, the charges accumulated in the inorganic oxide semiconductor material layer 23B and the like are simultaneously transferred to the first electrode 21. After completion of transfer, the charges transferred to the first electrode 21 are sequentially read out in each of the imaging elements.

According to the driving method of the solid-state imaging device described above, each of the imaging elements has such a structure where light having entered from the second electrode side does not enter the first electrode. In addition, in all of the imaging elements, charges in the first electrode are simultaneously discharged to the outside of the system while accumulating charges in the inorganic oxide semiconductor material layer and the like. Accordingly, the first electrodes of all the imaging elements can simultaneously and reliably be reset. Subsequently, in all of the imaging elements, the charges accumulated in the inorganic oxide semiconductor material layer and the like are simultaneously transferred to the first electrode. After completion of transfer, the charges transferred to the first electrode are sequentially read out in each of the imaging elements. Accordingly, what is generally called a global shutter function can easily be achieved.

In a case where the one inorganic oxide semiconductor material layer 23B is commonized for a plurality of the imaging elements, an end of the inorganic oxide semiconductor material layer 23B is preferably covered at least by the photoelectric conversion layer 23A in view of protection of the end of the inorganic oxide semiconductor material layer 23B. It is sufficient if the imaging element in such a case has a structure depicted in a schematic cross-sectional diagram in FIG. 1 at a right end of the inorganic oxide semiconductor material layer 23B.

Further, as a modification of Embodiment 4, a plurality of transfer control electrodes may be provided from a position closest to the first electrode 21 toward the charge accumulation electrode 24 as depicted in FIG. 67. Note that FIG. 67 depicts an example where two transfer control electrodes 25A and 25B are provided. In addition, adoptable is a structure where the on-chip micro-lens 14 is provided above the charge accumulation electrode 24 and the second electrode 22. In this case, light entering the on-chip micro-lens 14 is converged on the charge accumulation electrode 24 and prohibited from reaching the first electrode 21 and the transfer control electrodes 25A and 25B.

The first electrode 21 may be configured to extend within an opening 85 formed in the insulation layer 82, and connect to the inorganic oxide semiconductor material layer 23B.

Further, while the case of application to the CMOS solid-state imaging device which includes unit pixels each detecting a signal charge corresponding to an incident light amount as a physical amount and disposed in a matrix has been described in the embodiments by way of example, the application is not limited to application to the CMOS solid-state imaging device, but may be application to a CCD solid-state imaging device. In the latter case, the signal charge is transferred in the vertical direction by a vertical transfer register having a CCD structure, transferred in the horizontal direction by a horizontal transfer register, and amplified to output a pixel signal (image signal). Further, the application is not limited to any type of a column-type solid-state imaging device which includes pixels arranged in a two-dimensional matrix, and column signal processing circuits disposed one for each pixel column. Further, depending on cases, the selection transistor may be omitted.

Besides, application of the imaging element and the stacked imaging element of the present disclosure is not limited to a solid-state imaging device which detects a distribution of incident light amounts of visible light and captures the distribution as an image, but may be a solid-state imaging device which captures a distribution of incident light amounts of infrared lights, X-rays, particles, or the like as an image. In addition, in a broad sense, the imaging element and the stacked imaging element of the present disclosure is applicable to any type of solid-state imaging device (physical amount distribution detection device) such as a fingerprint detection sensor (physical amount distribution detection device) which detects a distribution of other physical amounts such as pressure and electrostatic capacitance, and captures the distribution as an image.

Further, the application is not limited to a solid-state imaging device which sequentially scans respective unit pixels in an imaging region in units of row, and reads a pixel signal from each of the unit pixels. The application may be an X-Y address type solid-state imaging device which selects any pixel in units of pixel, and reads a pixel signal from the selected pixel in units of pixel. The solid-state imaging device may be a mode constituted by one chip, or another mode which is module-shaped and has an imaging function packaged with an imaging region, a driving circuit, or an optical system.

In addition, the application is not limited to the solid-state imaging device, but may be an imaging device. The imaging device herein refers to a camera system such as a digital still camera and a video camera, and an electronic apparatus having an imaging function such as a cellular phone. The imaging device may be a device of a module-shaped mode mounted on an electronic apparatus, i.e., a camera module.

Figure 69:
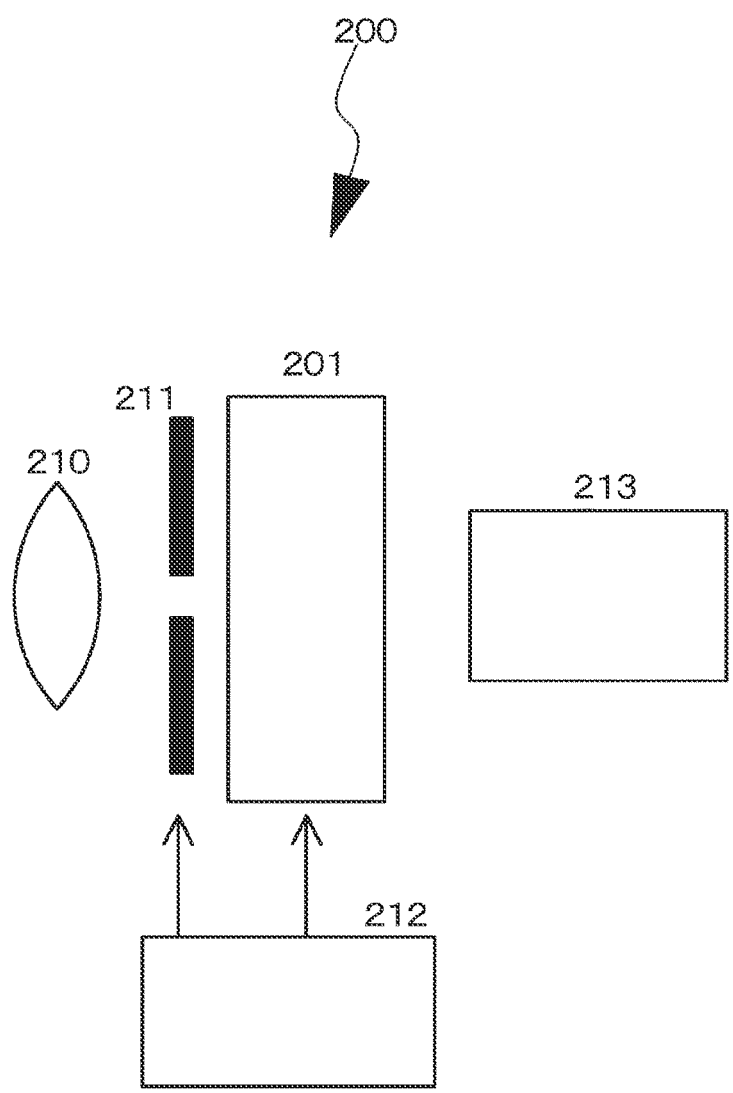
FIG. 69 is a conceptual diagram depicting an example of an electronic apparatus (camera) which includes a solid-state imaging device constituted by an imaging element and a stacked imaging element of the present disclosure.

FIG. 69 is a conceptual diagram depicting an example of an electronic apparatus (camera) 200 which includes a solid-state imaging device 201 constituted by the imaging element or the stacked imaging element of the present disclosure. The electronic apparatus 200 includes the solid-state imaging device 201, an optical lens 210, a shutter device 211, a driving circuit 212, and a signal processing circuit 213. The optical lens 210 forms an image of image forming light (incident light) received from an object on an imaging surface of the solid-state imaging device 201. In this manner, signal charges are accumulated within the solid-state imaging device 201 for a fixed period. The shutter device 211 controls a light irradiation period and a light shield period for the solid-state imaging device 201. The driving circuit 212 supplies a driving signal for controlling a transfer operation and the like of the solid-state imaging device 201 and a shutter operation of the shutter device 211. Signal transfer is performed by the solid-state imaging device 201 according to the driving signal (timing signal) supplied from the driving circuit 212. The signal processing circuit 213 performs various types of signal processing. A video signal subjected to signal processing is stored in a storage medium such as a memory, or output to a monitor. The electronic apparatus 200 configured as above can achieve reduction of a pixel size and improvement of transfer efficiency of the solid-state imaging device 201. Accordingly, the electronic apparatus 200 achieving improvement of pixel characteristics is obtainable. The electronic apparatus 200 to which the solid-state imaging device 201 is applicable is not limited to a camera, but may be an imaging device such as a digital still camera, a camera module for a mobile device such as a cellular phone, and the like.

The technology according to the present disclosure (present technology) is applicable to various products. For example, the technology according to the present disclosure may be practiced as a device mounted on a moving body of any of types such as a car, an electric car, a hybrid electric car, an automobile, a bicycle, a personal mobility, an airplane, a drone, a vessel, and a robot.

FIG. 72 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 72, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 72, an audio speaker 12061, a display section 12062, and an instrument panel 12063 are illustrated as the output device. The display section 12062 may, for example, include at least one of an on-board display and a head-up display.

Figure 73:
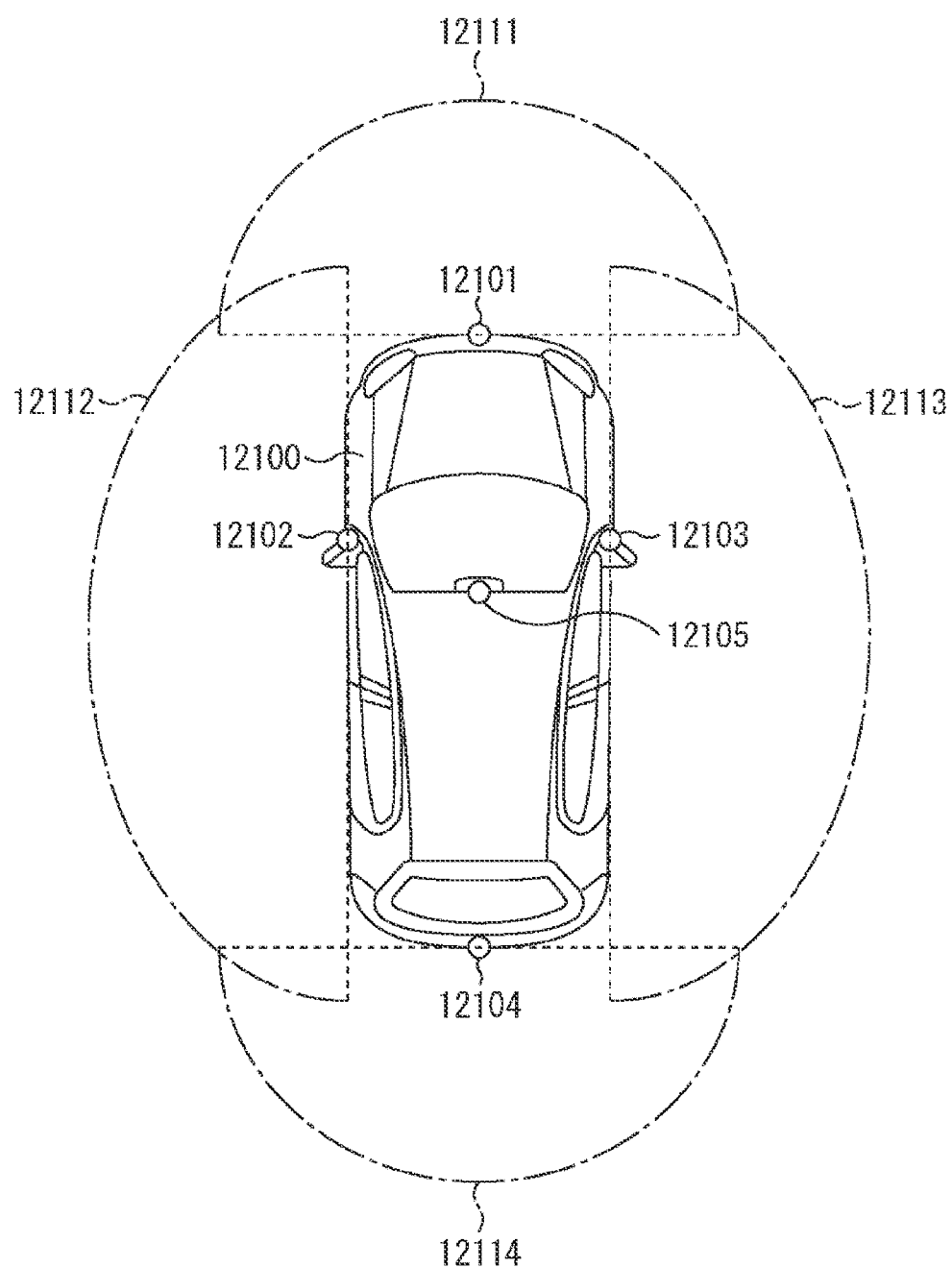
FIG. 73 is a diagram of assistance in explaining an example of installation positions of an outside-vehicle information detecting section and an imaging section.

FIG. 73 is a diagram depicting an example of the installation position of the imaging section 12031.

In FIG. 73, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 73 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Further, for example, the technology according to the present disclosure may be applied to an endoscopic surgery system.

Figure 74:
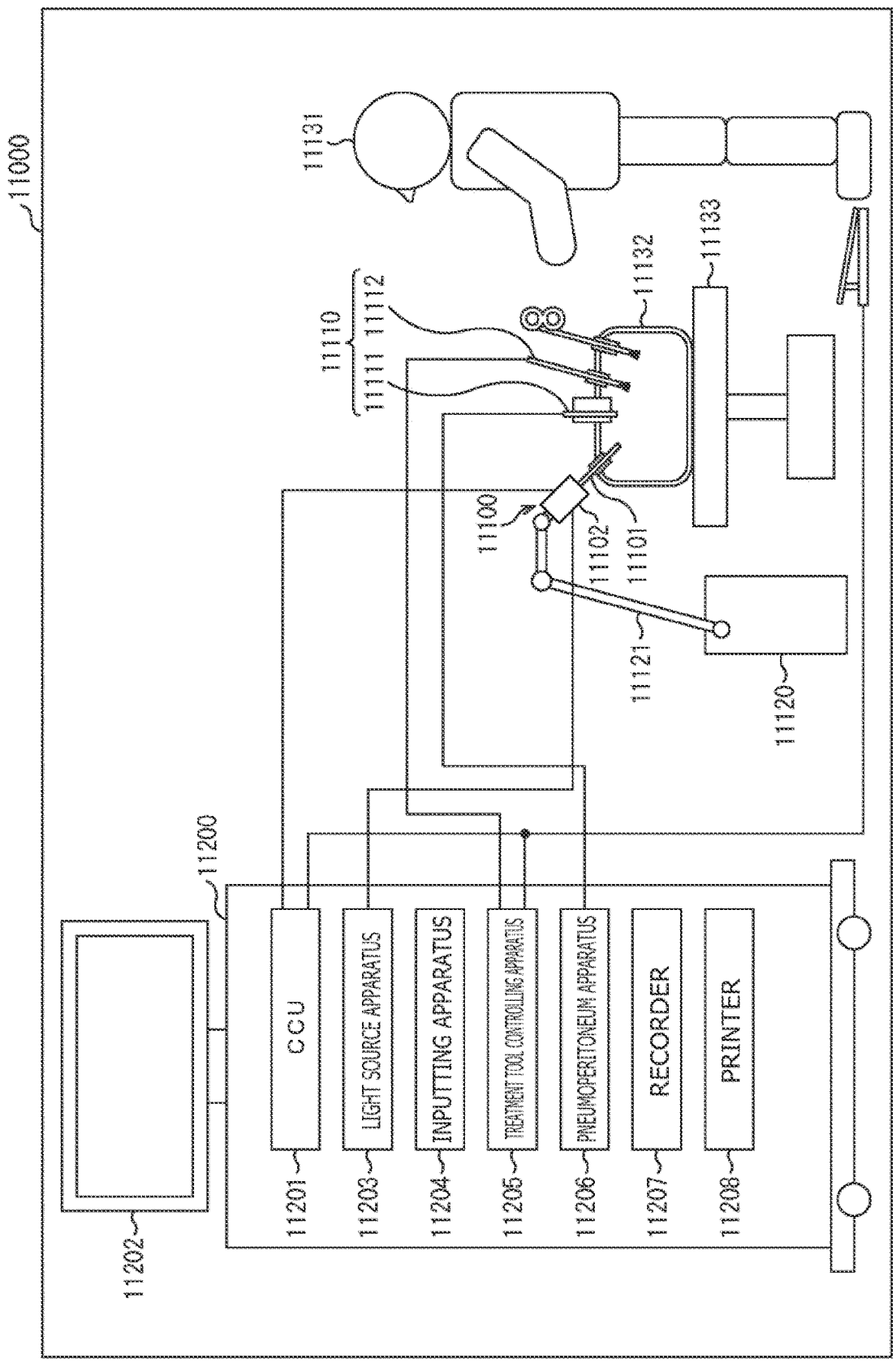
FIG. 74 is a view depicting an example of a schematic configuration of an endoscopic surgery system.

FIG. 74 is a view depicting an example of a schematic configuration of an endoscopic surgery system to which the technology according to an embodiment of the present disclosure (present technology) can be applied.

In FIG. 74, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 75:
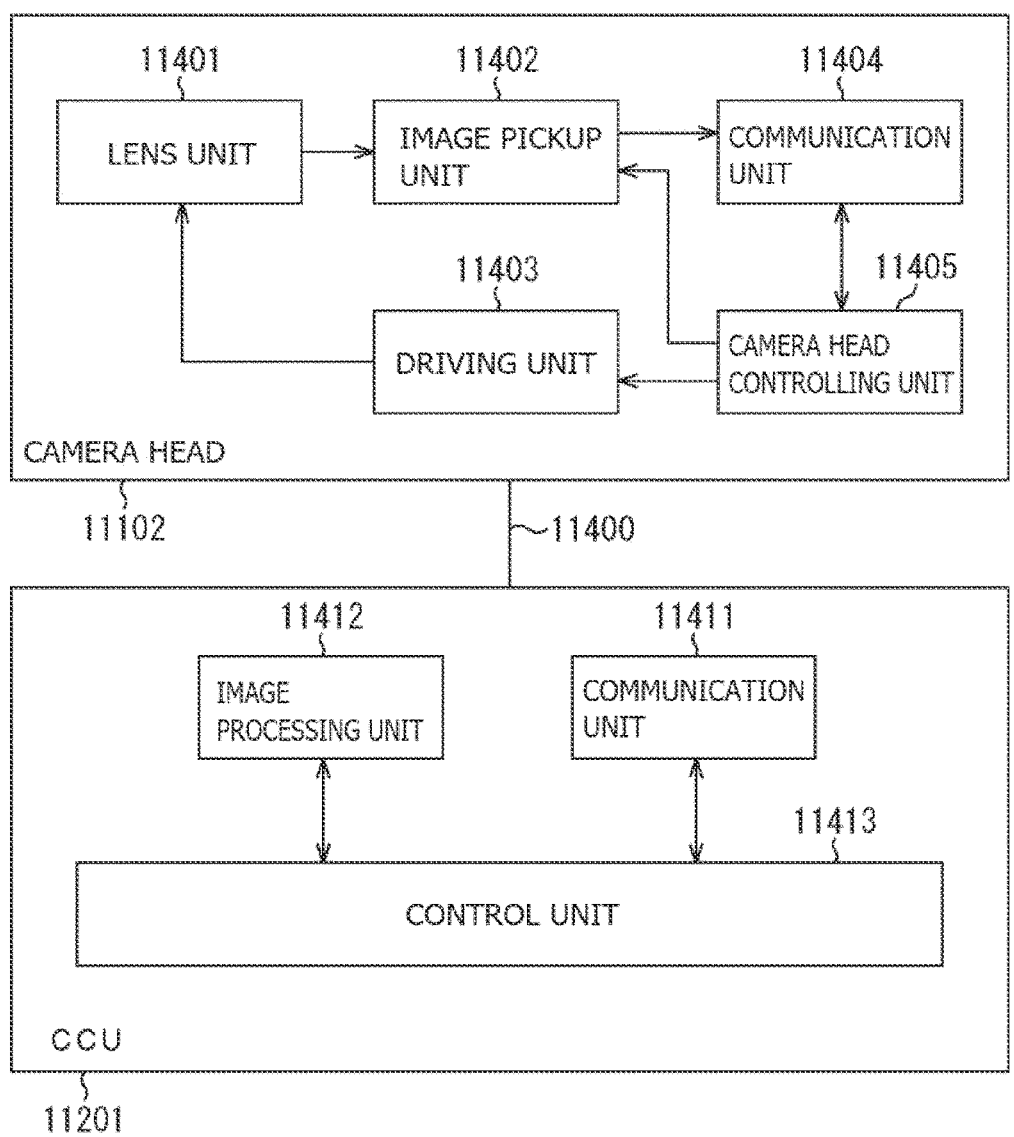
FIG. 75 is a block diagram depicting an example of a functional configuration of a camera head and a camera control unit (CCU).

FIG. 75 is a block diagram depicting an example of a functional configuration of the camera head 11102 and the CCU 11201 depicted in FIG. 74.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

While the endoscopic surgery system has been described herein by way of example, the technology according to the present disclosure may be applied to others such as a microscopic surgery system.

Note that the present disclosure may have following configurations.

[A01] <<Imaging Element: First Aspect>>
An imaging element including:
a first electrode;
a charge accumulation electrode disposed apart from the first electrode;
a photoelectric conversion unit formed in contact with the first electrode and above the charge accumulation electrode with an insulation layer interposed between the photoelectric conversion unit and the charge accumulation electrode; and
a second electrode formed on the photoelectric conversion unit, in which
the photoelectric conversion unit includes a photoelectric conversion layer and an inorganic oxide semiconductor material layer disposed in an order of the photoelectric conversion layer and the inorganic oxide semiconductor material layer from the second electrode side, and
the inorganic oxide semiconductor material layer contains indium atoms, tin atoms, titanium atoms, and zinc atoms.

[A02]
The imaging element according to [A01], in which,
assuming that a composition of the inorganic oxide semiconductor material layer is expressed as $In_aSn_bTi_cZn_dO_e$, and that $a+b+c+d=1.00$, $$b>d>c>0.09$$

is satisfied.

[A03]
The imaging element according to [A01] or [A02], in which,
assuming that a composition of the inorganic oxide semiconductor material layer is expressed as $In_aSn_bTi_cZn_dO_e$, and that $a+b+c+d=1.00$, $$a<(b+c+d)\leq 0.6$$

is satisfied.

[A04]<<Imaging Element: Second Aspect>>
An imaging element including:
a first electrode;
a charge accumulation electrode disposed apart from the first electrode;
a photoelectric conversion unit formed in contact with the first electrode and above the charge accumulation electrode with an insulation layer interposed between the photoelectric conversion unit and the charge accumulation electrode; and
a second electrode formed on the photoelectric conversion unit, in which
the photoelectric conversion unit includes a photoelectric conversion layer and an inorganic oxide semiconductor material layer disposed in an order of the photoelectric conversion layer and the inorganic oxide semiconductor material layer from the second electrode side,
the inorganic oxide semiconductor material layer contains indium atoms, tin atoms, titanium atoms, and zinc atoms, and
oxygen deficiency generation energy of metal atoms is 4 eV or higher.

[A05]
The imaging element according to any one of [A01] to [A04], in which,
assuming that an energy average value of maximum energy values in a conduction band of the inorganic oxide semiconductor material layer is $E_2$ and that an energy average value of LUMO values of the photoelectric conversion layer is $E_1$, $$E_1 - E_2 \geq 0.1 \text{ (eV)}$$

is satisfied.

[A06]
The imaging element according to [A05], in which $$E_1 - E_2 > 0.1 \text{ (eV)}$$

is satisfied.

[A07]
The imaging element according to any one of [A01] to [A06], in which
mobility of the material constituting the inorganic oxide semiconductor material layer is 10 $cm^2$/V·s or higher.

[A08]
The imaging element according to any one of [A01] to [A07], in which
the inorganic oxide semiconductor material layer is amorphous.

[A09]
The imaging element according to any one of [A01] to [A08], in which
a thickness of the inorganic oxide semiconductor material layer ranges from $1 \times 10^{-8}$ to $1.5 \times 10^{-7}$ m.

[A10]
The imaging element according to any one of [A01] to [A09], in which
a charge generated in the photoelectric conversion layer is transferred to the first electrode via the inorganic oxide semiconductor material layer.

[A11]
The imaging element according to [A10], in which
the charge is an electron.

[B01]
The imaging element according to any one of [A01] to [A11], further including:
a semiconductor substrate, in which
the photoelectric conversion unit is disposed above the semiconductor substrate.

[B02]
The imaging element according to any one of [A01] to [B01], in which
the first electrode extends within an opening provided in the insulation layer and connects to the inorganic oxide semiconductor material layer.

[B03]
The imaging element according to any one of [A01] to [B01], in which
the inorganic oxide semiconductor material layer extends within an opening provided in the insulation layer and connects to the first electrode.

[B04]
The imaging element according to [B03], in which
an edge of a top surface of the first electrode is covered with the insulation layer;
the first electrode is exposed on a bottom surface of the opening;
assuming that a surface of the insulation layer in contact with the top surface of the first electrode is a first surface, and that a surface of the insulation layer in contact with a portion included in the inorganic oxide semiconductor material layer and facing the charge accumulation electrode is a second surface, a side surface of the opening has an inclination expanding from the first surface to the second surface.

[B05]
The imaging element according to [B04], in which
a side surface of the opening having the inclination expanding from the first surface to the second surface is located on the charge accumulation electrode side.

[B06]<<Control Over Potentials of First Electrode and Charge Accumulation Electrode>>
The imaging element according to any one of [A01] to [B05], further including:
a control unit provided on the semiconductor substrate and including a driving circuit, in which
the first electrode and the charge accumulation electrode are connected to the driving circuit,
during a charge accumulation period, a potential $V_{11}$ is applied from the driving circuit to the first electrode, a potential $V_{31}$ is applied from the driving circuit to the charge accumulation electrode, and charges are accumulated in the inorganic oxide semiconductor material layer (or the inorganic oxide semiconductor material layer and the photoelectric conversion layer),
during a charge transfer period, a potential $V_{12}$ is applied from the driving circuit to the first electrode, a potential $V_{32}$ is applied from the driving circuit to the charge accumulation electrode, and the charges accumulated in the inorganic oxide semiconductor material layer (or the inorganic oxide semiconductor material layer and the photoelectric conversion layer) are read out to the control unit via the first electrode.
In this case, the potential of the first electrode is higher than the potential of the second electrode. In addition, $V_{31} > V_{11}$ and $V_{32} < V_{12}$ are satisfied.

[B07]<<Lower Charge Transfer Control Electrode>>
The imaging element according to any one of [A01] to [B06], in which
a charge transfer control electrode is formed in a region facing, via the insulation layer, a region included in the photoelectric conversion layer and located between the adjoining imaging elements.

[B08]<<Control Over Potentials of First Electrode, Charge Accumulation Electrode, and Lower Charge Transfer Control Electrode>>

The imaging element according to [B07], further including:
- a control unit disposed on the semiconductor substrate and including a driving circuit, in which
- the first electrode, the second electrode, the charge accumulation electrode, and the lower charge transfer control electrode are connected to the driving circuit,
- during a charge accumulation period, a potential $V_{11}$ is applied from the driving circuit to the first electrode, a potential $V_{31}$ is applied from the driving circuit to the charge accumulation electrode, a potential $V_{41}$ is applied from the driving circuit to the lower charge transfer control electrode, and charges are accumulated in the inorganic oxide semiconductor material layer (or the inorganic oxide semiconductor material layer and the photoelectric conversion layer),
- during a charge transfer period, a potential $V_{12}$ is applied from the driving circuit to the first electrode, a potential $V_{32}$ is applied from the driving circuit to the charge accumulation electrode, a potential $V_{42}$ is applied from the driving circuit to the lower charge transfer control electrode, and the charges accumulated in the inorganic oxide semiconductor material layer (or the inorganic oxide semiconductor material layer and the photoelectric conversion layer) are read out to the control unit via the first electrode.

In this case, $$V_{31} \geq V_{11}, V_{31} > V_{41}, \text{ and } V_{12} > V_{32} > V_{42}$$

are satisfied.

[B09]<<Lower Charge Transfer Control Electrode>>

The imaging element according to any one of [A01] to [B06], in which
- a charge transfer control electrode is formed on a region included in the photoelectric conversion layer and located between the adjoining imaging elements in place of the second electrode.

[B10]

The imaging element according to [B09], in which
- the second electrode is provided for each of the imaging elements; and
- the upper charge transfer control electrode surrounds at least a part of the second electrode, and is disposed apart from the second electrode and on a region-A of the photoelectric conversion layer.

[B11]

The imaging element according to [B09], in which
- the second electrode is provided for each of the imaging elements;
- the upper charge transfer control electrode surrounds at least a part of the second electrode, and is disposed apart from the second electrode; and
- a part of the charge accumulation electrode is present below the upper charge transfer control electrode.

[B12]

The imaging element according to [B09], in which
- the second electrode is provided for each of the imaging elements;
- the upper charge transfer control electrode surrounds at least a part of the second electrode, and is disposed apart from the second electrode;
- a part of the charge accumulation electrode is present below the upper charge transfer control electrode; and
- a lower charge transfer control electrode is formed below the upper charge transfer control electrode.

[B13]<<Control Over Potentials of First Electrode, Charge Accumulation Electrode, and Lower Charge Transfer Control Electrode>>

The imaging element according to any one of [B09] to [B12], further including:
- a control unit disposed on the semiconductor substrate and including a driving circuit, in which
- the first electrode, the second electrode, the charge accumulation electrode, and the upper charge transfer control electrode are connected to the driving circuit,
- during a charge accumulation period, a potential $V_{21}$ is applied from the driving circuit to the second electrode, a potential $V_{41}$ is applied from the driving circuit to the upper charge transfer control electrode, and charges are accumulated in the inorganic oxide semiconductor material layer (or the inorganic oxide semiconductor material layer and the photoelectric conversion layer),
- during a charge transfer period, a potential $V_{22}$ is applied from the driving circuit to the second electrode, a potential $V_{42}$ is applied from the driving circuit to the upper charge transfer control electrode, and the charges accumulated in the inorganic oxide semiconductor material layer (or the inorganic oxide semiconductor material layer and the photoelectric conversion layer) are read out to the control unit via the first electrode.

In this case, $$V_{21} \geq V_{41} \text{ and } V_{22} \geq V_{42}$$

are satisfied.

[B14]<<Transfer Control Electrode>>

The imaging element according to any one of [A01] to [B13], further including:
- a transfer control electrode disposed between the first electrode and the charge accumulation electrode and apart from the first electrode and the charge accumulation electrode, and so disposed as to face the inorganic oxide semiconductor material layer via the insulation layer.

[B15]<<Control Over Potentials of First Electrode, Charge Accumulation Electrode, and Transfer Control Electrode>>

The imaging element according to [B14], further including:
- a control unit provided on the semiconductor substrate and including a driving circuit, in which
- the first electrode, the charge accumulation electrode, and the transfer control electrode are connected to the driving circuit,
- during a charge accumulation period, a potential $V_{11}$ is applied from the driving circuit to the first electrode, a potential $V_{31}$ is applied from the driving circuit to the charge accumulation electrode, a potential $V_{51}$ is applied from the driving circuit to the transfer control electrode, and charges are accumulated in the inorganic oxide semiconductor material layer (or the inorganic oxide semiconductor material layer and the photoelectric conversion layer), and
- during a charge transfer period, a potential $V_{12}$ is applied from the driving circuit to the first electrode, a potential $V_{32}$ is applied from the driving circuit to the charge accumulation electrode, a potential $V_{52}$ is applied from the driving circuit to the transfer control electrode, and the charges accumulated in the inorganic oxide semiconductor material layer (or the inorganic oxide semiconductor material layer and the photoelectric conversion layer) are read out to the control unit via the first electrode.

In this case, the potential of the first electrode is higher than the potential of the second electrode, and $V_{31}>V_{51}$ and $V_{32} \le V_{52} \le V_{12}$ are satisfied.

[B16]<<Charge Discharge Electrode>>

The imaging element according to any one of [A01] to [B15], further including:
 a charge discharge electrode connected to the inorganic oxide semiconductor material layer and disposed apart from the first electrode and the charge accumulation electrode.

[B17]

The imaging element according to [B16], in which
 the charge discharge electrode is so disposed as to surround the first electrode and the charge accumulation electrode.

[B18]

The imaging element according to [B16] or [B17], in which
 the inorganic oxide semiconductor material layer extends inside a second opening provided in the insulation layer and connects to the charge discharge electrode;
 an edge of a top surface of the charge discharge electrode is covered with the insulation layer;
 the charge discharge electrode is exposed on a bottom surface of the second opening;
 assuming that a surface of the insulation layer in contact with the top surface of the charge discharge electrode is a third surface, and that a surface of the insulation layer in contact with a region included in the inorganic oxide semiconductor material layer and facing the charge accumulation electrode is a second surface, a side surface of the second opening has an inclination expanding from the third surface to the second surface.

[B19]<<Control Over Potentials of First Electrode, Charge Accumulation Electrode, and Charge Discharge Electrode>>

The imaging element according to any one of [B16] to [B18], further including:
 a control unit provided on the semiconductor substrate and including a driving circuit, in which
 the first electrode, the charge accumulation electrode, and the charge discharge electrode are connected to the driving circuit,
 during a charge accumulation period, a potential $V_{11}$ is applied from the driving circuit to the first electrode, a potential $V_{31}$ is applied from the driving circuit to the charge accumulation electrode, a potential $V_{61}$ is applied from the driving circuit to the charge discharge electrode, and charges are accumulated in the inorganic oxide semiconductor material layer (or the inorganic oxide semiconductor material layer and the photoelectric conversion layer),
 during a charge transfer period, a potential $V_{12}$ is applied from the driving circuit to the first electrode, a potential $V_{32}$ is applied from the driving circuit to the charge accumulation electrode, a potential $V_{62}$ is applied from the driving circuit to the charge discharge electrode, and the charges accumulated in the inorganic oxide semiconductor material layer (or the inorganic oxide semiconductor material layer and the photoelectric conversion layer) are read out to the control unit via the first electrode.

In this case, the potential of the first electrode is higher than the potential of the second electrode, and $V_{61}>V_{11}$, and $V_{62}<V_{12}$ are satisfied.

[B20]<<Charge Accumulation Electrode Segment>>

The imaging element according to any one of [A01] to [B19], in which
 the charge accumulation electrode includes a plurality of charge accumulation electrode segments.

[B21]

The imaging element according to [B20], in which,
 in a case where the potential of the first electrode is higher than the potential of the second electrode, a potential applied to the charge accumulation electrode segment located nearest the first electrode (first photoelectric conversion unit segment) during a charge transfer period is higher than a potential applied to the charge accumulation electrode segment located farthest from the first electrode;
 in a case where the potential of the first electrode is lower than the potential of the second electrode, a potential applied to the charge accumulation electrode segment located nearest the first electrode (first photoelectric conversion unit segment) during the charge transfer period is lower than a potential applied to the charge accumulation electrode segment located farthest from the first electrode.

[B22]

The imaging element according to any one of [A01] to [B21], in which
 at least a floating diffusion layer or an amplification transistor constituting the control unit is provided on the semiconductor substrate; and
 the first electrode is connected to the floating diffusion layer and a gate portion of the amplification transistor.

[B23]

The imaging element according to [B22], in which
 a reset transistor and a selection transistor constituting the control unit are further provided on the semiconductor substrate;
 the floating diffusion layer is connected to one source/drain region of the reset transistor; and
 one source/drain region of the amplification transistor is connected to one source/drain region of the selection transistor, while the other source/drain region of the selection transistor is connected to a signal line.

[B24]

The imaging element according to any one of [A01] to [B23], in which
 the charge accumulation electrode is larger in size than the first electrode.

[B25]

The imaging element according to any one of [A01] to [B24], in which
 light enters from the second electrode side; and
 a light shield layer is formed on the light entrance side near the second electrode.

[B26]

The imaging element according to any one of [A01] to [B24], in which
 light enters from the second electrode side, but is prohibited from entering the first electrode.

[B27]

The imaging element according to [B26], in which
 a light shield layer is formed on the light entrance side near the second electrode and above the first electrode.

[B28]

The imaging element according to [B26], in which
an on-chip micro-lens is provided above the charge accumulation electrode and the second electrode; and
light entering the on-chip micro-lens is converged on the charge accumulation electrode.

[B29] <<Imaging Element: First Configuration>>

The imaging element according to any one of [A01] to [B28], in which
the photoelectric conversion unit includes N (N≥2) photoelectric conversion unit segments;
each of the inorganic oxide semiconductor material layer and the photoelectric conversion layer includes N photoelectric conversion layer segments;
the insulation layer includes N insulation layer segments;
the charge accumulation electrode includes N charge accumulation electrode segments;
the nth (n=1, 2, 3, and up to N) photoelectric conversion unit segment includes the nth charge accumulation electrode segment, the nth insulation layer segment, and the nth photoelectric conversion layer segment;
the photoelectric conversion unit segment is located farther from the first electrode as the value of n increases; and
a thickness of the insulation layer segment gradually changes from the first photoelectric conversion unit segment to the Nth photoelectric conversion unit segment.

[B30] <<Imaging Element: Second Configuration>>

The imaging element according to any one of [A01] to [B28], in which
the photoelectric conversion unit includes N (N≥2) photoelectric conversion unit segments;
each of the inorganic oxide semiconductor material layer and the photoelectric conversion layer includes N photoelectric conversion layer segments;
the insulation layer includes N insulation layer segments;
the charge accumulation electrode includes N charge accumulation electrode segments;
the nth (n=1, 2, 3, and up to N) photoelectric conversion unit segment includes the nth charge accumulation electrode segment, the nth insulation layer segment, and the nth photoelectric conversion layer segment;
the photoelectric conversion unit segment is located farther from the first electrode as the value of n increases; and
a thickness of the photoelectric conversion layer segment gradually changes from the first photoelectric conversion unit segment to the Nth photoelectric conversion unit segment.

[B31] <<Imaging Element: Third Configuration>>

The imaging element according to any one of [A01] to [B28], in which
the photoelectric conversion unit includes N (N≥2) photoelectric conversion unit segments;
each of the inorganic oxide semiconductor material layer and the photoelectric conversion layer includes N photoelectric conversion layer segments;
the insulation layer includes N insulation layer segments;
the charge accumulation electrode includes N charge accumulation electrode segments;
the nth (n=1, 2, 3, and up to N) photoelectric conversion unit segment includes the nth charge accumulation electrode segment, the nth insulation layer segment, and the nth photoelectric conversion layer segment;
the photoelectric conversion unit segment is located farther from the first electrode as the value of n increases; and
materials constituting the insulation layer segments in the adjoining photoelectric conversion unit segments differ from each other.

[B32] <<Imaging Element: Fourth Configuration>>

The imaging element according to any one of [A01] to [B28], in which
the photoelectric conversion unit includes N (N≥2) photoelectric conversion unit segments;
each of the inorganic oxide semiconductor material layer and the photoelectric conversion layer includes N photoelectric conversion layer segments;
the insulation layer includes N insulation layer segments;
the charge accumulation electrode includes N charge accumulation electrode segments disposed apart from each other;
the nth (n=1, 2, 3, and up to N) photoelectric conversion unit segment includes the nth charge accumulation electrode segment, the nth insulation layer segment, and the nth photoelectric conversion layer segment;
the photoelectric conversion unit segment is located farther from the first electrode as the value of n increases; and
materials constituting the charge accumulation electrode segments in the adjoining photoelectric conversion unit segments differ from each other.

[B33] <<Imaging Element: Fifth Configuration>>

The imaging element according to any one of [A01] to [B28], in which
the photoelectric conversion unit includes N (N≥2) photoelectric conversion unit segments;
each of the inorganic oxide semiconductor material layer and the photoelectric conversion layer includes N photoelectric conversion layer segments;
the insulation layer includes N insulation layer segments;
the charge accumulation electrode includes N charge accumulation electrode segments disposed apart from each other;
the nth (n=1, 2, 3, and up to N) photoelectric conversion unit segment includes the nth charge accumulation electrode segment, the nth insulation layer segment, and the nth photoelectric conversion layer segment;
the photoelectric conversion unit segment is located farther from the first electrode as the value of n increases; and
an area of the charge accumulation electrode segment gradually decreases from the first photoelectric conversion unit segment to the Nth photoelectric conversion unit segment.

[B34] <<Imaging Element: Sixth Configuration>>

The imaging element according to any one of [A01] to [B28], in which,
assuming that a stacking direction of the charge accumulation electrode, the insulation layer, the inorganic oxide semiconductor material layer, and the photoelectric conversion layer is a Z direction, and that a direction away from the first electrode is an X direction, a cross-sectional area taken at a stacked portion where the charge accumulation electrode, the insulation layer, the inorganic oxide semiconductor material layer, and the photoelectric conversion layer are stacked in a Y-Z virtual plane changes depending on a distance from the first electrode.

[C01]<<Stacked Imaging Element>>
  A stacked imaging element including:
    at least the one imaging element according to any one of [A01] to [B34].
[D01]<<Solid-State Imaging Device: First Aspect>>
  A solid-state imaging device including:
    a plurality of the imaging elements according to any one of [A01] to [B34].
[D02]<<Solid-State Imaging Device: Second Aspect>>
  A solid-state imaging device including:
    a plurality of the stacked imaging elements according to [C01].
[E01]<<Solid-State Imaging Device: First Configuration>>
  A solid-state imaging device including:
    a photoelectric conversion unit that includes a first electrode, a photoelectric conversion layer, and a second electrode stacked on each other, in which
    the photoelectric conversion unit includes a plurality of the imaging elements according to any one of [A01] to [B34],
    an imaging element block is constituted by the plurality of imaging elements, and
    the first electrode is shared by the plurality of imaging elements constituting the imaging element block.
[E02]<<Solid-State Imaging Device: Second Configuration>>
  A solid-state imaging device including:
    a plurality of the stacked imaging elements according to [C01], in which
    an imaging element block is constituted by the plurality of imaging elements, and
    the first electrode is shared by the plurality of imaging elements constituting the imaging element block.
[E03]
  The solid-state imaging device according to [E01] or [E02], in which
    one on-chip micro-lens is disposed above the one imaging element.
[E04]
  The solid-state imaging device according to [E01] or [E02], in which
    the imaging element block is constituted by the two imaging elements; and
    one on-chip micro-lens is disposed above the imaging element block.
[E05]
  The solid-state imaging device according to any one of [E01] to [E04], in which
    one floating diffusion layer is provided for the plurality of imaging elements.
[E06]
  The solid-state imaging device according to any one of [E01] to [E05], in which
    the first electrode is disposed adjacent to the charge accumulation electrodes of the respective imaging elements.
[E07]
  The solid-state imaging device according to any one of [E01] to [E06], in which
    the first electrode is disposed adjacent to a part of the charge accumulation electrodes of the plurality of imaging elements, and not disposed adjacent to the rest of the charge accumulation electrodes of the plurality of imaging elements.
[E08]
  The solid-state imaging device according to [E07], in which
    a distance between the charge accumulation electrodes constituting the imaging elements is longer than a distance between the first electrode and the charge accumulation electrode in the imaging element adjacent to the first electrode.
[F01]<<Driving Method of Solid-State Imaging Device>>
  A driving method of a solid-state imaging device, the solid-state imaging device including
    a photoelectric conversion unit that includes a first electrode, a photoelectric conversion layer, and a second electrode stacked on each other,
    the photoelectric conversion unit further including a charge accumulation electrode disposed apart from the first electrode, and so disposed as to face the photoelectric conversion layer via an insulation layer, and
    a plurality of imaging elements each being structured such that light enters from the second electrode side and not entering the first electrode, the driving method repeating the steps of:
  simultaneously discharging charges in the first electrode to the outside of the system while accumulating charges in the inorganic oxide semiconductor material layer in all of the imaging elements; and
  subsequently, simultaneously transferring the charges accumulated in the inorganic oxide semiconductor material layer to the first electrode in all of the imaging elements, and, after completion of transfer, simultaneously reading out the charges transferred to the first electrode in each of the imaging elements.

REFERENCE SIGNS LIST

10 . . . Imaging element (stacked imaging element, first imaging element), 11 . . . Second imaging element, 12 . . . Third imaging element, 13 . . . Various imaging element components located below interlayer insulation layer, 14 . . . On-chip micro-lens (OCL), 15 . . . Light shield layer, 21 . . . First electrode, 22 . . . Second electrode, 23 . . . Photoelectric conversion unit, 23A . . . Photoelectric conversion layer, 23B . . . Inorganic oxide semiconductor material layer, 24 . . . Charge accumulation electrode, 24A, 24B, 24C . . . Charge accumulation electrode segment, 25, 25A, 25B . . . Transfer control electrode (charge transfer electrode), 26 . . . Charge discharge electrode, 27 . . . Lower charge transfer control electrode (lower and charge transfer control electrode), 27A . . . Connection hole, 27B . . . Pad portion, 28 . . . Upper charge transfer control electrode (upper and charge transfer control electrode), 41 . . . n-type semiconductor region constituting second imaging element, 43 . . . n-type semiconductor region constituting third imaging element, 42, 44, 73 . . . p$^+$ layer, 45, 46 . . . Gate portion of transfer transistor, 51 . . . Gate portion of reset transistor $TR1_{rst}$, 51A . . . Channel forming region of reset transistor $TR1_{rst}$, 51B, 51C . . . Source/drain region of reset transistor $TR1_{rst}$, 52 . . . Gate portion of amplification transistor $TR1_{amp}$, 52A . . . Channel forming region of amplification transistor $TR1_{amp}$, 52B, 52C . . . Source/drain region of amplification transistor $TR1_{amp}$, 53 . . . Gate portion of selection transistor $TR1_{sel}$, 53A . . . Channel forming region of selection transistor $TR1_{sel}$, 53B, 53C . . . Source/drain region of selection transistor $TR1_{sel}$, 61 . . . Contact hole portion, 62 ... Wiring layer, 63, 64, 68A ... Pad portion, 65, 68B ... Connection hole, 66, 67, 69 ... Connection portion, 70 ... Semiconductor substrate, 70A ... First surface (front surface) of semiconductor substrate, 70B ... Second surface (back surface) of semiconductor substrate, 71 ... Element separation region, 72 ... Oxide film, 74 ... $HfO_2$ film, 75 ... Insulation material film, 76, 81 ... Interlayer insulation layer, 82 ... Insulation layer, 82A ... Region between adjoining imaging elements (region-a), 83 ... Protection layer, 84 ... Opening, 85 ... Second opening, 100 ... Solid-state imaging device, 101 ... Stacked imaging element, 111 ... Imaging region, 112 ... Vertical driving circuit, 113 ... Column signal processing circuit, 114 ... Horizontal driving circuit, 115 ... Output circuit, 116 ... Driving control circuit, 117 ... Signal line (data output line), 118 ... Horizontal signal line, 200 ... Electronic apparatus (camera), 201 ... Solid-state imaging device, 210 ... Optical lens, 211 ... Shutter device, 212 ... Driving circuit, 213 ... Signal processing circuit, $FD_1$, $FD_2$, $FD_3$, 45C, 46C ... Floating diffusion layer, $TR1_{trs}$, $TR2_{trs}$, $TR3_{rst}$ ... Transfer transistor, $TR1_{rst}$, $TR2_{rst}$, $TR3_{rst}$ ... Reset transistor, $TR1_{amp}$, $TR2_{amp}$, $TR3_{amp}$ ... Amplification transistor, $TR1_{sel}$, $TR3_{sel}$, $TR3_{sel}$ ... Selection transistor, $V_{DD}$ ... Power source, $RST_1$, $RST_2$, $RST_3$ ... Reset line, $SEL_1$, $SEL_2$, $SEL_3$ ... Selection line, 117, VSL, $VSL_1$, $VSL_2$, $VSL_3$ ... Signal line (data output line), $TG_2$, $TG_3$ ... Transfer gate line, $V_{OA}$, $V_{OB}$, $V_{OT}$, $V_{OU}$ ... Wire

The invention claimed is:

1. An imaging element comprising:
a first electrode;
a charge accumulation electrode disposed apart from the first electrode;
a photoelectric conversion unit formed in contact with the first electrode and above the charge accumulation electrode with an insulation layer interposed between the photoelectric conversion unit and the charge accumulation electrode; and
a second electrode formed on the photoelectric conversion unit, wherein
the photoelectric conversion unit includes a photoelectric conversion layer and an inorganic oxide semiconductor material layer disposed in an order of the photoelectric conversion layer and the inorganic oxide semiconductor material layer from the second electrode side, and
the inorganic oxide semiconductor material layer contains indium atoms, tin atoms, titanium atoms, and zinc atoms.

2. The imaging element according to claim 1, wherein, assuming that a composition of the inorganic oxide semiconductor material layer is expressed as $In_aSn_bTi_cZn_dO_e$, and that $a+b+c+d=1.00$, $$b>d>c>0.09$$

is satisfied.

3. The imaging element according to claim 1, wherein, assuming that a composition of the inorganic oxide semiconductor material layer is expressed as $In_aSn_bTi_cZn_dO_e$, and that $a+b+c+d=1.00$, $$a<(b+c+d)\leq 0.6$$

is satisfied.

4. An imaging element comprising:
a first electrode;
a charge accumulation electrode disposed apart from the first electrode;
a photoelectric conversion unit formed in contact with the first electrode and above the charge accumulation electrode with an insulation layer interposed between the photoelectric conversion unit and the charge accumulation electrode; and
a second electrode formed on the photoelectric conversion unit, wherein
the photoelectric conversion unit includes a photoelectric conversion layer and an inorganic oxide semiconductor material layer disposed in an order of the photoelectric conversion layer and the inorganic oxide semiconductor material layer from the second electrode side,
the inorganic oxide semiconductor material layer contains indium atoms, tin atoms, titanium atoms, and zinc atoms, and
oxygen deficiency generation energy of metal atoms is 4 eV or higher.

5. The imaging element according to claim 1, wherein, assuming that an energy average value of maximum energy values in a conduction band of the inorganic oxide semiconductor material layer is E2 and that an energy average value of LUMO values of the photoelectric conversion layer is E1, $$E1-E2\geq 0.1\ (eV)$$

is satisfied.

6. The imaging element according to claim 5, wherein $$E1-E2>0.1\ (eV)$$

is satisfied.

7. The imaging element according to claim 1, wherein mobility of the material constituting the inorganic oxide semiconductor material layer is 10 cm2/V·s or higher.

8. The imaging element according to claim 1, wherein the inorganic oxide semiconductor material layer is amorphous.

9. The imaging element according to claim 1, wherein a thickness of the inorganic oxide semiconductor material layer ranges from 1×10-8 to 1.5×10-7 m.

10. The imaging element according to claim 1, wherein a charge generated in the photoelectric conversion layer is transferred to the first electrode via the inorganic oxide semiconductor material layer.

11. The imaging element according to claim 10, wherein the charge is an electron.

12. A stacked imaging element comprising:
at least the one imaging element according to claim 1.

13. A solid-state imaging device comprising:
a plurality of the imaging elements according to claim 1.

14. A solid-state imaging device comprising:
a plurality of the stacked imaging elements according to claim 12.

* * * * *